US012660487B2

(12) United States Patent
Sugisawa et al.

(10) Patent No.: US 12,660,487 B2
(45) Date of Patent: Jun. 16, 2026

(54) DISPLAY APPARATUS, DISPLAY MODULE, AND ELECTRONIC DEVICE

(71) Applicant: Semiconductor Energy Laboratory Co., Ltd., Atsugi (JP)

(72) Inventors: Nozomu Sugisawa, Isehara (JP); Yasumasa Yamane, Atsugi (JP); Daiki Nakamura, Atsugi (JP); Tsunenori Suzuki, Yokohama (JP); Naoto Goto, Tochigi (JP); Yasutaka Nakazawa, Tochigi (JP)

(73) Assignee: Semiconductor Energy Laboratory Co., Ltd., Atsugi (JP)

( * ) Notice: Subject to any disclaimer, the term of this patent is extended or adjusted under 35 U.S.C. 154(b) by 0 days.

(21) Appl. No.: 18/236,965

(22) Filed: Aug. 23, 2023

(65) Prior Publication Data

US 2024/0114755 A1 Apr. 4, 2024

(30) Foreign Application Priority Data

Sep. 2, 2022 (JP) ................................ 2022-139638
Oct. 24, 2022 (JP) ................................ 2022-169723
(Continued)

(51) Int. Cl.
*H10K 59/80* (2023.01)
*H10K 59/12* (2023.01)

(52) U.S. Cl.
CPC ..... *H10K 59/8793* (2023.02); *H10K 59/1201* (2023.02)

(58) Field of Classification Search
CPC . H10K 59/8793; H10K 59/1201; H10K 59/12
See application file for complete search history.

(56) References Cited

U.S. PATENT DOCUMENTS 5,953,985 A 9/1999 Kobayashi
6,120,338 A 9/2000 Hirano et al.
(Continued)

FOREIGN PATENT DOCUMENTS

JP 2000-036385 A 2/2000
JP 2002-324673 A 11/2002
(Continued)

OTHER PUBLICATIONS

Zakhidov.A et al., "Orthogonal processing: A new strategy for organic electronics", Chem. Sci. (Chemical Science), Apr. 7, 2011, vol. 2, No. 6, pp. 1178-1182.
(Continued)

*Primary Examiner* — Errol V Fernandes
(74) *Attorney, Agent, or Firm* — Eric J. Robinson; Robinson Intellectual Property Law Office, P.C.

(57) ABSTRACT

A novel display apparatus that is highly convenient, useful, or reliable is provided. The display apparatus includes a first light-emitting device including a first electrode, a first layer, a first unit, and a second electrode and a second light-emitting device including a third electrode, a second layer, a second unit, and a fourth electrode. The first unit is between the first electrode and the second electrode and includes a first light-emitting material. The first layer is between the first unit and the first electrode and is in contact with the first electrode. The third electrode is adjacent to the first electrode. A first gap is between the third electrode and the first electrode. The second unit is between the third electrode and the fourth electrode and includes a second light-emitting material. The second layer is between the second unit and the third electrode and is in contact with the third electrode. The first layer and the second layer use a material having a first spin density and a material having a second spin density higher than the first spin density, respec-
(Continued)

tively, each observed with an electron spin resonance (ESR) spectrometer when the material is in a film state.

10 Claims, 68 Drawing Sheets

(30) Foreign Application Priority Data

| | | |
|---|---|---|
| Apr. 3, 2023 | (JP) | 2023-060387 |
| May 10, 2023 | (JP) | 2023-077626 |
| Jul. 18, 2023 | (JP) | 2023-117083 |

(56) References Cited

U.S. PATENT DOCUMENTS

| | | | | |
|---|---|---|---|---|
| 7,399,991 | B2 | 7/2008 | Seo et al. | |
| 7,663,149 | B2 | 2/2010 | Seo et al. | |
| 2002/0072139 | A1 | 6/2002 | Kashiwabara | |
| 2011/0148290 | A1 | 6/2011 | Oota | |
| 2012/0256204 | A1 | 10/2012 | Yoshizumi et al. | |
| 2012/0273804 | A1 | 11/2012 | Hatano | |
| 2012/0276484 | A1 | 11/2012 | Izumi et al. | |
| 2013/0084531 | A1 | 4/2013 | Hamaguchi et al. | |
| 2013/0084664 | A1 | 4/2013 | Yoshitoku et al. | |
| 2013/0084666 | A1 | 4/2013 | Oshige | |
| 2013/0280839 | A1 | 10/2013 | Sonoda et al. | |
| 2013/0295705 | A1 | 11/2013 | Sonoda et al. | |
| 2014/0004640 | A1 | 1/2014 | Hamaguchi et al. | |
| 2014/0004642 | A1 | 1/2014 | Otsuka et al. | |
| 2015/0060826 | A1 | 3/2015 | Matsumoto et al. | |
| 2015/0069360 | A1 | 3/2015 | Sato | |
| 2015/0076476 | A1 | 3/2015 | Odaka et al. | |
| 2016/0172595 | A1 | 6/2016 | Malinowski et al. | |
| 2016/0315133 | A1 | 10/2016 | Sato | |
| 2017/0141167 | A1 | 5/2017 | Naganuma | |
| 2017/0256754 | A1 | 9/2017 | Defranco et al. | |
| 2018/0190908 | A1 | 7/2018 | Ke et al. | |
| 2020/0203662 | A1 | 6/2020 | Mollard et al. | |
| 2021/0384442 | A1* | 12/2021 | Watabe | H10K 59/876 |
| 2022/0216445 | A1 | 7/2022 | Seo et al. | |
| 2023/0276647 | A1 | 8/2023 | Kawano et al. | |
| 2023/0416201 | A1 | 12/2023 | Tada et al. | |

FOREIGN PATENT DOCUMENTS

| | | | |
|---|---|---|---|
| JP | 2003-059663 | A | 2/2003 |
| JP | 2008-098106 | A | 4/2008 |
| JP | 2008-147072 | A | 6/2008 |
| JP | 2008-251270 | A | 10/2008 |
| JP | 2014-120218 | A | 6/2014 |
| JP | 2014-135251 | A | 7/2014 |
| JP | 2014-232568 | A | 12/2014 |
| JP | 2015-115178 | A | 6/2015 |
| JP | 2016-197494 | A | 11/2016 |
| JP | 2019-179696 | A | 10/2019 |
| JP | 2020-160305 | A | 10/2020 |
| WO | WO-2018/087625 | | 5/2018 |

OTHER PUBLICATIONS

Malinowski.P et al., "High resolution photolithography for direct view active matrix organic light-emitting diode augmented reality displays", J. Soc. Inf. Display (Journal of the Society for Information Display), Apr. 2, 2018, vol. 26, No. 3, pp. 128-136.

Malinowski.P et al., "Photolithographic patterning of organic photodetectors with a non-fluorinated photoresist system", Organic Electronics, Jul. 12, 2014, vol. 15, No. 10, pp. 2355-2359.

Malinowski.P et al., "Multicolor 1250 ppi OLED Arrays Patterened by Photolithography", SID Digest '16 : SID International Symposium Digest of Technical Papers, May 22, 2016, vol. 47, No. 1, pp. 1009-1012.

Papadopoulos.N et al., "AMOLED Displays with In-Pixel Photodetector", Liquid Crystals and Display Technology, Jul. 9, 2020, pp. 1-19.

Ke.T et al., "Technology Developments in High-Resolution FMM-free OLED and BEOL IGZO TFTs for Power-Efficient Microdisplays", SID Digest '21 : SID International Symposium Digest of Technical Papers, May 1, 2021, vol. 52, No. 1, pp. 127-130.

Malinowski.P et al., "Integration of additional functionalities into the frontplane of AMOLED displays", SID Digest '20 : SID International Symposium Digest of Technical Papers, Aug. 1, 2020, vol. 51, No. 1, pp. 646-649.

Malinowski.P et al., "Organic photolithography for displays with integrated fingerprint scanner", SID Digest '19 : SID International Symposium Digest of Technical Papers, May 29, 2019, vol. 50, No. 1, pp. 1007-1010.

Ke. T et al., "Island and Hole Fabrication on OLED Stack for High-Resolution Sensor in Display Application", IDW '20 : Proceedings of the 27th International Display Workshops, Dec. 9, 2020, vol. 27, pp. 902-905.

Gather.M et al., "Solution-Processed Full-Color Polymer-OLED Displays Fabricated by Direct Photolithography", SID Digest '06 : SID International Symposium Digest of Technical Papers, Jun. 1, 2006, vol. 37, No. 1, pp. 909-911.

Malinowski.P et al., "Photolithography as Enabler of AMOLED Displays Beyond 1000 ppi", SID Digest '17 : SID International Symposium Digest of Technical Papers, May 1, 2017, vol. 48, No. 1, pp. 623-626.

* cited by examiner

6500

6505 6507
6501
6502
6508
6503
6504
6506

6502
6510 6513 6512 6511
6515 6516 6517 6518 6501

7100 7101
7000
7103
7111

7200
7211
7000
7212
7214 7213

7300 7301
7303
7000
7311

7400
7401
7000
7411

9101

9102

9103

9200

9201

9201

9201

700-3

DISPLAY APPARATUS, DISPLAY MODULE, AND ELECTRONIC DEVICE

BACKGROUND OF THE INVENTION

1. Field of the Invention

One embodiment of the present invention relates to a display apparatus, a display module, an electronic device, or a semiconductor device.

Note that one embodiment of the present invention is not limited to the above technical field. The technical field of one embodiment of the invention disclosed in this specification and the like relates to an object, a method, or a manufacturing method. One embodiment of the present invention relates to a process, a machine, manufacture, or a composition of matter. Specific examples of the technical field of one embodiment of the present invention disclosed in this specification include a semiconductor device, a display apparatus, a light-emitting apparatus, a power storage device, a memory device, a method for driving any of them, and a method for manufacturing any of them.

2. Description of the Related Art

In recent years, higher resolution has been required for display panels. Examples of devices that require high-resolution display panels include a smartphone, a tablet terminal, and a laptop computer. Furthermore, higher resolution has been required for a stationary display apparatus such as a television device or a monitor device along with a higher definition. A device absolutely required to have the highest resolution display panel is a device for virtual reality (VR) or augmented reality (AR).

Examples of the display apparatus that can be used for a display panel include, typically, a liquid crystal display apparatus, a light-emitting apparatus including a light-emitting element such as an organic electroluminescent (EL) element or a light-emitting diode (LED), and electronic paper performing display by an electrophoretic method or the like.

An organic EL element generally has a structure in which, for example, a layer containing a light-emitting organic compound is provided between a pair of electrodes. By voltage application to this element, the light-emitting organic compound can emit light. A display apparatus including such an organic EL element needs no backlight which is necessary for a liquid crystal display apparatus and the like and thus can have advantages such as thinness, lightweight, high contrast, and low power consumption. Patent Document 1, for example, discloses an example of a display apparatus using an organic EL element.

Patent Document 2 discloses a display apparatus using an organic EL device for VR.

REFERENCES

[Patent Document 1] Japanese Published Patent Application No. 2002-324673

[Patent Document 2] PCT International Publication No. 2018/087625

SUMMARY OF THE INVENTION

An object of one embodiment of the present invention is to provide a novel display apparatus that is highly convenient, useful, or reliable. Another object is to provide a novel display module that is highly convenient, useful, or reliable. Another object is to provide a novel electronic device that is highly convenient, useful, or reliable. Another object is to provide a novel display apparatus, a novel display module, a novel electronic device, or a novel semiconductor device.

Note that the description of these objects does not preclude the existence of other objects. In one embodiment of the present invention, there is no need to achieve all these objects. Other objects will be apparent from and can be derived from the description of the specification, the drawings, the claims, and the like.

(1) One embodiment of the present invention is a display apparatus including a first light-emitting device and a second light-emitting device.

The first light-emitting device includes a first electrode, a first layer, a first unit, and a second electrode. The first unit is between the first electrode and the second electrode. The first unit includes a first light-emitting material. The first layer is between the first unit and the first electrode. The first layer is in contact with the first electrode. The first layer uses a material having a first spin density observed with an electron spin resonance (ESR) spectrometer when the material is in a film state.

The second light-emitting device includes a third electrode, a second layer, a second unit, and a fourth electrode. The third electrode is adjacent to the first electrode. A first gap is between the third electrode and the first electrode. The second unit is between the third electrode and the fourth electrode. The second unit includes a second light-emitting material. The second layer is between the second unit and the third electrode. The second layer is in contact with the third electrode. The second layer uses a material having a second spin density observed with an electron spin resonance (ESR) spectrometer when the material is in a film state. The second spin density is higher than the first spin density.

(2) Another embodiment of the present invention is a display apparatus including a first light-emitting device and a second light-emitting device.

The first light-emitting device includes a first electrode, a first layer, a first unit, and a second electrode. The first unit is between the first electrode and the second electrode. The first unit includes a first light-emitting material. The first layer is between the first unit and the first electrode. The first layer is in contact with the first electrode. The first layer includes an electron-accepting material at a first weight percentage.

The second light-emitting device includes a third electrode, a second layer, a second unit, and a fourth electrode. The third electrode is adjacent to the first electrode. A first gap is between the third electrode and the first electrode. The second unit is between the third electrode and the fourth electrode. The second unit includes a second light-emitting material. The second layer is between the second unit and the third electrode. The second layer is in contact with the third electrode. The second layer includes an electron-accepting material at a second weight percentage. The second weight percentage is higher than the first weight percentage.

(3) Another embodiment of the present invention is the display apparatus in which a second gap is between the second layer and the first layer and overlaps with the first gap.

Accordingly, a phenomenon in which one of the first light-emitting device and the second light-emitting device emits light with unintended luminance in accordance with light emission of the other of the first light-emitting device and the second light-emitting device can be suppressed. In addition, the first light-emitting device and the second light-emitting device can be individually driven. Occurrence of a cross talk phenomenon between adjacent light-emitting devices can be suppressed. An increase in the driving voltage of the second light-emitting device can be suppressed. The resolution of the display apparatus can be increased. The aperture ratio of a pixel of the display apparatus can be increased. As a result, a novel display apparatus that is highly convenient, useful, or reliable can be provided.

(4) Another embodiment of the present invention is the display apparatus including a first insulating film, a conductive film, and a second insulating film.

The first insulating film overlaps with the conductive film. The first electrode and the third electrode are between the first insulating film and the conductive film. The conductive film includes the second electrode and the fourth electrode.

The second insulating film is between the conductive film and the first insulating film. The second insulating film overlaps with the first gap. The second insulating film fills the second gap. The second insulating film has a first opening and a second opening. The first opening overlaps with the first electrode. The second opening overlaps with the third electrode.

Thus, the second gap can be filled with the second insulating film. Moreover, a step due to the first and second gaps can be reduced so as to be close to a flat plane. A phenomenon in which a cut or a split is generated due to the step in the conductive film can be suppressed. As a result, a novel display apparatus that is highly convenient, useful, or reliable can be provided.

(5) Another embodiment of the present invention is the display apparatus in which an emission spectrum of the first light-emitting material has a maximum peak in the range greater than or equal to 380 nm and less than or equal to 480 nm and an emission spectrum of the second light-emitting material has a maximum peak in the range greater than or equal to 500 nm and less than or equal to 550 nm.

When the emission spectrum of the first light-emitting material has a maximum peak in the range greater than or equal to 380 nm and less than or equal to 480 nm and the emission spectrum of the second light-emitting material has a maximum peak in the range greater than or equal to 500 nm and less than or equal to 550 nm, the color gamut displayable on the display apparatus can be widened. By using the second light-emitting material having lower excitation energy than the first light-emitting material, the driving voltage of the second light-emitting device can be reduced. In addition, the power consumption of the display apparatus can be reduced. Even in the case where, at a wavelength where an emission spectrum of the first light-emitting material has a maximum peak, the absorption intensity of the electron-accepting material is higher than that at a wavelength where an emission spectrum of the second light-emitting material has a maximum peak, a phenomenon in which the first layer absorbs light emitted from the first light-emitting material can be suppressed by making the first weight percentage lower than the second weight percentage. As a result, a novel display apparatus that is highly convenient, useful, or reliable can be provided.

(6) Another embodiment of the present invention is the display apparatus in which the first light-emitting material is a fluorescent substance and the second light-emitting material is a phosphorescent substance.

This can reduce the power consumption of the display apparatus. As a result, a novel display apparatus that is highly convenient, useful, or reliable can be provided.

(7) Another embodiment of the present invention is a display module including the display apparatus and at least one of a connector and an integrated circuit.

(8) Another embodiment of the present invention is an electronic device including the display apparatus and at least one of a battery, a camera, a speaker, and a microphone.

Although the block diagram in drawings attached to this specification shows components classified based on their functions in independent blocks, it is difficult to classify actual components based on their functions completely, and one component can have a plurality of functions.

Note that the light-emitting apparatus in this specification includes, in its category, an image display device that uses a light-emitting device. The light-emitting apparatus may also include, in its category, a module in which a light-emitting device is provided with a connector such as an anisotropic conductive film or a tape carrier package (TCP), a module in which a printed wiring board is provided at the end of a TCP, and a module in which an integrated circuit (IC) is directly mounted on a light-emitting device by a chip on glass (COG) method. Furthermore, a lighting device or the like may include the light-emitting apparatus.

One embodiment of the present invention can provide a novel display apparatus that is highly convenient, useful, or reliable. Another embodiment of the present invention can provide a novel display module that is highly convenient, useful, or reliable. Another embodiment of the present invention can provide a novel electronic device that is highly convenient, useful, or reliable. A novel display apparatus can be provided. A novel display module can be provided. A novel electronic device can be provided.

Note that the description of these effects does not preclude the existence of other effects. One embodiment of the present invention does not necessarily have all these effects. Other effects will be apparent from and can be derived from the description of the specification, the drawings, the claims, and the like.

DETAILED DESCRIPTION OF THE INVENTION

Figure 1A:
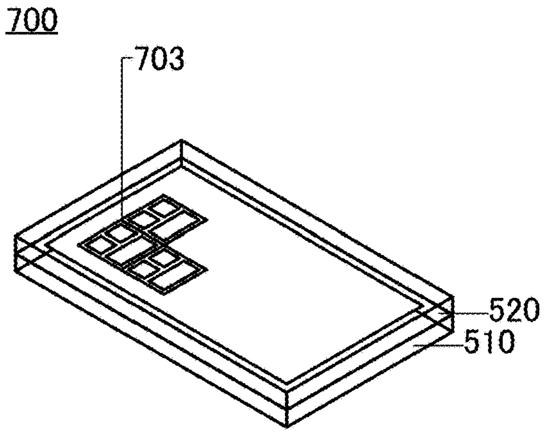
FIGS. 1A to 1D illustrate structures of a display apparatus of an embodiment.

A display apparatus of one embodiment of the present invention includes a first light-emitting device and a second light-emitting device. The first light-emitting device includes a first electrode, a first layer, a first unit, and a second electrode. The first unit is between the first electrode and the second electrode. The first unit includes a first light-emitting material. The first layer is between the first unit and the first electrode. The first layer is in contact with the first electrode. The first layer uses a material having a first spin density observed with an electron spin resonance (ESR) spectrometer when the material is in a film state. The second light-emitting device includes a third electrode, a second layer, a second unit, and a fourth electrode. The third electrode is adjacent to the first electrode. A first gap is between the third electrode and the first electrode. The second unit is between the third electrode and the fourth electrode. The second unit includes a second light-emitting material. The second layer is between the second unit and the third electrode. The second layer is in contact with the third electrode. The second layer uses a material having a second spin density observed with an electron spin resonance (ESR) spectrometer when the material is in a film state. The second spin density is higher than the first spin density.

Accordingly, a phenomenon in which one of the first light-emitting device and the second light-emitting device emits light with unintended luminance in accordance with light emission of the other of the first light-emitting device and the second light-emitting device can be suppressed. In addition, the first light-emitting device and the second light-emitting device can be individually driven. Occurrence of a cross talk phenomenon between adjacent light-emitting devices can be suppressed. An increase in the driving voltage of the second light-emitting device can be suppressed. The resolution of the display apparatus can be increased. The aperture ratio of a pixel of the display apparatus can be increased. As a result, a novel display apparatus that is highly convenient, useful, or reliable can be provided.

Embodiments will be described in detail with reference to the drawings. Note that the embodiments of the present invention are not limited to the following description, and it will be readily appreciated by those skilled in the art that modes and details of the present invention can be modified in various ways without departing from the spirit and scope of the present invention. Therefore, the present invention should not be construed as being limited to the description in the following embodiments. Note that in structures of the invention described below, the same portions or portions having similar functions are denoted by the same reference numerals in different drawings, and the description thereof is not repeated.

Embodiment 1

In this embodiment, a structure of a display apparatus of one embodiment of the present invention is described with reference to FIGS. 1A to 1D and FIG. 2.

Figure 1B:
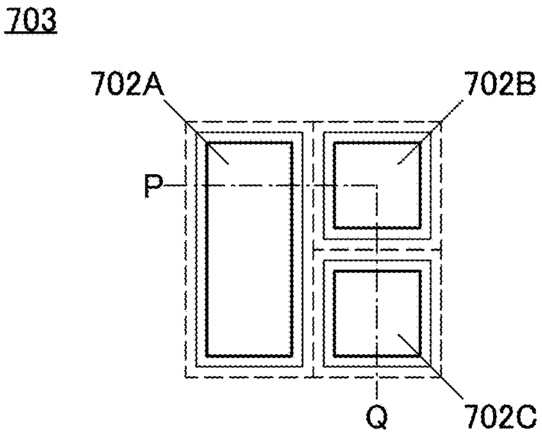
Figure 1C:
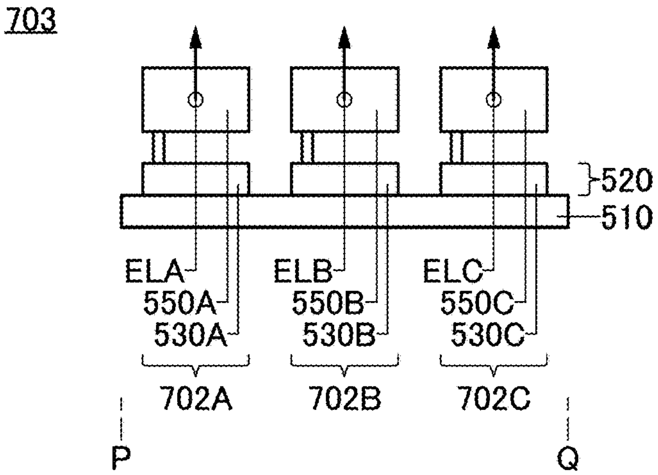
Figure 1D:
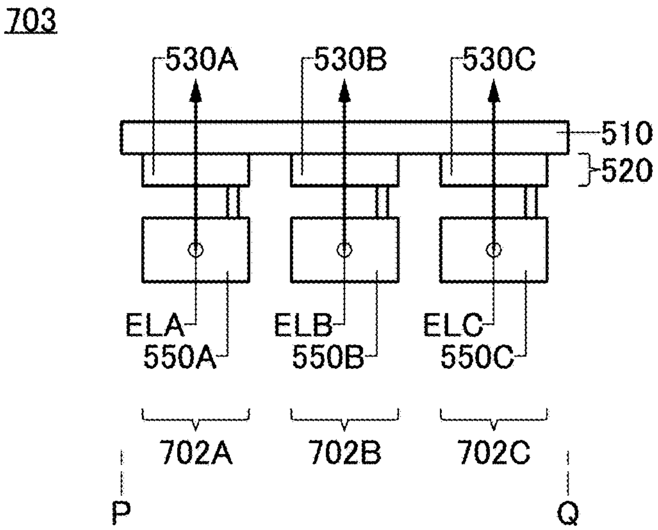

FIG. 1A is a cross-sectional view illustrating a structure of the display apparatus of one embodiment of the present invention, and FIG. 1B is a top view illustrating part of FIG. 1A. FIG. 1C is a cross-sectional view taken along a cutting line P-Q in FIG. 1, and FIG. 1D is a cross-sectional view illustrating a structure different from that in FIG. 1C.

Figure 2:
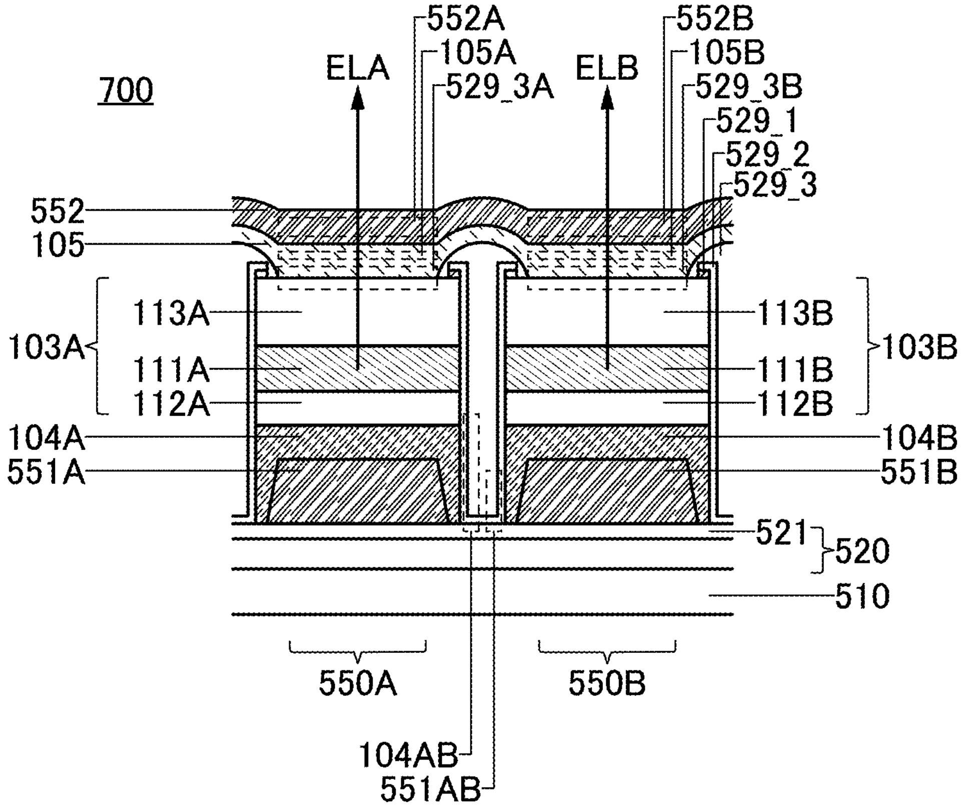
FIG. 2 illustrates a structure of a display apparatus of an embodiment.

FIG. 2 is a cross-sectional view illustrating the structure of the display apparatus of one embodiment of the present invention.

<Structure Example 1 of Display Apparatus>

A display apparatus 700 described in this embodiment includes a pixel set 703 (see FIG. 1A). The display apparatus 700 includes a substrate 510 and a functional layer 520.

The pixel set 703 includes a pixel 702A, a pixel 702B, and a pixel 702C (see FIG. 1B).

The pixel 702A includes a light-emitting device 550A and a pixel circuit 530A. The light-emitting device 550A is electrically connected to the pixel circuit 530A (see FIGS. 1C and 1D).

The pixel 702B includes a light-emitting device 550B and a pixel circuit 530B. The light-emitting device 550B is electrically connected to the pixel circuit 530B.

The pixel 702C includes a light-emitting device 550C and a pixel circuit 530C. The light-emitting device 550C is electrically connected to the pixel circuit 530C.

Note that the functional layer 520 includes the pixel circuits 530A, 530B, and 530C. The pixel circuit 530A is positioned between the light-emitting device 550A and the substrate 510, the pixel circuit 530B is positioned between the light-emitting device 550B and the substrate 510, and the pixel circuit 530C is positioned between the light-emitting device 550C and the substrate 510.

In the display apparatus 700 of one embodiment of the present invention, for example, the light-emitting device 550A emits light ELA in a direction where the pixel circuit 530A is not provided, the light-emitting device 550B emits light ELB in a direction where the pixel circuit 530B is not provided, and the light-emitting device 550C emits light ELC in a direction where the pixel circuit 530C is not provided (see FIG. 1C). In other words, the display apparatus 700 of one embodiment of the present invention is a top-emission display apparatus.

In the display apparatus 700 of one embodiment of the present invention, for example, the light-emitting device 550A emits light ELA in a direction where the pixel circuit 530A is provided, the light-emitting device 550B emits light ELB in a direction where the pixel circuit 530B is provided, and the light-emitting device 550C emits light ELC in a direction where the pixel circuit 530C is provided (see FIG. 1D). In other words, the display apparatus 700 of one embodiment of the present invention is a bottom-emission display apparatus.

«Structure Example of Light-Emitting Device 550A»

The light-emitting device 550A includes an electrode 551A, a layer 104A, a unit 103A, and an electrode 552A (see FIG. 2).

The unit 103A is positioned between the electrode 551A and the electrode 552A and contains a light-emitting material EMA. The unit 103A includes a layer 111A, a layer 112A, and a layer 113A.

Note that the details of a structure applicable to the light-emitting device 550A are described in Embodiments 2 to 6.

«Structure Example of Layer 104A»

The layer 104A is positioned between the unit 103A and the electrode 551A and is in contact with the electrode 551A. For example, an electron-accepting material AM can be used for the layer 104A. Specifically, a composite material containing the electron-accepting material AM and a hole-transport material can be used for the layer 104A. The electron-accepting material AM and an unshared electron pair of the hole-transport material interact with each other, whereby spin density D1 can be observed in a film of the material used for the layer 104A. Specifically, the spin density D1 that is greater than or equal to $1\times10^{16}$ spins/$cm^3$ and less than or equal to $1\times10^{21}$ spins/$cm^3$ can be observed. For example, a film of the material used for the layer 104A is formed over a quartz substrate and the spin density of the film can be observed by electron spin resonance (ESR).

The layer 104A contains the electron-accepting material AM at a weight percentage WA, for example. Note that an electron-accepting substance to be described in detail in Embodiment 3 can be used as the electron-accepting material AM.

«Structure Example of Light-Emitting Device 550B»

The light-emitting device 550B includes an electrode 551B, a layer 104B, a unit 103B, and an electrode 552B (see FIG. 2). The electrode 551B is adjacent to the electrode 551A and a gap 551AB is positioned between the electrode 551B and the electrode 551A. In other words, the electrode 551B is adjacent to the electrode 551A with the gap 551AB therebetween.

The unit 103B is positioned between the electrode 551B and the electrode 552B and contains a light-emitting material EMB. The unit 103B includes a layer 111B, a layer 112B, and a layer 113B.

Note that the details of a structure applicable to the light-emitting device 550B are described in Embodiments 2 to 6.

«Structure Example 1 of Layer 104B»

The layer 104B is positioned between the unit 103B and the electrode 551B and is in contact with the electrode 551B. For example, the electron-accepting material AM can be used for the layer 104B. In addition, spin density D2, which is higher than the spin density D1, can be observed in a film of a material used for the layer 104B.

The layer 104B contains the electron-accepting material AM at a weight percentage WB, for example. The weight percentage WB is higher than the weight percentage WA. Specifically, the layer 104B contains the electron-accepting material AM at a percentage higher than the weight percentage WA and lower than or equal to 50 weight percent; a weight percentage that is three times, preferably ten times the weight percentage WA can be used as the weight percentage WB.

«Structure example 2 of layer 104B»A gap 104AB is positioned between the layer 104B and the layer 104A. The gap 104AB overlaps with the gap 551AB. In other words, the layer 104B is adjacent to the layer 104A with the gap 104AB therebetween.

Accordingly, a phenomenon in which one of the light-emitting device 550A and the light-emitting device 550B emits light with unintended luminance in accordance with light emission of the other of the light-emitting device 550A and the light-emitting device 550B can be suppressed. In addition, the light-emitting device 550A and the light-emitting device 550B can be individually driven. Occurrence of a cross talk phenomenon between adjacent light-emitting devices can be suppressed. An increase in the driving voltage of the light-emitting device 550B can be suppressed. The resolution of the display apparatus can be increased. The aperture ratio of a pixel of the display apparatus can be increased. As a result, a novel display apparatus that is highly convenient, useful, or reliable can be provided.

<Structure Example 2 of Display Apparatus>

The display apparatus 700 described in this embodiment includes an insulating film 521, a conductive film 552, and an insulating film 529_3 (see FIG. 2). The display apparatus 700 further includes a layer 105, a film 5291, and a film 529_2.

«Structure Example of Insulating Film 521»

The insulating film 521 overlaps with the conductive film 552 with the electrodes 551A and 551B therebetween.

«Structure Example of Conductive Film 552»

The conductive film 552 includes the electrodes 552A and 552B.

For example, a conductive material can be used for the conductive film 552. Specifically, a single layer or a stack using a metal, an alloy, or a material containing a conductive compound can be used for the conductive film 552. Note that a structure example that can be employed for the conductive film 552 is described in detail in Embodiment 4.

«Structure Example of Layer 105»

The layer 105 includes a layer 105A and a layer 105B. For the layer 105, a material that facilitates carrier injection from the electrodes 552A and 552B can be used. An electron-injection material can be used for the layer 105, for example. Note that a structure example that can be employed for the layer 105 is described in detail in Embodiment 4.

In this specification and the like, a device formed using a metal mask or a fine metal mask (FMM) may be referred to as a device having a metal mask (MM) structure. In this specification and the like, a device formed without using a metal mask or an FMM is sometimes referred to as a device having a metal maskless (MML) structure.

«Structure Example of Film 529_1»

The film 529_1 has a plurality of openings; one opening overlaps with the electrode 551A, another opening overlaps with the electrode 551B, and another opening overlaps with the gap 551AB. For example, a film containing a metal, a metal oxide, an organic material, or an inorganic insulating material can be used as the film 529_1. Specifically, a light-blocking metal film can be used. This can block light emitted in the processing process to inhibit the characteristics of the light-emitting device from being degraded by the light.

«Structure Example of Film 529_2»

The film 529_2 has openings; one opening overlaps with the electrode 551A and the other opening overlaps with the electrode 551B. The film 5292 overlaps with the gap 551AB.

The film 529_2 includes a region in contact with the layer 104A and the layer 104B.

The film 529_2 includes a region in contact with the layer 112A and the layer 112B.

The film 529_2 includes a region in contact with the layer 111A and the layer 111B.

The film 529_2 includes a region in contact with the layer 113A and the layer 113B.

The film 529_2 includes a region in contact with the insulating film 521. The film 529_2 can be formed by an atomic layer deposition (ALD) method, for example. Thus, a film with favorable coverage can be formed. Specifically, a metal oxide film or the like can be used as the film 529_2. Aluminum oxide can be used, for example.

«Structure Example of Insulating Film 529_3»

The insulating film 529_3 is positioned between the conductive film 552 and the insulating film 521, overlaps with the gap 551AB, and fills the gap 104AB.

The insulating film 529_3 includes an opening 529_3A and an opening 529_3B, which overlap with the electrode 551A and the electrode 551B, respectively.

The insulating film 529_3 can be formed using a photosensitive resin, for example. Specifically, an acrylic resin or the like can be used.

Thus, the gap 104AB can be filled with the insulating film 529_3. Moreover, a step due to the gaps 551AB and 104AB can be reduced so as to be close to a flat plane. A phenomenon in which a cut or a split is generated due to the step in the conductive film 552 can be suppressed. As a result, a novel display apparatus that is highly convenient, useful, or reliable can be provided.

<Method for Manufacturing Display Apparatus>

Note that the display apparatus of one embodiment of the present invention can be manufactured by using a photolithography technique, for example.

[Step 1]

Specifically, in Step 1, the electrode 551A, the electrode 551B, and the gap 551AB are formed over the insulating film 521.

Note that 1,1,1,3,3,3-hexamethyldisilazane (abbreviation: HMIDS) is vaporized and a spray thereof is given to a heated workpiece, for example. Consequently, a stacked-layer film formed in Step 2 is hardly separated from the electrode 551A in the manufacturing process, for example.

[Step 2]

In Step 2, a first stacked-layer film to be the layers 104A, 112A, 111A, and 113A later is formed over the electrode 551A, the electrode 551B, and the gap 551AB.

[Step 3]

In Step 3, a first film to be the film 529_1 later is formed over the first stacked-layer film.

[Step 4]

In Step 4, an opening overlapping with the electrode 551B and the gap 551AB is formed in the first film by a photolithography method.

[Step 5]

In Step 5, part of the first stacked-layer film is removed using the first film as a resist. For example, the first stacked-layer film is removed from a region overlapping with the electrode 551B and a region overlapping with the gap 551AB by a dry etching method. Specifically, the first stacked-layer film can be removed from the region overlapping with the electrode 551B and the region overlapping with the gap 551AB using an oxygen-containing gas. Accordingly, a groove-like structure can be formed in the first stacked-layer film. In addition, the layers 104A, 112A, 111A, and 113A are formed.

Note that in Step 5, the electrode 551B is exposed to an etching gas used in the dry etching method. The conductivity of a conductive oxide such as indium oxide-tin oxide (abbreviation: ITO) or indium oxide-tin oxide containing silicon or silicon oxide (abbreviation: ITSO) is derived from levels formed by a tin atom or levels formed by an oxygen vacancy, for example. When the electrode 551B including such a conductive oxide is exposed to an etching gas containing oxygen, oxygen is added to the electrode 551B. In some case, the conductivity decreases and the resistance increases. Compared to the electrode 551A that supplies holes to the layer 104A, the electrode 551B is less likely to supply holes to the layer 104B.

When the electrode 551B, which has been exposed to an etching gas containing oxygen, is subjected to plasma treatment with use of a gas containing carbon tetrafluoride (abbreviation: $CF_4$), the conductivity can be improved.

[Step 6]

In Step 6, a second stacked-layer film to be the layers 104B, 112B, 111B, and 113B later is formed over the electrode 551B and the gap 551AB.

The layer 104B having a higher spin density than the layer 104A facilitates hole transfer from the electrode 551B to the layer 104B. In the case where the layers 104A and 104B contain the same combination of the electron-accepting material AM and a hole-transport material as a composite material, for example, the weight percentage of the electron-accepting material in the layer 104B is made higher than in the layer 104A. This can increase the spin density of the layer 104B. Hole transfer from the electrode 551B to the layer 104B is facilitated. Accordingly, an increase in driving voltage can be suppressed.

Note that the second stacked-layer film includes a region overlapping with the electrode 551A.

[Step 7]

In Step 7, a second film to be the film 529_1 later is formed over the second stacked-layer film.

[Step 8]

In Step 8, an opening overlapping with the electrode 551A and the gap 551AB is formed in the second film by a photolithography method.

[Step 9]

In Step 9, part of the second stacked-layer film is removed using the second film as a resist. For example, the second stacked-layer film is removed from a region overlapping with the electrode 551A and a region overlapping with the gap 551AB by a dry etching method. Specifically, the second stacked-layer film can be removed from the region overlapping with the electrode 551A and the region overlapping with the gap 551AB using an oxygen-containing gas. Accordingly, a groove-like structure can be formed in the second stacked-layer film. In addition, the layers 104B, 112B, 111B, and 113B are formed.

Note that in Step 9, the gap 104AB is formed in a region overlapping with the gap 551AB.

[Step 10]

In Step 10, a third film to be the film 529_2 later is formed over the first film and the second film by an ALD method, for example.

[Step 11]

In Step 11, the insulating film 529_3 is formed. For example, a photosensitive polymer can be used. Accordingly, the openings 529_3A and 529_3B are formed and the gap 551AB can be filled with the insulating film 529_3.

[Step 12]

In Step 12, part of the third film and part of the second film are removed using the insulating film 529_3 as a resist. For example, an opening overlapping with the electrode 551A and an opening overlapping with the electrode 551B are formed in the second film and the third film by an etching method, whereby the film 529_2 and the film 529_1 are processed into predetermined shapes.

Note that heating the workpiece can make the insulating film 529_3 have the fluidity. Thus, an end portion of the insulating film 529_3 can be gently curved.

[Step 13]

In Step 13, the layer 105 is formed over the layer 113A and the layer 113B. Next, the conductive film 552 is formed over the layer 105.

<Structure Example 3 of Display Apparatus>

In the display apparatus 700 described in this embodiment, an emission spectrum of the light-emitting material EMA has a maximum peak in the range greater than or equal to 380 nm and less than or equal to 480 nm and an emission spectrum of the light-emitting material EMB has a maximum peak in the range greater than or equal to 500 nm and less than or equal to 550 nm.

Alternatively, in the display apparatus 700 described in this embodiment, an emission spectrum of the light-emitting material EMA has a maximum peak in the range greater than or equal to 380 nm and less than or equal to 480 nm and an emission spectrum of the light-emitting material EMB has a maximum peak in the range greater than or equal to 600 nm and less than or equal to 780 nm.

Accordingly, the color gamut displayable on the display apparatus 700 can be widened. By using the light-emitting material EMB having lower excitation energy than the light-emitting material EMA, the driving voltage of the light-emitting device 550B can be reduced. In addition, the power consumption of the display apparatus 700 can be reduced. Even in the case where, at a wavelength where an emission spectrum of the light-emitting material EMA has a maximum peak, the absorption intensity of the electron-accepting material AM is higher than that at a wavelength where an emission spectrum of the light-emitting material EMB has a maximum peak, a phenomenon in which the layer 104A absorbs light emitted from the light-emitting material EMA can be suppressed by making the weight percentage WA lower than the weight percentage WB. As a result, a novel display apparatus that is highly convenient, useful, or reliable can be provided.

<Structure Example 4 of Display Apparatus>

In the display apparatus 700 described in this embodiment, the light-emitting material EMA is a fluorescent material and the light-emitting material EMB is a phosphorescent material.

This can reduce the power consumption of the display apparatus. As a result, a novel display apparatus that is highly convenient, useful, or reliable can be provided.

This embodiment can be combined with any of the other embodiments in this specification as appropriate.

Embodiment 2

In this embodiment, a structure of a light-emitting device 550X is described with reference to FIGS. 3A and 3B.

Figure 3A:
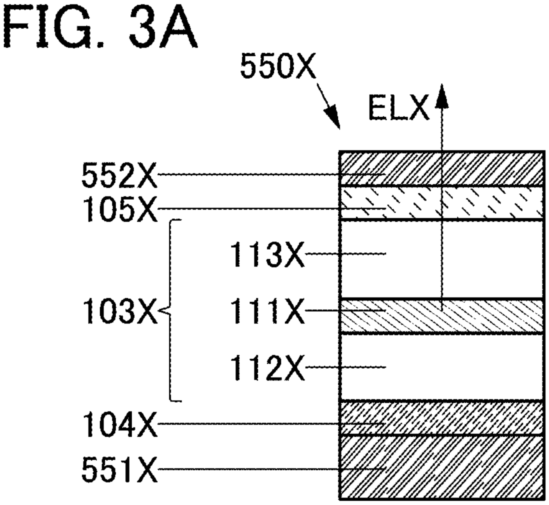
FIGS. 3A and 3B illustrate a structure of a light-emitting device of an embodiment.
Figure 3B:
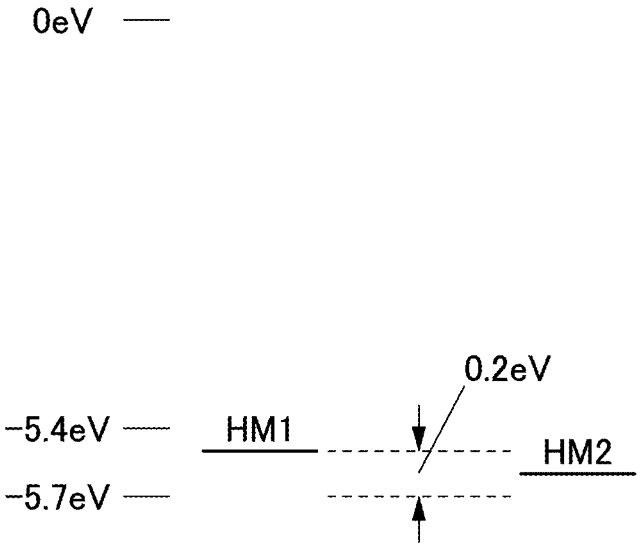

FIG. 3A is a cross-sectional view illustrating a structure of a light-emitting device of one embodiment of the present invention, and FIG. 3B is a diagram illustrating energy levels of materials used for the light-emitting device of one embodiment of the present invention.

The structure of the light-emitting device 550X described in this embodiment can be employed for a display apparatus of one embodiment of the present invention. Note that the description of the structure of the light-emitting device 550X can be referred to for the light-emitting device 550A. Specifically, the description of the light-emitting device 550X can be used for the description of the light-emitting device 550A by replacing “X” in the reference numerals of the components of the light-emitting device 550X with “A”. Similarly, the structure of the light-emitting device 550X can be employed for the light-emitting device 550B or the light-emitting device 550C by replacing “X” with “B” or “C”.

<Structure Example of Light-Emitting Device 550X>

The light-emitting device 550X described in this embodiment includes an electrode 551X, an electrode 552X, and a unit 103X. The electrode 552X overlaps with the electrode 551X, and the unit 103X is positioned between the electrode 552X and the electrode 551X.

<Structure Example of Unit 103X>

The unit 103X has a single-layer structure or a stacked-layer structure. For example, the unit 103X includes a layer 111X, a layer 112X, and a layer 113X (see FIG. 3A). The unit 103X has a function of emitting light ELX.

The layer 111X is positioned between the layer 113X and the layer 112X, the layer 113X is positioned between the electrode 552X and the layer 111X, and the layer 112X is positioned between the layer 111X and the electrode 551X.

For example, a layer selected from functional layers such as a light-emitting layer, a hole-transport layer, an electron-transport layer, and a carrier-blocking layer can be used for the unit 103X. A layer selected from functional layers such as a hole-injection layer, an electron-injection layer, an exciton-blocking layer, and a charge-generation layer can also be used for the unit 103X.

«Structure Example of Layer 112X»

A hole-transport material can be used for the layer 112X, for example. The layer 112X can be referred to as a hole-transport layer. A material having a wider bandgap than the light-emitting material contained in the layer 111X is preferably used for the layer 112X. In that case, transfer of energy from excitons generated in the layer 111X to the layer 112X can be inhibited.

[Hole-Transport Material]

A material having a hole mobility of $1\times10^{-6}$ $cm^2/Vs$ or higher can be suitably used as the hole-transport material.

As the hole-transport material, an amine compound or an organic compound having a π-electron rich heteroaromatic ring skeleton can be used, for example. Specifically, a compound having an aromatic amine skeleton, a compound having a carbazole skeleton, a compound having a thiophene skeleton, a compound having a furan skeleton, or the like can be used. The compound having an aromatic amine skeleton and the compound having a carbazole skeleton are particularly preferable because these compounds are highly reliable and have high hole-transport properties to contribute to a reduction in driving voltage.

The following are examples that can be used as a compound having an aromatic amine skeleton: 4,4'-bis[N-(1-naphthyl)-N-phenylamino]biphenyl (abbreviation: NPB), N,N-diphenyl-N,N-bis(3-methylphenyl)-4,4'-diaminobiphenyl (abbreviation: TPD), N,N-bis(9,9'-spirobi[9H-fluoren]-2-yl)-N,N-diphenyl-4,4'-diaminobiphenyl (abbreviation: BSPB), 4-phenyl-4'-(9-phenylfluoren-9-yl)triphenylamine (abbreviation: BPAFLP), 4-phenyl-3'-(9-phenylfluoren-9-yl)triphenylamine (abbreviation: mBPAFLP), 4-phenyl-4'-(9-phenyl-9H-carbazol-3-yl)triphenylamine (abbreviation: PCBA1BP), 4,4'-diphenyl-4"-(9-phenyl-9H-carbazol-3-yl) triphenylamine (abbreviation: PCBBi1BP), 4-(1-naphthyl)-4'-(9-phenyl-9H-carbazol-3-yl)triphenylamine (abbreviation: PCBANB), 4,4'-di(1-naphthyl)-4"-(9-phenyl-9H-carbazol-3-yl)triphenylamine (abbreviation: PCBNBB), 9,9-dimethyl-N-phenyl-N-[4-(9-phenyl-9H-carbazol-3-yl) phenyl]fluoren-2-amine (abbreviation: PCBAF), and N-phenyl-N-[4-(9-phenyl-9H-carbazol-3-yl)phenyl]-9,9'-spirobi [9H-fluoren]-2-amine (abbreviation: PCBASF).

As a compound having a carbazole skeleton, for example, 1,3-bis(N-carbazolyl)benzene (abbreviation: mCP), 4,4'-di (N-carbazolyl)biphenyl (abbreviation: CBP), 3,6-bis(3,5-diphenylphenyl)-9-phenylcarbazole (abbreviation: CzTP), or 3,3'-bis(9-phenyl-9H-carbazole) (abbreviation: PCCP) can be used.

As a compound having a thiophene skeleton, for example, 4,4',4"-(benzene-1,3,5-triyl)tri(dibenzothiophene) (abbreviation: DBT3P-II), 2,8-diphenyl-4-[4-(9-phenyl-9H-fluoren-9-yl)phenyl]dibenzothiophene (abbreviation: DBTFLP- III), or 4-[4-(9-phenyl-9H-fluoren-9-yl)phenyl]-6-phenyldibenzothiophene (abbreviation: DBTFLP-IV) can be used.

As a compound having a furan skeleton, for example, 4,4',4"-(benzene-1,3,5-triyl)tri(dibenzofuran) (abbreviation: DBF3P-II) or 4-{3-[3-(9-phenyl-9H-fluoren-9-yl)phenyl]phenyl}dibenzofuran (abbreviation: mmDBFFLBi-II) can be used.

«Structure Example of Layer 113X»

An electron-transport material, a material having an anthracene skeleton, and a mixed material can be used for the layer 113X, for example. The layer 113X can be referred to as an electron-transport layer. A material having a wider bandgap than the light-emitting material contained in the layer 111X is preferably used for the layer 113X. In that case, transfer of energy from excitons generated in the layer 111X to the layer 113X can be inhibited.

[Electron-Transport Material]

For example, a material having an electron mobility higher than or equal to $1\times10^{-7}$ $cm^2/Vs$ and lower than or equal to $5\times10^{-5}$ $cm^2/Vs$ when the square root of the electric field strength [V/cm] is 600 can be suitably used as the electron-transport material. In this case, the electron-transport property in the electron-transport layer can be suppressed. The amount of electrons injected into the light-emitting layer can be controlled. The light-emitting layer can be prevented from having excess electrons.

For example, a metal complex or an organic compound having a π-electron deficient heteroaromatic ring skeleton can be used as the electron-transport material.

As a metal complex, bis(10-hydroxybenzo[h]quinolinato)beryllium(II) (abbreviation: $BeBq_2$), bis(2-methyl-8-quinolinolato) (4-phenylphenolato)aluminum(III) (abbreviation: BAlq), bis(8-quinolinolato)zinc(II) (abbreviation: Znq), bis[2-(2-benzoxazolyl)phenolato]zinc(II) (abbreviation: ZnPBO), or bis[2-(2-benzothiazolyl)phenolato]zinc(II) (abbreviation: ZnBTZ) can be used, for example.

As an organic compound having a π-electron deficient heteroaromatic ring skeleton, a heterocyclic compound having a polyazole skeleton, a heterocyclic compound having a diazine skeleton, a heterocyclic compound having a pyridine skeleton, a heterocyclic compound having a triazine skeleton, or the like can be used, for example. In particular, the heterocyclic compound having a diazine skeleton or the heterocyclic compound having a pyridine skeleton has favorable reliability and thus is preferable. In addition, the heterocyclic compound having a diazine (pyrimidine or pyrazine) skeleton has a high electron-transport property to contribute to a reduction in driving voltage.

As a heterocyclic compound having a polyazole skeleton, 2-(4-biphenylyl)-5-(4-tert-butylphenyl)-1,3,4-oxadiazole (abbreviation: PBD), 3-(4-biphenylyl)-4-phenyl-5-(4-tert-butylphenyl)-1,2,4-triazole (abbreviation: TAZ), 1,3-bis[5-(p-tert-butylphenyl)-1,3,4-oxadiazol-2-yl]benzene (abbreviation: OXD-7), 9-[4-(5-phenyl-1,3,4-oxadiazol-2-yl)phenyl]-9H-carbazole (abbreviation: CO11), 2,2',2"-(1,3,5-benzenetriyl)tris(1-phenyl-1H-benzimidazole) (abbreviation: TPBI), or 2-[3-(dibenzothiophen-4-yl)phenyl]-1-phenyl-1H-benzimidazole (abbreviation: mDBTBIm-II) can be used, for example.

As a heterocyclic compound having a diazine skeleton, 2-[3-(dibenzothiophen-4-yl)phenyl]dibenzo[f,h]quinoxaline (abbreviation: 2mDBTPDBq-II), 2-[3'-(dibenzothiophen-4-yl)biphenyl-3-yl]dibenzo[f,h]quinoxaline (abbreviation: 2mDBTBPDBq-II), 2-[3'-(9H-carbazol-9-yl)biphenyl-3-yl]dibenzo[f,h]quinoxaline (abbreviation: 2mCzBPDBq), 4,6-bis[3-(phenanthren-9-yl)phenyl]pyrimidine (abbreviation: 4,6mPnP2Pm), 4,6-bis[3-(4-dibenzothienyl)phenyl]pyrimidine (abbreviation: 4,6mDBTP2Pm-II), or 4,8-bis[3-(dibenzothiophen-4-yl)phenyl]benzo[h]quinazoline (abbreviation: 4,8mDBtP2Bqn) can be used, for example.

As a heterocyclic compound having a pyridine skeleton, 3,5-bis[3-(9H-carbazol-9-yl)phenyl]pyridine (abbreviation: 35DCzPPy) or 1,3,5-tri[3-(3-pyridyl)phenyl]benzene (abbreviation: TmPyPB) can be used, for example.

As a heterocyclic compound having a triazine skeleton, 2-[3'-(9,9-dimethyl-9H-fluoren-2-yl)biphenyl-3-yl]-4,6-diphenyl-1,3,5-triazine (abbreviation: mFBPTzn), 2-(biphenyl-4-yl)-4-phenyl-6-(9,9'-spirobi[9H-fluoren]-2-yl)-1,3,5-triazine (abbreviation: BP-SFTzn), 2-{3-[3-(benzo[b]naphtho[1,2-d]furan-8-yl)phenyl]phenyl}-4,6-diphenyl-1,3,5-triazine (abbreviation: mBnfBPTzn), or 2-{3-[3-(benzo[b]naphtho[1,2-d]furan-6-yl)phenyl]phenyl}-4,6-diphenyl-1,3,5-triazine (abbreviation: mBnfBPTzn-02) can be used, for example.

[Material Having Anthracene Skeleton]

An organic compound having an anthracene skeleton can be used for the layer 113X. In particular, an organic compound having both an anthracene skeleton and a heterocyclic skeleton can be suitably used.

For example, an organic compound having both an anthracene skeleton and a nitrogen-containing five-membered ring skeleton can be used for the layer 113X. Alternatively, an organic compound having both an anthracene skeleton and a nitrogen-containing five-membered ring skeleton where two heteroatoms are included in a ring can be used for the layer 113X. Specifically, it is preferable to use, as the heterocyclic skeleton, a pyrazole ring, an imidazole ring, an oxazole ring, a thiazole ring, or the like.

For example, an organic compound having both an anthracene skeleton and a nitrogen-containing six-membered ring skeleton can be used for the layer 113X. Alternatively, an organic compound having both an anthracene skeleton and a nitrogen-containing six-membered ring skeleton where two heteroatoms are included in a ring can be used for the layer 113X. Specifically, it is preferable to use, as the heterocyclic skeleton, a pyrazine ring, a pyrimidine ring, a pyridazine ring, or the like.

[Structure Example of Mixed Material]

A material in which a plurality of kinds of substances are mixed can be used for the layer 113X. Specifically, a mixed material which contains an alkali metal, an alkali metal compound, or an alkali metal complex and an electron-transport substance can be used for the layer 113X. Note that the electron-transport material preferably has a highest occupied molecular orbital (HOMO) level of −6.0 eV or higher.

The mixed material can be suitably used for the layer 113X in combination with a structure using a composite material, which is separately described, for a layer 104X. For example, a composite material of an electron-accepting substance and a hole-transport material can be used for the layer 104X. Specifically, a composite material of an electron-accepting substance and a substance having a relatively deep HOMO level HM1, which is higher than or equal to −5.7 eV and lower than or equal to −5.4 eV, can be used for the layer 104X (see FIG. 3B). Using the mixed material for the layer 113X in combination with the structure using such a composite material for the layer 104X leads to an increase in the reliability of the light-emitting device.

Furthermore, a structure using a hole-transport material for the layer 112X is preferably combined with the structure using the mixed material for the layer 113X and the composite material for the layer 104X. For example, a substance having a HOMO level HM2, which differs by −0.2 eV to 0 eV from the relatively deep HOMO level HM1, can be used for the layer 112X (see FIG. 3B). This leads to an increase in the reliability of the light-emitting device. Note that in this specification and the like, the structure of the above-described light-emitting device may be referred to as a Recombination-Site Tailoring Injection structure (ReSTI structure).

The concentration of the alkali metal, the alkali metal compound, or the alkali metal complex preferably changes in the thickness direction of the layer 113X (including the case where the concentration is 0).

For example, a metal complex having an 8-hydroxyquinolinato structure can be used. A methyl-substituted product of the metal complex having an 8-hydroxyquinolinato structure (e.g., a 2-methyl-substituted product or a 5-methyl-substituted product) or the like can also be used.

As the metal complex having an 8-hydroxyquinolinato structure, 8-hydroxyquinolinato-lithium (abbreviation: Liq), 8-hydroxyquinolinato-sodium (abbreviation: Naq), or the like can be used. In particular, a complex of a monovalent metal ion, especially a complex of lithium is preferable, and Liq is further preferable.

«Structure Example 1 of Layer 111X»

Either a structure containing a light-emitting material or a structure containing a light-emitting material and a host material can be employed for the layer 111X, for example. The layer 111X can be referred to as a light-emitting layer. The layer 111X is preferably provided in a region where holes and electrons are recombined. This allows efficient conversion of energy generated by recombination of carriers into light and emission of the light.

Furthermore, the layer 111X is preferably provided apart from a metal used for the electrode or the like. In that case, a quenching phenomenon caused by the metal used for the electrode or the like can be inhibited.

It is preferable that a distance from an electrode or the like having reflectivity to the layer 111X be adjusted and the layer 111X be placed in an appropriate position in accordance with an emission wavelength. With this structure, the amplitude can be increased by utilizing an interference phenomenon between light reflected by the electrode or the like and light emitted from the layer 111X. Light with a predetermined wavelength can be intensified and the spectrum of the light can be narrowed. In addition, bright light emission colors with high intensity can be obtained. In other words, the layer 111X is placed in an appropriate position between electrodes and the like, and thus a microcavity structure can be formed.

For example, a fluorescent substance, a phosphorescent substance, or a substance exhibiting thermally activated delayed fluorescence (TADF) (also referred to as a TADF material) can be used for the light-emitting material. Thus, energy generated by recombination of carriers can be released as the light ELX from the light-emitting material (see FIG. 3A).

[Fluorescent Substance]

A fluorescent substance can be used for the layer 111X. For example, fluorescent substances exemplified below can be used for the layer 111X. Note that fluorescent substances that can be used for the layer 111X are not limited to the following, and a variety of known fluorescent substances can be used for the layer 111X.

Specifically, any of the following fluorescent substances can be used: 5,6-bis[4-(10-phenyl-9-anthryl)phenyl]-2,2'-bipyridine (abbreviation: PAP2BPy), 5,6-bis[4'-(10-phenyl-9-anthryl)biphenyl-4-yl]-2,2'-bipyridine (abbreviation: PAPP2BPy), N,N-diphenyl-N,N-bis[4-(9-phenyl-9H-fluoren-9-yl)phenyl]pyrene-1,6-diamine (abbreviation: 1,6FL- PAPrn), N,N-bis(3-methylphenyl)-N,N-bis[3-(9-phenyl-9H-fluoren-9-yl)phenyl]pyrene-1,6-diamine (abbreviation: 1,6mMemFLPAPrn), N,N-bis[4-(9H-carbazol-9-yl)phenyl]-N,N-diphenylstilbene-4,4'-diamine (abbreviation: YGA2S), 4-(9H-carbazol-9-yl)-4'-(10-phenyl-9-anthryl)triphenylamine (abbreviation: YGAPA), 4-(9H-carbazol-9-yl)-4'-(9,10-diphenyl-2-anthryl)triphenylamine (abbreviation: 2YGAPPA), N,9-diphenyl-N-[4-(10-phenyl-9-anthryl)phenyl]-9H-carbazol-3-amine (abbreviation: PCAPA), perylene, 2,5,8,11-tetra(tert-butyl)perylene (abbreviation: TBP), 4-(10-phenyl-9-anthryl)-4'-(9-phenyl-9H-carbazol-3-yl)triphenylamine (abbreviation: PCBAPA), N,N'-(2-tert-butylanthracene-9,10-diyldi-4,1-phenylene)bis(N,N,N-triphenyl-1,4-phenylenediamine) (abbreviation: DPABPA), N,9-diphenyl-N-[4-(9,10-diphenyl-2-anthryl)phenyl]-9H-carbazol-3-amine (abbreviation: 2PCAPPA), N,N-(pyrene-1,6-diyl)bis[(6,N-diphenylbenzo[b]naphtho[1,2-d]furan)-8-amine](abbreviation: 1,6BnfAPrn-03), N,N-diphenyl-N,N-bis(9-phenyl-9H-carbazol-2-yl)naphtho[2,3-b;6,7-b'] bisbenzofuran-3,10-diamine (abbreviation: 3,10PCA2Nbf (IV)-02), 3,10-bis[N-(dibenzofuran-3-yl)-N-phenylamino] naphtho[2,3-b;6,7-b']bisbenzofuran (abbreviation: 3,10FrA2Nbf(IV)-02), and the like.

Condensed aromatic diamine compounds typified by pyrenediamine compounds such as 1,6FLPAPrn, 1,6mMemFLPAPrn, and 1,6BnfAPrn-03 are particularly preferable because they have high hole-trapping properties and have high emission efficiency or high reliability.

Other examples of fluorescent substances include N-[4-(9,10-diphenyl-2-anthryl)phenyl]-N,N',N'-triphenyl-1,4-phenylenediamine (abbreviation: 2DPAPPA), N,N,N',N',N'',N'',N''',N'''-octaphenyldibenzo[g,p]chrysene-2,7,10,15-tetraamine (abbreviation: DBC1), coumarin 30, 9,10-diphenyl-2-[N-phenyl-N-(9-phenyl-carbazol-3-yl)-amino]-anthracene (abbreviation: 2PCAPA), N-[9,10-bis(biphenyl-2-yl)-2-anthryl]-N,9-diphenyl-9H-carbazol-3-amine (abbreviation: 2PCABPhA), N-(9,10-diphenyl-2-anthryl)-N,N',N'-triphenyl-1,4-phenylenediamine (abbreviation: 2DPAPA), N-[9,10-bis(biphenyl-2-yl)-2-anthryl]-N,N',N'-triphenyl-1,4-phenylenediamine (abbreviation: 2DPABPhA), 9,10-bis(biphenyl-2-yl)-N-[4-(9H-carbazol-9-yl)phenyl]-N-phenylanthracene-2-amine (abbreviation: 2YGABPhA), N,N,9-triphenylanthracene-9-amine (abbreviation: DPhAPhA), coumarin 545T, N,N'-diphenylquinacridone (abbreviation: DPQd), rubrene, and 5,12-bis(biphenyl-4-yl)-6,11-diphenyltetracene (abbreviation: BPT).

Other examples of fluorescent substances include 2-(2-{2-[4-(dimethylamino)phenyl]ethenyl}-6-methyl-4H-pyran-4-ylidene)propanedinitrile (abbreviation: DCM1), 2-{2-methyl-6-[2-(2,3,6,7-tetrahydro-1H,5H-benzo[ij]quinolizin-9-yl)ethenyl]-4H-pyran-4-ylidene}propanedinitrile (abbreviation: DCM2), N,N',N',N-tetrakis(4-methylphenyl) tetracene-5,11-diamine (abbreviation: p-mPhTD), 7,14-diphenyl-N,N',N',N-tetrakis(4-methylphenyl)acenaphtho[1,2-a]fluoranthene-3,10-diamine (abbreviation: p-mPhAFD), 2-{2-isopropyl-6-[2-(1,1,7,7-tetramethyl-2,3,6,7-tetra-hydro-1H,5H-benzo[ij]quinolizin-9-yl)ethenyl]-4H-pyran-4-ylidene}propanedinitrile (abbreviation: DCJTI), 2-{2-tert-butyl-6-[2-(1,1,7,7-tetramethyl-2,3,6,7-tetrahydro-1H,5H-benzo[ij]quinolizin-9-yl)ethenyl]-4H-pyran-4-ylidene}propanedinitrile (abbreviation: DCJTB), 2-(2,6-bis{2-[4-(dimethylamino)phenyl]ethenyl}-4H-pyran-4-ylidene)propanedinitrile (abbreviation: BisDCM), and 2-{2, 6-bis[2-(8-methoxy-1,1,7,7-tetramethyl-2,3,6,7-tetrahydro-1H,5H-benzo[ij]quinolizin-9-yl)ethenyl]-4H-pyran-4-ylidene}propanedinitrile (abbreviation: BisDCJTM).

[Phosphorescent Substance]

A phosphorescent substance can be used for the layer 111X. For example, phosphorescent substances exemplified below can be used for the layer 111X. Note that phosphorescent substances that can be used for the layer 111X are not limited to the following, and a variety of known phosphorescent substances can be used for the layer 111X.

For example, any of the following can be used for the layer 111X: an organometallic iridium complex having a 4H-triazole skeleton, an organometallic iridium complex having a 1H-triazole skeleton, an organometallic iridium complex having an imidazole skeleton, an organometallic iridium complex having a phenylpyridine derivative with an electron-withdrawing group as a ligand, an organometallic iridium complex having a pyrimidine skeleton, an organometallic iridium complex having a pyrazine skeleton, an organometallic iridium complex having a pyridine skeleton, a rare earth metal complex, a platinum complex, and the like.

[Phosphorescent Substance (Blue)]

As an organometallic iridium complex having a 4H-triazole skeleton or the like, tris{2-[5-(2-methylphenyl)-4-(2,6-dimethylphenyl)-4H-1,2,4-triazol-3-yl-κ$N^2$]phenyl-κC}iridium(III) (abbreviation: [Ir(mpptz-dmp)$_3$]), tris(5-methyl-3,4-diphenyl-4H-1,2,4-triazolato)iridium(III) (abbreviation: [Ir(Mptz)$_3$]), tris[4-(3-biphenyl)-5-isopropyl-3-phenyl-4H-1,2,4-triazolato]iridium(III) (abbreviation: [Ir(iPrptz-3b)$_3$]), or the like can be used.

As an organometallic iridium complex having a 1H-triazole skeleton or the like, tris[3-methyl-1-(2-methylphenyl)-5-phenyl-1H-1,2,4-triazolato]iridium(III) (abbreviation: [Ir(Mptz1-mp)$_3$]), tris(1-methyl-5-phenyl-3-propyl-1H-1,2,4-triazolato)iridium(III) (abbreviation: [Ir(Prptz1-Me)$_3$]), or the like can be used.

As an organometallic iridium complex having an imidazole skeleton or the like, fac-tris[1-(2,6-diisopropylphenyl)-2-phenyl-1H-imidazole]iridium(III) (abbreviation: [Ir(iPrpim)$_3$]), tris[3-(2,6-dimethylphenyl)-7-methylimidazo[1,2-f]phenanthridinato]iridium(III) (abbreviation: [Ir(dmpimpt-Me)$_3$]), or the like can be used.

As an organometallic iridium complex having a phenylpyridine derivative with an electron-withdrawing group as a ligand, or the like, bis[2-(4',6'-difluorophenyl)pyridinato-N,$C^2$]iridium(III) tetrakis(1-pyrazolyl)borate (abbreviation: FIr6), bis[2-(4',6'-difluorophenyl)pyridinato-N,$C^{2'}$]iridium(III) picolinate (abbreviation: FIrpic), bis{2-[3',5'-bis(trifluoromethyl)phenyl]pyridinato-N,$C^{2'}$}iridium(III) picolinate (abbreviation: Ir($CF_3$ppy)$_2$(pic)), bis[2-(4',6'-difluorophenyl)pyridinato-N,$C^{2'}$]iridium(III) acetylacetonate (abbreviation: FIracac), or the like can be used.

These substances are compounds exhibiting blue phosphorescence and having an emission wavelength peak at 440 nm to 520 nm.

[Phosphorescent Substance (Green)]

As an organometallic iridium complex having a pyrimidine skeleton or the like, tris(4-methyl-6-phenylpyrimidinato)iridium(III) (abbreviation: [Ir(mppm)$_3$]), tris(4-t-butyl-6-phenylpyrimidinato)iridium(III) (abbreviation: [Ir(tBuppm)$_3$]), (acetylacetonato)bis(6-methyl-4-phenylpyrimidinato)iridium(III) (abbreviation: [Ir(mppm)$_2$(acac)]), (acetylacetonato)bis(6-tert-butyl-4-phenylpyrimidinato)iridium(III) (abbreviation: [Ir(tBuppm)$_2$ (acac)]), (acetylacetonato)bis[6-(2-norbornyl)-4-phenylpyrimidinato]iridium(III) (abbreviation: [Ir(nbppm)$_2$(acac)]), (acetylacetonato)bis[5-methyl-6-(2-methylphenyl)-4-phenylpyrimidinato]iridium(III) (abbreviation: [Ir(mpmppm)$_2$(acac)]), (acetylacetonato)bis(4,6-diphenylpyrimidinato)iridium(III) (abbreviation: [Ir(dppm)$_2$(acac)]), or the like can be used.

As an organometallic iridium complex having a pyrazine skeleton or the like, (acetylacetonato)bis(3,5-dimethyl-2-phenylpyrazinato)iridium(III) (abbreviation: [Ir(mppr-Me)$_2$(acac)]), (acetylacetonato)bis(5-isopropyl-3-methyl-2-phenylpyrazinato)iridium(III) (abbreviation: [Ir(mppr-iPr)$_2$(acac)]), or the like can be used.

As an organometallic iridium complex having a pyridine skeleton or the like, tris(2-phenylpyridinato-N,$C^{2'}$)iridium(III) (abbreviation: [Ir(ppy)$_3$]), bis(2-phenylpyridinato-N,$C^{2'}$)iridium(III) acetylacetonate (abbreviation: [Ir(ppy)$_2$(acac)]), bis(benzo[h]quinolinato)iridium(III) acetylacetonate (abbreviation: [Ir(bzq)$_2$(acac)]), tris(benzo[h]quinolinato)iridium(III) (abbreviation: [Ir(bzq)$_3$]), tris(2-phenylquinolinato-N,$C^{2'}$)iridium(III) (abbreviation: [Ir(pq)$_3$]), bis(2-phenylquinolinato-N,$C^{2'}$)iridium(III) acetylacetonate (abbreviation: [Ir(pq)$_2$(acac)]), [2-$d_3$-methyl-8-(2-pyridinyl-κN)benzofuro[2,3-b]pyridine-κC]bis[2-(5-$d_3$-methyl-2-pyridinyl-κ$N^2$)phenyl-κC]iridium(III) (abbreviation: [Ir(5mppy-$d_3$)$_2$(mbfpypy-$d_3$)]), [2-$d_3$-methyl-(2-pyridinyl-κN)benzofuro[2,3-b]pyridine-κC]bis[2-(2-pyridinyl-κN)phenyl-κC]iridium(III) (abbreviation: [Ir(ppy)$_2$(mbfpypy-$d_3$)]), or the like can be used.

Examples of a rare earth metal complex are tris(acetylacetonato) (monophenanthroline)terbium(III) (abbreviation: [Tb(acac)$_3$(Phen)]), and the like.

These are compounds that mainly exhibit green phosphorescence and have an emission wavelength peak at 500 nm to 600 nm. Note that an organometallic iridium complex having a pyrimidine skeleton has distinctively high reliability or emission efficiency.

[Phosphorescent Substance (Red)]

As an organometallic iridium complex having a pyrimidine skeleton or the like, (diisobutyrylmethanato)bis[4,6-bis(3-methylphenyl)pyrimidinato]iridium(III) (abbreviation: [Ir(5mdppm)$_2$(dibm)]), bis[4,6-bis(3-methylphenyl)pyrimidinato](dipivaloylmethanato)iridium(III) (abbreviation: [Ir(5mdppm)$_2$(dpm)]), bis[4,6-di(naphthalen-1-yl)pyrimidinato](dipivaloylmethanato)iridium(III) (abbreviation: [Ir(d1npm)$_2$(dpm)]), or the like can be used.

As an organometallic iridium complex having a pyrazine skeleton or the like, (acetylacetonato)bis(2,3,5-triphenylpyrazinato)iridium(III) (abbreviation: [Ir(tppr)$_2$(acac)]), bis(2,3,5-triphenylpyrazinato)(dipivaloylmethanato)iridium(III) (abbreviation: [Ir(tppr)$_2$(dpm)]), (acetylacetonato)bis[2,3-bis(4-fluorophenyl)quinoxalinato]iridium(III) (abbreviation: [Ir(Fdpq)$_2$(acac)]), or the like can be used.

As an organometallic iridium complex having a pyridine skeleton or the like, tris(1-phenylisoquinolinato-N,$C^{2'}$)iridium(III) (abbreviation: [Ir(piq)$_3$]), bis(1-phenylisoquinolinato-N,$C^{2'}$)iridium(III) acetylacetonate (abbreviation: [Ir(piq)$_2$(acac)]), or the like can be used.

As a rare earth metal complex or the like, tris(1,3-diphenyl-1,3-propanedionato)(monophenanthroline)europium(III) (abbreviation: [Eu(DBM)$_3$(Phen)]), tris[1-(2-thenoyl)-3,3,3-trifluoroacetonato](monophenanthroline) europium(III) (abbreviation: [Eu(TTA)$_3$(Phen)]), or the like can be used.

As a platinum complex or the like, 2,3,7,8,12,13,17,18-octaethyl-21H,23H-porphyrin platinum(II) (abbreviation: PtOEP) or the like can be used.

These are compounds that exhibit red phosphorescence and have an emission peak at 600 nm to 700 nm. Furthermore, the organometallic iridium complexes having a pyrazine skeleton can provide red light emission with chromaticity favorably used for display apparatuses.

[Substance Exhibiting Thermally Activated Delayed Fluorescence (TADF)]

A TADF material can be used for the layer 111X. When a TADF material is used as the light-emitting substance, the S1 level of a host material is preferably higher than that of the TADF material. In addition, the T1 level of the host material is preferably higher than that of the TADF material.

For example, any of the TADF materials exemplified below can be used as the light-emitting material. Note that without being limited thereto, a variety of known TADF materials can be used.

In the TADF material, the difference between the S1 level and the T1 level is small, and reverse intersystem crossing (upconversion) from the triplet excited state into the singlet excited state can be achieved by a small amount of thermal energy. Thus, the singlet excited state can be efficiently generated from the triplet excited state. In addition, the triplet excitation energy can be converted into luminescence.

An exciplex whose excited state is formed of two kinds of substances has an extremely small difference between the S1 level and the T1 level and functions as a TADF material capable of converting triplet excitation energy into singlet excitation energy.

A phosphorescent spectrum observed at a low temperature (e.g., 77 K to 10 K) is used for an index of the T1 level. When the level of energy with a wavelength of the line obtained by extrapolating a tangent to the fluorescent spectrum at a tail on the short wavelength side is the S1 level and the level of energy with a wavelength of the line obtained by extrapolating a tangent to the phosphorescent spectrum at a tail on the short wavelength side is the T1 level, the difference between the S1 level and the T1 level of the TADF material is preferably smaller than or equal to 0.3 eV, further preferably smaller than or equal to 0.2 eV.

Examples of the TADF material include a fullerene, a derivative thereof, an acridine, a derivative thereof, and an eosin derivative. Furthermore, porphyrin containing a metal such as magnesium (Mg), zinc (Zn), cadmium (Cd), tin (Sn), platinum (Pt), indium (In), or palladium (Pd) can be also used as the TADF material.

Specifically, the following materials whose structural formulae are shown below can be used: a protoporphyrin-tin fluoride complex ($SnF_2$(Proto IX)), a mesoporphyrin-tin fluoride complex ($SnF_2$(Meso IX)), a hematoporphyrin-tin fluoride complex ($SnF_2$(Hemato IX)), a coproporphyrin tetramethyl ester-tin fluoride complex ($SnF_2$(Copro III-4Me)), an octaethylporphyrin-tin fluoride complex ($SnF_2$(OEP)), an etioporphyrin-tin fluoride complex ($SnF_2$(Etio I)), an octaethylporphyrin-platinum chloride complex ($PtCl_2OEP$), and the like.

[Chemical Formulae 1]

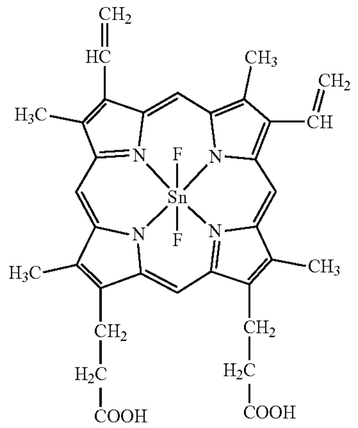

$SnF_2$(Proto IX)

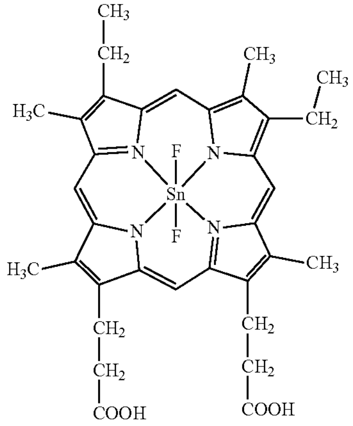

$SnF_2$(Meso IX)

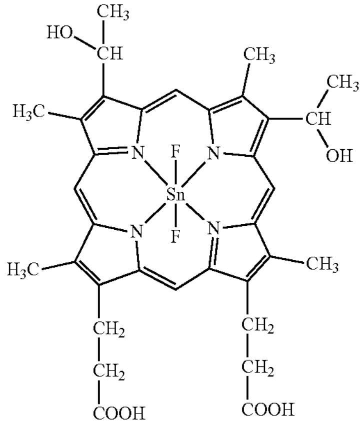

$SnF_2$(Hemato IX)

-continued

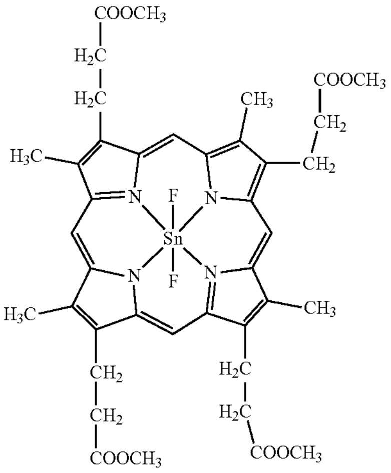

SnF2(Copro III-4Me)

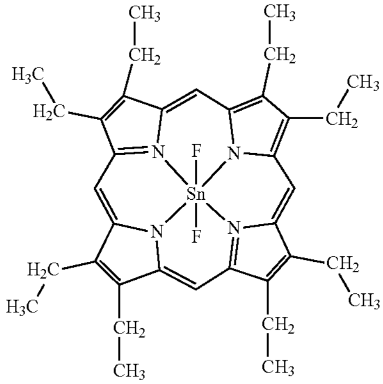

SnF2(OEP)

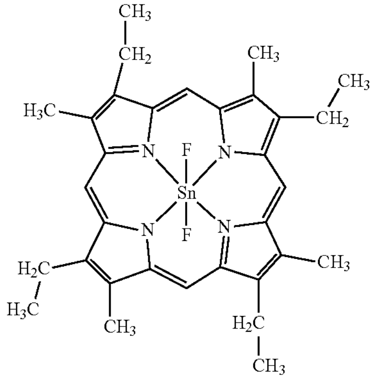

SnF2(Etio I)

-continued

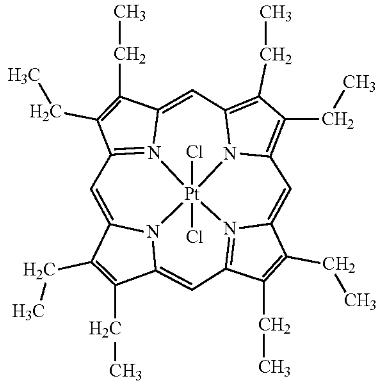

PtCl2OEP

Furthermore, a heterocyclic compound including one or both of a π-electron rich heteroaromatic ring and a π-electron deficient heteroaromatic ring can be used, for example, as the TADF material.

Specifically, the following compounds whose structural formulae are shown below can be used: 2-(biphenyl-4-yl)-4,6-bis(12-phenylindolo[2,3-a]carbazol-11-yl)-1,3,5-triazine (abbreviation: PIC-TRZ), 9-(4,6-diphenyl-1,3,5-triazin-2-yl)-9'-phenyl-9H,9'H-3,3'-bicarbazole (abbreviation: PCCzTzn), 2-{4-[3-(N-phenyl-9H-carbazol-3-yl)-9H-carbazol-9-yl]phenyl}-4,6-diphenyl-1,3,5-triazine (abbreviation: PCCzPTzn), 2-[4-(10H-phenoxazin-10-yl)phenyl]-4,6-diphenyl-1,3,5-triazine (abbreviation: PXZ-TRZ), 3-[4-(5-phenyl-5,10-dihydrophenazin-10-yl)phenyl]-4,5-diphenyl-1,2,4-triazole (abbreviation: PPZ-3TPT), 3-(9,9-dimethyl-9H-acridin-10-yl)-9H-xanthen-9-one (abbreviation: ACRXTN), bis[4-(9,9-dimethyl-9,10-dihydroacridine)phenyl]sulfone (abbreviation: DMAC-DPS), 10-phenyl-10H,10'H-spiro[acridin-9,9'-anthracen]-10'-one (abbreviation: ACRSA), and the like.

[Chemical Formulae 2]

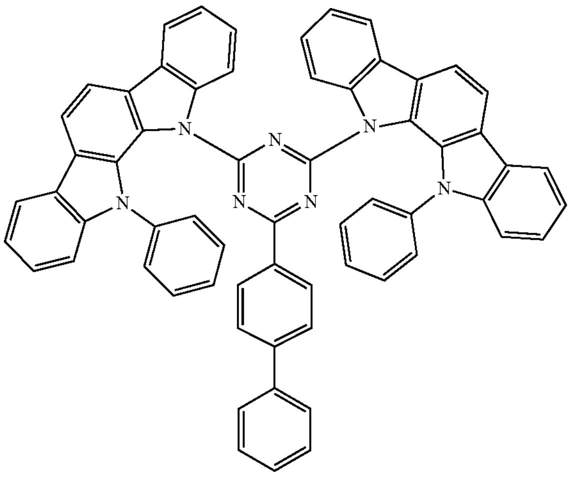

PIC-TRZ

-continued

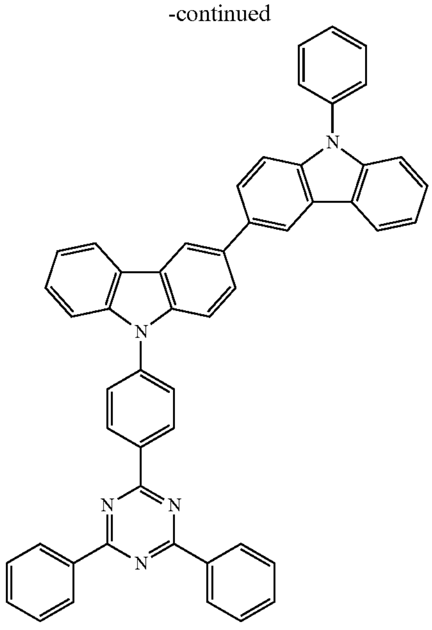

PCCzPTzn

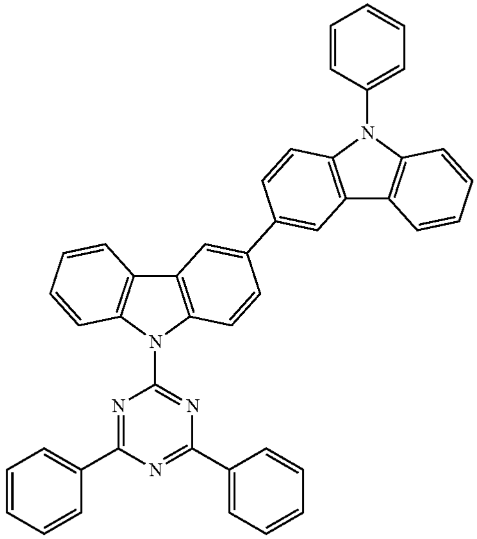

PCCzTzn

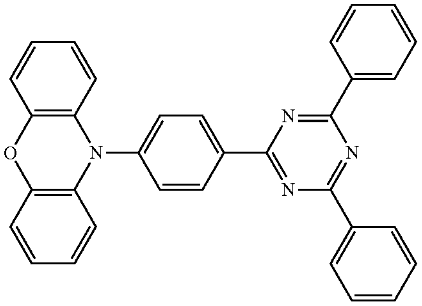

PXZ-TRZ

-continued

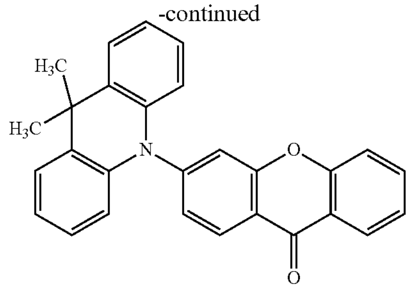

ACRXTN

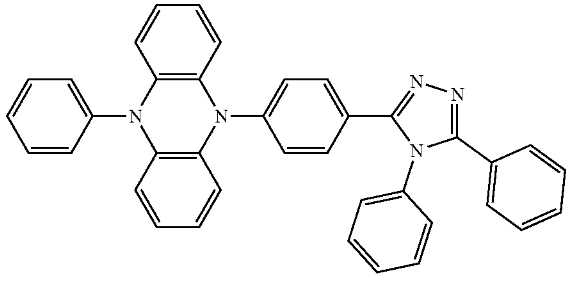

PPZ-3TPT

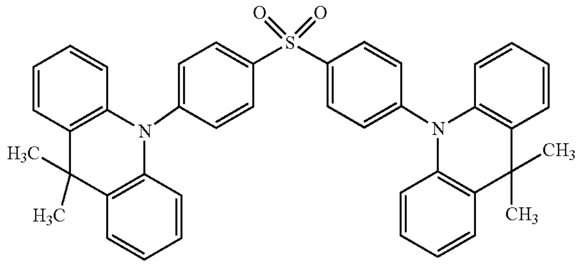

DMAC-DPS

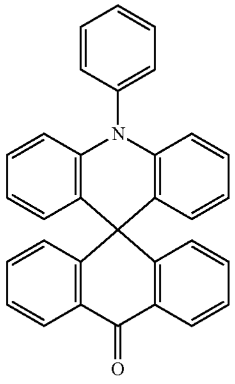

ACRSA

Such a heterocyclic compound is preferable because of having high electron-transport and hole-transport properties owing to a π-electron rich heteroaromatic ring and a π-electron deficient heteroaromatic ring. Among skeletons having the π-electron deficient heteroaromatic ring, in particular, a pyridine skeleton, a diazine skeleton (a pyrimidine skeleton, a pyrazine skeleton, and a pyridazine skeleton), and a triazine skeleton are preferred because of their high stability and reliability. In particular, a benzofuropyrimidine skeleton, a benzothienopyrimidine skeleton, a benzofuropyrazine skeleton, and a benzothienopyrazine skeleton are preferred because of their high electron-accepting properties and high reliability.

Among skeletons having the π-electron rich heteroaromatic ring, an acridine skeleton, a phenoxazine skeleton, a phenothiazine skeleton, a furan skeleton, a thiophene skeleton, and a pyrrole skeleton have high stability and reliability; therefore, at least one of these skeletons is preferably included. A dibenzofuran skeleton is preferable as a furan skeleton, and a dibenzothiophene skeleton is preferable as a thiophene skeleton. As a pyrrole skeleton, an indole skeleton, a carbazole skeleton, an indolocarbazole skeleton, a bicarbazole skeleton, and a 3-(9-phenyl-9H-carbazol-3-yl)-9H-carbazole skeleton are particularly preferable.

Note that a substance in which the π-electron rich heteroaromatic ring is directly bonded to the π-electron deficient heteroaromatic ring is particularly preferred because the electron-donating property of the π-electron rich heteroaromatic ring and the electron-accepting property of the π-electron deficient heteroaromatic ring are both improved, the energy difference between the S1 level and the T1 level becomes small, and thus thermally activated delayed fluorescence can be obtained with high efficiency. Note that an aromatic ring to which an electron-withdrawing group such as a cyano group is bonded may be used instead of the π-electron deficient heteroaromatic ring. As a π-electron rich skeleton, an aromatic amine skeleton, a phenazine skeleton, or the like can be used.

As a π-electron deficient skeleton, a xanthene skeleton, a thioxanthene dioxide skeleton, an oxadiazole skeleton, a triazole skeleton, an imidazole skeleton, an anthraquinone skeleton, a skeleton containing boron such as phenylborane and boranthrene, an aromatic ring or a heteroaromatic ring having a nitrile group or a cyano group such as benzonitrile or cyanobenzene, a carbonyl skeleton such as benzophenone, a phosphine oxide skeleton, a sulfone skeleton, or the like can be used.

As described above, a π-electron deficient skeleton and a π-electron rich skeleton can be used instead of at least one of the π-electron deficient heteroaromatic ring and the π-electron rich heteroaromatic ring.

«Structure Example 2 of Layer 111X»

A carrier-transport material can be used as the host material. For example, a hole-transport material, an electron-transport material, a substance exhibiting thermally activated delayed fluorescence (TADF), a material having an anthracene skeleton, or a mixed material can be used as the host material. A material having a wider bandgap than the light-emitting material contained in the layer 111X is preferably used as the host material. Thus, transfer of energy from excitons generated in the layer 111X to the host material can be inhibited.

[Hole-Transport Material]

A material having a hole mobility of $1\times10^{-6}$ $cm^2/Vs$ or higher can be suitably used as the hole-transport material. For example, a hole-transport material that can be used for the layer 112X can be used for the layer 111X.

[Electron-Transport Material]

A metal complex or an organic compound having a π-electron deficient heteroaromatic ring skeleton can be used as the electron-transport material. For example, an electron-transport material that can be used for the layer 113X can be used for the layer 111X.

[Material Having Anthracene Skeleton]

An organic compound having an anthracene skeleton can be used as the host material. An organic compound having an anthracene skeleton is particularly preferable in the case where a fluorescent substance is used as the light-emitting substance. Thus, a light-emitting device with high emission efficiency and high durability can be obtained.

Among the organic compounds having an anthracene skeleton, an organic compound having a diphenylanthracene skeleton, in particular, a 9,10-diphenylanthracene skeleton, is chemically stable and thus is preferable. The host material preferably has a carbazole skeleton because the hole-injection and hole-transport properties are improved. In particular, the host material preferably has a dibenzocarbazole skeleton because the HOMO level thereof is shallower than that of carbazole by approximately 0.1 eV so that holes enter the host material easily, the hole-transport property is improved, and the heat resistance is increased. Note that in terms of the hole-injection and hole-transport properties, instead of a carbazole skeleton, a benzofluorene skeleton or a dibenzofluorene skeleton may be used.

Thus, a substance having both a 9,10-diphenylanthracene skeleton and a carbazole skeleton, a substance having both a 9,10-diphenylanthracene skeleton and a benzocarbazole skeleton, or a substance having both a 9,10-diphenylanthracene skeleton and a dibenzocarbazole skeleton is preferable as the host material.

Examples of the substances that can be used include 6-[3-(9,10-diphenyl-2-anthryl)phenyl]benzo[b]naphtho[1,2-d]furan (abbreviation: 2mBnfPPA), 9-phenyl-10-[4'-(9-phenyl-9H-fluoren-9-yl)biphenyl-4-yl]anthracene (abbreviation: FLPPA), 9-(1-naphthyl)-10-[4-(2-naphthyl)phenyl]anthracene (abbreviation: αN-βNPAnth), 9-[4-(9-phenylcarbazol-3-yl)]phenyl-10-phenylanthracene (abbreviation: PCzPA), 9-[4-(10-phenyl-9-anthracenyl)phenyl]-9H-carbazole (abbreviation: CzPA), 7-[4-(10-phenyl-9-anthryl)phenyl]-7H-dibenzo[c,g]carbazole (abbreviation: cgDBCzPA), 3-[4-(1-naphthyl)phenyl]-9-phenyl-9H-carbazole (abbreviation: PCPN), and the like.

In particular, CzPA, cgDBCzPA, 2mBnfPPA, and PCzPA have excellent characteristics.

[Substance Exhibiting Thermally Activated Delayed Fluorescence (TADF)]

A TADF material can be used as the host material. When the TADF material is used as the host material, triplet excitation energy generated in the TADF material can be converted into singlet excitation energy by reverse intersystem crossing. Moreover, excitation energy can be transferred to the light-emitting substance. In other words, the TADF material functions as an energy donor, and the light-emitting substance functions as an energy acceptor. Thus, the emission efficiency of the light-emitting device can be increased.

This is very effective in the case where the light-emitting substance is a fluorescent substance. In that case, the S1 level of the TADF material is preferably higher than that of the fluorescent substance in order that high emission efficiency be achieved. Furthermore, the T1 level of the TADF material is preferably higher than the S1 level of the fluorescent substance. Therefore, the T1 level of the TADF material is preferably higher than that of the fluorescent substance.

It is also preferable to use a TADF material that emits light whose wavelength overlaps with the wavelength on the lowest-energy-side absorption band of the fluorescent substance. This enables smooth transfer of excitation energy from the TADF material to the fluorescent substance and accordingly enables efficient light emission, which is preferable.

In addition, in order to efficiently generate singlet excitation energy from the triplet excitation energy by reverse intersystem crossing, carrier recombination preferably occurs in the TADF material. It is also preferable that the triplet excitation energy generated in the TADF material not be transferred to the triplet excitation energy of the fluorescent substance. For that reason, the fluorescent substance preferably has a protecting group around a luminophore (a skeleton which causes light emission) of the fluorescent substance. As the protecting group, a substituent having no π bond and a saturated hydrocarbon are preferably used. Specific examples include an alkyl group having 3 to 10 carbon atoms, a substituted or unsubstituted cycloalkyl group having 3 to 10 carbon atoms, and a trialkylsilyl group having 3 to 10 carbon atoms. It is further preferable that the fluorescent substance have a plurality of protecting groups. The substituents having no π bond are poor in carrier-transport performance; therefore, the TADF material and the luminophore of the fluorescent substance can be made away from each other with little influence on carrier transportation or carrier recombination.

Here, the luminophore refers to an atomic group (skeleton) that causes light emission in a fluorescent substance. The luminophore is preferably a skeleton having a π bond, further preferably includes an aromatic ring, and still further preferably includes a condensed aromatic ring or a condensed heteroaromatic ring.

Examples of such a luminophore include a phenanthrene skeleton, a stilbene skeleton, an acridone skeleton, a phenoxazine skeleton, a phenothiazine skeleton, a naphthalene skeleton, an anthracene skeleton, a fluorene skeleton, a chrysene skeleton, a triphenylene skeleton, a tetracene skeleton, a pyrene skeleton, a perylene skeleton, a coumarin skeleton, a quinacridone skeleton, and a naphthobisbenzofuran skeleton. In particular, a fluorescent substance having any of a naphthalene skeleton, an anthracene skeleton, a fluorene skeleton, a chrysene skeleton, a triphenylene skeleton, a tetracene skeleton, a pyrene skeleton, a perylene skeleton, a coumarin skeleton, a quinacridone skeleton, and a naphthobisbenzofuran skeleton is preferred because of its high fluorescence quantum yield.

For example, the TADF material that can be used as the light-emitting material can be used as the host material.

[Structure Example 1 of Mixed Material]

A material in which a plurality of kinds of substances are mixed can be used as the host material. For example, a material which includes an electron-transport material and a hole-transport material can be used as the mixed material. The weight ratio between the hole-transport material and the electron-transport material contained in the mixed material is (the hole-transport material/the electron-transport material)=(1/19) or more and (19/1) or less. Thus, the carrier-transport property of the layer 111X can be easily adjusted and a recombination region can be easily controlled.

[Structure Example 2 of Mixed Material]

In addition, a material mixed with a phosphorescent substance can be used as the host material. When a fluorescent substance is used as the light-emitting substance, a phosphorescent substance can be used as an energy donor for supplying excitation energy to the fluorescent substance.

[Structure Example 3 of Mixed Material]

A mixed material containing a material to form an exciplex can be used as the host material. For example, a material in which an emission spectrum of a formed exciplex overlaps with a wavelength on the lowest-energy-side absorption band of the light-emitting substance can be used as the host material. This enables smooth energy transfer and improves emission efficiency. The driving voltage can be suppressed. With such a structure, light emission can be efficiently obtained by exciplex-triplet energy transfer (ExTET), which is energy transfer from the exciplex to the light-emitting substance (phosphorescent material).

A phosphorescent substance can be used as at least one of the materials forming an exciplex. Accordingly, reverse intersystem crossing can be used. Triplet excitation energy can be efficiently converted into singlet excitation energy.

Combination of an electron-transport material and a hole-transport material whose HOMO level is higher than or equal to that of the electron-transport material is preferable for forming an exciplex. The lowest unoccupied molecular orbital (LUMO) level of the hole-transport material is preferably higher than or equal to that of the electron-transport material. Thus, an exciplex can be efficiently formed. Note that the LUMO levels and the HOMO levels of the materials can be derived from the electrochemical characteristics (the reduction potentials and the oxidation potentials). Specifically, the reduction potentials and the oxidation potentials can be measured by cyclic voltammetry (CV).

The formation of an exciplex can be confirmed by a phenomenon in which the emission spectrum of the mixed film in which the hole-transport material and the electron-transport material are mixed is shifted to the longer wavelength side than the emission spectrum of each of the materials (or has another peak on the longer wavelength side) observed by comparison of the emission spectra of the hole-transport material, the electron-transport material, and the mixed film of these materials, for example. Alternatively, the formation of an exciplex can be confirmed by a difference in transient response, such as a phenomenon in which the transient PL lifetime of the mixed film has longer lifetime components or a larger proportion of delayed components than the transient PL lifetime of each of the materials, observed by comparison of transient photoluminescence (PL) of the hole-transport material, the electron-transport material, and the mixed film of these materials. The transient PL can be rephrased as transient electroluminescence (EL). That is, the formation of an exciplex can also be confirmed by a difference in transient response observed by comparison of the transient EL of the hole-transport material, the electron-transport material, and the mixed film of these materials.

This embodiment can be combined with any of the other embodiments in this specification as appropriate.

Embodiment 3

In this embodiment, a structure of the light-emitting device 550X is described with reference to FIGS. 3A and 3B.

The structure of the light-emitting device 550X described in this embodiment can be employed for a display apparatus of one embodiment of the present invention. Note that the description of the structure of the light-emitting device 550X can be referred to for the light-emitting device 550A. Specifically, the description of the light-emitting device 550X can be used for the description of the light-emitting device 550A by replacing "X" in the reference numerals of the components of the light-emitting device 550X with "A". Similarly, the structure of the light-emitting device 550X can be employed for the light-emitting device 550B or the light-emitting device 550C by replacing "X" with "B" or "C".

<Structure Example of Light-Emitting Device 550X>

The light-emitting device 550X described in this embodiment includes the electrode 551X, the electrode 552X, the unit 103X, and the layer 104X. The electrode 552X overlaps with the electrode 551X, and the unit 103X is positioned between the electrode 552X and the electrode 551X. The layer 104X is positioned between the electrode 551X and the unit 103X. For example, the structure described in Embodiment 2 can be employed for the unit 103X.

<Structure Example of Electrode 551X>

For example, a conductive material can be used for the electrode 551X. Specifically, a single layer or a stack using a metal, an alloy, or a film containing a conductive compound can be used for the electrode 551X.

A film that efficiently reflects light can be used for the electrode 551X, for example. Specifically, an alloy containing silver, copper, and the like, an alloy containing silver, palladium, and the like, or a metal film of aluminum or the like can be used for the electrode 551X.

For example, a metal film that transmits part of light and reflects another part of light can be used for the electrode 551X. Thus, a microcavity structure can be provided in the light-emitting device 550X. Alternatively, light with a predetermined wavelength can be extracted more efficiently than light with the other wavelengths. Alternatively, light with a narrow spectral half-width can be extracted. Alternatively, light of a bright color can be extracted.

For example, a film having a property of transmitting visible light can be used for the electrode 551X. Specifically, a single layer or a stack using a metal film, an alloy film, a conductive oxide film, or the like that is thin enough to transmit light can be used for the electrode 551X.

In particular, a material having a work function higher than or equal to 4.0 eV can be suitably used for the electrode 551X.

For example, a conductive oxide containing indium can be used. Specifically, indium oxide, indium oxide-tin oxide (abbreviation: ITO), indium oxide-tin oxide containing silicon or silicon oxide (abbreviation: ITSO), indium oxide-zinc oxide, indium oxide containing tungsten oxide and zinc oxide (abbreviation: IWZO), or the like can be used.

For another example, a conductive oxide containing zinc can be used. Specifically, zinc oxide, zinc oxide to which gallium is added, zinc oxide to which aluminum is added, or the like can be used.

Furthermore, for example, gold (Au), platinum (Pt), nickel (Ni), tungsten (W), chromium (Cr), molybdenum (Mo), iron (Fe), cobalt (Co), copper (Cu), palladium (Pd), or a nitride of a metal material (e.g., titanium nitride) can be used. Graphene can also be used.

«Structure Example 1 of Layer 104X»

A hole-injection material can be used for the layer 104X, for example. The layer 104X can be referred to as a hole-injection layer.

For example, a material having a hole mobility lower than or equal to $1\times10^{-3}$ $cm^2/Vs$ when the square root of the electric field strength [V/cm] is 600 can be used for the layer 104X. A film having an electrical resistivity greater than or equal to $1\times10^4\Omega\cdot cm$ and less than or equal to $1\times10^7\Omega\cdot cm$ can be used as the layer 104X. The electrical resistivity of the layer 104X is preferably greater than or equal to $5\times10^4\Omega\cdot cm$ and less than or equal to $1\times10^7\Omega\cdot cm$, further preferably greater than or equal to $1\times10^5\Omega\cdot cm$ and less than or equal to $1\times10^7\Omega\cdot cm$.

«Structure Example 2 of Layer 104X»

Specifically, an electron-accepting substance can be used for the layer 104X. Alternatively, a composite material containing a plurality of kinds of substances can be used for the layer 104X. This can facilitate the injection of holes from the electrode 551X, for example. Alternatively, the driving voltage of the light-emitting device 550X can be reduced.

[Electron-Accepting Substance]

An organic compound or an inorganic compound can be used as the electron-accepting substance. The electron-accepting substance can extract electrons from an adjacent hole-transport layer or a hole-transport material.

For example, a compound having an electron-withdrawing group (a halogen group or a cyano group) can be used as the electron-accepting substance. Note that an electron-accepting organic compound is easily evaporated, which facilitates film deposition. Thus, the productivity of the light-emitting device 550X can be increased.

Specifically, 7,7,8,8-tetracyano-2,3,5,6-tetrafluoroquinodimethane (abbreviation: F4-TCNQ), chloranil, 2,3,6,7,10,11-hexacyano-1,4,5,8,9,12-hexaazatriphenylene (abbreviation: HAT-CN), 1,3,4,5,7,8-hexafluorotetracyanonaphthoquinodimethane (abbreviation: F6-TCNNQ), 2-(7-dicyanomethylene-1,3,4,5,6,8,9,10-octafluoro-7H-pyren-2-ylidene)malononitrile, or the like can be used.

A compound in which electron-withdrawing groups are bonded to a condensed aromatic ring having a plurality of heteroatoms, such as HAT-CN, is particularly preferable because it is thermally stable.

A [3]radialene derivative having an electron-withdrawing group (in particular, a cyano group or a halogen group such as a fluoro group) has a very high electron-accepting property and thus is preferred.

Specifically, α,α',α"-1,2,3-cyclopropanetriylidenetris[4-cyano-2,3,5,6-tetrafluorobenzeneacetonitrile], α,α',α"-1,2,3-cyclopropanetriylidenetris[2,6-dichloro-3,5-difluoro-4-(trifluoromethyl)benzeneacetonitrile], α,α',α"-1,2,3-cyclopropanetriylidenetris[2,3,4,5,6-pentafluorobenzeneacetonitrile], or the like can be used.

For the electron-accepting substance, a transition metal oxide such as a molybdenum oxide, a vanadium oxide, a ruthenium oxide, a tungsten oxide, or a manganese oxide can be used.

It is possible to use any of the following materials: phthalocyanine-based compounds such as phthalocyanine (abbreviation: $H_2Pc$); phthalocyanine-based complex compounds such as copper phthalocyanine (abbreviation: CuPc); and compounds having an aromatic amine skeleton such as 4,4'-bis[N-(4-diphenylaminophenyl)-N-phenylamino]biphenyl (abbreviation: DPAB) and N,N-bis[4-bis(3-methylphenyl)aminophenyl]-N,N'-diphenyl-4,4'-diaminobiphenyl (abbreviation: DNTPD).

In addition, high molecular compounds such as poly(3,4-ethylenedioxythiophene)/polystyrenesulfonic acid (abbreviation: PEDOT/PSS), and the like can be used.

[Structure Example 1 of Composite Material]

For example, a composite material containing an electron-accepting substance and a hole-transport material can be used for the layer 104X. Accordingly, not only a material having a high work function but also a material having a low work function can also be used for the electrode 551X. Alternatively, a material used for the electrode 551X can be selected from a wide range of materials regardless of its work function.

For the hole-transport material in the composite material, for example, a compound having an aromatic amine skeleton, a carbazole derivative, an aromatic hydrocarbon, an aromatic hydrocarbon having a vinyl group, or a high molecular compound (such as an oligomer, a dendrimer, or a polymer) can be used. A material having a hole mobility of $1\times10^{-6}$ $cm^2/Vs$ or higher can be suitably used as the hole-transport material in the composite material. For example, the hole-transport material that can be used for the layer 112X can be used for the composite material.

A substance having a relatively deep HOMO level can be suitably used as the hole-transport material in the composite material. Specifically, the HOMO level is preferably higher than or equal to −5.7 eV and lower than or equal to −5.4 eV. Accordingly, hole injection to the unit 103X can be facilitated. Hole injection to the layer 112X can be facilitated. The reliability of the light-emitting device 550X can be increased.

As the compound having an aromatic amine skeleton, for example, N,N'-di(p-tolyl)-N,N'-diphenyl-p-phenylenediamine (abbreviation: DTDPPA), 4,4'-bis[N-(4-diphenylaminophenyl)-N-phenylamino]biphenyl (abbreviation: DPAB), N,N'-bis[4-bis(3-methylphenyl)aminophenyl]-N,N'-diphenyl-4,4'-diaminobiphenyl (abbreviation: DNTPD), or 1,3,5-tris[N-(4-diphenylaminophenyl)-N-phenylamino]benzene (abbreviation: DPA3B) can be used.

As the carbazole derivative, for example, 3-[N-(9-phenylcarbazol-3-yl)-N-phenylamino]-9-phenylcarbazole (abbreviation: PCzPCA1), 3,6-bis[N-(9-phenylcarbazol-3-yl)-N-phenylamino]-9-phenylcarbazole (abbreviation: PCzPCA2), 3-[N-(1-naphthyl)-N-(9-phenylcarbazol-3-yl)amino]-9-phenylcarbazole (abbreviation: PCzPCN1), 4,4'-di(N-carbazolyl)biphenyl (abbreviation: CBP), 1,3,5-tris[4-(N-carbazolyl)phenyl]benzene (abbreviation: TCPB), 9-[4-(10-phenyl-9-anthracenyl)phenyl]-9H-carbazole (abbreviation: CzPA), or 1,4-bis[4-(N-carbazolyl)phenyl]-2,3,5,6-tetraphenylbenzene can be used.

As the aromatic hydrocarbon, for example, 2-tert-butyl-9,10-di(2-naphthyl)anthracene (abbreviation: t-BuDNA), 2-tert-butyl-9,10-di(1-naphthyl)anthracene, 9,10-bis(3,5-diphenylphenyl)anthracene (abbreviation: DPPA), 2-tert-butyl-9,10-bis(4-phenylphenyl)anthracene (abbreviation: t-BuDBA), 9,10-di(2-naphthyl)anthracene (abbreviation: DNA), 9,10-diphenylanthracene (abbreviation: DPAnth), 2-tert-butylanthracene (abbreviation: t-BuAnth), 9,10-bis(4-methyl-1-naphthyl)anthracene (abbreviation: DMNA), 2-tert-butyl-9,10-bis[2-(1-naphthyl)phenyl]anthracene, 9,10-bis[2-(1-naphthyl)phenyl]anthracene, 2,3,6,7-tetramethyl-9,10-di(1-naphthyl)anthracene, 2,3,6,7-tetramethyl-9,10-di(2-naphthyl)anthracene, 9,9'-bianthryl, 10,10'-diphenyl-9,9'-bianthryl, 10,10'-bis(2-phenylphenyl)-9,9'-bianthryl, 10,10'-bis[(2,3,4,5,6-pentaphenyl)phenyl]-9,9'-bianthryl, anthracene, tetracene, rubrene, perylene, 2,5,8,11-tetra(tert-butyl)perylene, pentacene, or coronene can be used.

As the aromatic hydrocarbon having a vinyl group, for example, 4,4'-bis(2,2-diphenylvinyl)biphenyl (abbreviation: DPVBi) or 9,10-bis[4-(2,2-diphenylvinyl)phenyl]anthracene (abbreviation: DPVPA) can be used.

As the high molecular compound, for example, poly(N-vinylcarbazole) (abbreviation: PVK), poly(4-vinyltriphenylamine) (abbreviation: PVTPA), poly[N-(4-{N'-[4-(4-diphenylamino)phenyl]phenyl-N'-phenylamino}phenyl)methacrylamide](abbreviation: PTPDMA), or poly[N,N'-bis(4-butylphenyl)-N,N'-bis(phenyl)benzidine](abbreviation: Poly-TPD) can be used.

Furthermore, a substance having any of a carbazole skeleton, a dibenzofuran skeleton, a dibenzothiophene skeleton, and an anthracene skeleton can be suitably used as the hole-transport material in the composite material, for example. Moreover, a substance including any of the following can be used as the hole-transport material in the composite material: an aromatic amine having a substituent that includes a dibenzofuran ring or a dibenzothiophene ring, an aromatic monoamine that includes a naphthalene ring, and an aromatic monoamine in which a 9-fluorenyl group is bonded to nitrogen of amine through an arylene group. With the use of a substance including an N,N-bis(4-biphenyl)amino group, the reliability of the light-emitting device 550X can be increased.

Specific examples of the above-described substances include N-(4-biphenyl)-6,N-diphenylbenzo[b]naphtho[1,2-d]furan-8-amine (abbreviation: BnfABP), N,N-bis(4-biphenyl)-6-phenylbenzo[b]naphtho[1,2-d]furan-8-amine (abbreviation: BBABnf), 4,4'-bis(6-phenylbenzo[b]naphtho[1,2-d]furan-8-yl)-4"-phenyl)triphenylamine (abbreviation: BnfBB1BP), N,N-bis(4-biphenyl)benzo[b]naphtho[1,2-d]furan-6-amine (abbreviation: BBABnf(6)), N,N-bis(4-biphenyl)benzo[b]naphtho[1,2-d]furan-8-amine (abbreviation: BBABnf(8)), N,N-bis(4-biphenyl)benzo[b]naphtho[2,3-d]furan-4-amine (abbreviation: BBABnf(II)(4)), N,N-bis[4-(dibenzofuran-4-yl)phenyl]-4-amino-p-terphenyl (abbreviation: DBfBB1TP), N-[4-(dibenzothiophen-4-yl)phenyl]-N-phenyl-4-biphenylamine (abbreviation: ThBA1BP), 4-(2-naphthyl)-4',4"-diphenyltriphenylamine (abbreviation: BBAβNB), 4-[4-(2-naphthyl)phenyl]-4',4"-diphenyltriphenylamine (abbreviation: BBAβNBi), 4,4'-diphenyl-4"-(6;1'-binaphthyl-2-yl)triphenylamine (abbreviation: BBAαNβNB), 4,4'-diphenyl-4"-(7;1'-binaphthyl-2-yl)triphenylamine (abbreviation: BBAαNβNB-03), 4,4'-diphenyl-4"-(7-phenyl)naphthyl-2-yl)triphenylamine (abbreviation: BBAαNβNB-03), 4,4'-diphenyl-4"-(6;2'-binaphthyl-2-yl)triphenylamine (abbreviation: BBA(βN2)B), 4,4'-diphenyl-4"-(7;2'-binaphthyl-2-yl)triphenylamine (abbreviation: BBA(βN2)B-03), 4,4'-diphenyl-4"-(4;2'-binaphthyl-1-yl)triphenylamine (abbreviation: BBAβNαNB), 4,4'-diphenyl-4"-(5;2'-binaphthyl-1-yl)triphenylamine (abbreviation: BBAβ8NαNB-02), 4-(4-biphenylyl)-4'-(2-naphthyl)-4"-phenyl)triphenylamine (abbreviation: TPBiA βNB), 4-(3-biphenylyl)-4'-[4-(2-naphthyl)phenyl]-4"-phenyl)triphenylamine (abbreviation: mTPBiA βNBi), 4-(4-biphenylyl)-4'-[4-(2-naphthyl)phenyl]-4"-phenyl)triphenylamine (abbreviation: TPBiAβNBi), 4-phenyl-4'-(1-naphthyl)triphenylamine (abbreviation: αNBA1BP), 4,4'-bis(1-naphthyl)triphenylamine (abbreviation: αNBB1BP), 4,4'-diphenyl-4"-[4'-(carbazol-9-yl)biphenyl-4-yl]triphenylamine (abbreviation: YGTBi1BP), 4'-[4-(3-phenyl-9H-carbazol-9-yl)phenyl]tris(biphenyl-4-yl)amine (abbreviation: YGTBi1BP-02), 4-[4'-(carbazol-9-yl)biphenyl-4-yl]-4'-(2-naphthyl)-4"-phenyltriphenylamine (abbreviation: YGTBiβNB), N-[4-(9-phenyl-9H-carbazol-3-yl)phenyl]-N-[4-(1-naphthyl)phenyl]-9,9'-spirobi[9H-fluoren]-2-amine (abbreviation: PCBNBSF), N,N-bis(biphenyl-4-yl)-9,9'-spirobi[9H-fluoren]-2-amine (abbreviation: BBASF), N,N-bis(biphenyl-4-yl)-9,9'-spirobi[9H-fluoren]-4-amine (abbreviation: BBASF(4)), N-(biphenyl-2-yl)-N-(9,9-dimethyl-9H-fluoren-2-yl)-9,9'-spirobi[9H-fluoren]-4-amine (abbreviation: oFBiSF), N-(biphenyl-4-yl)-N-(9,9-dimethyl-9H-fluoren-2-yl)dibenzofuran-4-amine (abbreviation: FrBiF), N-[4-(1-naphthyl)phenyl]-N-[3-(6-phenyldibenzofuran-4-yl)phenyl]-1-naphthylamine (abbreviation: mPDBfBNBN), 4-phenyl-4'-(9-phenylfluoren-9-yl)triphenylamine (abbreviation: BPAFLP), 4-phenyl-3'-(9-phenylfluoren-9-yl)triphenylamine (abbreviation: mBPAFLP), 4-phenyl-4'-[4-(9-phenylfluoren-9-yl)phenyl]triphenylamine (abbreviation: BPAFLBi), 4-phenyl-4'-(9-phenyl-9H-carbazol-3-yl)triphenylamine (abbreviation: PCBA1BP), 4,4'-diphenyl-4"-(9-phenyl-9H-carbazol-3-yl)triphenylamine (abbreviation: PCBBi1BP), 4-(1-naphthyl)-4'-(9-phenyl-9H-carbazol-3-yl)triphenylamine (abbreviation: PCBANB), 4,4'-di(1-naphthyl)-4"-(9-phenyl-9H-carbazol-3-yl)triphenylamine (abbreviation: PCBNBB), N-phenyl-N-[4-(9-phenyl-9H-carbazol-3-yl)phenyl]-9,9'-spirobi[9H-fluoren]-2-amine (abbreviation: PCBASF), N-(biphenyl-4-yl)-N-[4-(9-phenyl-9H-carbazol-3-yl)phenyl]-9,9-dimethyl-9H-fluoren-2-amine (abbreviation: PCBBiF), N,N-bis(9,9-dimethyl-9H-fluoren-2-yl)-9,9'-spirobi-9H-fluoren-4-amine, N,N-bis(9,9-dimethyl-9H-fluoren-2-yl)-9,9'-spirobi-9H-fluoren-3-amine, N,N-bis(9,9-dimethyl-9H-fluoren-2- yl)-9,9'-spirobi-9H-fluoren-2-amine, and N,N-bis(9,9-dimethyl-9H-fluoren-2-yl)-9,9'-spirobi-9H-fluoren-1-amine.

[Structure Example 2 of Composite Material]

For example, a composite material including an electron-accepting substance, a hole-transport material, and a fluoride of an alkali metal or a fluoride of an alkaline earth metal can be used as the hole-injection material. In particular, a composite material in which the proportion of fluorine atoms is higher than or equal to 20% can be suitably used. Thus, the refractive index of the layer 104X can be reduced. A layer with a low refractive index can be formed inside the light-emitting device 550X. The external quantum efficiency of the light-emitting device 550X can be improved.

This embodiment can be combined with any of the other embodiments in this specification as appropriate.

Embodiment 4

In this embodiment, a structure of the light-emitting device 550X is described with reference to FIGS. 3A and 3B.

The structure of the light-emitting device 550X described in this embodiment can be employed for a display apparatus of one embodiment of the present invention. Note that the description of the structure of the light-emitting device 550X can be referred to for the light-emitting device 550A. Specifically, the description of the light-emitting device 550X can be used for the description of the light-emitting device 550A by replacing "X" in the reference numerals of the components of the light-emitting device 550X with "A". Similarly, the structure of the light-emitting device 550X can be employed for the light-emitting device 550B or the light-emitting device 550C by replacing "X" with "B" or "C".

<Structure Example of Light-Emitting Device 550X>

The light-emitting device 550X described in this embodiment includes the electrode 551X, the electrode 552X, the unit 103X, and a layer 105X. The electrode 552X includes a region overlapping with the electrode 551X, and the unit 103X includes a region positioned between the electrode 551X and the electrode 552X. The layer 105X includes a region positioned between the unit 103X and the electrode 552X. For example, the structure described in Embodiment 2 can be employed for the unit 103X.

<Structure Example of Electrode 552X>

For example, a conductive material can be used for the electrode 552X. Specifically, a single layer or a stack using a metal, an alloy, or a material containing a conductive compound can be used for the electrode 552X.

The material that can be used for the electrode 551X described in Embodiment 3 can be used for the electrode 552X, for example. In particular, a material having a lower work function than the electrode 551X can be suitably used for the electrode 552X. Specifically, a material having a work function lower than or equal to 3.8 eV is preferably used.

For example, an element belonging to Group 1 of the periodic table, an element belonging to Group 2 of the periodic table, a rare earth metal, or an alloy containing any of these elements can be used for the electrode 552X.

Specifically, an element such as lithium (Li) or cesium (Cs), an element such as magnesium (Mg), calcium (Ca), or strontium (Sr), an element such as europium (Eu) or ytterbium (Yb), or an alloy containing any of these elements such as an alloy of magnesium and silver or an alloy of aluminum and lithium can be used for the electrode 552X.

«Structure Example of Layer 105X»

An electron-injection material can be used for the layer 105X, for example. The layer 105X can be referred to as an electron-injection layer.

Specifically, an electron-donating substance can be used for the layer 105X. Alternatively, a material in which an electron-donating substance and an electron-transport material are combined can be used for the layer 105X. Alternatively, electride can be used for the layer 105X. This can facilitate the injection of electrons from the electrode 552X, for example. Alternatively, not only a material having a low work function but also a material having a high work function can also be used for the electrode 552X. Alternatively, a material used for the electrode 552X can be selected from a wide range of materials regardless of its work function. Specifically, Al, Ag, ITO, indium oxide-tin oxide containing silicon or silicon oxide, or the like can be used for the electrode 552X. The driving voltage of the light-emitting device 550X can be reduced.

[Electron-Donating Substance]

For example, an alkali metal, an alkaline earth metal, a rare earth metal, or a compound thereof (an oxide, a halide, a carbonate, or the like) can be used as the electron-donating substance. Alternatively, an organic compound such as tetrathianaphthacene (abbreviation: TTN), nickelocene, or decamethylnickelocene can be used as the electron-donating substance.

As an alkali metal compound (including an oxide, a halide, and a carbonate), lithium oxide, lithium fluoride (LiF), cesium fluoride (CsF), lithium carbonate, cesium carbonate, 8-hydroxyquinolinato-lithium (abbreviation: Liq), or the like can be used.

As an alkaline earth metal compound (including an oxide, a halide, and a carbonate), calcium fluoride ($CaF_2$) or the like can be used.

[Structure Example 1 of Composite Material]

A material composed of two or more kinds of substances can be used as the electron-injection material. For example, an electron-donating substance and an electron-transport material can be used for the composite material.

[Electron-Transport Material]

A material having an electron mobility higher than or equal to $1\times10^{-7}$ $cm^2/Vs$ and lower than or equal to $5\times10^{-5}$ $cm^2/Vs$ when the square root of the electric field strength [V/cm] is 600 can be suitably used as the electron-transport material. In this case, the amount of electrons injected into the light-emitting layer can be controlled. The light-emitting layer can be prevented from having excess electrons.

A metal complex or an organic compound having a π-electron deficient heteroaromatic ring skeleton can be used as the electron-transport material. For example, an electron-transport material that can be used for the layer 113X can be used for the layer 105X.

[Structure Example 2 of Composite Material]

A material including a fluoride of an alkali metal in a microcrystalline state and an electron-transport material can be used for the composite material. Alternatively, a material including a fluoride of an alkaline earth metal in a microcrystalline state and an electron-transport material can be used for the composite material. In particular, a composite material including a fluoride of an alkali metal or a fluoride of an alkaline earth metal at 50 wt % or higher can be suitably used. Alternatively, a composite material including an organic compound having a bipyridine skeleton can be suitably used. Thus, the refractive index of the layer 105X can be reduced. The external quantum efficiency of the light-emitting device 550X can be improved.

[Structure Example 3 of Composite Material]

For example, a composite material of a first organic compound including an unshared electron pair and a first metal can be used for the layer 105X. The sum of the number of electrons of the first organic compound and the number of electrons of the first metal is preferably an odd number. The molar ratio of the first metal to 1 mol of the first organic compound is preferably greater than or equal to 0.1 and less than or equal to 10, further preferably greater than or equal to 0.2 and less than or equal to 2, still further preferably greater than or equal to 0.2 and less than or equal to 0.8.

Accordingly, the first organic compound including an unshared electron pair interacts with the first metal and thus can form a singly occupied molecular orbital (SOMO). Furthermore, in the case where electrons are injected from the electrode 552X into the layer 105X, a barrier therebetween can be reduced.

The layer 105X can adopt a composite material that allows the spin density measured by an electron spin resonance (ESR) method to be preferably greater than or equal to $1\times10^{16}$ spins/$cm^3$, further preferably greater than or equal to $5\times10^{16}$ spins/$cm^3$, still further preferably greater than or equal to $1\times10^{17}$ spins/$cm^3$.

[Organic Compound Including Unshared Electron Pair]

For example, an electron-transport material can be used for the organic compound including an unshared electron pair. For example, a compound having an electron deficient heteroaromatic ring can be used. Specifically, a compound with at least one of a pyridine ring, a diazine ring (a pyrimidine ring, a pyrazine ring, and a pyridazine ring), and a triazine ring can be used. Accordingly, the driving voltage of the light-emitting device 550X can be reduced.

Note that the LUMO level of the organic compound including an unshared electron pair is preferably higher than or equal to −3.6 eV and lower than or equal to −2.3 eV. In general, the HOMO level and the LUMO level of an organic compound can be estimated by cyclic voltammetry (CV), photoelectron spectroscopy, optical absorption spectroscopy, inverse photoelectron spectroscopy, or the like.

For example, 4,7-diphenyl-1,10-phenanthroline (abbreviation: BPhen), 2,9-di(naphthalen-2-yl)-4,7-diphenyl-1,10-phenanthroline (abbreviation: NBPhen), diquinoxalino[2,3-a:2',3'-c]phenazine (abbreviation: HATNA), 2,4,6-tris[3'-(pyridin-3-yl)biphenyl-3-yl]-1,3,5-triazine (abbreviation: TmPPPyTz), 2,2'-(1,3-phenylene)bis(9-phenyl-1,10-phenanthroline) (abbreviation: mPPhen2P), or the like can be used as the organic compound including an unshared electron pair. Note that NBPhen has a higher glass transition temperature (Tg) than BPhen and thus has high heat resistance.

Alternatively, for example, copper phthalocyanine can be used as the organic compound including an unshared electron pair. The number of electrons of the copper phthalocyanine is an odd number.

[First Metal]

When the number of electrons of the first organic compound including an unshared electron pair is an even number, for example, a composite material of the first organic compound and the first metal that belongs to an odd-numbered group in the periodic table can be used for the layer 105X.

For example, manganese (Mn), which is a metal belonging to Group 7, cobalt (Co), which is a metal belonging to Group 9, copper (Cu), silver (Ag), and gold (Au), which are metals belonging to Group 11, aluminum (Al) and indium (In), which are metals belonging to Group 13 are odd-numbered groups in the periodic table. Note that elements belonging to Group 11 have a lower melting point than elements belonging to Group 7 or Group 9 and thus are suitable for vacuum evaporation. In particular, Ag is preferable because of its low melting point. By using a metal having a low reactivity with water or oxygen as the first metal, the moisture resistance of the light-emitting device 550X can be improved.

The use of Ag for the electrode 552X and the layer 105X can increase the adhesion between the layer 105X and the electrode 552X.

When the number of electrons of the first organic compound including an unshared electron pair is an odd number, a composite material of the first organic compound and the first metal that belongs to an even-numbered group in the periodic table can be used for the layer 105X. For example, iron (Fe), which is a metal belonging to Group 8, is an element belonging to an even-numbered group in the periodic table.

[Electride]

For example, a substance obtained by adding electrons at high concentration to an oxide where calcium and aluminum are mixed can be used, for example, as the electron-injection material.

This embodiment can be combined with any of the other embodiments in this specification as appropriate.

Embodiment 5

In this embodiment, a structure of the light-emitting device 550X is described with reference to FIG. 4A.

Figure 4A:
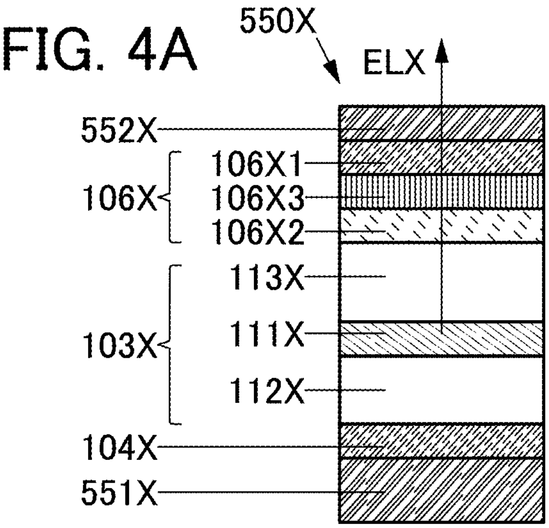
FIGS. 4A and 4B illustrate structures of a light-emitting device of an embodiment.

FIG. 4A is a cross-sectional view illustrating a structure of a light-emitting device of one embodiment of the present invention.

The structure of the light-emitting device 550X described in this embodiment can be employed for a display apparatus of one embodiment of the present invention. Note that the description of the structure of the light-emitting device 550X can be referred to for the light-emitting device 550A. Specifically, the description of the light-emitting device 550X can be used for the description of the light-emitting device 550A by replacing "X" in the reference numerals of the components of the light-emitting device 550X with "A". Similarly, the structure of the light-emitting device 550X can be employed for the light-emitting device 550B or the light-emitting device 550C by replacing "X" with "B" or "C".

<Structure Example of Light-Emitting Device 550X>

The light-emitting device 550X described in this embodiment includes the electrode 551X, the electrode 552X, the unit 103X, and an intermediate layer 106X (see FIG. 4A). The electrode 552X includes a region overlapping with the electrode 551X, and the unit 103X includes a region positioned between the electrode 551X and the electrode 552X. The intermediate layer 106X includes a region positioned between the electrode 552X and the unit 103X.

«Structure Example 1 of Intermediate Layer 106X»

The intermediate layer 106X has a function of supplying electrons to the anode side and supplying holes to the cathode side when voltage is applied. The intermediate layer 106X can be referred to as a charge-generation layer.

For example, the hole-injection material that can be used for the layer 104X described in Embodiment 3 can be used for the intermediate layer 106X. Specifically, the composite material can be used for the intermediate layer 106X.

Alternatively, for example, a stacked-layer film in which a film containing the composite material and a film containing a hole-transport material are stacked can be used for the intermediate layer 106X. Note that the film containing a hole-transport material is positioned between the film containing the composite material and the cathode.

«Structure Example 2 of Intermediate Layer 106X»

A stacked-layer film in which a layer 106X1 and a layer 106X2 are stacked can be used for the intermediate layer 106X. The layer 106X1 includes a region positioned between the unit 103X and the electrode 552X and the layer 106X2 includes a region positioned between the unit 103X and the layer 106X1.

«Structure Example of Layer 106X1»

For example, the hole-injection material that can be used for the layer 104X described in Embodiment 3 can be used for the layer 106X1. Specifically, the composite material can be used for the layer 106X1. A film having an electrical resistivity greater than or equal to $1\times10^4\Omega\cdot$cm and less than or equal to $1\times10^7\Omega\cdot$cm can be used as the layer 106X1. The electrical resistivity of the layer 106X1 is preferably greater than or equal to $5\times10^4\Omega\cdot$cm and less than or equal to $1\times10^7\Omega\cdot$cm, further preferably greater than or equal to $1\times10^5\Omega\cdot$cm and less than or equal to $1\times10^7\Omega\cdot$cm.

«Structure Example of Layer 106X2»

For example, the material that can be used for the layer 105X described in Embodiment 4 can be used for the layer 106X2.

«Structure Example 3 of Intermediate Layer 106X»

A stacked-layer film in which the layer 106X1, the layer 106X2, and a layer 106X3 are stacked can be used for the intermediate layer 106X. The layer 106X3 includes a region positioned between the layer 106X1 and the layer 106X2.

«Structure Example of Layer 106X3»

For example, an electron-transport material can be used for the layer 106X3. The layer 106X3 can be referred to as an electron-relay layer. With the layer 106X3, a layer that is on the anode side and in contact with the layer 106X3 can be distanced from a layer that is on the cathode side and in contact with the layer 106X3. Interaction between the layer that is on the anode side and in contact with the layer 106X3 and the layer that is on the cathode side and in contact with the layer 106X3 can be reduced. Electrons can be smoothly supplied to the layer that is on the anode side and in contact with the layer 106X3.

A substance whose LUMO level is positioned between the LUMO level of an electron-accepting substance contained in the layer 106X1 and the LUMO level of the substance contained in the layer 106X2 can be suitably used for the layer 106X3.

For example, a material having a LUMO level in a range higher than or equal to −5.0 eV, preferably higher than or equal to −5.0 eV and lower than or equal to −3.0 eV, can be used for the layer 106X3.

Specifically, a phthalocyanine-based material can be used for the layer 106X3. For example, copper phthalocyanine (abbreviation: CuPc) or a metal complex having a metal-oxygen bond and an aromatic ligand can be used for the layer 106X3.

This embodiment can be combined with any of the other embodiments in this specification as appropriate.

Embodiment 6

In this embodiment, a structure of the light-emitting device 550X is described with reference to FIG. 4B.

Figure 4B:
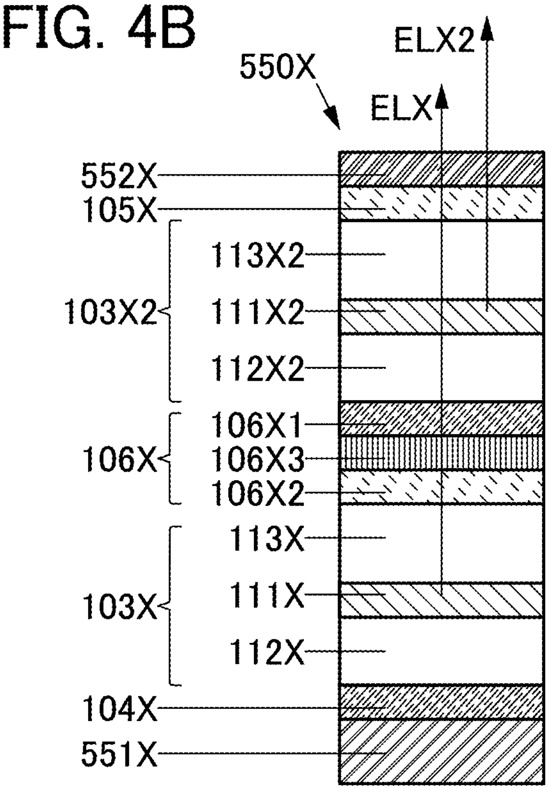

FIG. 4B is a cross-sectional view illustrating a structure of a light-emitting device of one embodiment of the present invention which is different from that in FIG. 4A.

The structure of the light-emitting device 550X described in this embodiment can be employed for a display apparatus of one embodiment of the present invention. Note that the description of the structure of the light-emitting device 550X can be referred to for the light-emitting device 550A. Specifically, the description of the light-emitting device 550X can be used for the description of the light-emitting device 550A by replacing "X" in the reference numerals of the components of the light-emitting device 550X with "A". Similarly, the structure of the light-emitting device 550X can be employed for the light-emitting device 550B or the light-emitting device 550C by replacing "X" with "B" or "C".

<Structure Example of Light-Emitting Device 550X>

The light-emitting device 550X described in this embodiment includes the electrode 551X, the electrode 552X, the unit 103X, the intermediate layer 106X, and a unit 103X2 (see FIG. 4B).

The unit 103X is positioned between the electrode 552X and the electrode 551X, and the intermediate layer 106X is positioned between the electrode 552X and the unit 103X.

The unit 103X2 is positioned between the electrode 552X and the intermediate layer 106X. The unit 103X2 has a function of emitting light ELX2.

In other words, the light-emitting device 550X includes the stacked units between the electrode 551X and the electrode 552X. The number of stacked units is not limited to two and may be three or more. A structure including the stacked units positioned between the electrode 551X and the electrode 552X and the intermediate layer 106X positioned between the units is referred to as a stacked light-emitting device or a tandem light-emitting device in some cases.

This structure enables high luminance emission while the current density is kept low. Reliability can be improved. The driving voltage can be reduced in comparison with that of the light-emitting device with the same luminance. The power consumption can be reduced.

«Structure Example 1 of Unit 103X2»

The unit 103X2 includes a layer 111X2, a layer 112X2, and a layer 113X2. The layer 111X2 is positioned between the layer 112X2 and the layer 113X2.

The structure that can be employed for the unit 103X can be employed for the unit 103X2. For example, the same structure as the unit 103X can be employed for the unit 103X2.

«Structure Example 2 of Unit 103X2»

The structure that is different from the structure of the unit 103X can be employed for the unit 103X2. For example, the unit 103X2 can have a structure emitting light whose hue is different from that of light emitted from the unit 103X.

Specifically, a stack including the unit 103X emitting red light and green light and the unit 103X2 emitting blue light can be employed. With this structure, a light-emitting device emitting light of a desired color can be provided. A light-emitting device emitting white light can be provided, for example.

«Structure Example of Intermediate Layer 106X»

The intermediate layer 106X has a function of supplying electrons to one of the unit 103X and the unit 103X2 and supplying holes to the other. For example, the intermediate layer 106X described in Embodiment 5 can be used.

<Method for Fabricating Light-Emitting Device 550X>

For example, each of the electrode 551X, the electrode 552X, the unit 103X, the intermediate layer 106X, and the unit 103X2 can be formed by a dry process, a wet process, an evaporation method, a droplet discharging method, a coating method, a printing method, or the like. A formation method may differ between components of the device.

Specifically, the light-emitting device 550X can be manufactured with a vacuum evaporation apparatus, an inkjet apparatus, a coating apparatus such as a spin coater, a gravure printing apparatus, an offset printing apparatus, a screen printing apparatus, or the like.

For example, the electrode can be formed by a wet process or a sol-gel method using a paste of a metal material. In addition, an indium oxide-zinc oxide film can be formed by a sputtering method using a target obtained by adding zinc oxide to indium oxide at a concentration higher than or equal to 1 wt % and lower than or equal to 20 wt %. Furthermore, an indium oxide film containing tungsten oxide and zinc oxide (IWZO) can be formed by a sputtering method using a target containing, with respect to indium oxide, tungsten oxide at a concentration higher than or equal to 0.5 wt % and lower than or equal to 5 wt % and zinc oxide at a concentration higher than or equal to 0.1 wt % and lower than or equal to 1 wt %.

This embodiment can be combined with any of the other embodiments in this specification as appropriate.

Embodiment 7

In this embodiment, a structure of a display apparatus of one embodiment of the present invention is described with reference to FIG. 5A to 5C and FIG. 6.

Figure 5A:
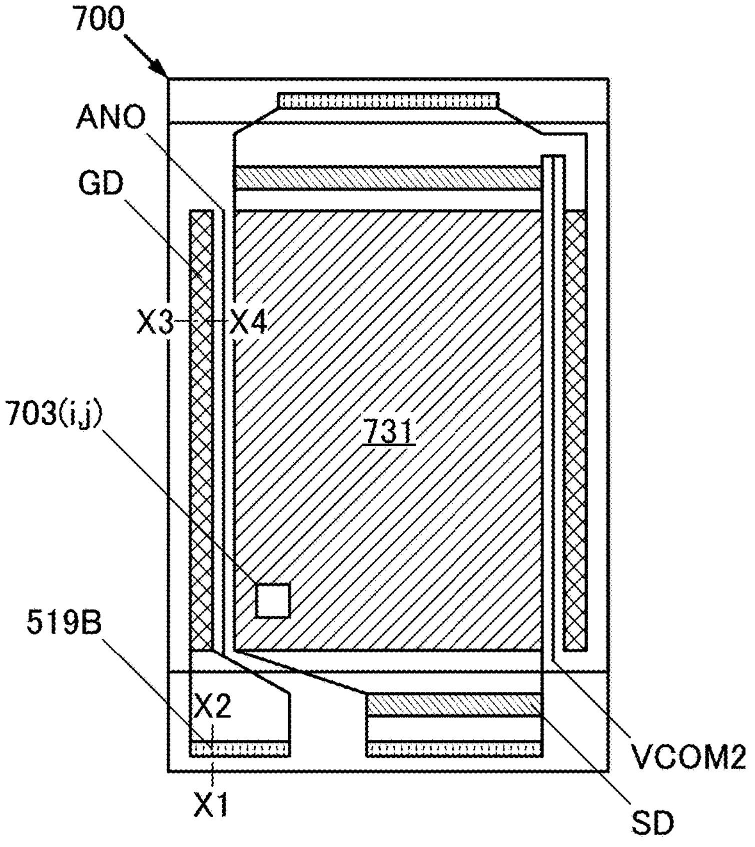
FIGS. 5A to 5C illustrate a structure of a display apparatus of an embodiment.
Figure 5B:
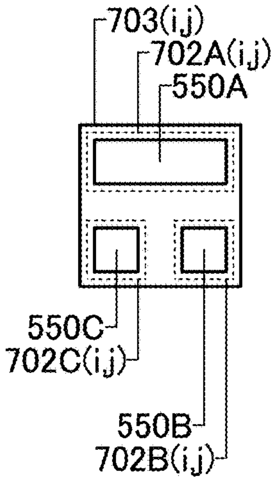
Figure 5C:
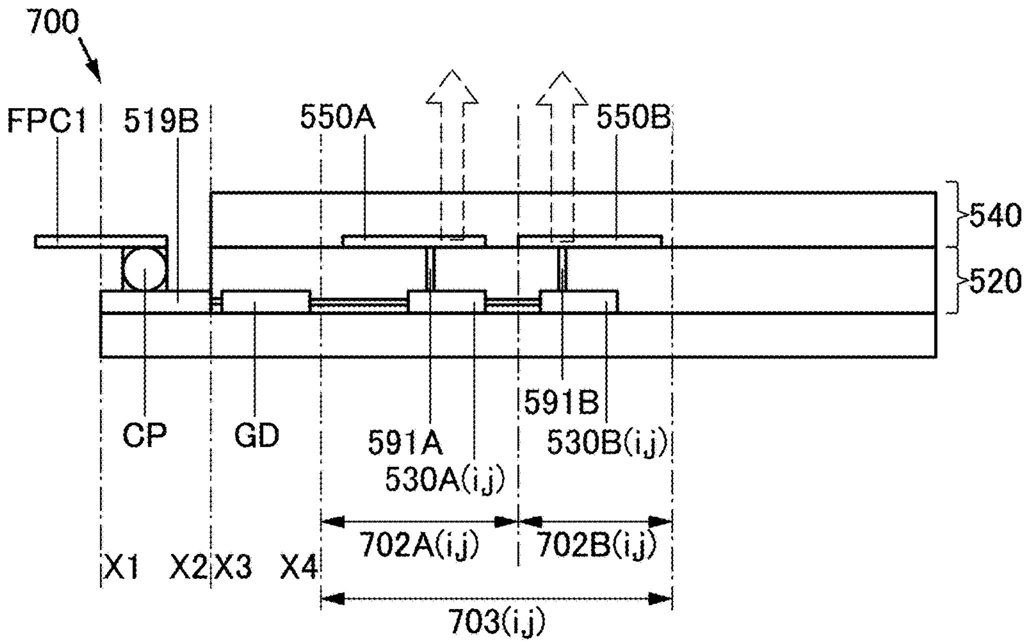

FIGS. 5A to 5C illustrate a structure of a display apparatus of one embodiment of the present invention. FIG. 5A is a top view of the display apparatus of one embodiment of the present invention, and FIG. 5B is a top view illustrating part of FIG. 5A. FIG. 5C illustrates cross sections taken along cutting lines X1-X2 and X3-X4 in FIG. 5A and a cross section of a pixel set 703(*ij*).

Figure 6:
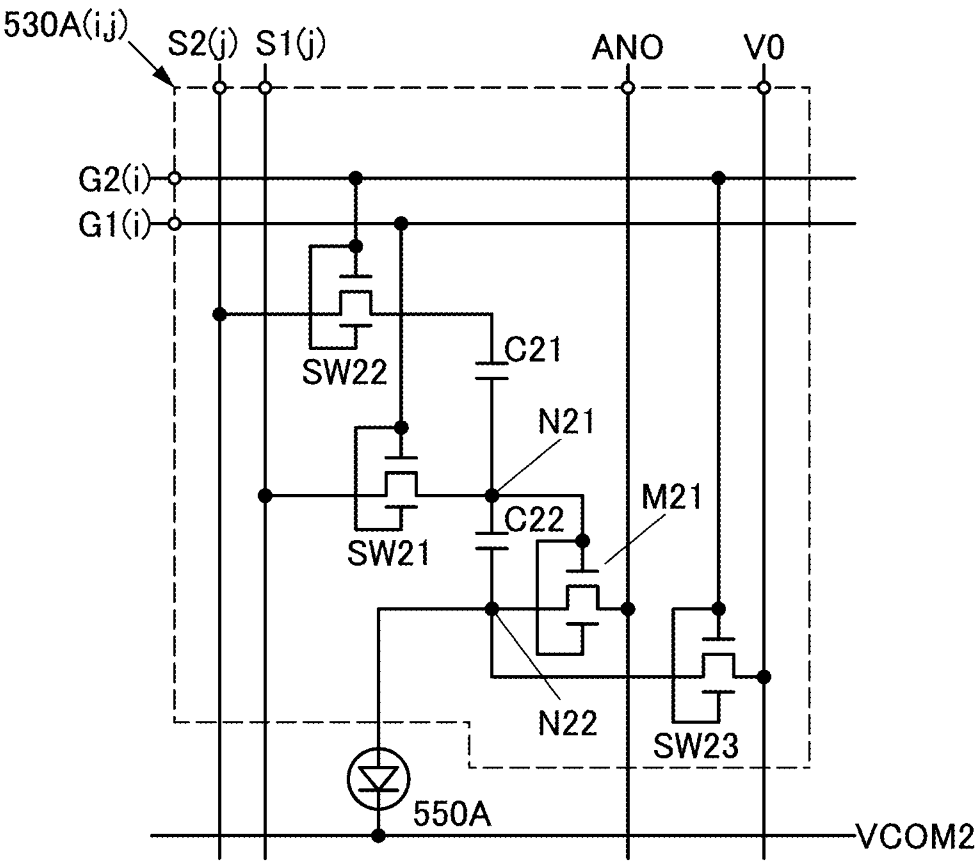
FIG. 6 illustrates a configuration of a display apparatus of an embodiment.

FIG. 6 is a circuit diagram illustrating the structure of the display apparatus of one embodiment of the present invention.

In this specification, an integer variable of 1 or more may be used for reference numerals. For example, "(p)" where p is an integer variable of 1 or more may be used for part of a reference numeral that specifies any one of up to p components. For another example, "(m,n)" where each of m and n is an integer variable of 1 or more may be used for part of a reference numeral that specifies any one of up to m×n components.

<Structure Example 1 of Display Apparatus 700>

The display apparatus 700 of one embodiment of the present invention includes a region 731 (see FIG. 5A). The region 731 includes the pixel set 703(*i,j*).

«Structure Example 1 of Pixel Set 703(*i,j*)»

The pixel set 703(*ij*) includes a pixel 702A(i,j), a pixel 702B(i,j), and a pixel 702C(i,j) (see FIGS. 5B and 5C).

The pixel 702A(i,j) includes a pixel circuit 530A(i,j) and the light-emitting device 550A. The light-emitting device 550A is electrically connected to the pixel circuit 530A(i,j).

For example, the light-emitting device described in any one of Embodiments 2 to 6 can be used as the light-emitting device 550A.

The pixel 702B(i,j) includes a pixel circuit 530B(i,j) and the light-emitting device 550B. The light-emitting device 550B is electrically connected to the pixel circuit 530B(i,j). Similarly, the pixel 702C(i,j) includes the light-emitting device 550C.

For example, the structure described in Embodiment 1 can be employed for the light-emitting devices 550A to 550C.

<Structure Example 2 of Display Apparatus 700>

The display apparatus 700 of one embodiment of the present invention includes a functional layer 540 and the functional layer 520 (see FIG. 5C). The functional layer 540 overlaps with the functional layer 520.

The functional layer 540 includes the light-emitting device 550A.

The functional layer 520 includes the pixel circuit 530A(i,j) and a wiring (see FIG. 5C). The pixel circuit 530A(i,j) is electrically connected to the wiring. For example, a conductive film provided in an opening 591A in the functional layer 520 can be used for the wiring. The wiring electrically connects a terminal 519B to the pixel circuit 530A(i,j). Note that a conductive material CP electrically connects the terminal 519B to a flexible printed circuit board FPC1. In addition, a conductive film provided in an opening 591B in the functional layer 520 can be used for the wiring, for example.

<Structure Example 3 of Display Apparatus 700>

In addition, the display apparatus 700 of one embodiment of the present invention includes a driver circuit GD and a driver circuit SD (see FIG. 5A).

«Structure Example of Driver Circuit GD»

The driver circuit GD supplies a first selection signal and a second selection signal.

«Structure Example of Driver Circuit SD»

The driver circuit SD supplies a first control signal and a second control signal.

«Structure Example of Wiring»

As the wiring, a conductive film G1(*i*), a conductive film G2(*i*), a conductive film S1(*j*), a conductive film S2(*j*), a conductive film ANO, a conductive film VCOM2, and a conductive film V0 are included (see FIG. 6).

The conductive film G1(*i*) is supplied with the first selection signal, and the conductive film G2(*i*) is supplied with the second selection signal.

The conductive film S1(*j*) is supplied with the first control signal, and the conductive film S2(*j*) is supplied with the second control signal.

«Structure Example 1 of Pixel Circuit 530A(i,j)»

The pixel circuit 530A(i,j) is electrically connected to the conductive film G1(*i*) and the conductive film S1(*j*). The conductive film G1(*i*) supplies the first selection signal, and the conductive film S1(*j*) supplies the first control signal.

The pixel circuit 530A(i,j) drives the light-emitting device 550A in response to the first selection signal and the first control signal. The light-emitting device 550A emits light.

In the light-emitting device 550A, one of the electrodes is electrically connected to the pixel circuit 530A(i,j) and the other electrode is electrically connected to the conductive film VCOM2.

«Structure Example 2 of Pixel Circuit 530A(i,j)»

The pixel circuit 530A(i,j) includes a switch SW21, a switch SW22, a transistor M21, a capacitor C21, and a node N21.

The transistor M21 includes a gate electrode electrically connected to the node N21, a first electrode electrically connected to the light-emitting device 550A, and a second electrode electrically connected to the conductive film ANO.

The switch SW21 includes a first terminal electrically connected to the node N21, a second terminal electrically connected to the conductive film S1(*j*), and a gate electrode having a function of controlling an on/off state of the switch SW21 according to the potential of the conductive film G1(*i*).

The switch SW22 includes a first terminal electrically connected to the conductive film S2(*j*), and a gate electrode having a function of controlling an on/off state of the switch SW22 according to the potential of the conductive film G2(*i*).

The capacitor C21 includes a conductive film electrically connected to the node N21 and a conductive film electrically connected to a second electrode of the switch SW22.

Accordingly, an image signal can be stored in the node N21. Alternatively, the potential of the node N21 can be changed using the switch SW22. Alternatively, the intensity of light emitted from the light-emitting device 550A can be controlled with the potential of the node N21. As a result, a novel apparatus that is highly convenient, useful, or reliable can be provided.

«Structure Example 3 of Pixel Circuit 530A(i,j)»

The pixel circuit 530A(i,j) includes a switch SW23, a node N22, and a capacitor C22.

The switch SW23 includes a first terminal electrically connected to the conductive film V0, a second terminal electrically connected to the node N22, and a gate electrode having a function of controlling an on/off state of the switch SW23 according to the potential of the conductive film G2(*i*).

The capacitor C22 includes a conductive film electrically connected to the node N21 and a conductive film electrically connected to the node N22.

The first electrode of the transistor M21 is electrically connected to the node N22.

This embodiment can be combined with any of the other embodiments in this specification as appropriate.

Embodiment 8

In this embodiment, a display module of one embodiment of the present invention is described.

<Display Module>

Figure 7:
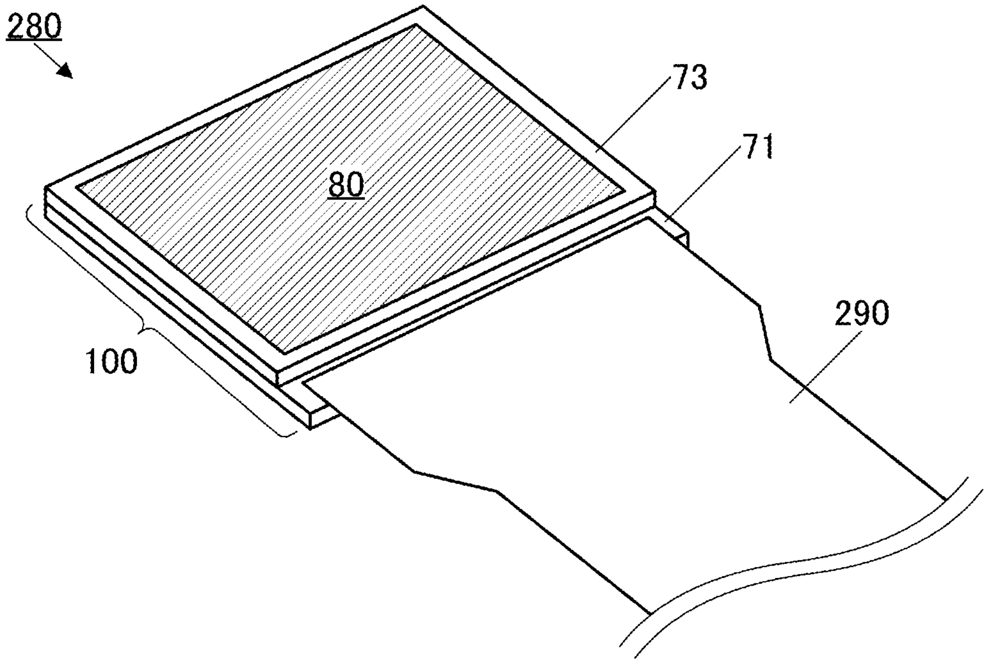
FIG. 7 illustrates a structure of a display module of an embodiment.

FIG. 7 is a perspective view illustrating a structure of a display module 280.

The display module 280 includes a display apparatus 100, and an FPC 290 or a connector. The display apparatus described in Embodiment 1 can be used as the display apparatus 100, for example.

The FPC 290 is supplied with a signal and electric power from the outside and supplies the signal and the electric power to the display apparatus 100. An IC may be mounted on the FPC 290. Note that a connector is a mechanical component for electrical connection through a conductor, and the conductor can electrically connect the display apparatus 100 to a component to be connected. For example, the FPC 290 can be used as the conductor. The connector can detach the display apparatus 100 from the connected component.

«Display Apparatus 100A»

Figure 8A:
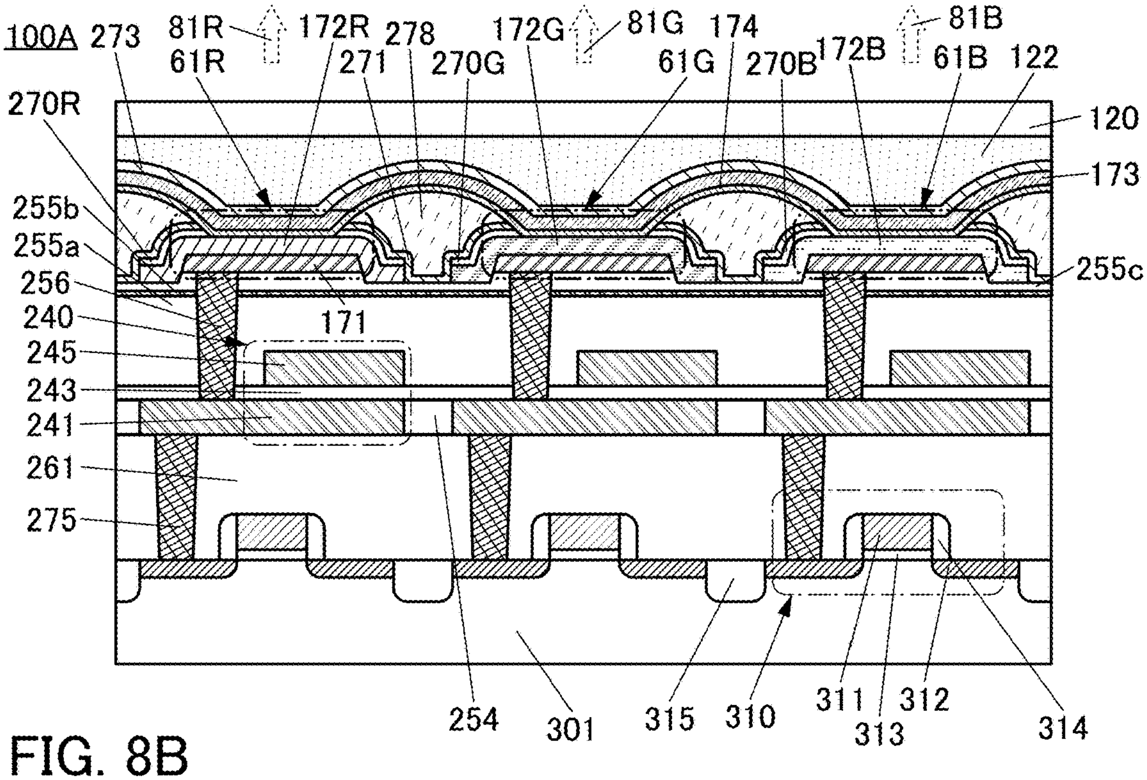
FIGS. 8A and 8B illustrate structures of display apparatuses of an embodiment.

FIG. 8A is a cross-sectional view illustrating a structure of a display apparatus 100A. The display apparatus 100A can be used as the display apparatus 100 of the display module 280, for example. A substrate 301 corresponds to a substrate 71 in FIG. 7.

The display apparatus 100A includes the substrate 301, a transistor 310, an element isolation layer 315, an insulating layer 261, a capacitor 240, an insulating layer 255 (an insulating layer 255*a*, an insulating layer 255*b*, and an insulating layer 255*c*), a light-emitting device 61R, a light-emitting device 61G, and a light-emitting device 61B. The insulating layer 261 is provided over the substrate 301, and the transistor 310 is positioned between the substrate 301 and the insulating layer 261. The insulating layer 255*a* is provided over the insulating layer 261, the capacitor 240 is positioned between the insulating layer 261 and the insulating layer 255*a*, and the insulating layer 255*a* is positioned between the capacitors 240 and the light-emitting devices 61R, 61G, and 61B.

[Transistor 310]

The transistor 310 includes a conductive layer 311, a pair of low-resistance regions 312, an insulating layer 313, and an insulating layer 314, and its channel is formed in part of the substrate 301. The conductive layer 311 functions as a gate electrode. The insulating layer 313 is positioned between the substrate 301 and the conductive layer 311 and functions as a gate insulating layer. The substrate 301 includes the pair of low-resistance regions 312 doped with an impurity. Note that such regions function as a source and a drain. The side surface of the conductive layer 311 is covered with the insulating layer 314.

The element isolation layer 315 is embedded in the substrate 301, and positioned between two adjacent transistors 310.

[Capacitor 240]

The capacitor 240 includes a conductive layer 241, a conductive layer 245, and an insulating layer 243, and the insulating layer 243 is positioned between the conductive layer 241 and the conductive layer 245. The conductive layer 241 functions as one electrode of the capacitor 240, the conductive layer 245 functions as the other electrode of the capacitor 240, and the insulating layer 243 functions as a dielectric of the capacitor 240.

The conductive layer 241 is positioned over the insulating layer 261 and is embedded in an insulating layer 254. The conductive layer 241 is electrically connected to one of the source and the drain of the transistor 310 through a plug 275 embedded in the insulating layer 261. The insulating layer 243 covers the conductive layer 241. The conductive layer 245 overlaps with the conductive layer 241 with the insulating layer 243 therebetween.

[Insulating Layer 255]

The insulating layer 255 includes the insulating layer 255*a*, the insulating layer 255*b*, and the insulating layer 255*c*, and the insulating layer 255*b* is positioned between the insulating layer 255*a* and the insulating layer 255*c*.

[Light-Emitting Device 61R, Light-Emitting Device 61G, and Light-Emitting Device 61B]

The light-emitting devices 61R, 61G, and 61B are provided over the insulating layer 255*c*. For example, the light-emitting device described in any of Embodiments 2 to 6 can be used as any of the light-emitting devices 61R, 61G, and 61B.

The light-emitting device 61R includes a conductive layer 171 and an EL layer 172R, and the EL layer 172R covers the top and side surfaces of the conductive layer 171. A sacrificial layer 270R is positioned over the EL layer 172R. The light-emitting device 61G includes the conductive layer 171 and an EL layer 172G, and the EL layer 172G covers the top and side surfaces of the conductive layer 171. A sacrificial layer 270G is positioned over the EL layer 172G. The light-emitting device 61B includes the conductive layer 171 and an EL layer 172B, and the EL layer 172B covers the top and side surfaces of the conductive layer 171. A sacrificial layer 270B is positioned over the EL layer 172B.

The conductive layer 171 is electrically connected to one of the source and the drain of the transistor 310 through a plug 256 embedded in the insulating layers 243, 255*a*, 255*b*, and 255*c*, the conductive layer 241 embedded in the insulating layer 254, and the plug 275 embedded in the insulating layer 261. The top surface of the insulating layer 255*c* and the top surface of the plug 256 are level with or substantially level with each other. Any of a variety of conductive materials can be used for the plugs.

[Protective Layer 271, Insulating Layer 278, Protective Layer 273, and Bonding Layer 122]

A protective layer 271 and an insulating layer 278 are positioned between adjacent light-emitting devices, e.g., between the light-emitting device 61R and the light-emitting device 61G, and the insulating layer 278 is provided over the protective layer 271. A protective layer 273 is provided over the light-emitting devices 61R, 61G, and 61B.

A bonding layer 122 attaches the protective layer 273 to a substrate 120.

[Substrate 120]

The substrate 120 corresponds to a substrate 73 in FIG. 7. A light-blocking layer can be provided for the surface of the substrate 120 on the bonding layer 122 side, for example. A variety of optical members can be provided on the outer side of the substrate 120.

A film can be used as the substrate. In particular, a film with a low water absorption rate can be suitably used. For example, the water absorption rate is preferably 1% or lower, further preferably 0.1% or lower. Thus, a change in size of the film can be inhibited. Furthermore, generation of wrinkles or the like can be inhibited. Moreover, a change in shape of the display apparatus can be inhibited.

For example, a polarizing plate, a retardation plate, a light diffusion layer (e.g., a diffusion film), an anti-reflection layer, a light-condensing film, or the like can be used as the optical member.

It is possible that a highly optically isotropic material, in other words, a material with a low birefringence index is used for the substrate and a circular polarizing plate is provided to overlap with the display apparatus. For example, it is possible to use, for the substrate, a material that has an absolute value of a retardation (phase difference) of 30 nm or less, preferably 20 nm or less, further preferably 10 nm or less. For example, a triacetyl cellulose (TAC, also referred to as cellulose triacetate) film, a cycloolefin polymer (COP) film, a cycloolefin copolymer (COC) film, or an acrylic resin film can be used as a highly optically isotropic film.

Furthermore, an antistatic film inhibiting the attachment of dust, a water repellent film inhibiting the attachment of stain, a hard coat film inhibiting generation of a scratch caused by the use, an impact-absorbing layer, or the like may be provided as a surface protective layer on the outer surface of the substrate 120. For example, a glass layer, silica ($SiO_x$), diamond like carbon (DLC), aluminum oxide ($AlO_x$), a polyester-based material, a polycarbonate-based material, or the like can be used for the surface protective layer. Note that a material having a high visible light transmittance can be suitably used for the surface protective layer. In addition, a material having high hardness can be suitably used for the surface protective layer.

Figure 8B:
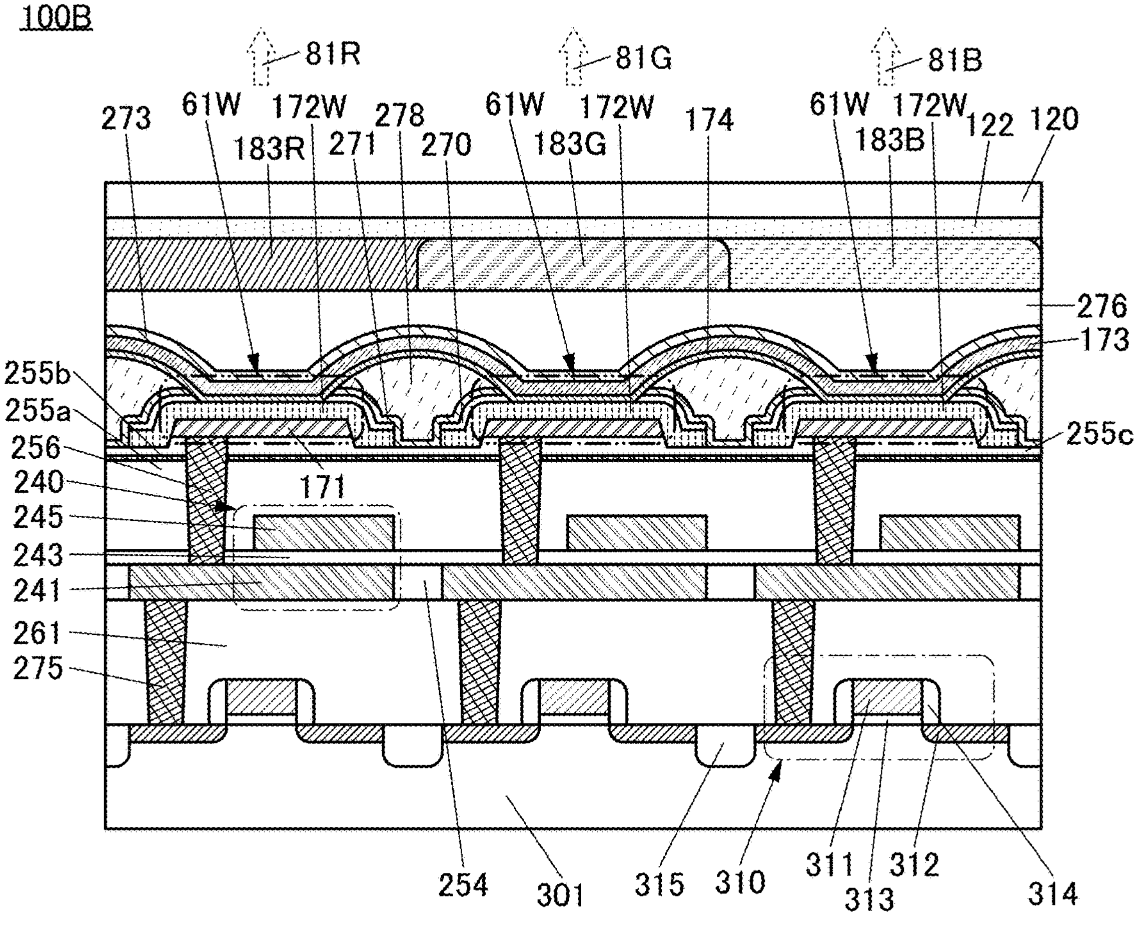

«Display Apparatus 100B»FIG. 8B is a cross-sectional view illustrating a structure of a display apparatus 100B. For example, the display apparatus 100B can be used as the display apparatus 100 of the display module 280 (see FIG. 7).

The display apparatus 100B includes the substrate 301, a light-emitting device 61W, the capacitor 240, and the transistor 310. The light-emitting device 61W can emit white light, for example.

The display apparatus 100B includes a coloring layer 183R, a coloring layer 183G, and a coloring layer 183B. The coloring layer 183R overlaps with one light-emitting device 61W, the coloring layer 183G overlaps with another light-emitting device 61W, and the coloring layer 183B overlaps with another light-emitting device 61W.

For example, the coloring layer 183R, the coloring layer 183G, and the coloring layer 183B can transmit red light, green light, and blue light, respectively.

«Display Apparatus 100C»

Figure 9:
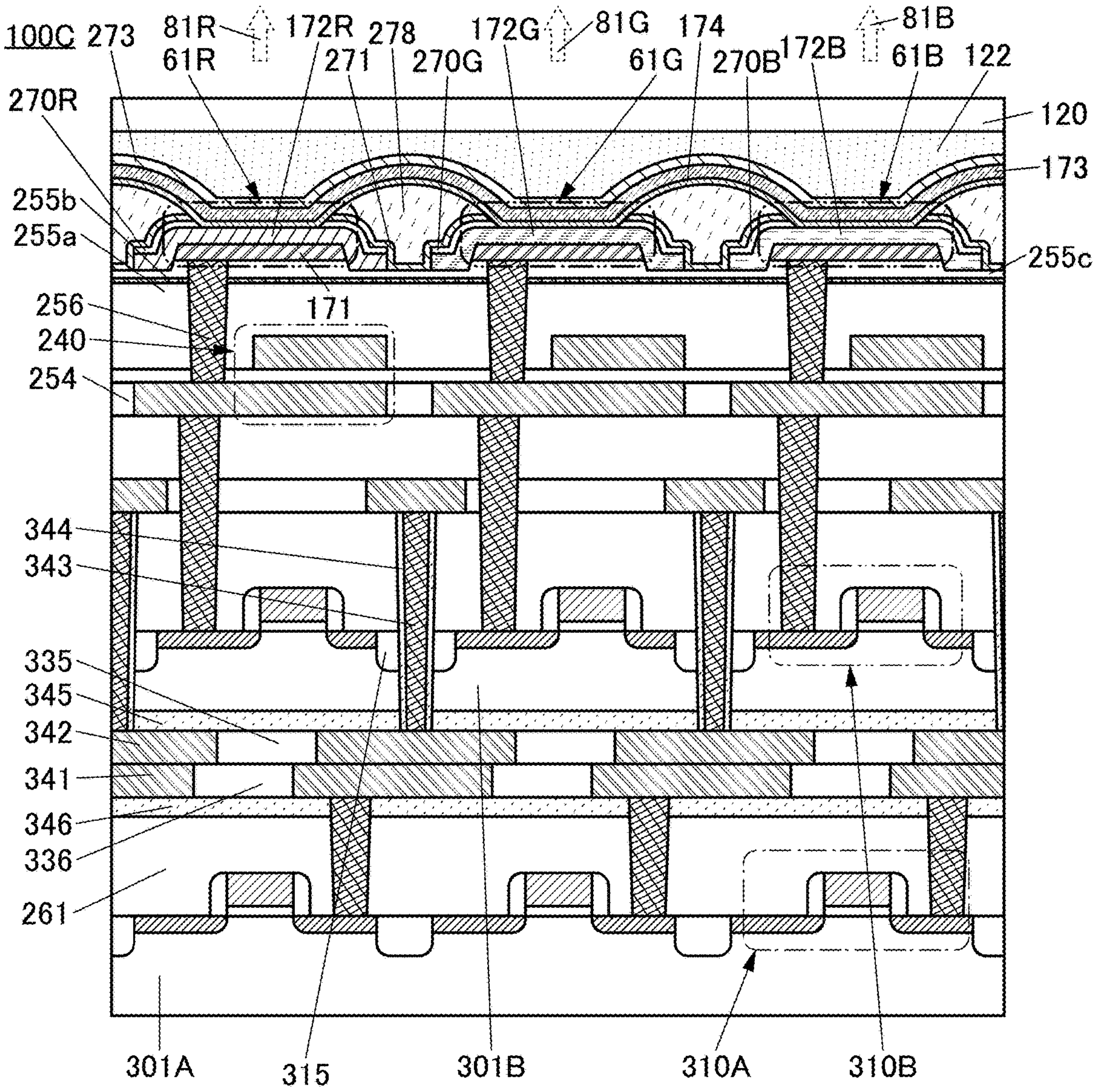
FIG. 9 illustrates a structure of a display apparatus of an embodiment.

FIG. 9 is a cross-sectional view illustrating a structure of a display apparatus 100C. The display apparatus 100C can be used as the display apparatus 100 of the display module 280, for example (see FIG. 7). Note that in the following description of display apparatuses, the description of portions similar to those of the above-described display apparatuses may be omitted.

The display apparatus 100C includes a substrate 301B and a substrate 301A. The display apparatus 100C includes a transistor 310B, the capacitor 240, the light-emitting devices 61R, 61G, and 61B, and a transistor 310A. A channel of the transistor 310A is formed in part of the substrate 301A and a channel of the transistor 310B is formed in part of the substrate 301B.

[Insulating Layer 345 and Insulating Layer 346]

An insulating layer 345 is in contact with the bottom surface of the substrate 301B, and an insulating layer 346 is positioned over the insulating layer 261. For example, the inorganic insulating film that can be used as the protective layer 273 can be used as the insulating layers 345 and 346. The insulating layers 345 and 346 function as protective layers and can inhibit impurities from being diffused into the substrates 301B and 301A.

[Plug 343]

A plug 343 penetrates the substrate 301B and the insulating layer 345. An insulating layer 344 covers the side surface of the plug 343. For example, the inorganic insulating film that can be used as the protective layer 273 can be used as the insulating layer 344. The insulating layer 344 functions as a protective layer and can inhibit impurities from being diffused into the substrate 301B.

[Conductive Layer 342]

A conductive layer 342 is positioned between the insulating layer 345 and the insulating layer 346. It is preferable that the conductive layer 342 be embedded in an insulating layer 335 and a plane formed by the conductive layer 342 and the insulating layer 335 be preferably flat. Note that the conductive layer 342 is electrically connected to the plug 343.

[Conductive Layer 341]

A conductive layer 341 is positioned between the insulating layer 346 and the insulating layer 335. It is preferable that the conductive layer 341 be embedded in an insulating layer 336 and a plane formed by the conductive layer 341 and the insulating layer 336 be flat. The conductive layer 341 is bonded to the conductive layer 342. Thus, the substrate 301A is electrically connected to the substrate 301B.

The conductive layers 341 and 342 are preferably formed using the same conductive material. For example, it is possible to use a metal film containing an element selected from Al, Cr, Cu, Ta, Ti, Mo, and W, or a metal nitride film containing any of the above elements as a component (e.g., a titanium nitride film, a molybdenum nitride film, or a tungsten nitride film). Copper is particularly preferably used for the conductive layers 341 and 342. In that case, it is possible to employ copper-to-copper (Cu-to-Cu) direct bonding (a technique for achieving electrical continuity by connecting copper (Cu) pads).

«Display Apparatus 100D»

Figure 10:
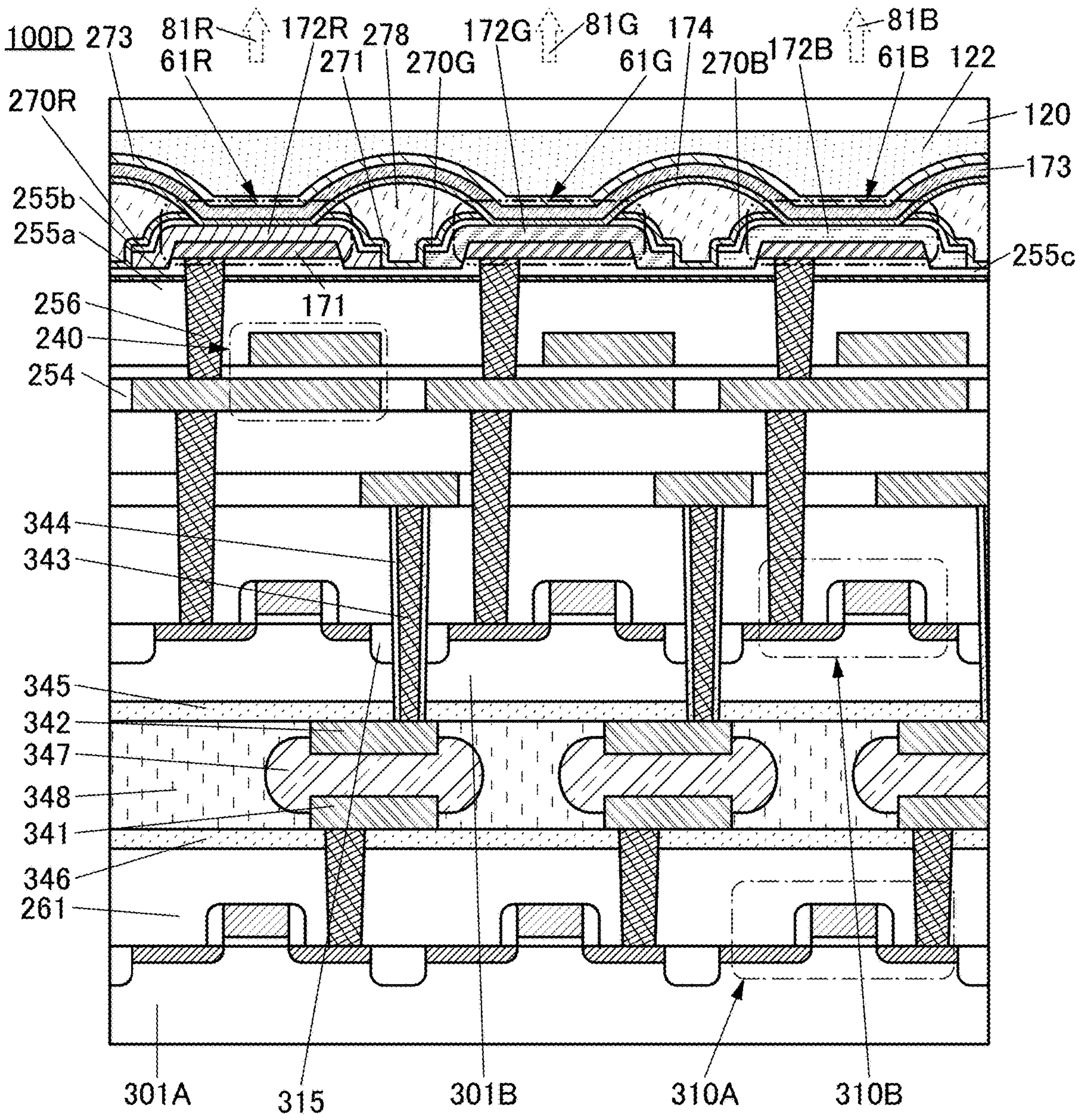
FIG. 10 illustrates a structure of a display apparatus of an embodiment.

FIG. 10 is a cross-sectional view illustrating a structure of a display apparatus 100D. The display apparatus 100D can be used as the display apparatus 100 of the display module 280, for example (see FIG. 7).

The display apparatus 100D includes a bump 347, and the bump 347 bonds the conductive layer 341 to the conductive layer 342. The bump 347 electrically connects the conductive layer 341 to the conductive layer 342. The bump 347 can be formed using a conductive material containing gold (Au), nickel (Ni), indium (In), tin (Sn), or the like, for example. Solder can be used for the bump 347, for example.

The display apparatus 100D includes a bonding layer 348. The bonding layer 348 attaches the insulating layer 345 to the insulating layer 346.

«Display Apparatus 100E»

Figure 11:
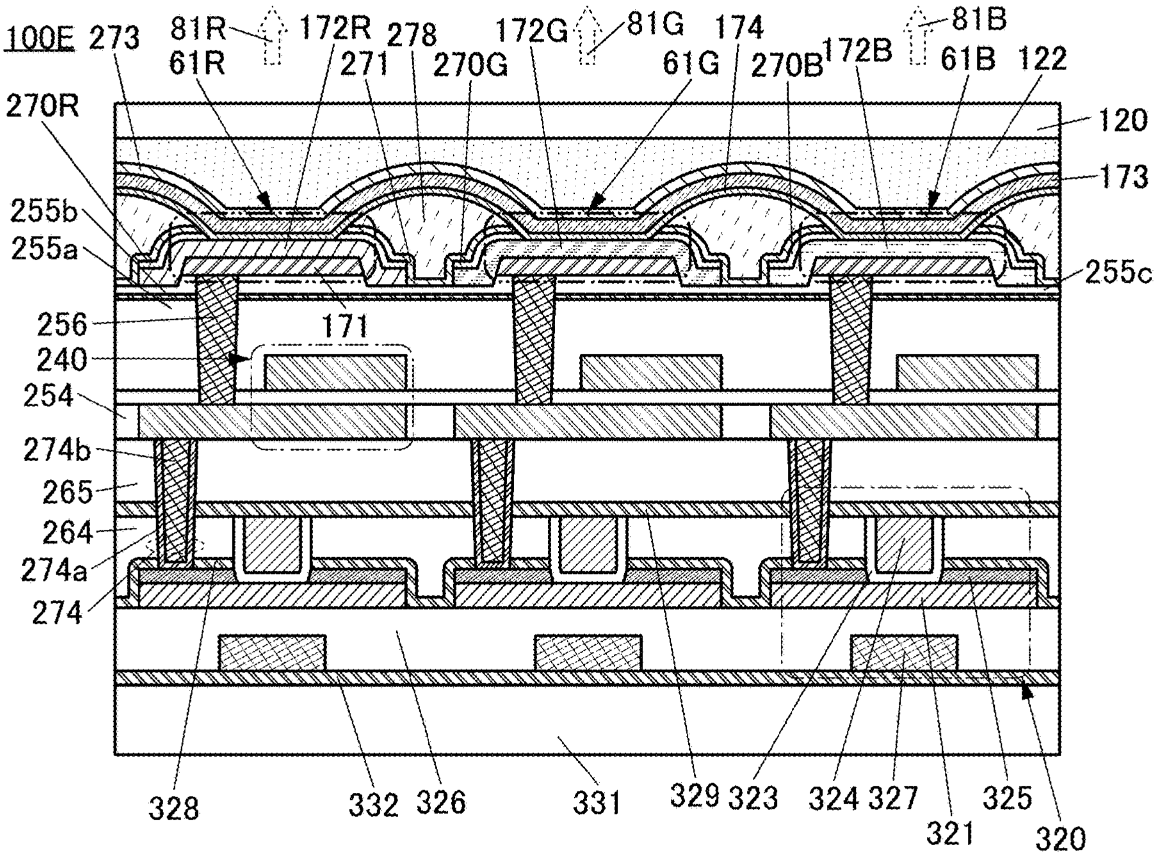
FIG. 11 illustrates a structure of a display apparatus of an embodiment.

FIG. 11 is a cross-sectional view illustrating a structure of a display apparatus 100E. The display apparatus 100E can be used as the display apparatus 100 of the display module 280, for example (see FIG. 7). A substrate 331 corresponds to the substrate 71 in FIG. 7. An insulating substrate or a semiconductor substrate can be used as the substrate 331. The display apparatus 100E includes a transistor 320. Note that the display apparatus 100E is different from the display apparatus 100A in that the transistor is an OS transistor.

[Insulating Layer 332]

An insulating layer 332 is provided over the substrate 331. For example, a film in which hydrogen or oxygen is less likely to be diffused than in a silicon oxide film can be used as the insulating layer 332. Specifically, an aluminum oxide film, a hafnium oxide film, a silicon nitride film, or the like can be used as the insulating layer 332. Thus, the insulating layer 332 can prevent impurities such as water and hydrogen from being diffused from the substrate 331 into the transistor 320. Furthermore, oxygen can be prevented from being released from a semiconductor layer 321 to the insulating layer 332 side.

[Transistor 320]

The transistor 320 includes the semiconductor layer 321, an insulating layer 323, a conductive layer 324, a pair of conductive layers 325, an insulating layer 326, and a conductive layer 327.

The conductive layer 327 is provided over the insulating layer 332 and functions as a first gate electrode of the transistor 320. The insulating layer 326 covers the conductive layer 327. Part of the insulating layer 326 functions as a first gate insulating layer. The insulating layer 326 includes an oxide insulating film at least in a region in contact with the semiconductor layer 321. Specifically, a silicon oxide film or the like is preferably used. The insulating layer 326 has a flat top surface. The semiconductor layer 321 is provided over the insulating layer 326. A metal oxide film having semiconductor characteristics can be used as the semiconductor layer 321. The pair of conductive layers 325 is provided on and in contact with the semiconductor layer 321, and functions as a source electrode and a drain electrode.

[Insulating Layer 328 and Insulating Layer 264]

An insulating layer 328 covers the top and side surfaces of the pair of conductive layers 325, the side surface of the semiconductor layer 321, and the like. An insulating layer 264 is provided over the insulating layer 328 and functions as an interlayer insulating layer. The insulating layers 328 and 264 have an opening reaching the semiconductor layer 321. For example, an insulating film similar to the insulating layer 332 can be used as the insulating layer 328. Thus, the insulating layer 328 can prevent impurities such as water and hydrogen from being diffused from the insulating layer 264 into the semiconductor layer 321. Furthermore, oxygen can be prevented from being released from the semiconductor layer 321.

[Insulating Layer 323]

The insulating layer 323 is in contact with the side surfaces of the insulating layers 264 and 328 and the conductive layer 325 and the top surface of the semiconductor layer 321 inside the opening.

[Conductive Layer 324]

Inside the opening, the conductive layer 324 is embedded and in contact with the insulating layer 323. The conductive layer 324 has a top surface subjected to planarization treatment, and is level with or substantially level with the top surface of the insulating layer 323 and the top surface of the insulating layer 264. The conductive layer 324 functions as a second gate electrode, and the insulating layer 323 functions as a second gate insulating layer.

[Insulating Layer 329 and Insulating Layer 265]

An insulating layer 329 covers the conductive layer 324 and the insulating layers 323 and 264. An insulating layer 265 is provided over the insulating layer 329 and functions as an interlayer insulating layer. For example, an insulating film similar to the insulating layers 328 and 332 can be used as the insulating layer 329. Thus, impurities such as water and hydrogen can be prevented from being diffused from the insulating layer 265 into the transistor 320, for example.

[Plug 274]

A plug 274 is embedded in the insulating layers 265, 329, 264, and 328 and is electrically connected to one of the pair of conductive layers 325. The plug 274 includes a conductive layer 274*a* and a conductive layer 274*b*. The conductive layer 274*a* is in contact with each of the side surfaces of openings in the insulating layers 265, 329, 264, and 328. In addition, the conductive layer 274*a* covers part of the top surface of the conductive layer 325. The conductive layer 274*b* is in contact with the top surface of the conductive layer 274*a*. For example, a conductive material in which hydrogen and oxygen are less likely to be diffused can be suitably used for the conductive layer 274*a*.

«Display Apparatus 100F»

Figure 12:
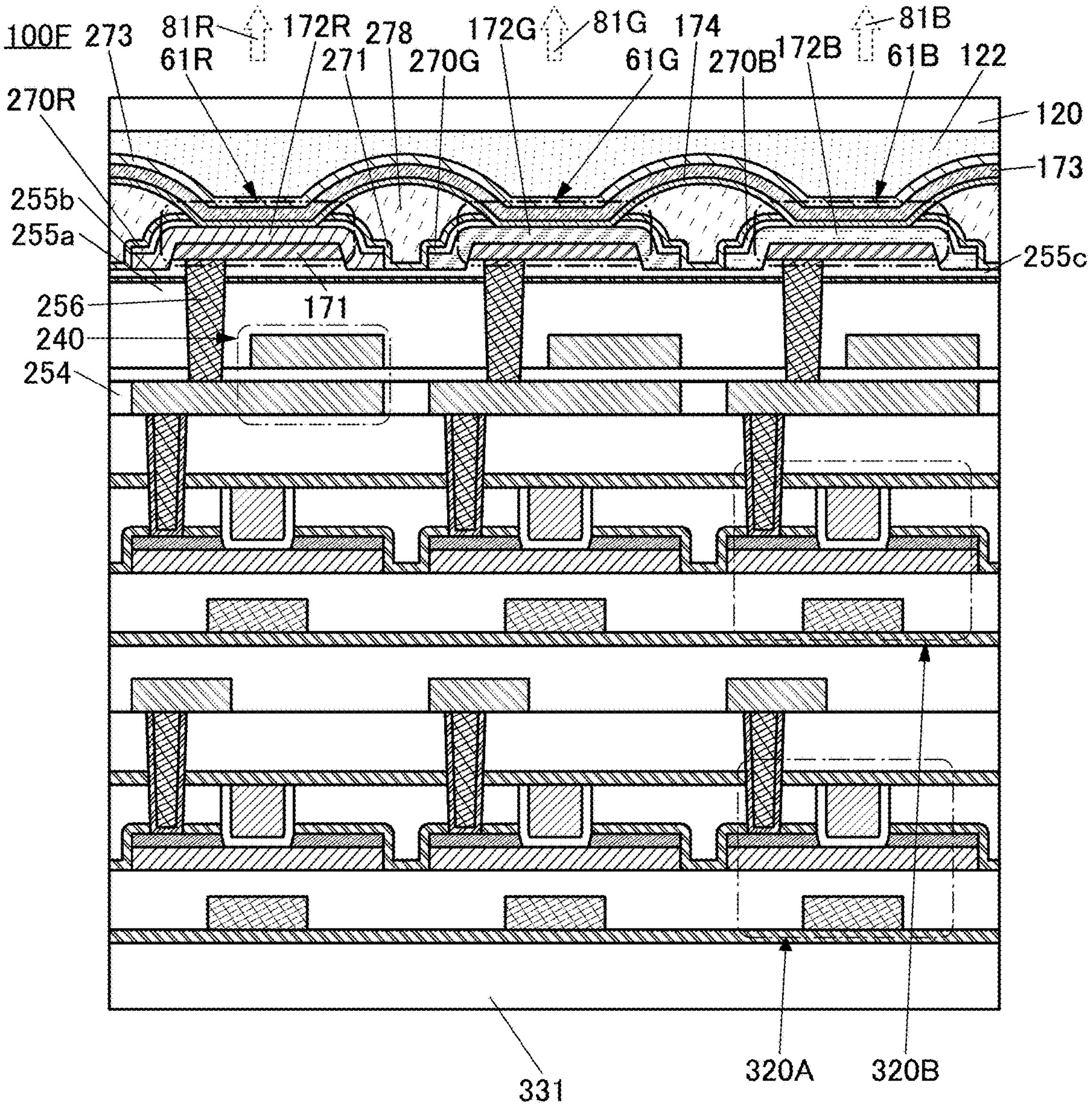
FIG. 12 illustrates a structure of a display apparatus of an embodiment.

FIG. 12 is a cross-sectional view illustrating a structure of a display apparatus 100F. The display apparatus 100F has a structure in which a transistor 320A and a transistor 320B are stacked. Each of the transistors 320A and 320B includes an oxide semiconductor and a channel formed in the oxide semiconductor. Note that the structure of the display apparatus 100F is not limited to the stacked-layer structure of two transistors, and may be a structure in which three or more transistors are stacked, for example.

The structures of the transistor 320A and the peripheral components are the same as those of the transistor 320 and the peripheral components of the display apparatus 100E. The structures of the transistor 320B and the peripheral components are the same as those of the transistor 320 and the peripheral components of the display apparatus 100E.

«Display Apparatus 100G»

Figure 13:
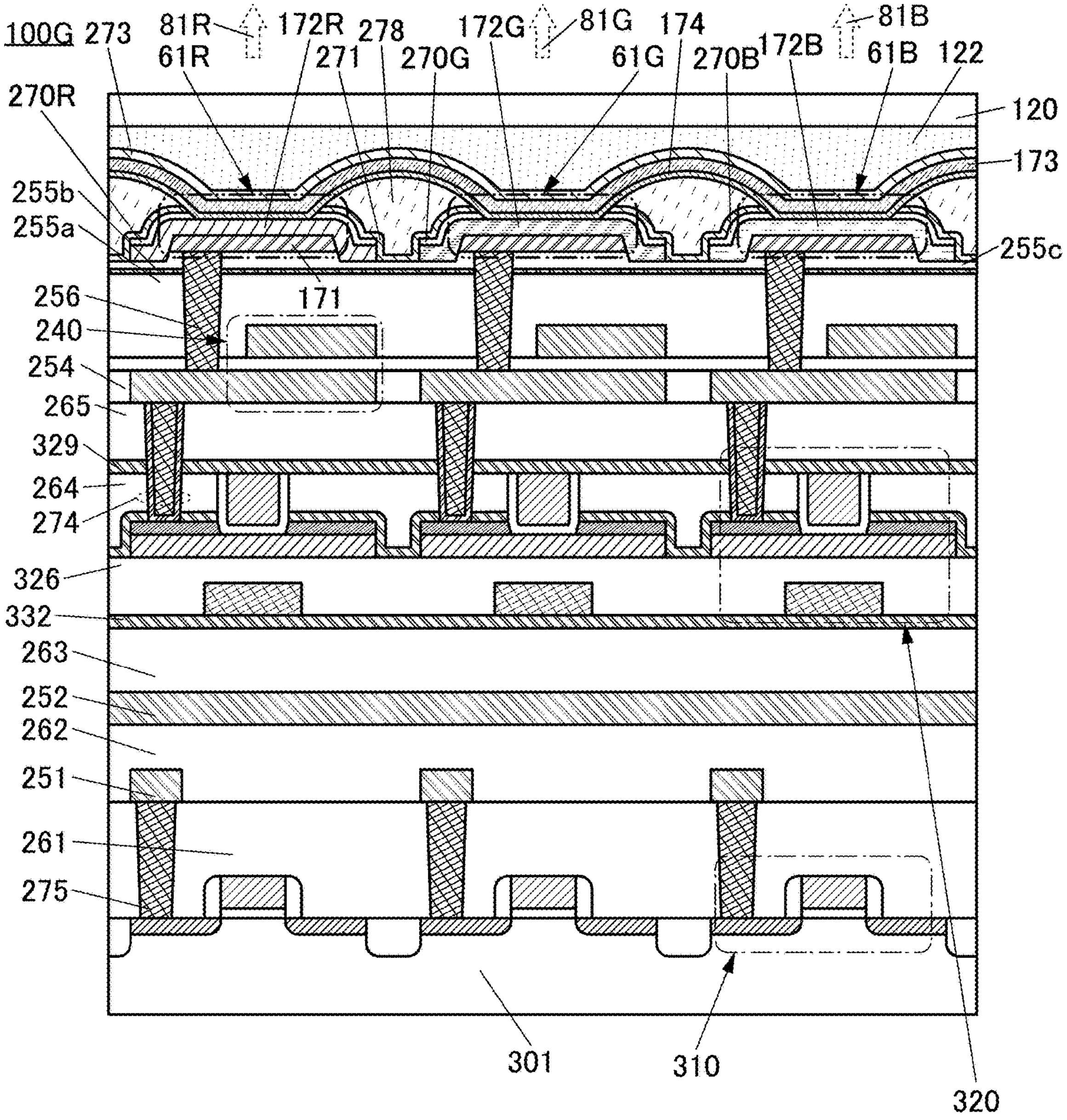
FIG. 13 illustrates a structure of a display apparatus of an embodiment.

FIG. 13 is a cross-sectional view illustrating a structure of a display apparatus 100G. The display apparatus 100G has a structure in which the transistor 310 and the transistor 320 are stacked. The channel of the transistor 310 is formed in the substrate 301. The transistor 320 includes an oxide semiconductor and the channel formed in the oxide semiconductor.

The insulating layer 261 covers the transistor 310 and a conductive layer 251 is provided over the insulating layer 261. An insulating layer 262 covers the conductive layer 251 and a conductive layer 252 is provided over the insulating layer 262. An insulating layer 263 and the insulating layer 332 covers the conductive layer 252. The conductive layer 251 and the conductive layer 252 each function as a wiring.

The transistor 320 is provided over the insulating layer 332 and the insulating layer 265 covers the transistor 320. The capacitor 240 is provided over the insulating layer 265 and is electrically connected to the transistor 320 through the plug 274.

For example, the transistor 320 can be used as a transistor included in a pixel circuit. For another example, the transistor 310 can be used as a transistor included in a pixel circuit or for a driver circuit (e.g., a gate driver circuit or a source driver circuit) for driving the pixel circuit. The transistor 310 and the transistor 320 can be used for a variety of circuits such as an arithmetic circuit and a memory circuit. Thus, not only a pixel circuit but also a driver circuit can be provided directly under the light-emitting device, for example. The display apparatus can be downsized as compared to the case where a driver circuit is provided around a display region.

At least part of this embodiment can be implemented in combination with any of the other embodiments described in this specification, as appropriate.

Embodiment 9

In this embodiment, a display module of one embodiment of the present invention is described.

<Display Module>

Figure 14:
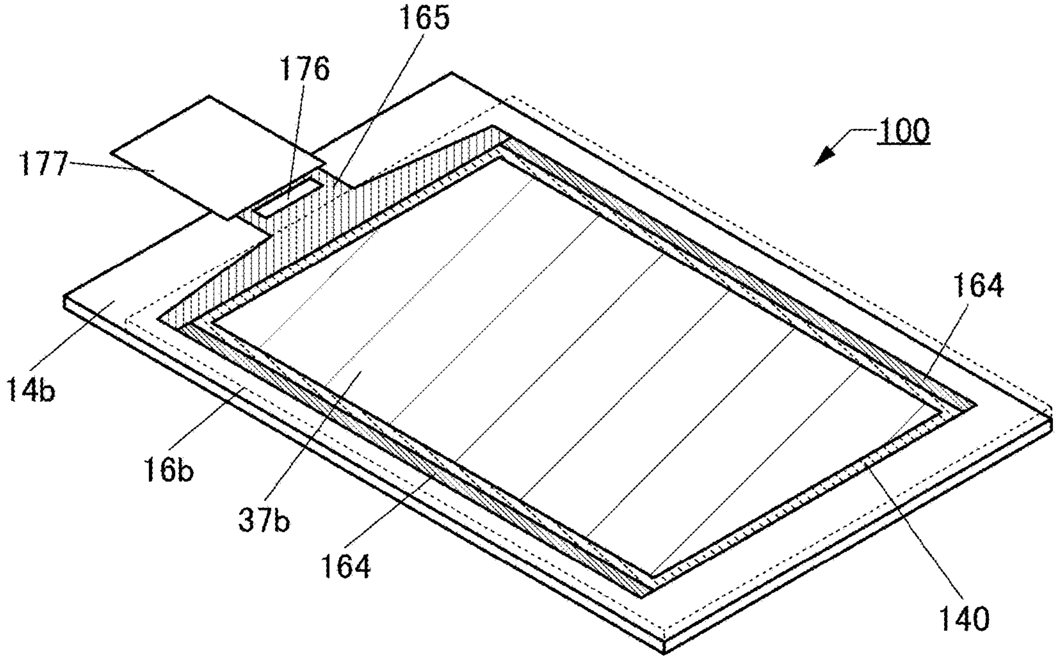
FIG. 14 illustrates a structure of a display module of an embodiment.

FIG. 14 is a perspective view illustrating a structure of a display module.

The display module includes the display apparatus 100, an integrated circuit (IC) 176, and one of an FPC 177 and a connector. The display apparatus described in Embodiment 1 can be used as the display apparatus 100, for example.

The display apparatus 100 is electrically connected to the IC 176 and the FPC 177. The FPC 177 is supplied with a signal and electric power from the outside and supplies the signal and the electric power to the display apparatus 100. Note that a connector is a mechanical component for electrical connection through a conductor, and the conductor can electrically connect the display apparatus 100 to a component to be connected. For example, the FPC 177 can be used as the conductor. The connector can detach the display apparatus 100 from the connected component.

The display module includes the IC 176. For example, the IC 176 can be provided for a substrate **14*b* by a chip on glass (COG) method. Alternatively, the IC 176 can be provided for an FPC by a chip on film (COF) method, for example. Note that a gate driver circuit, a source driver circuit, or the like can be used as the IC 176**.

«Display Apparatus 100H»

Figure 15A:
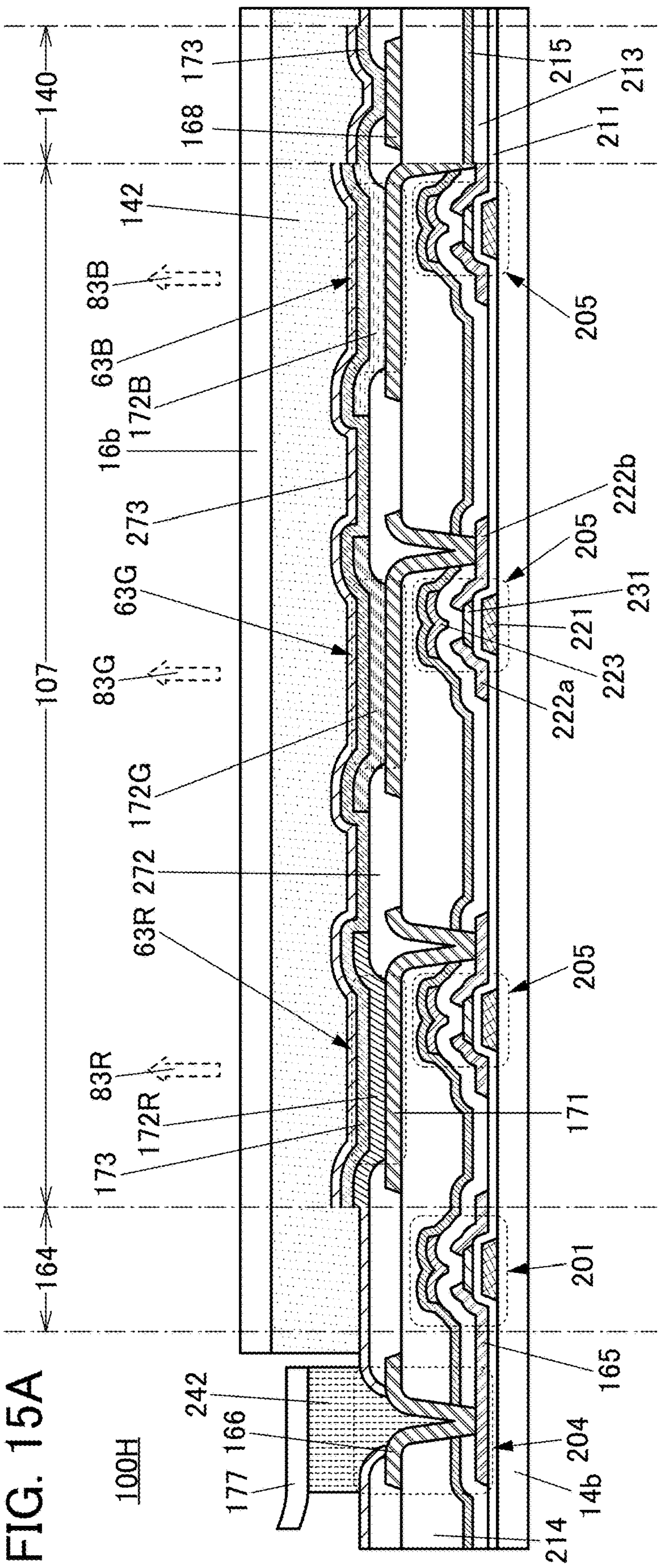
FIGS. 15A to 15C illustrate a structure of a display apparatus of an embodiment.

FIG. 15A is a cross-sectional view illustrating a structure of a display apparatus 100H.

The display apparatus 100H includes a display portion **37*b*, a connection portion 140, a circuit 164, a wiring 165, and the like. The display apparatus 100H includes a substrate 16*b* and the substrate 14*b*, which are bonded to each other. The display apparatus 100H includes one or more connection portions 140. The connection portion(s) 140 can be provided outside the display portion 37*b*. For example, the connection portion 140 can be provided along one side of the display portion 37*b*. Alternatively, the connection portion(s) 140 can be provided along a plurality of sides, for example, the connection portion(s) 140 can be provided to surround four sides. In the connection portion 140**, a common electrode of a light-emitting device is electrically connected to a conductive layer, which supplies a predetermined potential to the common electrode.

The wiring 165 is supplied with a signal or electric power from the FPC 177 or the IC 176. The wiring 165 supplies a signal and electric power to the display portion **37*b* and the circuit 164**.

For example, a gate driver circuit can be used as the circuit 164.

The display apparatus 100H includes the substrate **14*b*, the substrate 16*b*, a transistor 201, a transistor 205, a light-emitting device 63R, a light-emitting device 63G, alight-emitting device 63B, and the like (see FIG. 15A). For example, the light-emitting device 63R emits red light 83R, the light-emitting device 63G emits green light 83G, and the light-emitting device 63B emits blue light 83B. Note that a variety of optical members can be provided on the outer side of the substrate 16*b***. For example, a polarizing plate, a retardation plate, a light diffusion layer (e.g., a diffusion film), an anti-reflection layer, a light-condensing film, or the like can be provided.

For example, the light-emitting device described in any of Embodiments 2 to 6 can be used as each of the light-emitting devices 63R, 63G, and 63B.

The light-emitting device includes the conductive layer 171, which functions as a pixel electrode. The conductive layer 171 includes a recessed portion, which overlaps with an opening provided in an insulating layer 214, an insulating layer 215, and an insulating layer 213. The transistor 205 includes a conductive layer **222*b*, which is electrically connected to the conductive layer 171**.

The display apparatus 100H includes an insulating layer 272. The insulating layer 272 covers an end portion of the conductive layer 171 to fill the recessed portion of the conductive layer 171 (see FIG. 15A).

The display apparatus 100H includes the protective layer 273 and a bonding layer 142. The protective layer 273 covers the light-emitting devices 63R, 63G, and 63B. The protective layer 273 and the substrate **16*b* are bonded to each other with the bonding layer 142. The bonding layer 142 fills a gap between the substrate 16*b* and the protective layer 273. Note that the bonding layer 142 may be formed in a frame shape so as not to overlap with the light-emitting devices and a region surrounded by the bonding layer 142, the substrate 16*b*, and the protective layer 273 may be filled with a resin different from the material of the bonding layer 142. Alternatively, a hollow sealing structure may be employed, in which the region is filled with an inert gas (e.g., nitrogen or argon). For example, the material that can be used for the bonding layer 122 can be used for the bonding layer 142**.

The display apparatus 100H includes the connection portion 140, which includes a conductive layer 168. Note that a power supply potential is supplied to the conductive layer 168. The light-emitting device includes a conductive layer 173. The conductive layer 168 is electrically connected to the conductive layer 173, to which a power supply potential is supplied. Note that the conductive layer 173 functions as a common electrode. For example, the conductive layer 171 and the conductive layer 168 can be formed by processing one conductive film.

The display apparatus 100H has a top-emission structure. The light-emitting device emits light to the substrate **16*b* side. The conductive layer 171 contains a material reflecting visible light, and the conductive layer 173** transmits visible light.

[Insulating Layer 211, Insulating Layer 213, Insulating Layer 215, and Insulating Layer 214]

An insulating layer 211, the insulating layer 213, the insulating layer 215, and the insulating layer 214 are provided in this order over the substrate 14*b*. Note that the number of insulating layers is not limited and each insulating layer may be a single layer or a stacked layer of two or more layers.

For example, an inorganic insulating film can be used as each of the insulating layers 211, 213, and 215. A silicon nitride film, a silicon oxynitride film, a silicon oxide film, a silicon nitride oxide film, an aluminum oxide film, or an aluminum nitride film can be used, for example. A hafnium oxide film, an yttrium oxide film, a zirconium oxide film, a gallium oxide film, a tantalum oxide film, a magnesium oxide film, a lanthanum oxide film, a cerium oxide film, a neodymium oxide film, or the like may be used. A stack including two or more of the above insulating films may also be used.

The insulating layers 215 and 214 cover the transistors. The insulating layer 214 functions as a planarization layer. For example, a material in which impurities such as water and hydrogen are less likely to be diffused is preferably used for the insulating layer 215 or the insulating layer 214. This can effectively inhibit impurities from being diffused to the transistors from the outside. Furthermore, the reliability of the display apparatus can be improved.

For example, an organic insulating layer can be favorably used as the insulating layer 214. Specifically, an acrylic resin, a polyimide resin, an epoxy resin, a polyamide resin, a polyimide-amide resin, a siloxane resin, a benzocyclobutene-based resin, a phenol resin, a precursor of any of these resins, or the like can be used for the organic insulating layer. Alternatively, the insulating layer 214 can have a stacked-layer structure of an organic insulating layer and an inorganic insulating layer. Thus, the outermost layer of the insulating layer 214 can be used as an etching protective layer. For example, in the case where a phenomenon of forming a recessed portion in the insulating layer 214 should be avoided in processing the conductive layer 171 into a predetermined shape, the phenomenon can be inhibited.

[Transistor 201 and Transistor 205]

The transistor 201 and the transistor 205 are formed over the substrate 14*b*. These transistors can be fabricated using the same materials in the same steps.

Each of the transistors 201 and 205 includes a conductive layer 221, the insulating layer 211, a conductive layer 222*a*, the conductive layer 222*b*, a semiconductor layer 231, the insulating layer 213, and a conductive layer 223. The insulating layer 211 is positioned between the conductive layer 221 and the semiconductor layer 231. The conductive layer 221 functions as a gate and the insulating layer 211 functions as a first gate insulating layer. The conductive layer 222*a* and the conductive layer 222*b* function as a source and a drain. The insulating layer 213 is positioned between the conductive layer 223 and the semiconductor layer 231. The conductive layer 223 functions as a gate and the insulating layer 213 functions as a second gate insulating layer. Here, a plurality of layers obtained by processing the same conductive film are shown with the same hatching pattern.

There is no particular limitation on the structure of the transistors included in the display apparatus of this embodiment. For example, a planar transistor, a staggered transistor, or an inverted staggered transistor can be used. A top-gate transistor or a bottom-gate transistor can be used. Alternatively, gates may be provided above and below a semiconductor layer where a channel is formed.

The structure in which the semiconductor layer where a channel is formed is provided between two gates is used for the transistors 201 and 205. The two gates may be connected to each other and supplied with the same signal to operate the transistor. Alternatively, the threshold voltage of the transistor may be controlled by applying a potential for controlling the threshold voltage to one of the two gates and a potential for driving to the other of the two gates.

There is no particular limitation on the crystallinity of a semiconductor layer of the transistors, and an amorphous semiconductor or a semiconductor having crystallinity (a microcrystalline semiconductor, a polycrystalline semiconductor, a single crystal semiconductor, or a semiconductor partly including crystal regions) may be used. It is preferable to use a semiconductor having crystallinity, in which case deterioration of the transistor characteristics can be suppressed.

The semiconductor layer of the transistor preferably contains a metal oxide. That is, an OS transistor is preferably used as the transistor included in the display apparatus of this embodiment.

[Semiconductor Layer]

For example, indium oxide, gallium oxide, and zinc oxide can be used for the semiconductor layer. The metal oxide preferably contains two or three kinds selected from indium, an element M, and zinc. The element M is one or more of gallium, aluminum, silicon, boron, yttrium, tin, copper, vanadium, beryllium, titanium, iron, nickel, germanium, zirconium, molybdenum, lanthanum, cerium, neodymium, hafnium, tantalum, tungsten, cobalt, and magnesium. Specifically, the element M is preferably one or more of aluminum, gallium, yttrium, and tin.

It is particularly preferable that an oxide containing indium (In), gallium (Ga), and zinc (Zn) (also referred to as IGZO) be used as the metal oxide used for the semiconductor layer. Alternatively, it is preferable to use an oxide containing indium, tin, and zinc (also referred to as ITZO (registered trademark)). It is preferable to use an oxide containing indium, gallium, tin, and zinc. It is preferable to use an oxide containing indium (In), aluminum (Al), and zinc (Zn) (also referred to as IAZO). It is preferable to use an oxide containing indium (In), aluminum (Al), gallium (Ga), and zinc (Zn) (also referred to as IAGZO).

When the metal oxide used for the semiconductor layer is In-M-Zn oxide, the atomic ratio of In is preferably greater than or equal to the atomic ratio of Min the In-M-Zn oxide. Examples of the atomic ratio of the metal elements in such In-M-Zn oxide are In:M:Zn=1:1:1, 1:1:1.2, 1:3:2, 1:3:4, 2:1:3, 3:1:2, 4:2:3, 4:2:4.1, 5:1:3, 5:1:6, 5:1:7, 5:1:8, 6:1:6, and 5:2:5 and a composition in the vicinity of any of the above atomic ratios. Note that the vicinity of the atomic ratio includes ±30% of an intended atomic ratio.

For example, when the atomic ratio is described as In:Ga:Zn=4:2:3 or a composition in the vicinity thereof, the case is included where the atomic ratio of Ga is greater than or equal to 1 and less than or equal to 3 and the atomic ratio of Zn is greater than or equal to 2 and less than or equal to 4 with the atomic ratio of In being 4. In addition, when the atomic ratio is described as In:Ga:Zn=5:1:6 or a composition in the vicinity thereof, the case is included where the atomic ratio of Ga is greater than 0.1 and less than or equal to 2 and the atomic ratio of Zn is greater than or equal to 5 and less than or equal to 7 with the atomic ratio of In being 5. Furthermore, when the atomic ratio is described as In:Ga:Zn=1:1:1 or a composition in the vicinity thereof, the case is included where the atomic ratio of Ga is greater than 0.1 and less than or equal to 2 and the atomic ratio of Zn is greater than 0.1 and less than or equal to 2 with the atomic ratio of In being 1.

The semiconductor layer may include two or more metal oxide layers having different compositions. For example, a stacked-layer structure of a first metal oxide layer having In:M:Zn=1:3:4 [atomic ratio] or a composition in the vicinity thereof and a second metal oxide layer having In:M:Zn=1:1:1 [atomic ratio] or a composition in the vicinity thereof and being formed over the first metal oxide layer can be favorably employed. In particular, gallium or aluminum is preferably used as the element M.

Alternatively, a stacked-layer structure of one selected from indium oxide, indium gallium oxide, and IGZO, and one selected from IAZO, IAGZO, and ITZO (registered trademark) may be employed, for example.

Examples of an oxide semiconductor having crystallinity include a c-axis-aligned crystalline oxide semiconductor (CAAC-OS) and a nanocrystalline oxide semiconductor (nc-OS).

Alternatively, a transistor using silicon in its channel formation region (a Si transistor) may be used. Examples of silicon include single crystal silicon, polycrystalline silicon, and amorphous silicon. In particular, a transistor containing low-temperature polysilicon (LTPS) in its semiconductor layer (also referred to as an LTPS transistor) can be used. The LTPS transistor has high field-effect mobility and excellent frequency characteristics.

With the use of Si transistors such as LTPS transistors, a circuit required to be driven at a high frequency (e.g., a data driver circuit) can be formed on the same substrate as the display portion. This allows simplification of an external circuit mounted on the display apparatus and a reduction in costs of parts and mounting costs.

An OS transistor has much higher field-effect mobility than a transistor containing amorphous silicon. In addition, the OS transistor has an extremely low leakage current between a source and a drain in an off state (hereinafter also referred to as off-state current), and charge accumulated in a capacitor that is connected in series to the transistor can be held for a long period. Furthermore, the power consumption of the display apparatus can be reduced with the OS transistor.

To increase the luminance of the light-emitting device included in the pixel circuit, the amount of current fed through the light-emitting device needs to be increased. To increase the current amount, the source-drain voltage of a driving transistor included in the pixel circuit needs to be increased. An OS transistor has a higher withstand voltage between a source and a drain than a Si transistor; hence, high voltage can be applied between the source and the drain of the OS transistor. Therefore, when an OS transistor is used as the driving transistor in the pixel circuit, the amount of current flowing through the light-emitting device can be increased, so that the luminance of the light-emitting device can be increased.

When transistors are driven in a saturation region, a change in source-drain current relative to a change in gate-source voltage can be smaller in an OS transistor than in a Si transistor. Accordingly, when an OS transistor is used as the driving transistor included in the pixel circuit, a current flowing between the source and the drain can be minutely determined by controlling the gate-source voltage. Thus, the amount of current flowing through the light-emitting device can be controlled. Consequently, the number of gray levels expressed by the pixel circuit can be increased.

Regarding saturation characteristics of current flowing when transistors are driven in the saturation region, even when the source-drain voltage of an OS transistor increases gradually, a more stable current (saturation current) can be fed through the OS transistor than through a Si transistor. Thus, by using an OS transistor as the driving transistor, a stable current can be fed through light-emitting devices even when the current-voltage characteristics of the light-emitting devices vary, for example. In other words, when the OS transistor is driven in the saturation region, the source-drain current hardly changes with an increase in the source-drain voltage. Hence, the luminance of the light-emitting device can be stable.

As described above, by using OS transistors as the driving transistors included in the pixel circuits, it is possible to inhibit black-level degradation, increase the luminance, increase the number of gray levels, and suppress variations in characteristics of light-emitting devices, for example.

The transistors included in the circuit 164 and the transistors included in the display portion 107 may have the same structure or different structures. One structure or two or more kinds of structures may be employed for a plurality of transistors included in the circuit 164. Similarly, one structure or two or more kinds of structures may be employed for a plurality of transistors included in the display portion 107.

All transistors included in the display portion 107 may be OS transistors, or all transistors included in the display portion 107 may be Si transistors. Alternatively, some of the transistors included in the display portion 107 may be OS transistors and the others may be Si transistors.

For example, when both an LTPS transistor and an OS transistor are used in the display portion 107, the display apparatus can have low power consumption and high driving capability. Note that a structure in which an LTPS transistor and an OS transistor are used in combination is referred to as LTPO in some cases. For example, it is preferable that an OS transistor be used as a transistor functioning as a switch for controlling electrical continuity between wirings and an LTPS transistor be used as a transistor for controlling current.

For example, one transistor included in the display portion 107 functions as a transistor for controlling a current flowing through the light-emitting device and can be referred to as a driving transistor. One of a source and a drain of the driving transistor is electrically connected to the pixel electrode of the light-emitting device. An LTPS transistor is preferably used as the driving transistor. In that case, the amount of current flowing through the light-emitting device can be increased.

Another transistor included in the display portion 107 functions as a switch for controlling selection or non-selection of a pixel and can be referred to as a selection transistor. A gate of the selection transistor is electrically connected to a gate line, and one of a source and a drain thereof is electrically connected to a signal line. An OS transistor is preferably used as the selection transistor. In that case, the gray level of the pixel can be maintained even with an extremely low frame frequency (e.g., 1 fps or less); thus, power consumption can be reduced by stopping the driver in displaying a still image.

As described above, the display apparatus of one embodiment of the present invention can have all of a high aperture ratio, high resolution, high display quality, and low power consumption.

Note that the display apparatus of one embodiment of the present invention has a structure including the OS transistor and the light-emitting device having an MML structure. This structure can significantly reduce a leakage current that would flow through a transistor and a leakage current that would flow between adjacent light-emitting devices. Displaying images on the display apparatus having this structure can bring one or more of image crispness, image sharpness, high color saturation, and a high contrast ratio to the viewer. When a leakage current that would flow through the transistor and a lateral leakage current that would flow between light-emitting devices are extremely low, display with little leakage of light at the time of black display (black-level degradation), for example, can be achieved.

In particular, current flowing between adjacent light-emitting devices having the MML structure can be extremely reduced.

[Transistor 209 and Transistor 210]

Figure 15B:
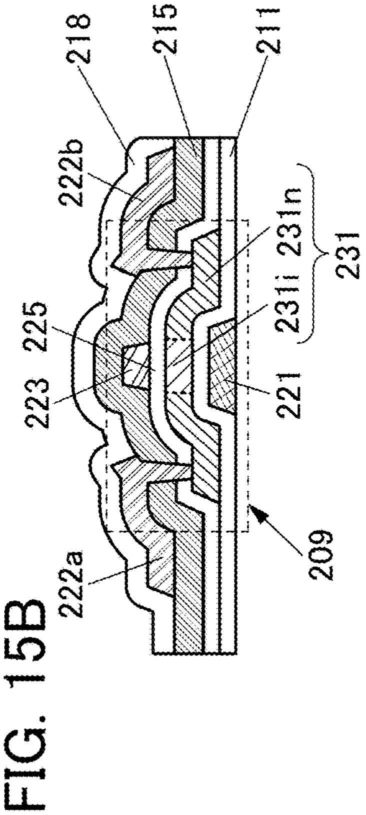
Figure 15C:
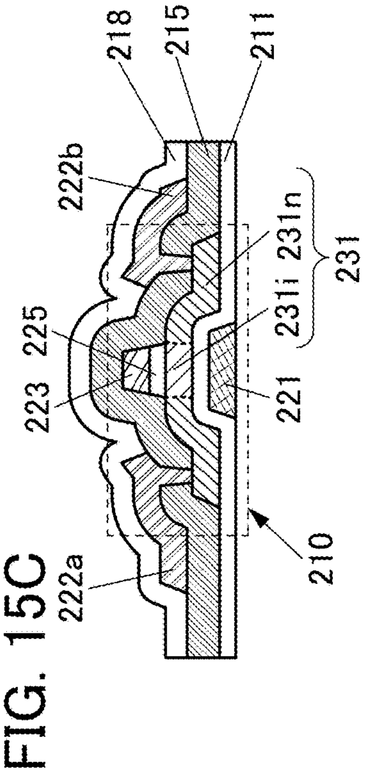

FIGS. 15B and 15C are cross-sectional views each illustrating another example of a cross-sectional structure of a transistor that can be used for the display apparatus 100H.

A transistor 209 and a transistor 210 each include the conductive layer 221, the insulating layer 211, the semiconductor layer 231, the conductive layer 222*a*, the conductive layer 222*b*, an insulating layer 225, the conductive layer 223, and the insulating layer 215. The semiconductor layer 231 includes a channel formation region 231*i* and a pair of low-resistance regions 231*n*. The insulating layer 211 is positioned between the conductive layer 221 and the channel formation region 231*i*. The conductive layer 221 functions as a gate and the insulating layer 211 functions as a first gate insulating layer. The insulating layer 225 is positioned at least between the conductive layer 223 and the channel formation region 231*i*. The conductive layer 223 functions as a gate, and the insulating layer 225 functions as a second gate insulating layer. The conductive layer 222*a* is electrically connected to one of the pair of low-resistance regions 231*n* and the conductive layer 222*b* is electrically connected to the other of the pair of low-resistance regions 231*n*. The insulating layer 215 covers the conductive layer 223. An insulating layer 218 covers the transistor.

[Structure Example 1 of Insulating Layer 225]

In the transistor 209, the insulating layer 225 covers the top and side surfaces of the semiconductor layer 231 (see FIG. 15B). The insulating layer 225 and the insulating layer 215 have openings, through which the conductive layers 222*a* and 222*b* are electrically connected to the low-resistance regions 231*n*. One of the conductive layers 222*a* and 222*b* functions as a source, and the other functions as a drain.

[Structure Example 2 of Insulating Layer 225]

In the transistor 210, the insulating layer 225 overlaps with the channel formation region 231*i* of the semiconductor layer 231 and does not overlap with the low-resistance regions 231*n* (see FIG. 15C). For example, the insulating layer 225 can be processed into a predetermined shape using the conductive layer 223 as a mask. The insulating layer 215 covers the insulating layer 225 and the conductive layer 223. The insulating layer 215 has openings, and the conductive layers 222*a* and 222*b* are electrically connected to the low-resistance regions 231*n*.

[Connection Portion 204]

A connection portion 204 is provided for the substrate 14*b*. The connection portion 204 includes a conductive layer 166, which is electrically connected to the wiring 165. Note that the connection portion 204 does not overlap with the substrate 16*b*, and the conductive layer 166 is exposed. Note that the conductive layer 166 and the conductive layer 171 can be formed by processing one conductive film. The conductive layer 166 is electrically connected to the FPC 177 through a connection layer 242. As the connection layer 242, for example, an anisotropic conductive film (ACF) or an anisotropic conductive paste (ACP) can be used.

«Display Apparatus 100I»

Figure 16:
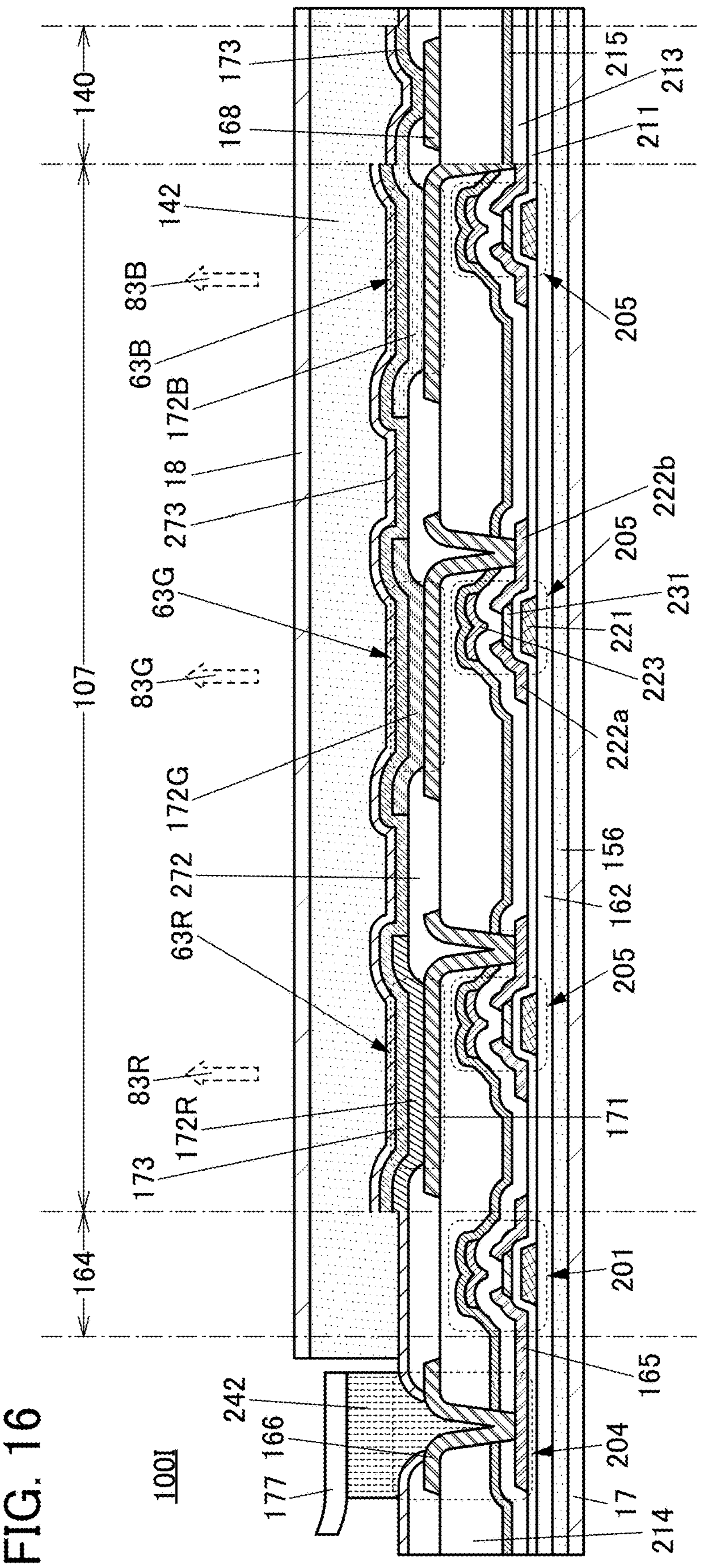
FIG. 16 illustrates a structure of a display apparatus of an embodiment.

FIG. 16 is a cross-sectional view illustrating a structure of a display apparatus 100I. The display apparatus 100I is different from the display apparatus 100H in having flexibility. In other words, the display apparatus 100I is a flexible display. The display apparatus 100I includes a substrate 17 and a substrate 18 instead of the substrate 14*b* and the substrate 16*b*, respectively. The substrates 17 and 18 both have flexibility.

The display apparatus 100I includes a bonding layer 156 and an insulating layer 162. The insulating layer 162 and the substrate 17 are bonded to each other with the bonding layer 156. For example, the material that can be used for the bonding layer 122 can be used for the bonding layer 156. For example, the material that can be used for the insulating layer 211, the insulating layer 213, or the insulating layer 215 can be used for the insulating layer 162. Note that the transistors 201 and 205 are provided over the insulating layer 162.

For example, the insulating layer 162 is formed over a formation substrate, and the transistors, the light-emitting devices, and the like are formed over the insulating layer 162. Then, the bonding layer 142 is formed over the light-emitting devices, and the formation substrate and the substrate 18 are bonded to each other with the bonding layer 142. After that, the formation substrate is separated from the insulating layer 162 and the surface of the insulating layer 162 is exposed. Then, the bonding layer 156 is formed on the exposed surface of the insulating layer 162, and the insulating layer 162 and the substrate 17 are bonded to each other with the bonding layer 156. In this manner, the components formed over the formation substrate can be transferred onto the substrate 17, whereby the display apparatus 100I can be manufactured.

«Display Apparatus 100J»

Figure 17:
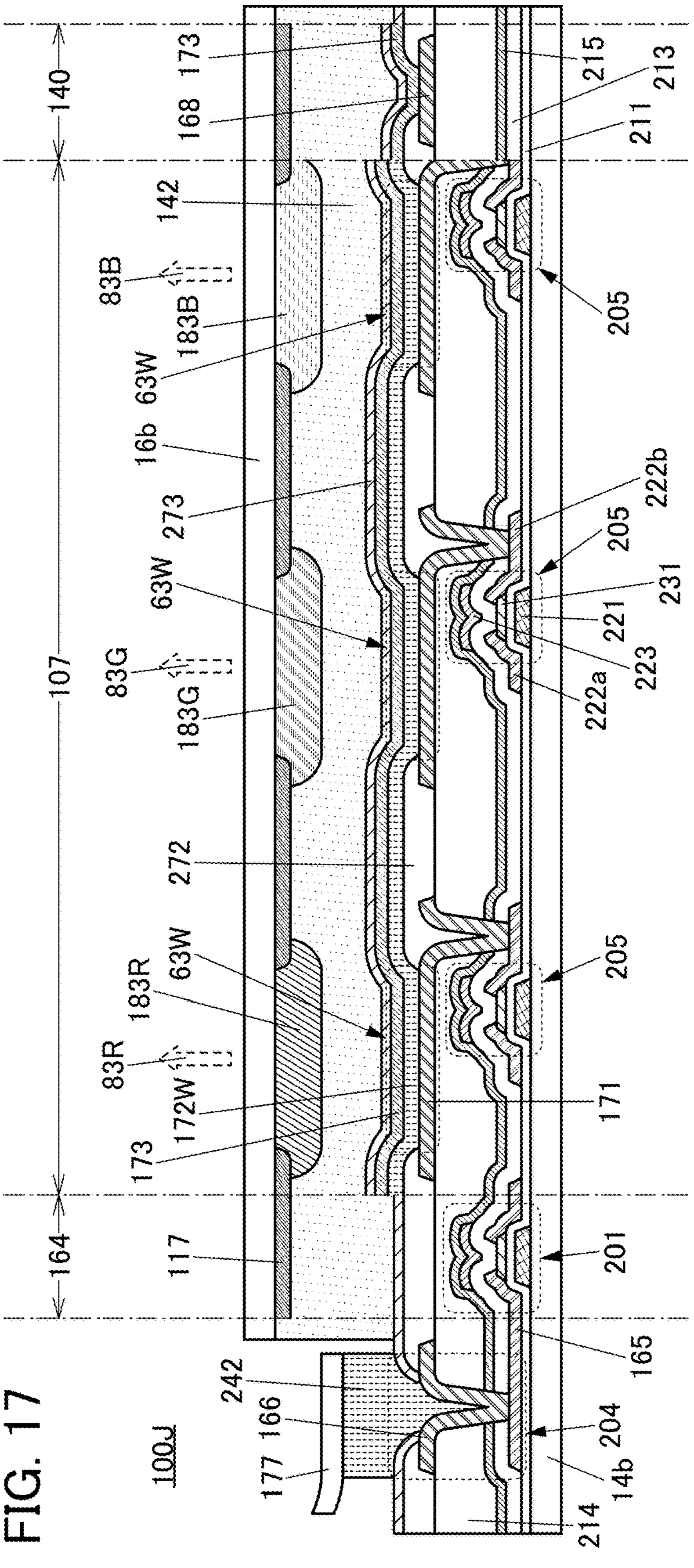
FIG. 17 illustrates a structure of a display apparatus of an embodiment.

FIG. 17 is a cross-sectional view illustrating a structure of a display apparatus 100J. The display apparatus 100J is different from the display apparatus 100H in including light-emitting devices 63W, instead of the light-emitting devices 63R, 63G and 63B, and the coloring layers 183R, 183G, and 183B.

The display apparatus 100J includes the coloring layers 183R, 183G, and 183B between the substrate 16*b* and the substrate 14*b*. The coloring layer 183R overlaps with one light-emitting device 63W, the coloring layer 183G overlaps with another light-emitting device 63W, and the coloring layer 183B overlaps with another light-emitting device 63W.

The display apparatus 100J includes a light-blocking layer 117. For example, the light-blocking layer 117 is provided between the coloring layers 183R and 183G, between the coloring layers 183G and 183B, and between the coloring layers 183B and 183R. The light-blocking layer 117 includes a region overlapping with the connection portion 140 and a region overlapping with the circuit 164.

The light-emitting device 63W can emit white light, for example. For example, the coloring layer 183R, the coloring layer 183G, and the coloring layer 183B can transmit red light, green light, and blue light, respectively. In this manner, the display apparatus 100J can emit the red light 83R, the green light 83G, and the blue light 83B, for example, to perform full color display.

«Display Apparatus 100K»

Figure 18:
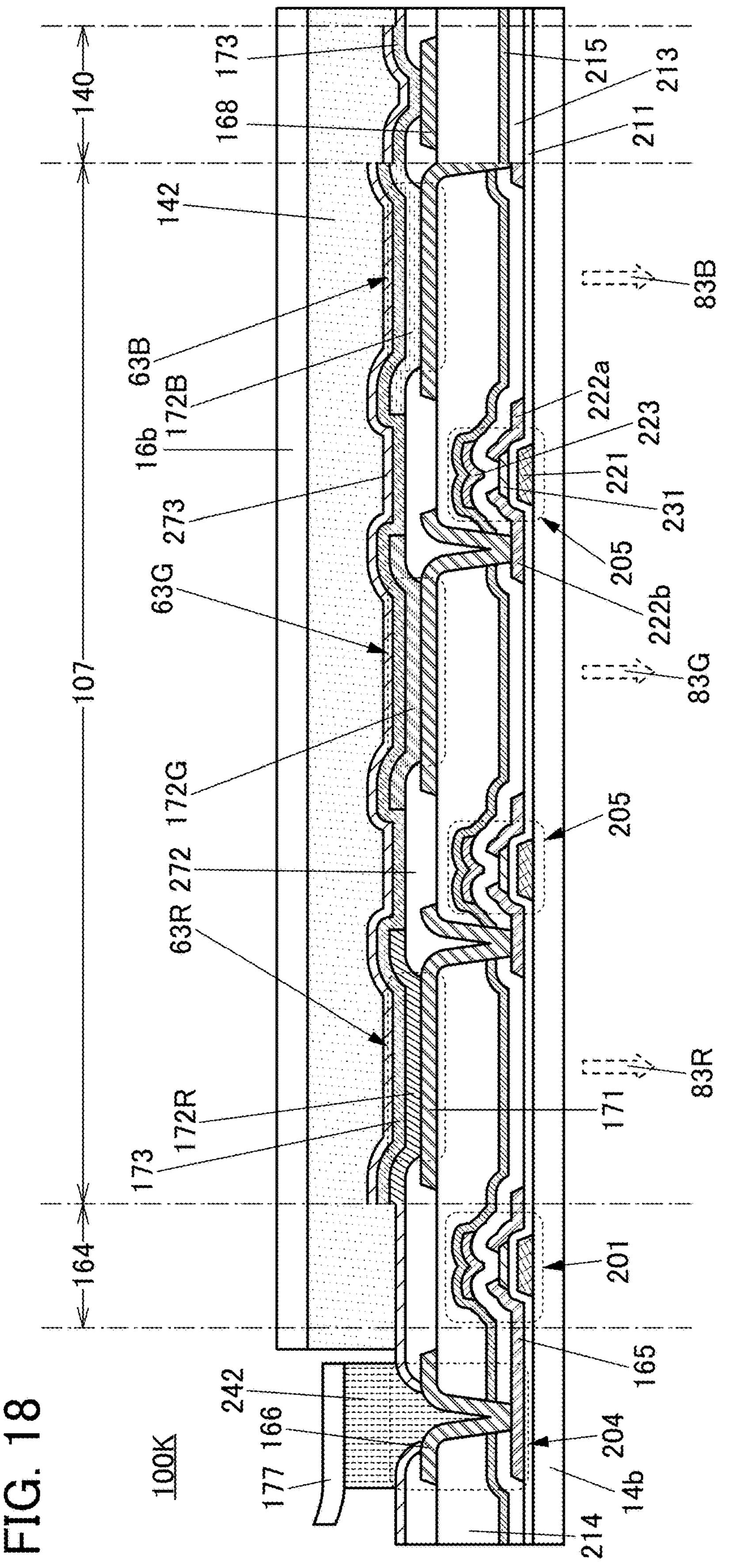
FIG. 18 illustrates a structure of a display apparatus of an embodiment.

FIG. 18 is a cross-sectional view illustrating a structure of a display apparatus 100K. The display apparatus 100K is different from the display apparatus 100H in having a bottom-emission structure. The light-emitting devices emit the light 83R, the light 83G, and the light 83B to the substrate 14*b* side. A visible-light-transmitting material is used for the conductive layer 171. A visible-light-reflecting material is used for the conductive layer 173.

«Display Apparatus 100L»

Figure 19:
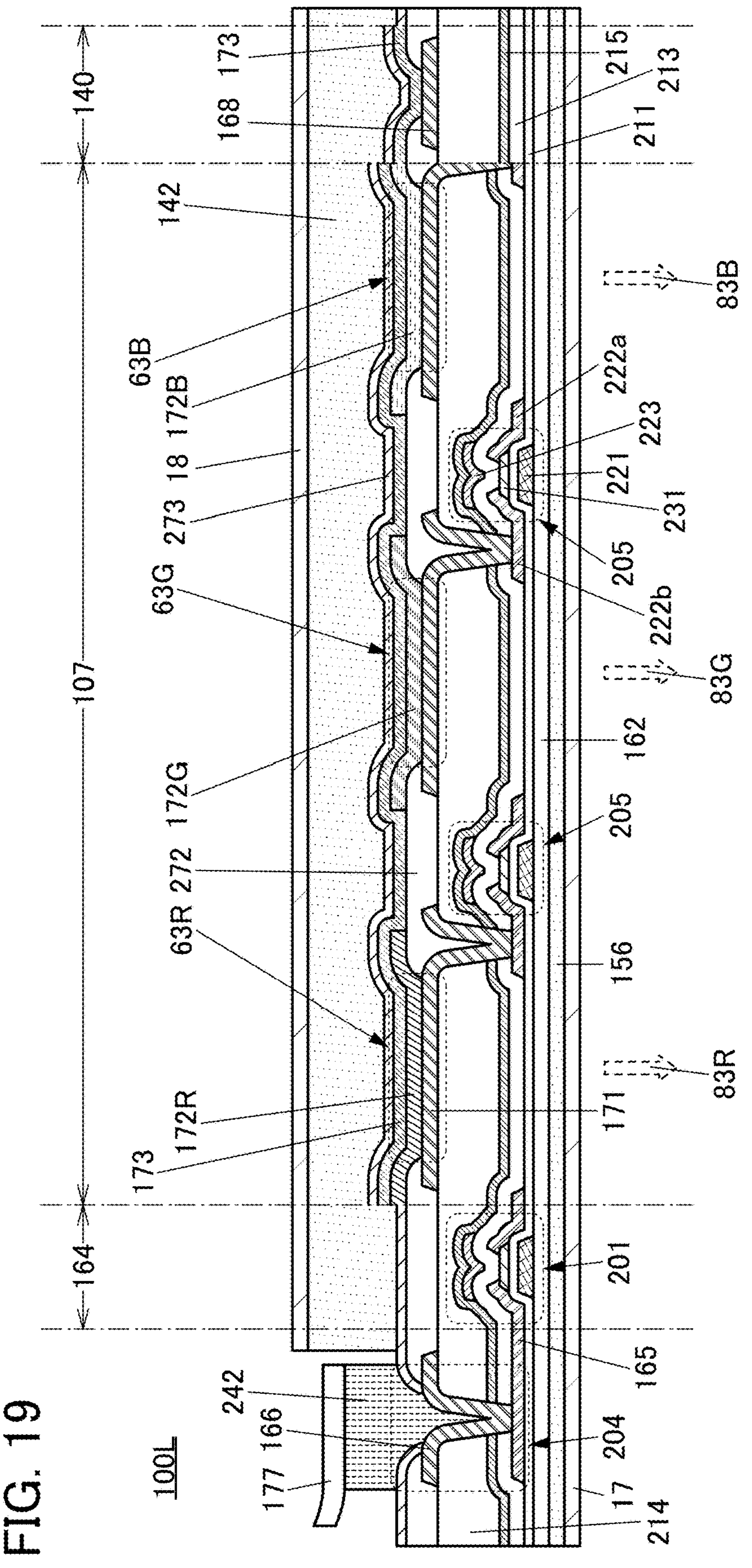
FIG. 19 illustrates a structure of a display apparatus of an embodiment.

FIG. 19 is a cross-sectional view illustrating a structure of a display apparatus 100L. The display apparatus 100L is different from the display apparatus 100H in having flexibility and a bottom-emission structure. The display apparatus 100L includes the substrate 17 and the substrate 18 instead of the substrate 14*b* and the substrate 16*b*, respectively. The substrates 17 and 18 both have flexibility. The light-emitting devices emit the light 83R, the light 83G, and the light 83B to the substrate 17 side.

The conductive layer 221 and the conductive layer 223 may have a property of transmitting visible light and a property of reflecting visible light. When the conductive layers 221 and 223 have a property of transmitting visible light, the visible-light transmittance in the display portion 107 can be improved. Meanwhile, when the conductive layers 221 and 223 have a property of reflecting visible light, the amount of visible light entering the semiconductor layer 231 can be reduced. In addition, damage to the semiconductor layer 231 can be reduced. Accordingly, the reliability of the display apparatus 100K or the display apparatus 100L can be increased.

Even in a top-emission display apparatus such as the display apparatus 100H or the display apparatus 100I, at least part of the layers included in the transistor 205 may have a property of transmitting visible light. In this case, the conductive layer 171 also has a property of transmitting visible light. Accordingly, the visible-light transmittance in the display portion 107 can be improved.

«Display Apparatus 100M»

Figure 20:
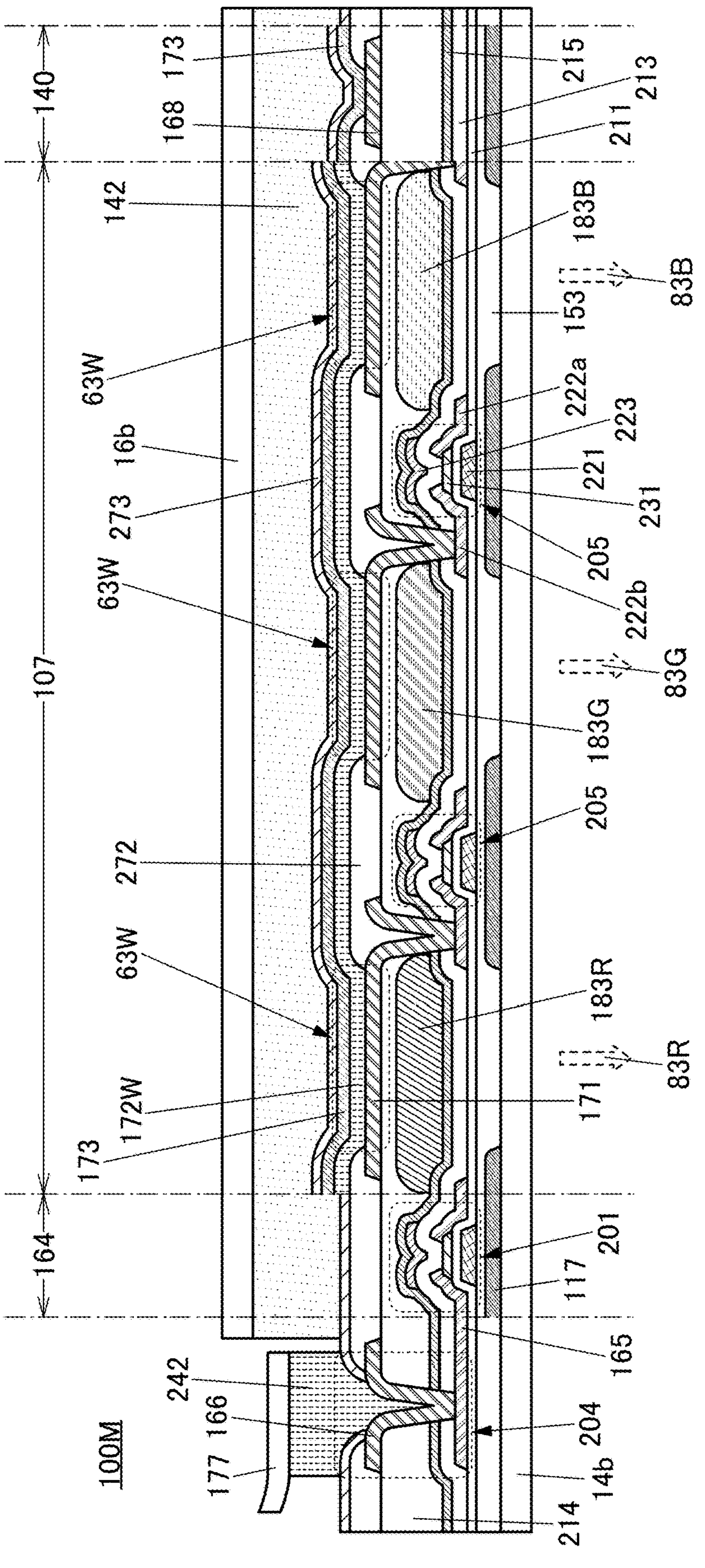
FIG. 20 illustrates a structure of a display apparatus of an embodiment.

FIG. 20 is a cross-sectional view illustrating a structure of a display apparatus 100M. The display apparatus 100M is different from the display apparatus 100H in having a bottom-emission structure and including the light-emitting devices 63W, instead of the light-emitting devices 63R, 63G and 63B, and the coloring layers 183R, 183G, and 183B.

The display apparatus 100M includes the coloring layers 183R, 183G, and 183B. The display apparatus 100M includes the light-blocking layer 117.

[Coloring Layer 183R, Coloring Layer 183G, and Coloring Layer 183B]

The coloring layers 183R, 183G, and 183B are positioned between the substrate 14*b* and the respective light-emitting devices 63W. For example, the coloring layers 183R, 183G, and 183B can be provided between the insulating layer 215 and the insulating layer 214.

[Light-Blocking Layer 117]

The light-blocking layer 117 is provided over the substrate 14*b* and positioned between the substrate 14*b* and the transistor 205. The insulating layer 153 is positioned between the light-blocking layer 117 and the transistor 205. For example, the light-blocking layer 117 does not overlap with a light-emitting region of the light-emitting device 63W. For example, the light-blocking layer 117 overlaps with the connection portion 140 and the circuit 164.

The light-blocking layer 117 can also be provided in the display apparatus 100K or the display apparatus 100L. In this case, light emitted from the light-emitting devices 63R, 63G, and 63B can be inhibited from being reflected by the substrate 14*b* and being diffused inside the display apparatus 100K or the display apparatus 100L, for example. Thus, the display apparatus 100K and the display apparatus 100L can provide high display quality. Meanwhile, when the light-blocking layer 117 is not provided, the extraction efficiency of light emitted from the light-emitting devices 63R, 63G, and 63B can be increased.

At least part of this embodiment can be implemented in combination with any of the other embodiments described in this specification, as appropriate.

Embodiment 10

In this embodiment, electronic devices of embodiments of the present invention will be described.

Electronic devices of this embodiment are each provided with the display apparatus of one embodiment of the present invention in a display portion. The display apparatus of one embodiment of the present invention is highly reliable and can be easily increased in resolution and definition. Thus, the display apparatus of one embodiment of the present invention can be used for a display portion of a variety of electronic devices.

Examples of the electronic devices include a digital camera, a digital video camera, a digital photo frame, a mobile phone, a portable game console, a portable information terminal, and an audio reproducing device, in addition to electronic devices with a relatively large screen, such as a television device, desktop and laptop personal computers, a monitor of a computer and the like, digital signage, and a large game machine such as a pachinko machine.

In particular, the display apparatus of one embodiment of the present invention can have high definition, and thus can be favorably used for an electronic device having a relatively small display portion. Examples of such an electronic device include watch-type and bracelet-type information terminal devices (wearable devices) and wearable devices worn on the head, such as a VR device like a head-mounted display, a glasses-type AR device, and an MR device.

The definition of the display apparatus of one embodiment of the present invention is preferably as high as HD (number of pixels: 1280×720), FHD (number of pixels: 1920×1080), WQHD (number of pixels: 2560×1440), WQXGA (number of pixels: 2560×1600), 4K (number of pixels: 3840×2160), or 8K (number of pixels: 7680×4320). In particular, definition of 4K, 8K, or higher is preferable. The pixel density (resolution) of the display apparatus of one embodiment of the present invention is preferably 100 ppi or higher, further preferably 300 ppi or higher, further preferably 500 ppi or higher, further preferably 1000 ppi or higher, still further preferably 2000 ppi or higher, still further preferably 3000 ppi or higher, still further preferably 5000 ppi or higher, yet further preferably 7000 ppi or higher. With such a display apparatus having one or both of high definition and high resolution, the electronic device can have higher realistic sensation, sense of depth, and the like in personal use such as portable use or home use. There is no particular limitation on the screen ratio (aspect ratio) of the display apparatus of one embodiment of the present invention. For example, the display apparatus is compatible with a variety of screen ratios such as 1:1 (a square), 4:3, 16:9, and 16:10.

The electronic device in this embodiment may include a sensor (a sensor having a function of measuring force, displacement, position, speed, acceleration, angular velocity, rotational frequency, distance, light, liquid, magnetism, temperature, a chemical substance, sound, time, hardness, electric field, current, voltage, electric power, radiation, flow rate, humidity, gradient, oscillation, odor, or infrared rays).

The electronic device in this embodiment can have a variety of functions. For example, the electronic device in this embodiment can have a function of displaying a variety of information (e.g., a still image, a moving image, and a text image) on the display portion, a touch panel function, a function of displaying a calendar, date, time, and the like, a function of executing a variety of software (programs), a wireless communication function, and a function of reading out a program or data stored in a recording medium.

Examples of head-mounted wearable devices are described with reference to FIG. 21A to 21D. These wearable devices have at least one of a function of displaying AR contents, a function of displaying VR contents, a function of displaying SR contents, and a function of displaying MR contents. The electronic device having a function of displaying contents of at least one of AR, VR, SR, MR, and the like enables the user to feel a higher level of immersion.

Figure 21A:
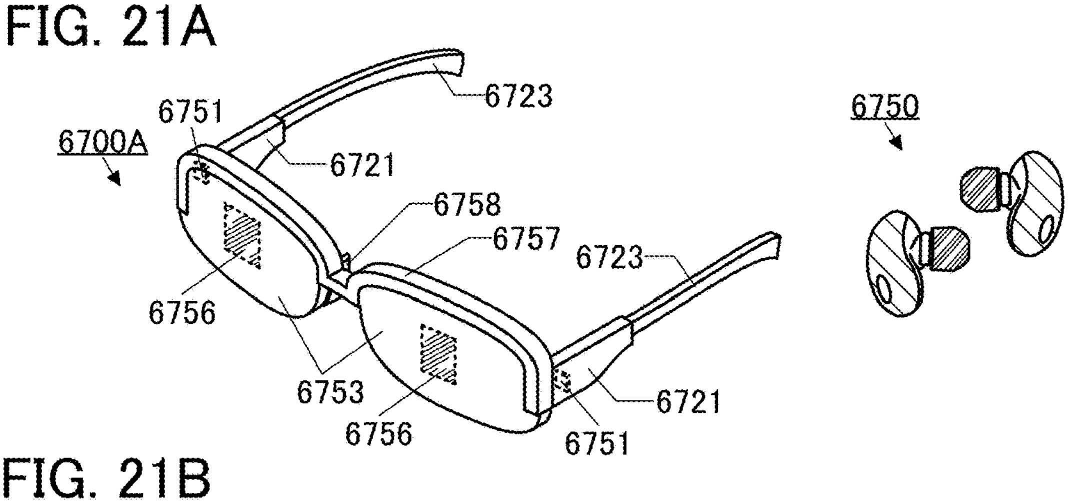
FIGS. 21A to 21D illustrate examples of electronic devices of an embodiment.
Figure 21B:
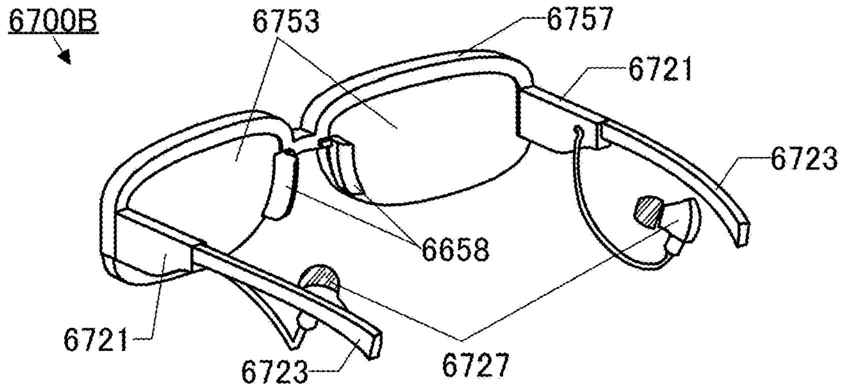

An electronic device 6700A illustrated in FIG. 21A and an electronic device 6700B illustrated in FIG. 21B each include a pair of display panels 6751, a pair of housings 6721, a communication portion (not illustrated), a pair of wearing portions 6723, a control portion (not illustrated), an image capturing portion (not illustrated), a pair of optical members 6753, a frame 6757, and a pair of nose pads 6758.

The display apparatus of one embodiment of the present invention can be used for the display panels 6751. Thus, a highly reliable electronic device is obtained.

The electronic devices 6700A and 6700B can each project images displayed on the display panels 6751 onto display regions 6756 of the optical members 6753. Since the optical members 6753 have a light-transmitting property, the user can see images displayed on the display regions, which are superimposed on transmission images seen through the optical members 6753. Accordingly, the electronic devices 6700A and 6700B are electronic devices capable of AR display.

In the electronic devices 6700A and 6700B, a camera capable of capturing images of the front side may be provided as the image capturing portion. Furthermore, when the electronic devices 6700A and 6700B are provided with an acceleration sensor such as a gyroscope sensor, the orientation of the user's head can be sensed and an image corresponding to the orientation can be displayed on the display regions 6756.

The communication portion includes a wireless communication device, and a video signal, for example, can be supplied by the wireless communication device. Instead of or in addition to the wireless communication device, a connector that can be connected to a cable for supplying a video signal and a power supply potential may be provided.

The electronic devices 6700A and 6700B are provided with a battery so that they can be charged wirelessly and/or by wire.

A touch sensor module may be provided in the housing 6721. The touch sensor module has a function of detecting a touch on the outer surface of the housing 6721. Detecting a tap operation, a slide operation, or the like by the user with the touch sensor module enables various types of processing. For example, a video can be paused or restarted by a tap operation, and can be fast-forwarded or fast-reversed by a slide operation. When the touch sensor module is provided in each of the two housings 6721, the range of the operation can be increased.

Various touch sensors can be applied to the touch sensor module. For example, any of touch sensors of the following types can be used: a capacitive type, a resistive type, an infrared type, an electromagnetic induction type, a surface acoustic wave type, and an optical type. In particular, a capacitive sensor or an optical sensor is preferably used for the touch sensor module.

In the case of using an optical touch sensor, a photoelectric conversion element (also referred to as a photoelectric conversion device) can be used as a light-receiving element. One or both of an inorganic semiconductor and an organic semiconductor can be used for an active layer of the photoelectric conversion element.

Figure 21C:
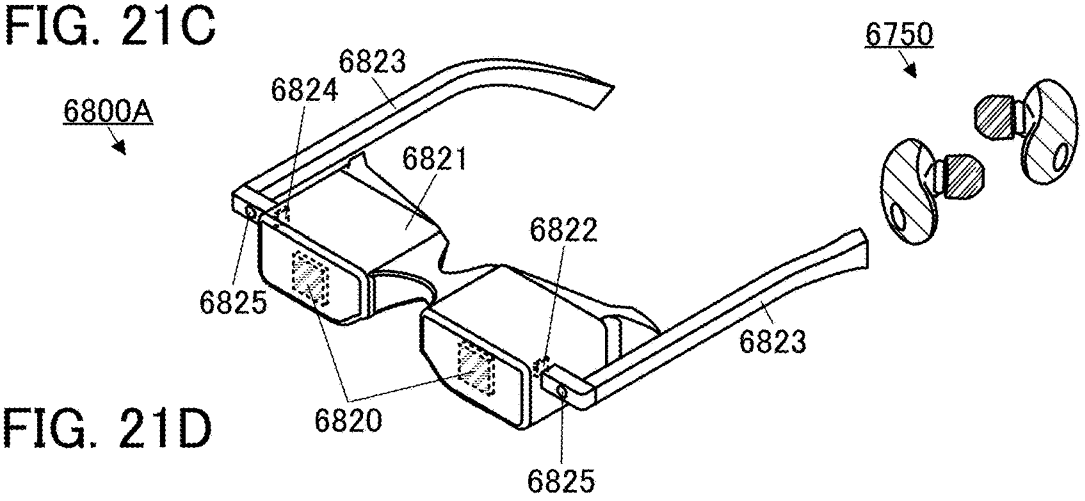
Figure 21D:
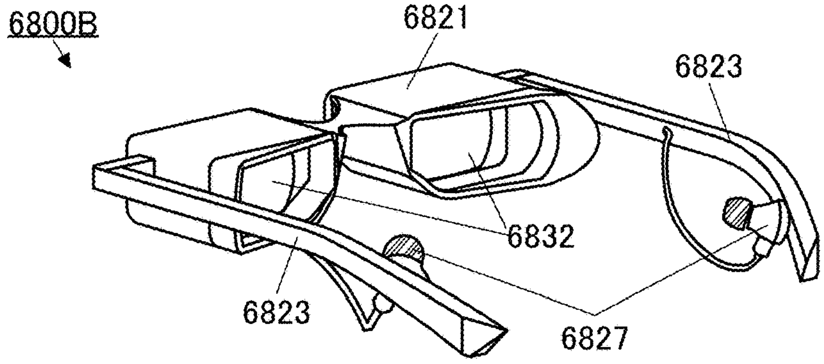

An electronic device 6800A illustrated in FIG. 21C and an electronic device 6800B illustrated in FIG. 21D each include a pair of display portions 6820, a housing 6821, a communication portion 6822, a pair of wearing portions 6823, a control portion 6824, a pair of image capturing portions 6825, and a pair of lenses 6832.

The display apparatus of one embodiment of the present invention can be used in the display portions 6820. Thus, a highly reliable electronic device is obtained.

The display portions 6820 are positioned inside the housing 6821 so as to be seen through the lenses 6832. When the pair of display portions 6820 display different images, three-dimensional display using parallax can be performed.

The electronic devices 6800A and 6800B can be regarded as electronic devices for VR. The user who wears the electronic device 6800A or the electronic device 6800B can see images displayed on the display portions 6820 through the lenses 6832.

The electronic devices 6800A and 6800B preferably include a mechanism for adjusting the lateral positions of the lenses 6832 and the display portions 6820 so that the lenses 6832 and the display portions 6820 are positioned optimally in accordance with the positions of the user's eyes. Moreover, the electronic devices 6800A and 6800B preferably include a mechanism for adjusting focus by changing the distance between the lenses 6832 and the display portions 6820.

The electronic device 6800A or the electronic device 6800B can be mounted on the user's head with the wearing portions 6823. FIG. 21C, for instance, shows an example where the wearing portion 6823 has a shape like a temple (also referred to as a joint or the like) of glasses; however, one embodiment of the present invention is not limited thereto. The wearing portion 6823 can have any shape with which the user can wear the electronic device, for example, a shape of a helmet or a band.

The image capturing portion 6825 has a function of obtaining information on the external environment. Data obtained by the image capturing portion 6825 can be output to the display portion 6820. An image sensor can be used for the image capturing portion 6825. Moreover, a plurality of cameras may be provided so as to support a plurality of fields of view, such as a telescope field of view and a wide field of view.

Although an example where the image capturing portions 6825 are provided is shown here, a range sensor (also referred to as a sensing portion) capable of measuring a distance between the user and an object just needs to be provided. In other words, the image capturing portion 6825 is one embodiment of the sensing portion. As the sensing portion, an image sensor or a range image sensor such as a light detection and ranging (LiDAR) sensor can be used, for example. By using images obtained by the camera and images obtained by the range image sensor, more information can be obtained and a gesture operation with higher accuracy is possible.

The electronic device 6800A may include a vibration mechanism that functions as bone-conduction earphones. For example, at least one of the display portion 6820, the housing 6821, and the wearing portion 6823 can include the vibration mechanism. Thus, without additionally requiring an audio device such as headphones, earphones, or a speaker, the user can enjoy video and sound only by wearing the electronic device 6800A.

The electronic devices 6800A and 6800B may each include an input terminal. To the input terminal, a cable for supplying a video signal from a video output device or the like, power for charging a battery provided in the electronic device, and the like can be connected.

The electronic device of one embodiment of the present invention may have a function of performing wireless communication with earphones 6750. The earphones 6750 include a communication portion (not illustrated) and have a wireless communication function. The earphones 6750 can receive information (e.g., audio data) from the electronic device with the wireless communication function. For example, the electronic device 6700A in FIG. 21A has a function of transmitting information to the earphones 6750 with the wireless communication function. As another example, the electronic device 6800A in FIG. 21C has a function of transmitting information to the earphones 6750 with the wireless communication function.

The electronic device may include an earphone portion. The electronic device 6700B in FIG. 21B includes earphone portions 6727. For example, the earphone portion 6727 can be connected to the control portion by wire. Part of a wiring that connects the earphone portion 6727 and the control portion may be positioned inside the housing 6721 or the wearing portion 6723.

Similarly, the electronic device 6800B in FIG. 21D includes earphone portions 6827. For example, the earphone portion 6827 can be connected to the control portion 6824 by wire. Part of a wiring that connects the earphone portion 6827 and the control portion 6824 may be positioned inside the housing 6821 or the wearing portion 6823. Alternatively, the earphone portions 6827 and the wearing portions 6823 may include magnets. This is preferred because the earphone portions 6827 can be fixed to the wearing portions 6823 with magnetic force and thus can be easily housed.

The electronic device may include an audio output terminal to which earphones, headphones, or the like can be connected. The electronic device may include one or both of an audio input terminal and an audio input mechanism. As the audio input mechanism, a sound collecting device such as a microphone can be used, for example. The electronic device may have a function of a headset by including the audio input mechanism.

As described above, both the glasses-type device (e.g., the electronic devices 6700A and 6700B) and the goggles-type device (e.g., the electronic devices 6800A and 6800B) are preferable as the electronic device of one embodiment of the present invention.

The electronic device of one embodiment of the present invention can transmit information to earphones by wire or wirelessly.

Figure 22A:
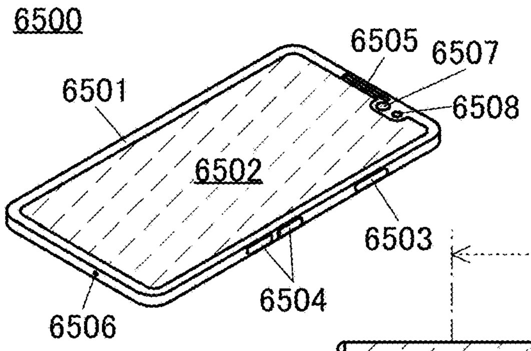
FIGS. 22A to 22F illustrate examples of electronic devices of an embodiment.

An electronic device 6500 illustrated in FIG. 22A is a portable information terminal that can be used as a smartphone.

The electronic device 6500 includes a housing 6501, a display portion 6502, a power button 6503, buttons 6504, a speaker 6505, a microphone 6506, a camera 6507, a light source 6508, and the like. The display portion 6502 has a touch panel function.

The display apparatus of one embodiment of the present invention can be used in the display portion 6502. Thus, a highly reliable electronic device is obtained.

Figure 22B:
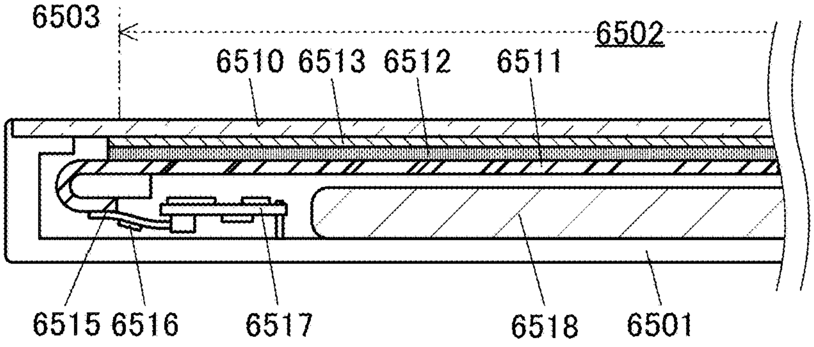

FIG. 22B is a schematic cross-sectional view including an end portion of the housing 6501 on the microphone 6506 side.

A protection member 6510 having a light-transmitting property is provided on the display surface side of the housing 6501. A display panel 6511, an optical member 6512, a touch sensor panel 6513, a printed circuit board 6517, a battery 6518, and the like are provided in a space surrounded by the housing 6501 and the protection member 6510.

The display panel 6511, the optical member 6512, and the touch sensor panel 6513 are fixed to the protection member 6510 with a bonding layer (not illustrated).

Part of the display panel 6511 is folded back in a region outside the display portion 6502, and an FPC 6515 is connected to the region that is folded back. An IC 6516 is mounted on the FPC 6515. The FPC 6515 is connected to a terminal provided on the printed circuit board 6517.

The flexible display of one embodiment of the present invention can be used as the display panel 6511. Thus, an extremely lightweight electronic device can be achieved. Since the display panel 6511 is extremely thin, the battery 6518 with high capacity can be mounted without an increase in the thickness of the electronic device. Moreover, part of the display panel 6511 is folded back so that a connection portion with the FPC 6515 is provided on the back side of the pixel portion, whereby an electronic device with a narrow bezel can be achieved.

Figure 22C:
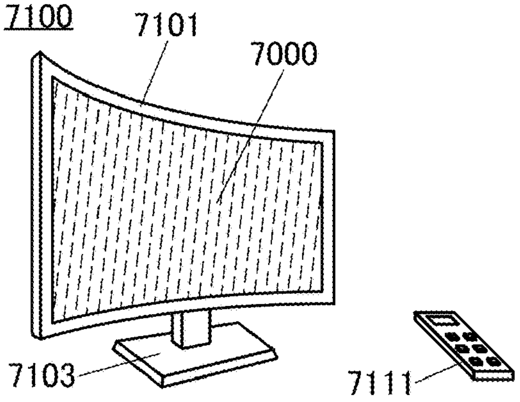

FIG. 22C illustrates an example of a television device. In a television device 7100, a display portion 7000 is incorporated in a housing 7101. Here, the housing 7101 is supported by a stand 7103.

The display apparatus of one embodiment of the present invention can be used in the display portion 7000. Thus, a highly reliable electronic device is obtained.

Operation of the television device 7100 illustrated in FIG. 22C can be performed with an operation switch provided in the housing 7101 and a separate remote controller 7111. Alternatively, the display portion 7000 may include a touch sensor, and the television device 7100 may be operated by touch on the display portion 7000 with a finger or the like. The remote controller 7111 may be provided with a display portion for displaying information output from the remote controller 7111. With operation keys or a touch panel of the remote controller 7111, channels and volume can be controlled and images displayed on the display portion 7000 can be controlled.

Note that the television device 7100 includes a receiver, a modem, and the like. A general television broadcast can be received with the receiver. When the television device is connected to a communication network with or without wires via the modem, one-way (from a transmitter to a receiver) or two-way (e.g., between a transmitter and a receiver or between receivers) information communication can be performed.

Figure 22D:
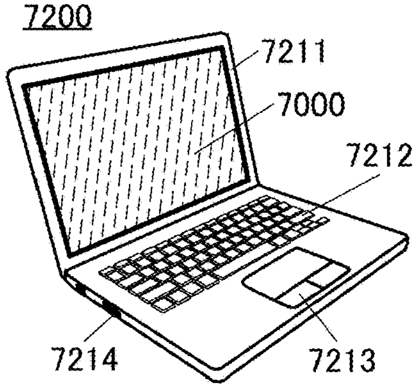

FIG. 22D illustrates an example of a laptop personal computer. A laptop personal computer 7200 includes a housing 7211, a keyboard 7212, a pointing device 7213, an external connection port 7214, and the like. The display portion 7000 is incorporated in the housing 7211.

The display apparatus of one embodiment of the present invention can be used in the display portion 7000. Thus, a highly reliable electronic device is obtained.

Figure 22E:
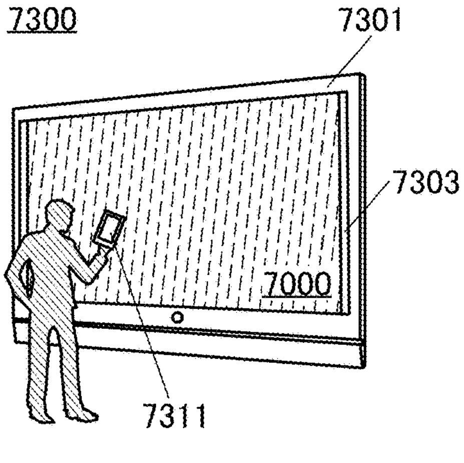
Figure 22F:
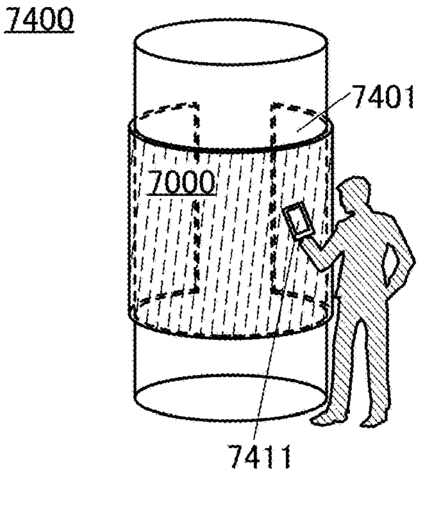

FIGS. 22E and 22F illustrate examples of digital signage.

Digital signage 7300 illustrated in FIG. 22E includes a housing 7301, the display portion 7000, a speaker 7303, and the like. The digital signage 7300 can also include an LED lamp, operation keys (including a power switch or an operation switch), a connection terminal, a variety of sensors, a microphone, and the like.

FIG. 22F shows digital signage 7400 attached to a cylindrical pillar 7401. The digital signage 7400 includes the display portion 7000 provided along a curved surface of the pillar 7401.

In FIGS. 22E and 22F, the display apparatus of one embodiment of the present invention can be used in the display portion 7000. Thus, a highly reliable electronic device is obtained.

A larger area of the display portion 7000 can increase the amount of information that can be provided at a time. The larger display portion 7000 attracts more attention, so that the effectiveness of the advertisement can be increased, for example.

The use of the touch panel in the display portion 7000 is preferable because in addition to display of still or moving images on the display portion 7000, intuitive operation by a user is possible. Moreover, for an application for providing information such as route information or traffic information, usability can be enhanced by intuitive operation.

As illustrated in FIGS. 22E and 22F, it is preferable that the digital signage 7300 or the digital signage 7400 can work with an information terminal 7311 or an information terminal 7411, such as a smartphone that a user has, through wireless communication. For example, information of an advertisement displayed on the display portion 7000 can be displayed on a screen of the information terminal 7311 or the information terminal 7411. By operation of the information terminal 7311 or the information terminal 7411, a displayed image on the display portion 7000 can be switched.

It is possible to make the digital signage 7300 or the digital signage 7400 execute a game with the use of the screen of the information terminal 7311 or the information terminal 7411 as an operation means (controller). Thus, an unspecified number of users can join in and enjoy the game concurrently.

Electronic devices illustrated in FIGS. 23A to 23G include a housing 9000, a display portion 9001, a speaker 9003, an operation key 9005 (including a power switch or an operation switch), a connection terminal 9006, a sensor 9007 (a sensor having a function of measuring force, displacement, position, speed, acceleration, angular velocity, rotational frequency, distance, light, liquid, magnetism, temperature, a chemical substance, sound, time, hardness, electric field, current, voltage, electric power, radiation, flow rate, humidity, gradient, oscillation, odor, or infrared rays), a microphone 9008, and the like.

The electronic devices illustrated in FIGS. 23A to 23G have a variety of functions. For example, the electronic devices can have a function of displaying a variety of information (e.g., a still image, a moving image, and a text image) on the display portion, a touch panel function, a function of displaying a calendar, date, time, and the like, a function of controlling processing with the use of a variety of software (programs), a wireless communication function, and a function of reading out and processing a program or data stored in a recording medium. Note that the functions of the electronic devices are not limited thereto, and the electronic devices can have a variety of functions. The electronic devices may include a plurality of display portions. The electronic devices may be provided with a camera or the like and have a function of taking a still image or a moving image, a function of storing the taken image in a storage medium (an external storage medium or a storage medium incorporated in the camera), a function of displaying the taken image on the display portion, and the like.

The electronic devices in FIGS. 23A to 23G are described in detail below.

Figure 23A:
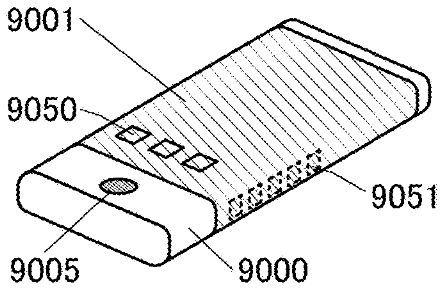
FIGS. 23A to 23G illustrate examples of electronic devices of an embodiment.

FIG. 23A is a perspective view of a portable information terminal 9101. The portable information terminal 9101 can be used as a smartphone, for example. The portable information terminal 9101 may include the speaker 9003, the connection terminal 9006, the sensor 9007, or the like. The portable information terminal 9101 can display text and image information on its plurality of surfaces. FIG. 23A illustrates an example where three icons 9050 are displayed. Furthermore, information 9051 indicated by dashed rectangles can be displayed on another surface of the display portion 9001. Examples of the information 9051 include notification of reception of an e-mail, an SNS message, an incoming call, or the like, the title and sender of an e-mail, an SNS message, or the like, the date, the time, remaining battery, and the radio field intensity. Alternatively, the icon 9050, for example, may be displayed at the position where the information 9051 is displayed.

Figure 23B:
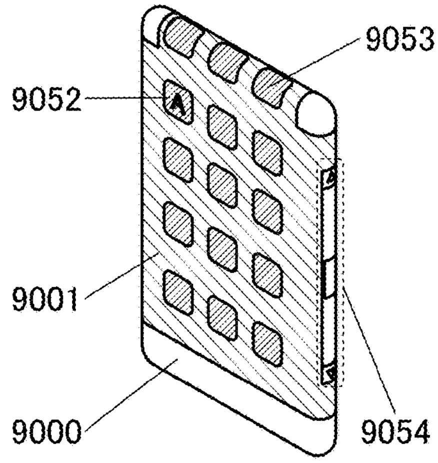

FIG. 23B is a perspective view of a portable information terminal 9102. The portable information terminal 9102 has a function of displaying information on three or more surfaces of the display portion 9001. Here, information 9052, information 9053, and information 9054 are displayed on different surfaces. For example, the user of the portable information terminal 9102 can check the information 9053 displayed such that it can be seen from above the portable information terminal 9102, with the portable information terminal 9102 put in a breast pocket of user's clothes. Thus, the user can see the display without taking out the portable information terminal 9102 from the pocket and decide whether to answer the call, for example.

Figure 23C:
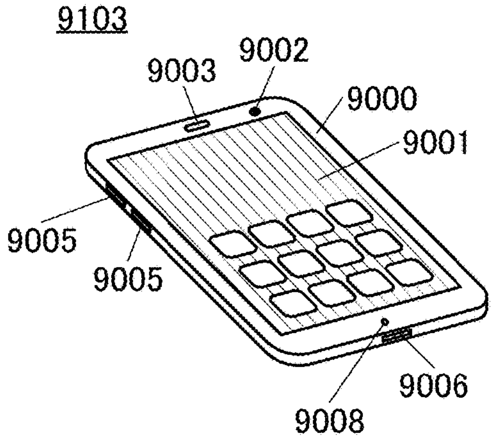

FIG. 23C is a perspective view of a tablet terminal 9103. The tablet terminal 9103 is capable of executing a variety of applications such as mobile phone calls, e-mailing, viewing and editing texts, music reproduction, Internet communication, and a computer game, for example. The tablet terminal 9103 includes the display portion 9001, the camera 9002, the microphone 9008, and the speaker 9003 on the front surface of the housing 9000; the operation keys 9005 as buttons for operation on the left side surface of the housing 9000; and the connection terminal 9006 on the bottom surface of the housing 9000.

Figure 23D:
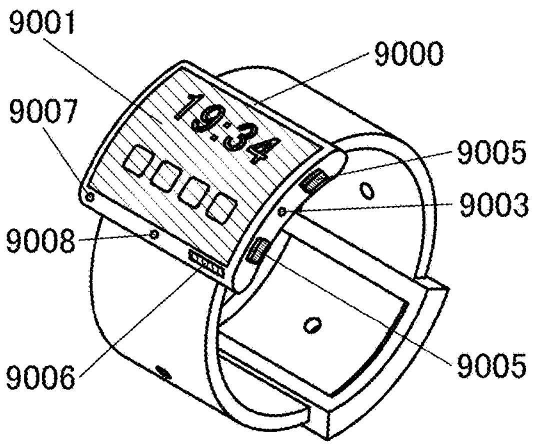

FIG. 23D is a perspective view of a watch-type portable information terminal 9200. The portable information terminal 9200 can be used as a Smartwatch (registered trademark), for example. The display surface of the display portion 9001 is curved, and an image can be displayed on the curved display surface. Furthermore, for example, mutual communication between the portable information terminal 9200 and a headset capable of wireless communication can be performed, and thus hands-free calling is possible. With the connection terminal 9006, the portable information terminal 9200 can perform mutual data transmission with another information terminal and charging. Note that the charging operation may be performed by wireless power feeding.

Figure 23E:
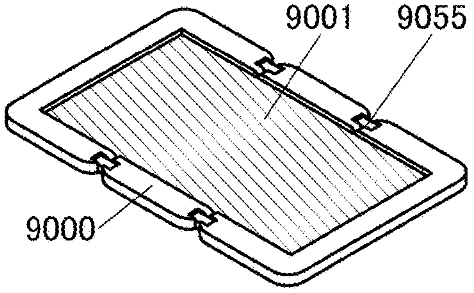
Figure 23F:
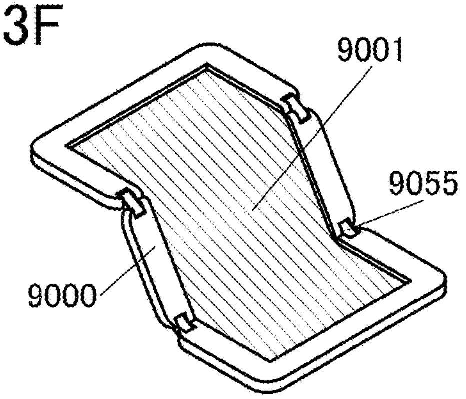
Figure 23G:
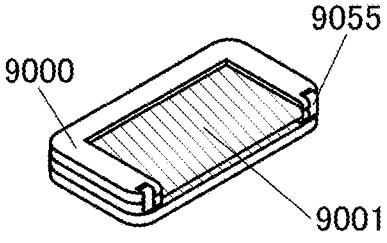

FIGS. 23E to 23G are perspective views of a foldable portable information terminal 9201. FIG. 23E is a perspective view showing the portable information terminal 9201 that is opened. FIG. 23G is a perspective view showing the portable information terminal 9201 that is folded. FIG. 23F is a perspective view showing the portable information terminal 9201 that is shifted from one of the states in FIGS. 23E and 23G to the other. The portable information terminal 9201 is highly portable when folded. When the portable information terminal 9201 is opened, a seamless large display region is highly browsable. The display portion 9001 of the portable information terminal 9201 is supported by three housings 9000 joined together by hinges 9055. The display portion 9001 can be folded with a radius of curvature greater than or equal to 0.1 mm and less than or equal to 150 mm, for example.

This embodiment can be combined with any of the other embodiments as appropriate. In this specification, in the case where a plurality of structure examples are shown in one embodiment, the structure examples can be combined as appropriate.

Example 1

In this example, a light-emitting device 1 to a light-emitting device 3 that can be used for a display apparatus of one embodiment of the present invention are described with reference to FIG. 24, FIG. 25, FIG. 26, FIG. 27, FIG. 28, and FIGS. 29A to 29D.

Figure 24:
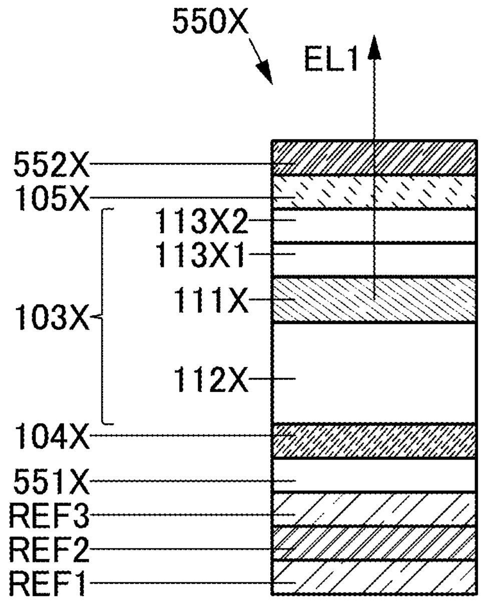
FIG. 24 illustrates a structure of a light-emitting device that can be used for a display apparatus of an example.

FIG. 24 illustrates a structure of the light-emitting device 550X.

Figure 25:
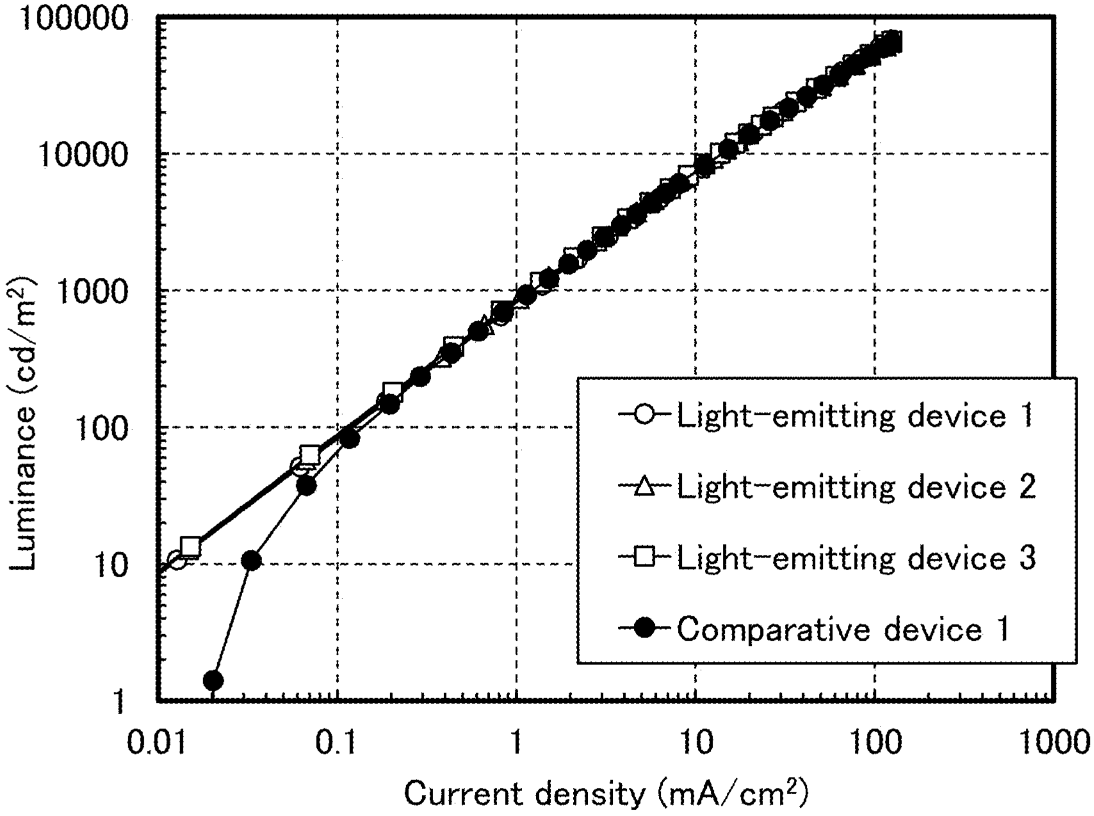
FIG. 25 shows current density-luminance characteristics of light-emitting devices of an example.

FIG. 25 shows current density-luminance characteristics of the light-emitting devices 1 to 3 and a comparative device 1.

Figure 26:
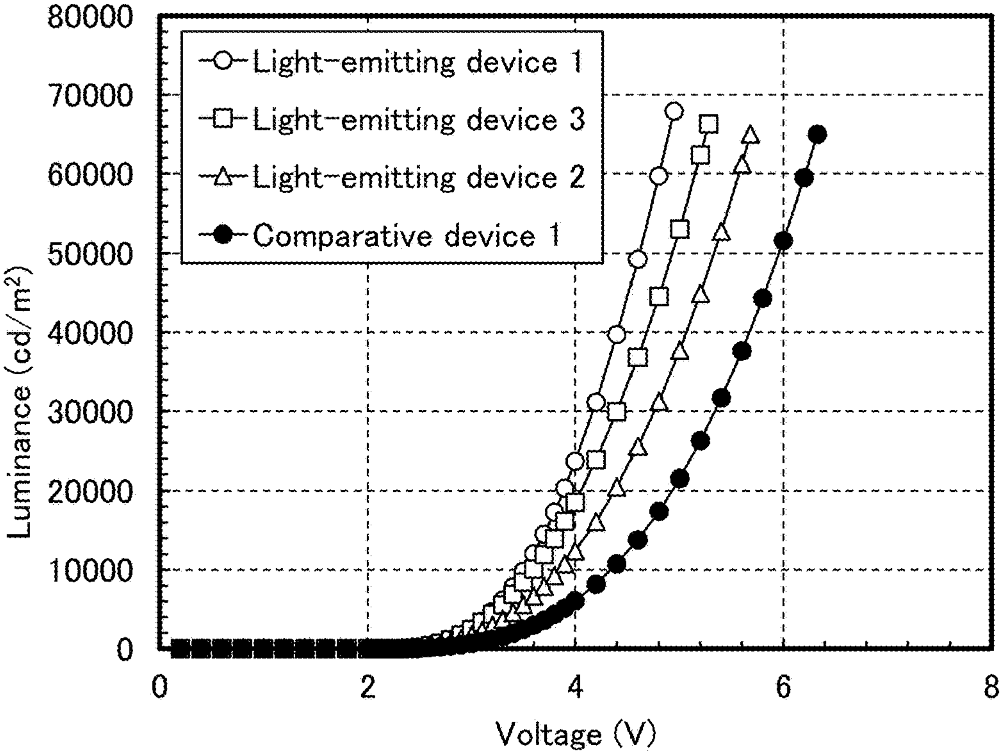
FIG. 26 shows voltage-luminance characteristics of light-emitting devices of an example.

FIG. 26 shows voltage-luminance characteristics of the light-emitting devices 1 to 3 and the comparative device 1.

Figure 27:
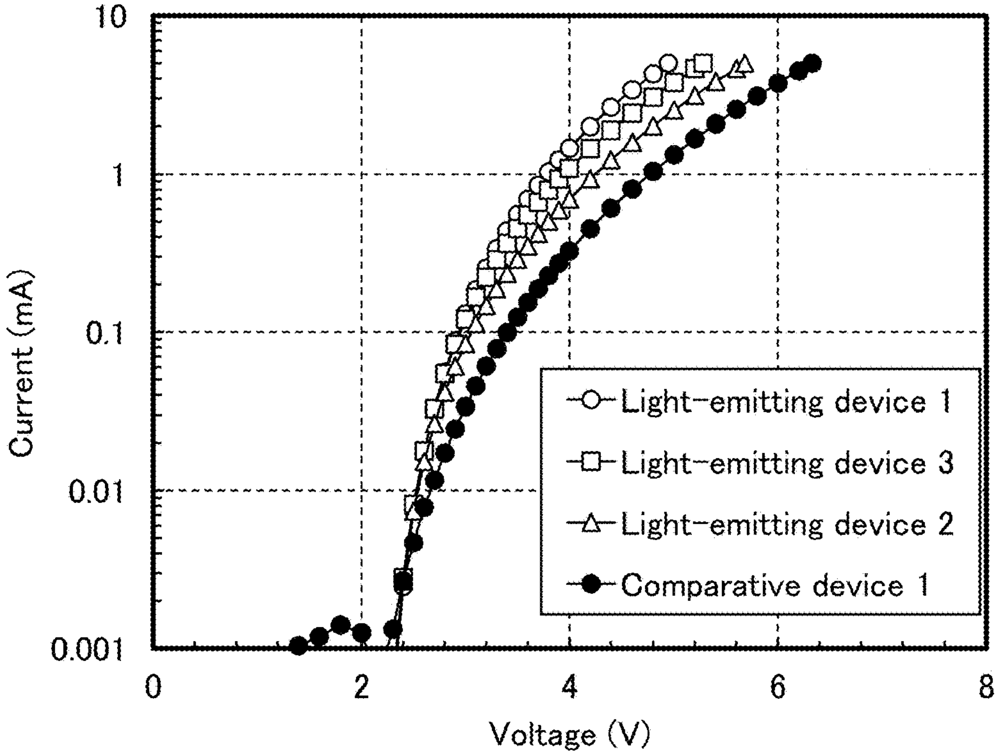
FIG. 27 shows voltage-current characteristics of light-emitting devices of an example.

FIG. 27 shows voltage-current characteristics of the light-emitting devices 1 to 3 and the comparative device 1.

Figure 28:
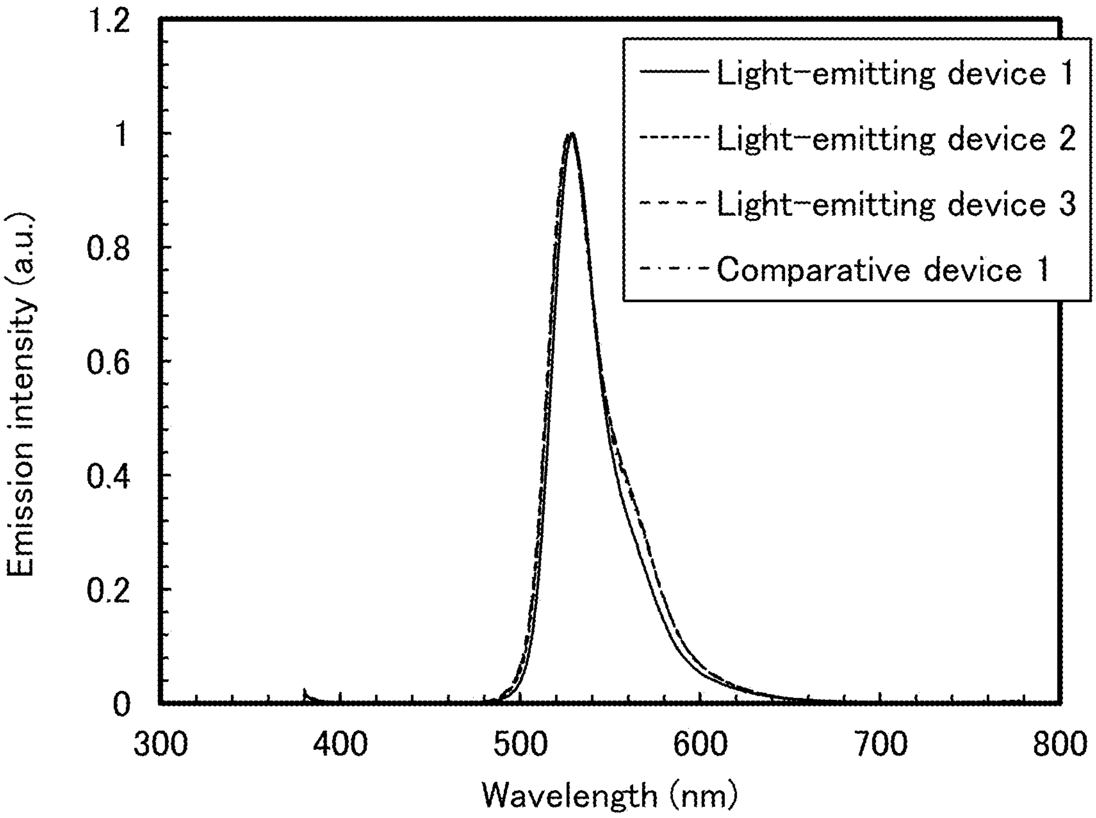
FIG. 28 shows emission spectra of light-emitting devices of an example.

FIG. 28 shows emission spectra of the light-emitting devices 1 to 3 and the comparative device 1 each emitting light at a luminance of 1000 cd/$m^2$.

FIGS. 29A to 29D are optical micrographs showing the emission states of the light-emitting devices 1 to 3 and the comparative device 1 each emitting light while being supplied with a current flowing at a current density of 2.5 mA/$cm^2$.

<Light-Emitting Device 1>

The fabricated light-emitting device 1, which is described in this example, has a structure similar to that of the light-emitting device 550X (see FIG. 24).

«Structure of Light-Emitting Device 1»

Table 1 shows the structure of the light-emitting device 1. Structural formulae of materials used in the light-emitting devices described in this example are shown below. Note that in the tables in this example, subscript and superscript characters are written in ordinary size for convenience. For example, a subscript character in an abbreviation and a superscript character in a unit are written in ordinary size in the tables. The corresponding description in the specification gives an accurate reading of such notations in the tables.

TABLE 1

| Components | Reference numerals | Materials | Composition ratio | Thickness/nm |
|---|---|---|---|---|
| Layer | CAP | ITO | | 70 |
| Electrode | 552X | Ag:Mg | 1:0.1 | 25 |
| Layer | 105X | LiF:Yb | 1:0.5 | 1.5 |
| Layer | 113X2 | mPPhen2P | | 15 |
| Layer | 113X1 | 2mPCCzPDBq | | 10 |
| Layer | 111X | 8mpTP-4mDBtPBfpm: βNCCP:Ir(5mppy-d3)2(mbfpypy-d3) | 0.6: 0.4:0.1 | 40 |
| Layer | 112X | PCBBiF | | 10 |
| Layer | 104X | PCBBiF: OCHD-003 | 1:x | 10 |
| Electrode | 551X | ITSO | | 10 |
| Reflective film | REF3 | Ti | | 6 |
| Reflective film | REF2 | Al | | 70 |
| Reflective film | REF1 | Ti | | 50 |

[Chemical Formulae 3]

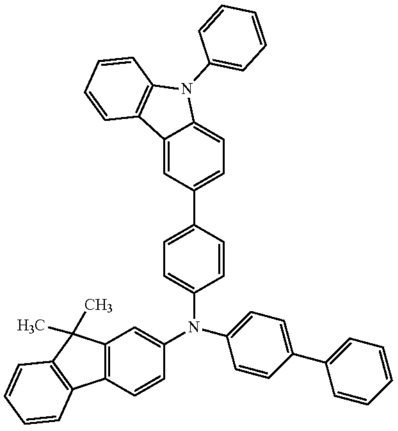

PCBBiF

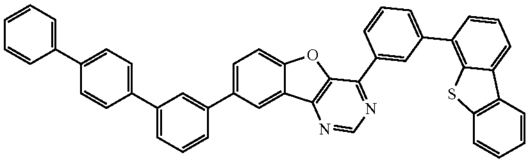

8mpTP-4mDBtPBfpm

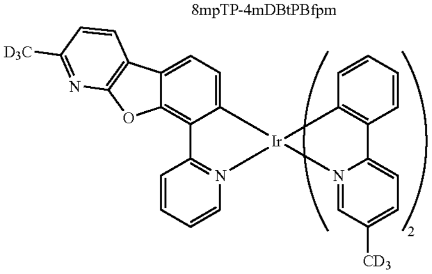

Ir(5mppy-d3)2(mbfpypy-d3)

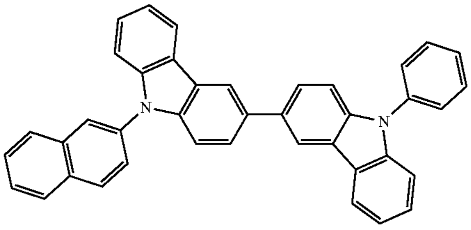

β NCCP

TABLE 1-continued

| Compo-nents | Reference numerals | Materials | Compo-sition ratio | Thickness/ nm |
|---|---|---|---|---|

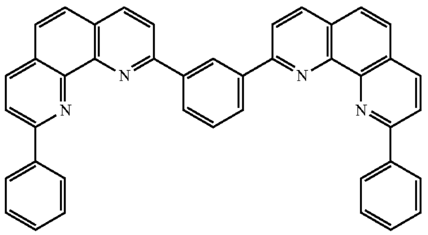

mPPhen2P

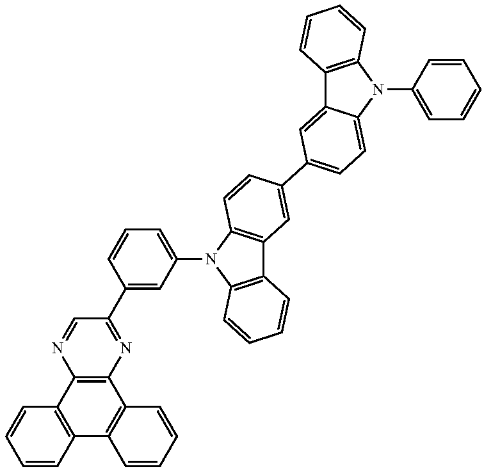

2mPCCzPDBq

«Method for Fabricating Light-Emitting Device 1»

The light-emitting device 1 described in this example was fabricated using a method including the following steps.

[Step 1]

A reflective film REF1 was formed in Step 1. Specifically, the reflective film REF1 was formed by a sputtering method using titanium (Ti) as a target. The reflective film REF1 contains Ti and has a thickness of 50 nm.

[Step 2]

A reflective film REF2 was formed over the reflective film REF1 in Step 2. Specifically, the reflective film REF2 was formed by a sputtering method using aluminum (Al) as a target. The reflective film REF2 contains Al and has a thickness of 70 nm.

[Step 3]

A reflective film REF3 was formed over the reflective film REF2 in Step 3. Specifically, the reflective film REF3 was formed by a sputtering method using Ti as a target. The reflective film REF3 contains Ti and has a thickness of 6 nm.

[Step 4-1]

In Step 4-1, the electrode 551X was formed over the reflective film REF3. Specifically, the electrode 551X was formed by a sputtering method using indium oxide-tin oxide containing silicon or silicon oxide (abbreviation: ITSO) as a target. The electrode 551X contains ITSO and has a thickness of 10 nm and an area of 4 $mm^2$ (2 mm×2 mm).

[Step 4-2]

In Step 4-2, a workpiece provided with the electrode was washed with water. Then, the workpiece was transferred into a vacuum evaporation apparatus in which the pressure was reduced to approximately $10^{-4}$ Pa, and vacuum baking was performed at 170° C. for 60 minutes in a heating chamber of the vacuum evaporation apparatus. Then, the workpiece was cooled down for approximately 30 minutes.

[Step 5]

In Step 5, the layer 104X was formed over the electrode 551X. Specifically, materials of the layer 104X were co-deposited by a resistance-heating method. The layer 104X contains N-(biphenyl-4-yl)-N-[4-(9-phenyl-9H-carbazol-3-yl)phenyl]-9,9-dimethyl-9H-fluoren-2-amine (abbreviation: PCBBiF) and an electron-accepting material (OCHD-003) at 1:0.03 in a weight ratio and has a thickness of 10 nm. Note that OCHD-003 contains fluorine, and has a molecular weight of 672.

[Step 6]

In Step 6, the layer 112X was formed over the layer 104X. Specifically, a material of the layer 112X was deposited by a resistance-heating method. The layer 112X contains PCBBiF and has a thickness of 10 nm.

[Step 7]

In Step 7, the layer 111X was formed over the layer 112X. Specifically, materials of the layer 111X were co-deposited by a resistance-heating method. The layer 111X contains 8-(1,1': 4',1"-terphenyl-3-yl)-4-[3-(dibenzothiophen-4-yl)phenyl]-[1]benzofuro[3,2-d]pyrimidine (abbreviation: 8mpTP-4mDBtPBfpm), 9-(2-naphthyl)-9'-phenyl-9H,9'H-3,3'-bicarbazole (abbreviation: βNCCP), and [2-$d_3$-methyl-8-(2-pyridinyl-κN)benzofuro[2,3-b]pyridine-κC]bis[2-(5-$d_3$-methyl-2-pyridinyl-κ$N^2$)phenyl-κC]iridium(III) (abbreviation: $Ir(5mppy\text{-}d3)_2(mbfpypy\text{-}d3)$) at 0.6:0.4:0.1 in a weight ratio and has a thickness of 40 nm.

[Step 8]

In Step 8, a layer 113X1 was formed over the layer 111X. Specifically, a material of the layer 113X1 was deposited by a resistance-heating method. The layer 113X1 contains 2-{3-[3-(N-phenyl-9H-carbazol-3-yl)-9H-carbazol-9-yl]phenyl}dibenzo[f,h]quinoxaline (abbreviation: 2mPCCzPDBq) and has a thickness of 10 nm.

[Step 9]

In Step 9, the layer 113X2 was formed over the layer 113X1. Specifically, a material of the layer 113X2 was deposited by a resistance-heating method. The layer 113X2 contains 2,2'-(1,3-phenylene)bis(9-phenyl-1,10-phenanthroline) (abbreviation: mPPhen2P) and has a thickness of 15 nm.

[Step 10]

In Step 10, the layer 105X was formed over the layer 113X2. Specifically, materials of the layer 105X were co-deposited by a resistance-heating method. The layer 105X contains lithium fluoride (LiF) and ytterbium (Yb) at 1:0.5 in a volume ratio and has a thickness of 1.5 nm.

[Step 11]

In Step 11, the electrode 552X was formed over the layer 105X. Specifically, materials of the electrode 552X were co-deposited by a resistance-heating method. The electrode 552X contains silver (Ag) and magnesium (Mg) at 1:0.1 in a volume ratio and has a thickness of 25 nm.

[Step 12]

In Step 12, a layer CAP was formed over the electrode 552X. Specifically, the layer CAP was formed by a sputtering method using indium oxide-tin oxide (abbreviation: ITO) as a target. The layer CAP contains ITO and has a thickness of 70 nm.

«Operation Characteristics of Light-Emitting Device 1»

When supplied with electric power, the light-emitting device 1 emitted light EL1 (see FIG. 24). Operation characteristics of the light-emitting device 1 were measured at room temperature (see FIG. 25 to FIG. 28). Note that luminance, CIE chromaticity, and emission spectra were measured with a spectroradiometer (SR-UL1R manufactured by TOPCON TECHNOHOUSE CORPORATION).

Table 2 shows main initial characteristics of the fabricated light-emitting device emitting light at a luminance of approximately 1000 cd/$m^2$. Table 2 also shows the characteristics of other light-emitting devices each having a structure described later.

TABLE 2

| | Voltage (V) | Current (mA) | Current density (mA/cm2) | Chromaticity x | Chromaticity y | Current efficiency (cd/A) |
|---|---|---|---|---|---|---|
| Light-emitting device 1 | 2.8 | 0.06 | 1.4 | 0.27 | 0.69 | 78.6 |
| Light-emitting device 2 | 2.8 | 0.04 | 1.0 | 0.28 | 0.68 | 84.0 |
| Light-emitting device 3 | 2.8 | 0.05 | 1.4 | 0.28 | 0.68 | 84.3 |
| Comparative device 1 | 3.1 | 0.05 | 1.1 | 0.28 | 0.68 | 81.6 |

The light-emitting device 1 was found to exhibit favorable characteristics. In terms of the voltage-luminance characteristics, for example, the light-emitting device 1 exhibited luminance equal to that of the comparative device 1 described later at a voltage lower than that for the comparative device 1 (see FIG. 26). The comparative device 1 described later and the light-emitting device 1 have similar structures but were fabricated by different methods. Specifically, in Step 4-2 of the fabrication method of the comparative device 1, the electrode 551X of the comparative device 1 is exposed to an etching gas used in a dry etching method and the properties of the electrode 551X change. Moreover, the light-emitting device 1 emitted light more uniformly than the comparative device 1 described later (see FIG. 29A).

<Light-Emitting Device 2>

The fabricated light-emitting device 2, which is described in this example, has a structure similar to that of the light-emitting device 550X (see FIG. 24). The structure of the light-emitting device 2 is different from that of the light-emitting device 1 in the layer 104X. Specifically, the light-emitting device 2 is different from the light-emitting device 1 in containing PCBBiF and OCHD-003 at 1:0.10 in a weight ratio and in a fabrication method. Different portions are described in detail here, and the above description is referred to for portions where a structure and a method similar to the above were employed.

«Method for Fabricating Light-Emitting Device 2»

The light-emitting device 2 described in this example was fabricated using a method including the following steps.

The fabrication method of the light-emitting device 2 is different from that of the light-emitting device 1 in Step 4-2 and Step 9. Different portions are described in detail here, and the above description is referred to for portions where a method similar to the above was employed.

[Step 4-2]

In Step 4-2, 1,1,1,3,3,3-hexamethyldisilazane (abbreviation: HMIDS) was vaporized, and a spray thereof was given, for 120 seconds, to a workpiece heated to 60° C.

Next, in an apparatus in which the pressure was reduced to 5.0 Pa, $O_2$ plasma treatment was performed with an energy of 600 W for 3 seconds while oxygen was supplied at a flow rate of 48 sccm; the pressure was adjusted to 1.0 Pa; and then $O_2$ plasma treatment was performed with an energy of 600 W for 10 seconds while oxygen was supplied at a flow rate of 48 sccm. Note that this step corresponds to Step 5 of the manufacturing method of the display apparatus described in Embodiment 1. In this manner, the electrode 551X of the light-emitting device 2 is exposed to an etching gas used in a dry etching method. In addition, the properties of the electrode 551X of the light-emitting device 2 are made different from those of the electrode 551X of the light-emitting device 1.

Next, in an apparatus in which the pressure was reduced to 5.0 Pa, $CF_4$ plasma treatment was performed with an energy of 200 W for 3 seconds while $CF_4$ was supplied at a flow rate of 80 sccm; the pressure was adjusted to 2.0 Pa; and then $CF_4$ plasma treatment was performed with an energy of 200 W for 15 seconds while $CF_4$ was supplied at a flow rate of 80 sccm.

[Step 5]

In Step 5, the layer 104X was formed over the electrode 551X. Specifically, materials of the layer 104X were co-deposited by a resistance-heating method. The layer 104X contains PCBBiF and OCHD-003 at 1:0.10 in a weight ratio and has a thickness of 10 nm.

[Step 9]

In Step 9, the layer 113X2 was formed over the layer 113X1. Specifically, a material of the layer 113X2 was deposited by a resistance-heating method. The layer 113X2 contains mPPhen2P and has a thickness of 15 nm.

Next, the workpiece provided with the layer 113X2 was taken out from a vacuum apparatus and then immersed in pure water for 20 minutes, and water droplets attached to the workpiece were removed by spraying a nitrogen gas.

Then, the workpiece was transferred into a vacuum evaporation apparatus in which the pressure was reduced to approximately $10^{-4}$ Pa, and vacuum baking was performed at 70° C. for 90 minutes in a heating chamber of the vacuum evaporation apparatus. Then, the workpiece was cooled down for approximately 30 minutes.

After taken out from a vacuum apparatus, the workpiece was treated in the air under orange light. The workpiece was stored in a black box when not treated, so that the operation time in the air was adjusted to 24 hours; the operation time in the air includes the time taken for immersing the workpiece in pure water.

«Operation Characteristics of Light-Emitting Device 2»

Figure 29A:
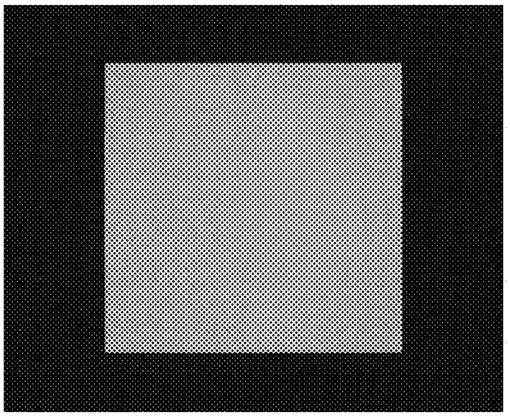
FIGS. 29A to 29D illustrate emission states of light-emitting devices of an example.
Figure 29B:
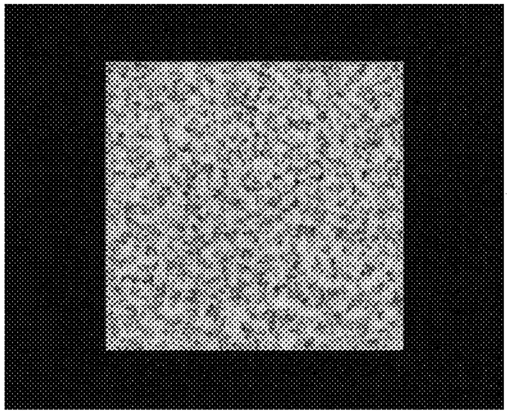
Figure 29C:
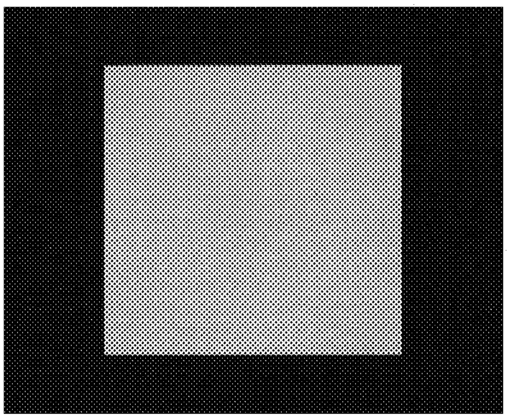
Figure 29D:
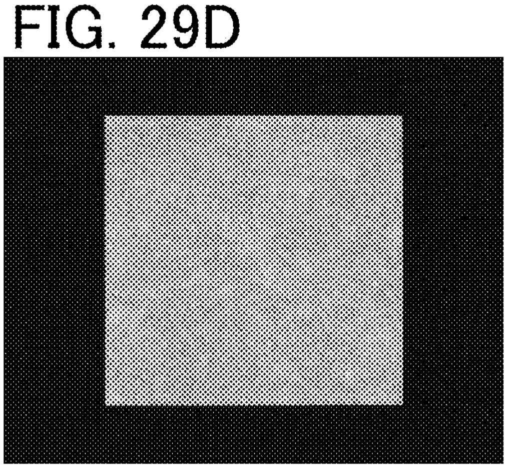

When supplied with electric power, the light-emitting device 2 emitted the light EL1 (see FIG. 24). Operation characteristics of the light-emitting device 2 were measured at room temperature (see FIG. 25 to FIG. 28). Although Step 4-2 of the fabrication method of the light-emitting device 2 is the same as that of the comparative device 1 described later, in terms of the voltage-luminance characteristics, the light-emitting device 2 exhibited luminance equal to that of the comparative device 1 described later at a voltage lower than that for the comparative device 1 (see FIG. 26). The use of the layer 104X containing the electron-accepting material at a high weight percentage was able to compensate for the properties of the electrode 551X that impaired in Step 4-2 of the fabrication method. Specifically, the electrode 551X exposed to the etching gas containing oxygen was compensated for a change in its properties. FIG. 29B shows the emission state of the light-emitting device 2.

<Light-Emitting Device 3>

The fabricated light-emitting device 3, which is described in this example, has a structure similar to that of the light-emitting device 550X (see FIG. 24). The structure of the light-emitting device 3 is different from that of the light-emitting device 1 in the layer 104X. Specifically, the light-emitting device 3 is different from the light-emitting device 1 in containing PCBBiF and OCHD-003 at 1:0.30 in a weight ratio and in a fabrication method. Different portions are described in detail here, and the above description is referred to for portions where a structure and a method similar to the above were employed.

«Method for Fabricating Light-Emitting Device 3»

The light-emitting device 3 described in this example was fabricated using a method including the following steps.

The fabrication method of the light-emitting device 3 is different from that of the light-emitting device 1 in Step 4-2 and Step 9. Different portions are described in detail here, and the above description is referred to for portions where a method similar to the above was employed.

[Step 4-2]

In Step 4-2, HMDS was vaporized, and a spray thereof was given, for 120 seconds, to a workpiece heated to 60° C.

Next, in an apparatus in which the pressure was reduced to 5.0 Pa, $O_2$ plasma treatment was performed with an energy of 600 W for 3 seconds while oxygen was supplied at a flow rate of 48 sccm; the pressure was adjusted to 1.0 Pa; and then $O_2$ plasma treatment was performed with an energy of 600 W for 10 seconds while oxygen was supplied at a flow rate of 48 sccm. Note that this step corresponds to Step 5 of the manufacturing method of the display apparatus described in Embodiment 1. In this manner, the electrode 551X of the light-emitting device 3 is exposed to an etching gas used in a dry etching method. In addition, the properties of the electrode 551X of the light-emitting device 3 are made different from those of the electrode 551X of the light-emitting device 1.

Next, in an apparatus in which the pressure was reduced to 5.0 Pa, $CF_4$ plasma treatment was performed with an energy of 200 W for 3 seconds while $CF_4$ was supplied at a flow rate of 80 sccm; the pressure was adjusted to 2.0 Pa; and then $CF_4$ plasma treatment was performed with an energy of 200 W for 15 seconds while $CF_4$ was supplied at a flow rate of 80 sccm.

[Step 5]

In Step 5, the layer 104X was formed over the electrode 551X. Specifically, materials of the layer 104X were co-deposited by a resistance-heating method. The layer 104X contains PCBBiF and OCHD-003 at 1:0.30 in a weight ratio and has a thickness of 10 nm.

[Step 9]

In Step 9, the layer 113X2 was formed over the layer 113X1. Specifically, a material of the layer 113X2 was deposited by a resistance-heating method. The layer 113X2 contains mPPhen2P and has a thickness of 15 nm.

Next, the workpiece provided with the layer 113X2 was taken out from a vacuum apparatus and then immersed in pure water for 20 minutes, and water droplets attached to the workpiece were removed by spraying a nitrogen gas.

Then, the workpiece was transferred into a vacuum evaporation apparatus in which the pressure was reduced to approximately $10^{-4}$ Pa, and vacuum baking was performed at 70° C. for 90 minutes in a heating chamber of the vacuum evaporation apparatus. Then, the workpiece was cooled down for approximately 30 minutes.

After taken out from a vacuum apparatus, the workpiece was treated in the air under orange light. The workpiece was stored in a black box when not treated, so that the operation time in the air was adjusted to 24 hours; the operation time in the air includes the time taken for immersing the workpiece in pure water.

«Operation Characteristics of Light-Emitting Device 3»

When supplied with electric power, the light-emitting device 3 emitted the light EL1 (see FIG. 24). Operation characteristics of the light-emitting device 3 were measured at room temperature (see FIG. 25 to FIG. 28). Although Step 4-2 of the fabrication method of the light-emitting device 3 is the same as that of the comparative device 1 described later, in terms of the voltage-luminance characteristics, the light-emitting device 3 exhibited luminance equal to that of the comparative device 1 at a voltage lower than that for the comparative device 1 (see FIG. 26). In addition, although Step 4-2 of the fabrication method of the light-emitting device 3 is the same as that of the light-emitting device 2, the light-emitting device 3 exhibited luminance equal to that of the light-emitting device 2 at a voltage lower than that for the light-emitting device 2. The use of the layer 104X containing the electron-accepting material at a high weight percentage was able to more favorably compensate for the properties of the electrode 551X that impaired in Step 4-2 of the fabrication method. Specifically, the electrode 551X exposed to the etching gas containing oxygen was compensated for a change in its properties. Moreover, the light-emitting device 3 emitted light more uniformly than the comparative device 1 (see FIG. 29C).

<Comparative Device 1>

The fabricated comparative device 1, which is described in this example, has a structure similar to that of the light-emitting device 550X (see FIG. 24). The comparative device 1 and the light-emitting device 1 have similar structures but were fabricated by different methods. Different portions are described in detail here, and the above description is referred to for portions where a structure and a method similar to the above were employed.

«Method for Fabricating Comparative Device 1»

The comparative device 1 described in this example was fabricated using a method including the following steps.

The fabrication method of the comparative device 1 is different from that of the light-emitting device 1 in Step 4-2 and Step 9. Different portions are described in detail here, and the above description is referred to for portions where a method similar to the above was employed.

[Step 4-2]

In Step 4-2, HMDS was vaporized, and a spray thereof was given, for 120 seconds, to a workpiece heated to 60° C.

Next, in an apparatus in which the pressure was reduced to 5.0 Pa, $O_2$ plasma treatment was performed with an energy of 600 W for 3 seconds while oxygen was supplied at a flow rate of 48 sccm; the pressure was adjusted to 1.0 Pa; and then $O_2$ plasma treatment was performed with an energy of 600 W for 10 seconds while oxygen was supplied at a flow rate of 48 sccm. Note that this step corresponds to Step 5 of the manufacturing method of the display apparatus described in Embodiment 1. In this manner, the electrode 551X of the comparative device 1 is exposed to an etching gas used in a dry etching method. In addition, the properties of the electrode 551X of the comparative device 1 are made different from those of the electrode 551X of the light-emitting device 1.

Next, in an apparatus in which the pressure was reduced to 5.0 Pa, $CF_4$ plasma treatment was performed with an energy of 200 W for 3 seconds while $CF_4$ was supplied at a flow rate of 80 sccm; the pressure was adjusted to 2.0 Pa; and then $CF_4$ plasma treatment was performed with an energy of 200 W for 15 seconds while $CF_4$ was supplied at a flow rate of 80 sccm.

[Step 5]

In Step 5, the layer 104X was formed over the electrode 551X. Specifically, materials of the layer 104X were co-deposited by a resistance-heating method. The layer 104X contains PCBBiF and OCHD-003 at 1:0.03 in a weight ratio and has a thickness of 10 nm.

[Step 9]

In Step 9, the layer 113X2 was formed over the layer 113X1. Specifically, a material of the layer 113X2 was deposited by a resistance-heating method. The layer 113X2 contains mPPhen2P and has a thickness of 15 nm.

Next, the workpiece provided with the layer 113X2 was taken out from a vacuum apparatus and then immersed in pure water for 20 minutes, and water droplets attached to the workpiece were removed by spraying a nitrogen gas.

Then, the workpiece was transferred into a vacuum evaporation apparatus in which the pressure was reduced to approximately $10^{-4}$ Pa, and vacuum baking was performed at 70° C. for 90 minutes in a heating chamber of the vacuum evaporation apparatus. Then, the workpiece was cooled down for approximately 30 minutes.

After taken out from a vacuum apparatus, the workpiece was treated in the air under orange light. The workpiece was stored in a black box when not treated, so that the operation time in the air was adjusted to 24 hours; the operation time in the air includes the time taken for immersing the workpiece in pure water.

Example 2

In this example, a method for processing an electrode of a light-emitting device that can be used for a display apparatus of one embodiment of the present invention is described with reference to FIGS. 30A to 30C, FIGS. 31A and 31B, FIG. 32, FIG. 33, FIG. 34, FIG. 35, FIG. 36, FIG. 37, and FIG. 38.

Figure 30A:
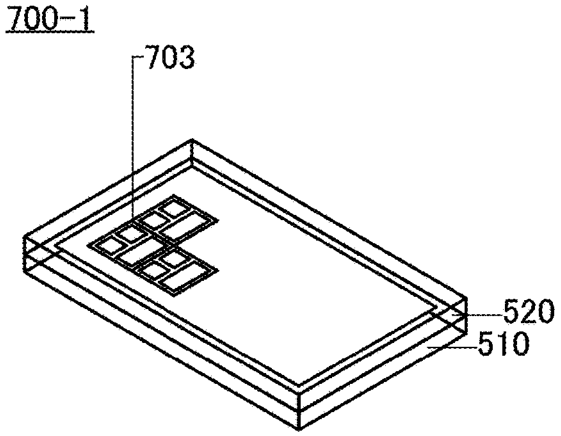
FIGS. 30A to 30C illustrate a structure of a display apparatus of an example.
Figure 30B:
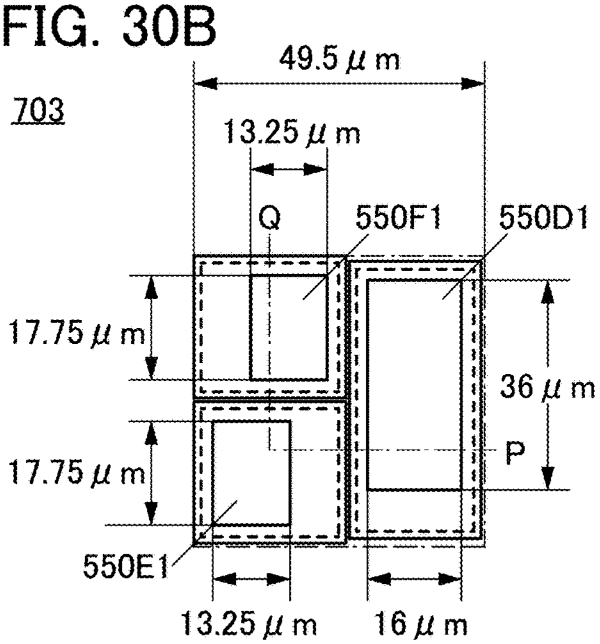
Figure 30C:
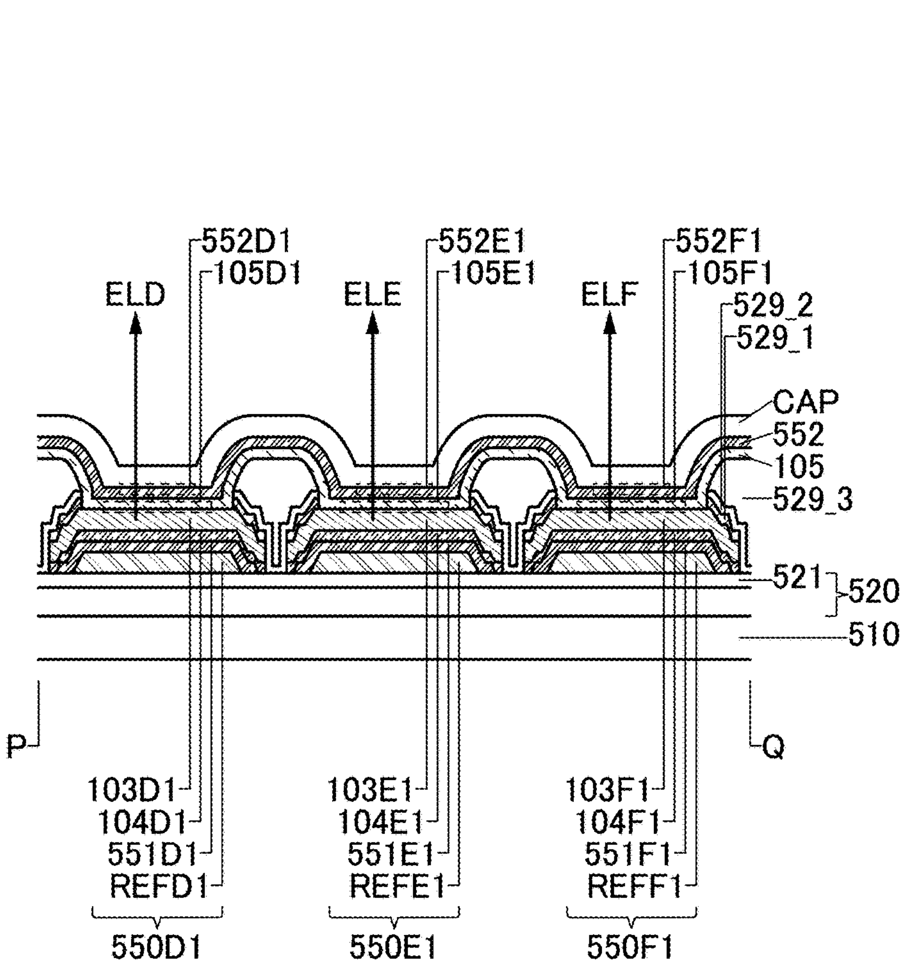

FIG. 30A illustrates a structure of a display apparatus 700-1. FIG. 30B illustrates part of FIG. 30A and FIG. 30C illustrates a cross section taken along a cutting line P-Q in FIG. 30B.

Figure 31A:
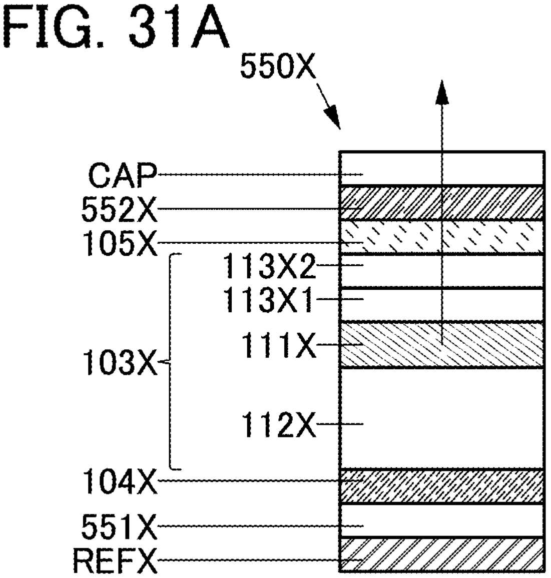
FIGS. 31A and 31B illustrate structures of a light-emitting device that can be used for a display apparatus of an example.
Figure 31B:
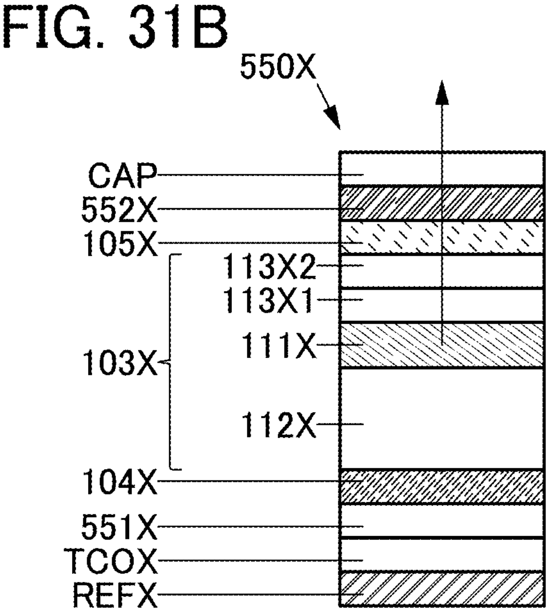

FIG. 31A illustrates a structure of a light-emitting device that can be used for the display apparatus 700-1, and FIG. 31B illustrates a structure of a light-emitting device that can be used for a display apparatus 700-2.

Figure 32:
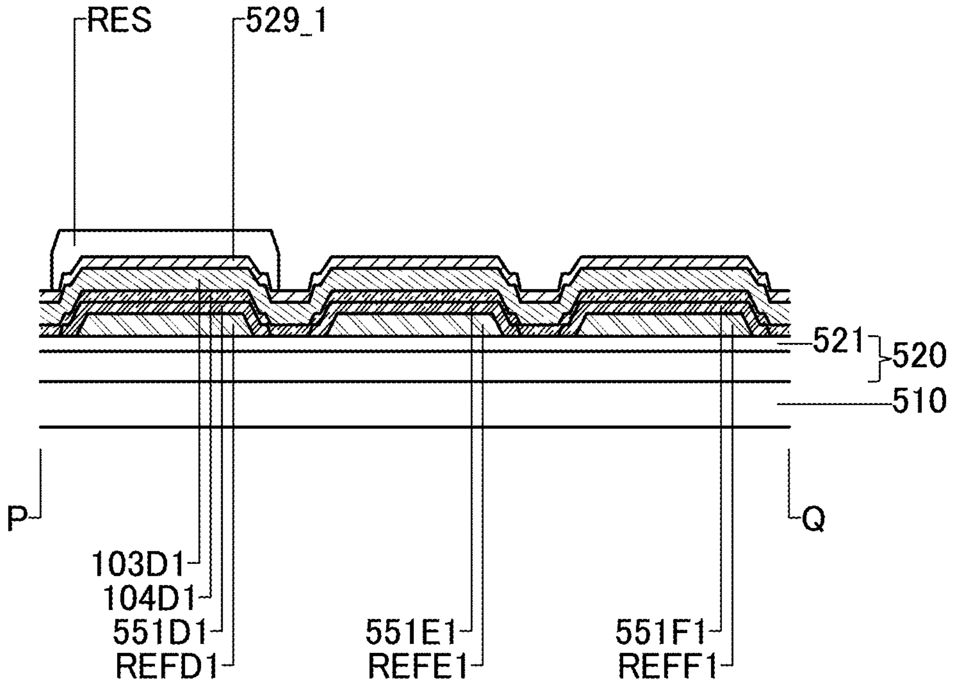
FIG. 32 illustrates a method for fabricating a display apparatus of an example.

FIG. 32 illustrates a fabrication method of the display apparatus 700-1.

Figure 33:
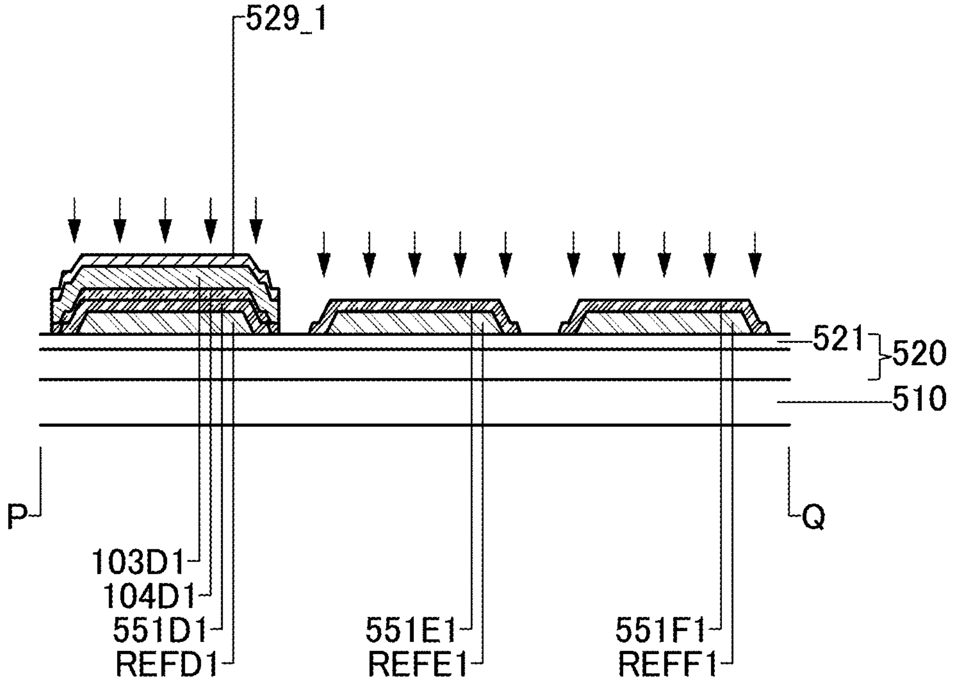
FIG. 33 illustrates a method for fabricating a display apparatus of an example.

FIG. 33 illustrates the fabrication method of the display apparatus 700-1.

Figure 34:
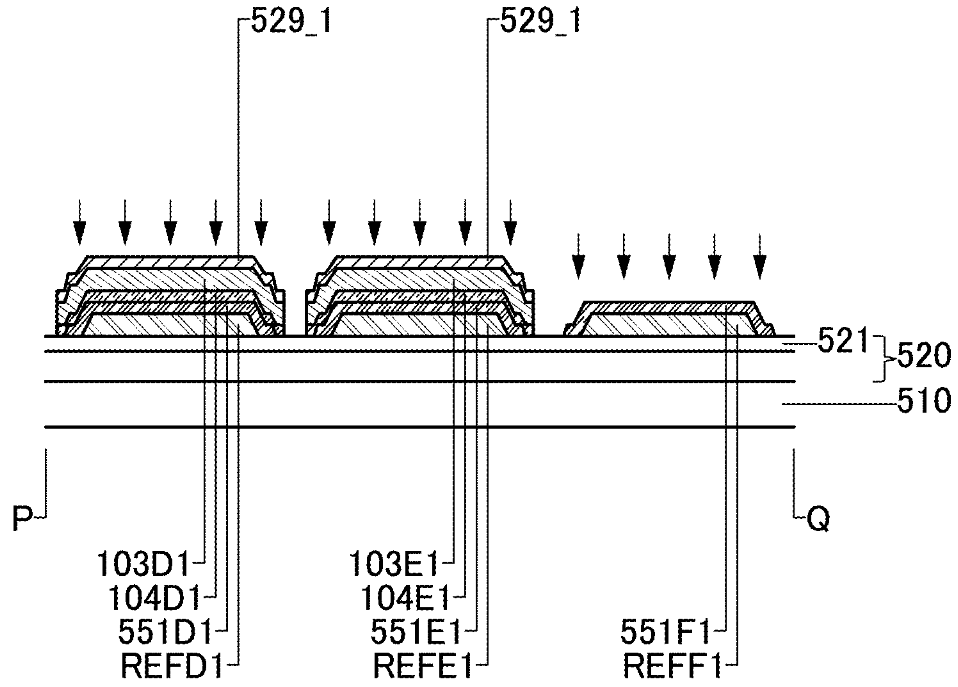
FIG. 34 illustrates a method for fabricating a display apparatus of an example.

FIG. 34 illustrates the fabrication method of the display apparatus 700-1.

Figure 35:
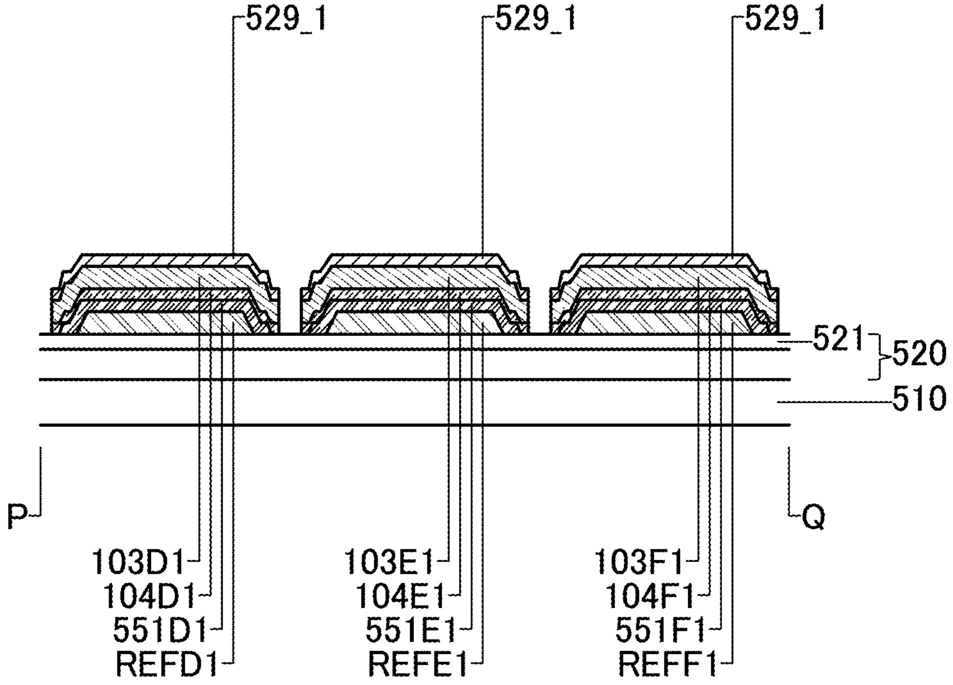
FIG. 35 illustrates a method for fabricating a display apparatus of an example.

FIG. 35 illustrates the fabrication method of the display apparatus 700-1.

Figure 36:
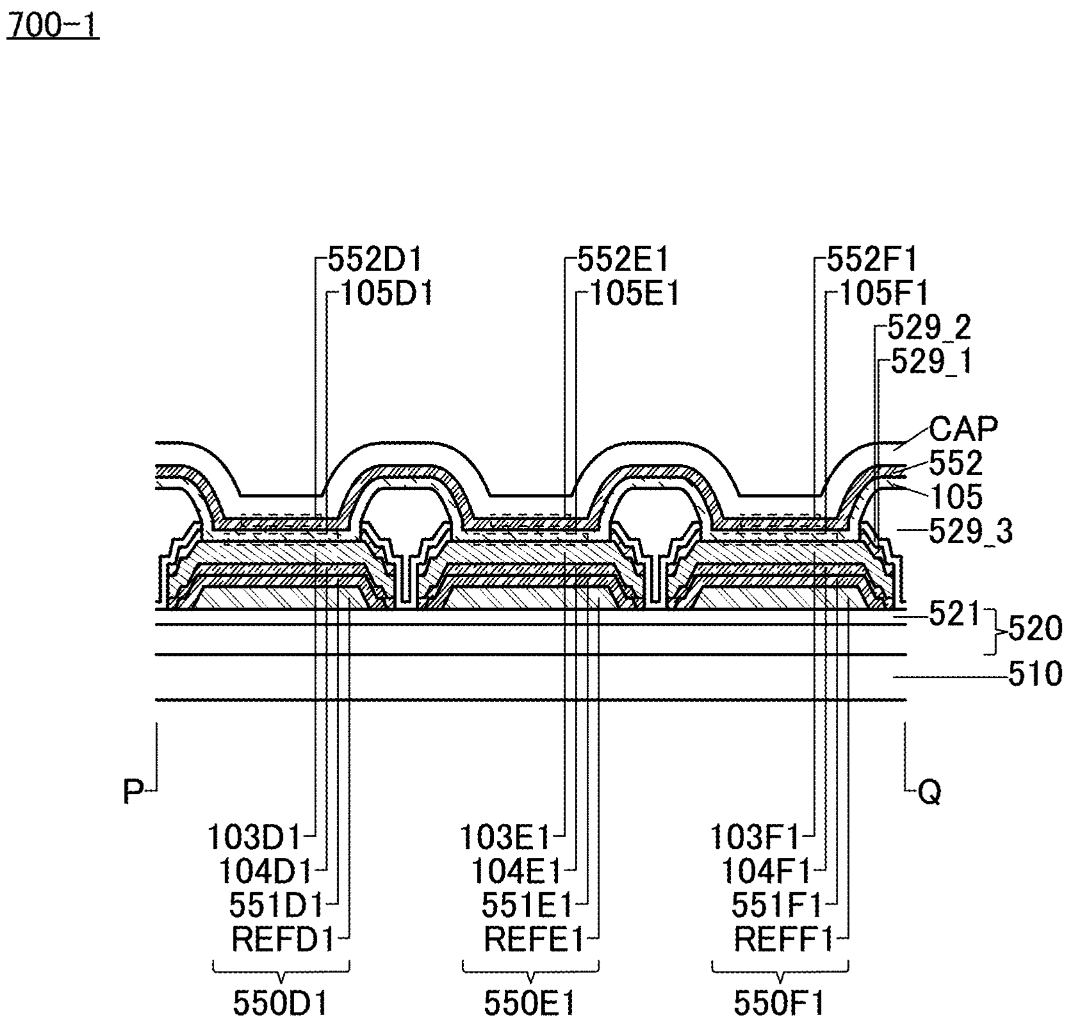
FIG. 36 illustrates a method for fabricating a display apparatus of an example.

FIG. 36 illustrates the fabrication method of the display apparatus 700-1.

Figure 37:
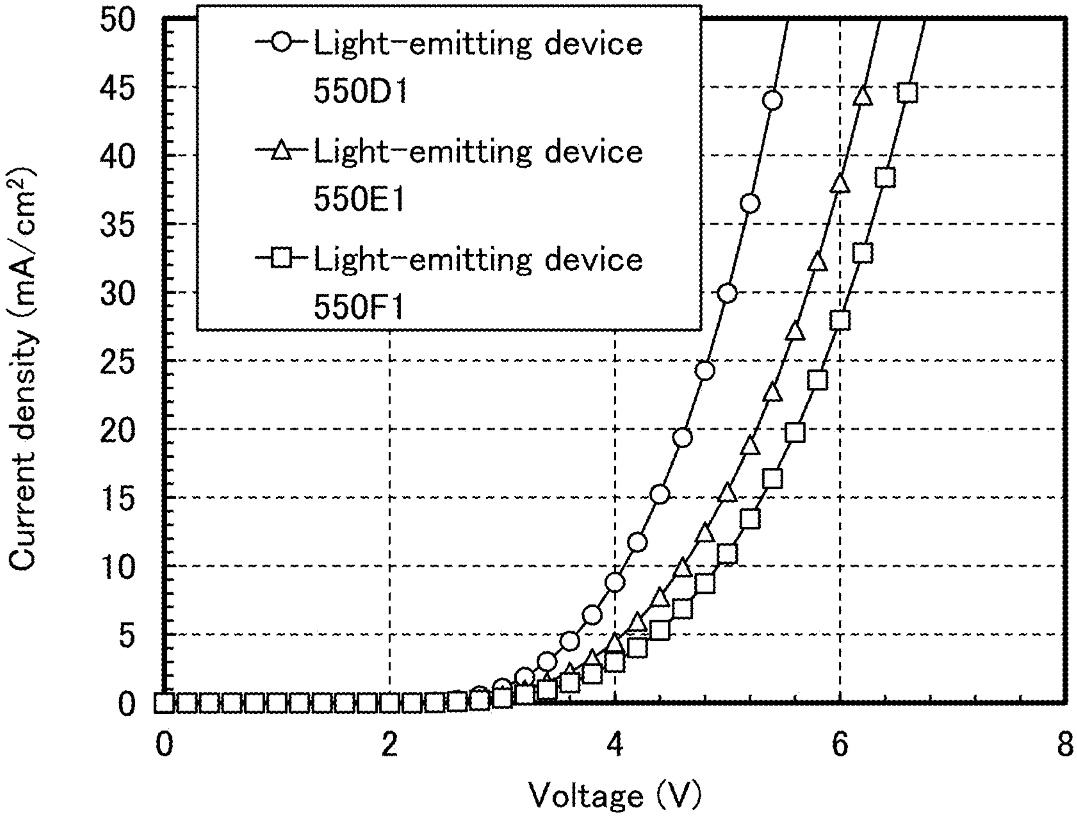
FIG. 37 shows voltage-current density characteristics of light-emitting devices of an example.

FIG. 37 shows voltage-current density characteristics of a light-emitting device 550D1, a light-emitting device 550E1, and a light-emitting device 550F1.

Figure 38:
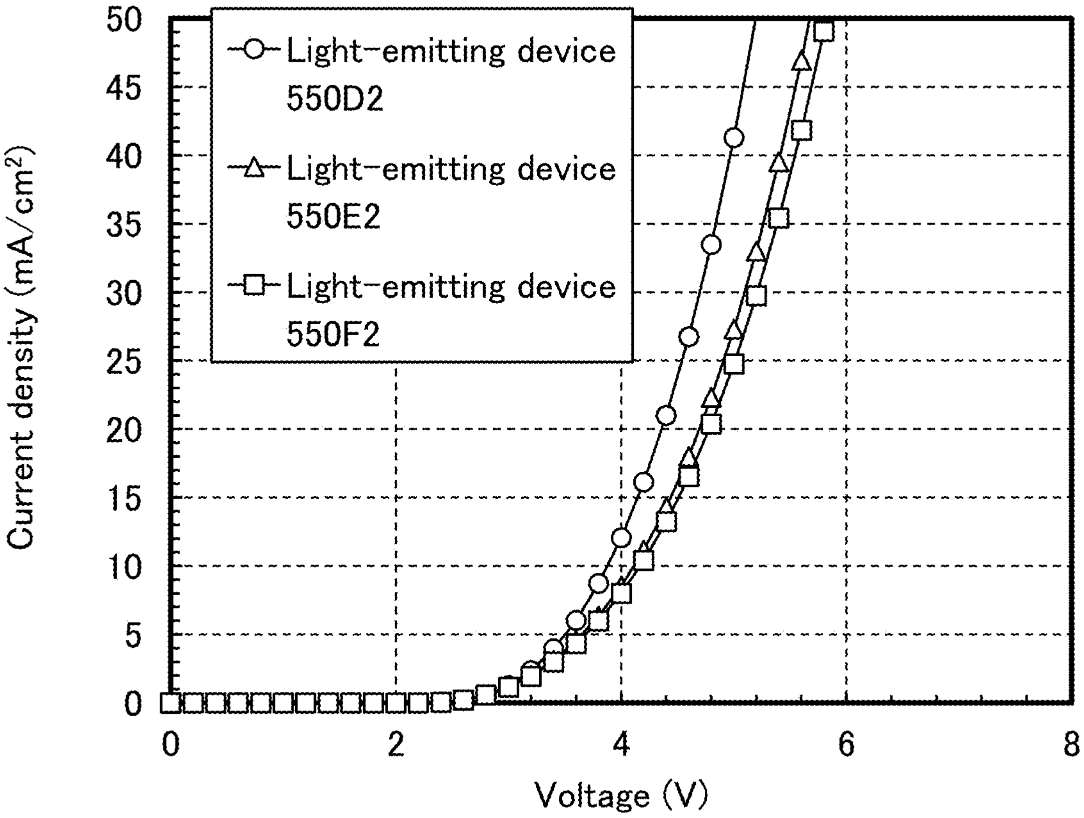
FIG. 38 shows voltage-current density characteristics of light-emitting devices of an example.

FIG. 38 shows voltage-current density characteristics of a light-emitting device 550D2, a light-emitting device 550E2, and a light-emitting device 550F2.

<Display apparatus 700-1>

The display apparatus 700-1 includes the pixel set 703 (see FIG. 30A). The pixel set 703 includes the light-emitting device 550D1, the light-emitting device 550E1, and the light-emitting device 550F1 (see FIG. 30B).

Note that in the display apparatus 700-1 described in this example, the light-emitting devices 550D1, 550E1, and 550F1 each include a layer containing ITSO on a surface of an electrode. In particular, the case where a processing method using plasma is employed for the electrodes of the light-emitting devices 550E1 and 550F1 will be described.

Note that in the display apparatus 700-2 described later, the light-emitting devices 550D2, 550E2, and 550F2 each include a layer containing indium oxide-zinc oxide (InZO) on a surface of an electrode. In particular, the case where a processing method using plasma is employed for the electrodes of the light-emitting devices 550E2 and 550F2 will be described.

Note that the display apparatus 700-1 includes a plurality of pixel sets 703 arranged to have a resolution of 500 ppi in a square region with a size of 2 mm×2 mm. That is, the display apparatus 700-1 includes the plurality of pixel sets 703 arranged longitudinally and horizontally at an approximately 49.5 μm pitch. The display apparatus 700-1 includes the substrate 510 and the functional layer 520, and the functional layer 520 includes the insulating film 521 (see FIG. 30C).

<Light-Emitting Device 550D1>

The light-emitting device 550D1 has a rectangular front surface with a size of approximately 16 μm×36 μm (see FIG. 30B). The light-emitting device 550D1 includes a reflective film REFD1, an electrode 551D1, a layer 104D1, a unit 103D1, a layer 105D1, an electrode 552D1, and the layer CAP (see FIG. 30C).

<Light-Emitting Device 550E1>

The light-emitting device 550E1 has a rectangular front surface with a size of approximately 13.25 μm×17.75 μm (see FIG. 30B). The light-emitting device 550E1 includes a reflective film REFE1, an electrode 551E1, a layer 104E1, a unit 103E1, a layer 105E1, an electrode 552E1, and the layer CAP (see FIG. 30C).

<Light-Emitting Device 550F1>

The light-emitting device 550F1 has a rectangular front surface with a size of approximately 13.25 μm×17.75 μm (see FIG. 30B). The light-emitting device 550F1 includes a reflective film REFF1, an electrode 551F1, a layer 104F1, a unit 103F1, a layer 105F1, an electrode 552F1, and the layer CAP (see FIG. 30C).

«Structure of Light-Emitting Device»

In FIG. 31A and Table 3, the reference numerals "D1", "E1", and "F1" corresponding to the components of the light-emitting devices 550D1, 550E1, and 550F1, respectively, are replaced with "X". Note that in the tables in this example, subscript and superscript characters are written in ordinary size for convenience. For example, a subscript character in an abbreviation and a superscript character in a unit are written in ordinary size in the tables. The corresponding description in the specification gives an accurate reading of such notations in the tables.

TABLE 3

| Components | Reference numerals | Materials | Composition ratio | Thickness/ nm |
|---|---|---|---|---|
| Layer | CAP | IGZO | | 70 |
| Electrode | 552X | Ag:Mg | 1:0.1 | 15 |
| Layer | 105X | LiF:Yb | 1:1 | 1 |
| Layer | 113X2 | mPPhen2P | | 10 |
| Layer | 113X1 | 2mPCCzPDBq | | 10 |
| Layer | 111X | 8mpTP-4mDBtPBfpm:βNCCP:Ir(5mppy-d3)2(mbfpypy-d3) | 0.6:0.4:0.1 | 42.4 |
| Layer | 112X | PCBBiF | | 98.0 |
| Layer | 104X | PCBBiF:OCHD-003 | 1:0.03 | 11.4 |
| Electrode | 551X | ITSO | | 50 |
| Reflective film | REFX | APC | | 100 |

«Method for Fabricating Display Apparatus 700-1»

The display apparatus 700-1 described in this example was fabricated using a method including the following steps.

[Step 1-1]

In Step 1-1, a reflective film was formed over the insulating film 521. Specifically, the reflective film was formed by a sputtering method using an alloy containing silver (Ag), palladium (Pd), and copper (Cu) (abbreviation: APC) as a target. The reflective film contains APC and has a thickness of 100 nm.

[Step 1-2]

In Step 1-2, the reflective films REFD1, REFE1, and REFF1 were formed by a photolithography method.

[Step 2-1]

In Step 2-1, a conductive film was formed over the reflective films REFD1, REFE1, and REFF1. Specifically, the conductive film was formed by a sputtering method using ITSO as a target. The conductive film contains ITSO and has a thickness of 50 nm.

[Step 2-2]

In Step 2-2, the electrodes 551D1, 551E1, and 551F1 were formed by a photolithography method. After that, heating was performed at 200° C. in a nitrogen atmosphere for 60 minutes. Note that the electrodes 551D1, 551E1, and 551F1 cover the reflective films REFD1, REFE1, and REFF1, respectively.

[Step 2-3]

In Step 2-3, a workpiece provided with the electrode was washed with water and then transferred into a vacuum evaporation apparatus. After that, the pressure in the vacuum evaporation apparatus was reduced to approximately $10^{-4}$ Pa, and vacuum baking was performed at 200° C. for 2.78 hours in a heating chamber of the vacuum evaporation apparatus. Then, the workpiece was cooled down for approximately 30 minutes.

[Step 3]

In Step 3, a film was formed over the electrodes 551D1, 551E1, and 551F1. Specifically, materials of the film were co-deposited by a resistance-heating method. The film contains PCBBiF and OCHD-003 at 1:0.03 in a weight ratio and has a thickness of 11.4 nm.

[Step 4]

In Step 4, a stacked-layer film was formed. Specifically, a material of the stacked-layer film was deposited by a resistance-heating method. The stacked-layer film includes components to be the unit 103D1 later. Note that "X" in the reference numerals of the components in FIG. 31A and Table 3 is replaced with "D1" in the unit 103D1.

[Step 5-1]

In Step 5-1, a stacked-layer film to be the film 529_1 later was formed over the above-described stacked-layer film (see FIG. 32). Specifically, a stacked-layer film including a 10-nm-thick film containing tris(8-quinolinolato)aluminum (III) (abbreviation: $Alq_3$) formed by a resistance-heating method, a 30-nm-thick film containing aluminum oxide formed by an ALD method, and a 50-nm-thick film containing molybdenum (Mo) formed by a sputtering method was formed.

[Step 5-2]

In Step 5-2, the stacked-layer film was processed into a predetermined shape to form the film 529_1. Specifically, unnecessary portions were removed by an etching method using a resist RES.

First, the resist RES was formed using a photosensitive polymer. The resist RES overlaps with the electrode 551D1. Then, an unnecessary portion of the metal film containing Mo was removed by a dry etching method using the resist RES. Specifically, the metal film containing Mo was processed using a gas containing $CF_4$, oxygen, and helium as an etching gas. Then, the resist RES was removed using a solution containing tetramethyl ammonium hydroxide (abbreviation: TMAH).

Next, an unnecessary portion of the film containing aluminum oxide was removed by a dry etching method using the metal film containing Mo. Specifically, the film containing aluminum oxide was processed using a gas containing trifluoromethane (abbreviation: $CHF_3$) and helium (He) as an etching gas. Note that the metal film containing Mo functions as a hard mask.

[Step 5-3]

In Step 5-3, the film 529_1, the unit 103D1, and the layer 104D1 were processed into predetermined shapes (see FIG. 33). Specifically, unnecessary portions were removed by a dry etching method. The processing was performed in an apparatus in which the pressure was reduced to 2.0 Pa with an energy of 1000 W while oxygen was supplied at a flow rate of 167 sccm. The film 529_1 functions as a hard mask. The layer 104D1, the unit 103D1, and the film 529_1 overlap with the electrode 551D1.

After Step 5-1 to Step 5-3, the electrode 551D1, the unit 103D1, and the components therebetween in the light-emitting device are formed on the workpiece and the film 529_1 is formed over the unit 103D1.

Furthermore, the electrodes 551E1 and 551F1 are exposed. The electrodes 551E1 and 551F1 are exposed to an etching gas used in a dry etching method. The properties of surfaces of the electrodes 551E1 and 551F1 are different from those of a surface of the electrode 551D1.

Note that a workpiece provided with some components of a light-emitting device and one or more exposed electrodes can be referred to as work in process. In the case where an electrode is exposed on work in process, another light-emitting device can be formed over the electrode.

[Step 6]

In Step 6, the exposed electrodes were subjected to plasma treatment. Specifically, the plasma treatment was performed in an apparatus in which the pressure was reduced to 2.0 Pa with an energy of 1000 W for 15 seconds while a gas containing $CF_4$, oxygen, and helium was supplied. During the plasma treatment, the properties of the electrodes 551E1 and 551F1 are improved.

Then, the workpiece was transferred into a vacuum evaporation apparatus, the pressure in the apparatus was reduced to approximately $10^{-4}$ Pa, and vacuum baking was performed at 80° C. for 2.78 hours in a heating chamber of the vacuum evaporation apparatus. Then, the workpiece was cooled down for approximately 30 minutes.

[Step 7]

In Step 7, a film was formed over the electrodes 551D1, 551E1, and 551F1. Specifically, treatment similar to that in Step 3 was performed.

[Step 8]

In Step 8, a stacked-layer film was formed. Specifically, treatment similar to that in Step 4 was performed. The stacked-layer film includes components to be the unit 103E1 later. Note that "X" in the reference numerals of the components in FIG. 31A and Table 3 is replaced with "E1" in the unit 103E1.

[Step 9-1]

In Step 9-1, a stacked-layer film to be the film 529_1 later was formed over the above-described stacked-layer film. Specifically, treatment similar to that in Step 5-1 was performed.

[Step 9-2]

In Step 9-2, the stacked-layer film was processed into a predetermined shape to form the film 529_1. Specifically, treatment similar to that in Step 5-2 was performed. Note that the description of Step 5-2 can be used for the description of Step 9-2 by replacing "D1" in the reference numerals with "E1".

[Step 9-3]

In Step 9-3, the film 529_1, the unit 103E1, and the layer 104E1 were processed into predetermined shapes (see FIG. 34). Specifically, treatment similar to that in Step 5-3 was performed. Note that the description of Step 5-3 can be used for the description of Step 9-3 by replacing "D1" in the reference numerals with "E1".

After Step 9-1 to Step 9-3, the electrode 551E1, the unit 103E1, and the components therebetween in the light-emitting device are formed on the workpiece and the film 529_1 is formed over the unit 103E1.

Furthermore, the electrode 551F1 is exposed. The electrode 551F1 is exposed to an etching gas used in a dry etching method. The properties of the surface of the electrode 551F1 are different from those of the surface of the electrode 551D1 or the electrode 551E1.

[Step 10]

In Step 10, the exposed electrodes were subjected to plasma treatment. Specifically, the plasma treatment was performed in an apparatus in which the pressure was reduced to 2.0 Pa with an energy of 1000 W for 15 seconds while a gas containing $CF_4$, oxygen, and helium was supplied. During the plasma treatment, the properties of the electrode 551F1 are improved.

Then, the workpiece was transferred into a vacuum evaporation apparatus, the pressure in the apparatus was reduced to approximately $10^{-4}$ Pa, and vacuum baking was performed at 80° C. for 2.78 hours in a heating chamber of the vacuum evaporation apparatus. Then, the workpiece was cooled down for approximately 30 minutes.

[Step 11]

In Step 11, a film was formed over the electrodes 551D1, 551E1, and 551F1. Specifically, treatment similar to that in Step 3 was performed.

[Step 12]

In Step 12, a stacked-layer film was formed. Specifically, treatment similar to that in Step 4 was performed. The stacked-layer film includes components to be the unit 103F1 later. Note that "X" in the reference numerals of the components in FIG. 31A and Table 3 is replaced with "F1" in the unit 103F1.

[Step 13-1]

In Step 13-1, a stacked-layer film to be the film 529_1 later was formed over the above-described stacked-layer film. Specifically, treatment similar to that in Step 5-1 was performed.

[Step 13-2]

In Step 13-2, the stacked-layer film was processed into a predetermined shape to form the film 529_1. Specifically, treatment similar to that in Step 5-2 was performed. Note that the description of Step 5-2 can be used for the description of Step 13-2 by replacing "D1" in the reference numerals with "F1".

[Step 13-3]

In Step 13-3, the film 529_1, the unit 103F1, and the layer 104F1 were processed into predetermined shapes (see FIG. 35). Specifically, treatment similar to that in Step 5-3 was performed. Note that the description of Step 5-3 can be used for the description of Step 13-3 by replacing "D1" in the reference numerals with "F1".

After Step 13-1 to Step 13-3, the electrode 551F1, the unit 103F1, and the components therebetween in the light-emitting device are formed on the workpiece and the film 529_1 is formed over the unit 103F1.

[Step 14]

In Step 14, the metal film containing Mo was removed from the film 529_1 and the insulating film containing aluminum oxide was left. Specifically, a dry etching method using a gas containing $CF_4$, oxygen, and helium was employed.

[Step 15]

In Step 15, the film 529_2 was formed over the film 529_1. Specifically, the workpiece was transferred into an ALD deposition apparatus and a material was deposited by an ALD method. Note that the film 529_2 contains aluminum oxide and has a thickness of 15 nm.

[Step 16]

In Step 16, the insulating film 529_3 was formed over the film 529_2. Specifically, a photosensitive polymer and a photolithography method were used. Note that the insulating film 529_3 fills a gap between the electrode 551D1 and the electrode 551E1 and a gap between the electrode 551E1 and the electrode 551F1 and has openings overlapping with the electrodes 551D1, 551E1, and 551F1.

The workpiece was heated to process the insulating film 529_3 into a predetermined shape. Specifically, the workpiece was heated in an air atmosphere at 100° C. for 60 minutes so that top and side surfaces of the insulating film 529_3 were continuously curved.

[Step 17]

In Step 17, the film 529_1 and the film 529_2 were processed into predetermined shapes. Specifically, unnecessary portions are removed by an etching method using an aqueous solution containing hydrofluoric acid (HF) to expose the units 103D1, 103E1, and 103F1. Note that the film 529_2 functions as a resist.

Then, the workpiece was transferred into a vacuum evaporation apparatus, the pressure in the apparatus was reduced to approximately $10^{-4}$ Pa, and vacuum baking was performed at 80° C. for 1.5 hours in a heating chamber of the vacuum evaporation apparatus. Then, the workpiece was cooled down for approximately 30 minutes.

[Step 18]

In Step 18, the layer 105 was formed over the units 103D1, 103E1, and 103F1 (see FIG. 36). Specifically, materials of the layer 105 were co-deposited by a resistance-heating method. The layer 105 contains lithium fluoride (LiF) and ytterbium (Yb) at 1:1 in a volume ratio and has a thickness of 1 nm.

[Step 19]

In Step 19, the conductive film 552 was formed over the layer 105. Specifically, materials of the conductive film 552 were co-deposited by a resistance-heating method. The conductive film 552 contains silver (Ag) and magnesium (Mg) at 1:0.1 in a weight ratio and has a thickness of 15 nm. The conductive film 552 includes the electrodes 552D1, 552E1, and 552F1.

[Step 20]

In Step 20, the layer CAP was formed over the conductive film 552. Specifically, the layer CAP was formed by a sputtering method using In—Ga—Zn oxide (abbreviation: IGZO) as a target. The layer CAP contains IGZO and has a thickness of 70 nm.

By the above-described method, the display apparatus 700-1 was fabricated.

<Operation Characteristics of Display Apparatus 700-1>

The display apparatus 700-1 includes the light-emitting devices 550D1, the light-emitting devices 550E1, and the light-emitting devices 550F1 that are arranged to have a resolution of 500 ppi.

«Operation characteristics of light-emitting device 550D1»

When supplied with electric power, the light-emitting device 550D1 emitted light ELD (see FIG. 30C). Operation characteristics of the light-emitting device 550D1 were measured at room temperature (see FIG. 37). Note that the area of the light-emitting device 550D1 occupies 23.58% of the area of a measurement region. The measured value was corrected with use of the area ratio.

Table 4 shows main initial characteristics of the fabricated light-emitting device emitting light while being supplied with a current flowing at a current density of approximately 10.0 mA/cm$^2$. Table 4 also shows the characteristics of the other light-emitting devices each having a structure described later.

TABLE 4

| | Voltage (V) | Current density (mA/cm2) |
|---|---|---|
| Light-emitting device 550D1 | 4.08 | 10.0 |
| Light-emitting device 550E1 | 4.61 | 10.0 |
| Light-emitting device 550F1 | 4.92 | 10.0 |

The light-emitting device 550D1 was found to exhibit favorable characteristics.

«Operation Characteristics of Light-Emitting Device 550E1»

When supplied with electric power, the light-emitting device 550E1 emitted light ELE (see FIG. 30C). Operation characteristics of the light-emitting device 550E1 were measured at room temperature (see FIG. 37). Note that the area of the light-emitting device 550E1 occupies 9.76% of the area of a measurement region. The measured value was corrected with use of the area ratio.

Table 4 shows the main initial characteristics of the fabricated light-emitting device emitting light while being supplied with a current flowing at a current density of approximately 10.0 mA/cm$^2$.

The light-emitting device 550E1 was found to exhibit favorable characteristics. In order to flow the same amount of current through the light-emitting devices 550D1 and 550E1, a voltage higher than that for the light-emitting device 550D1 was required for the light-emitting device 550E1 although the properties of the electrode 551E1 are improved in Step 6.

«Operation Characteristics of Light-Emitting Device 550F1»

When supplied with electric power, the light-emitting device 550F1 emitted light ELF (see FIG. 30C). Operation characteristics of the light-emitting device 550F1 were measured at room temperature (see FIG. 37). Note that the area of the light-emitting device 550F1 occupies 9.76% of the area of a measurement region. The measured value was corrected with use of the area ratio.

Table 4 shows the main initial characteristics of the fabricated light-emitting device emitting light while being supplied with a current flowing at a current density of approximately 10.0 mA/cm$^2$.

The light-emitting device 550F1 was found to exhibit favorable characteristics. In order to flow the same amount of current through the light-emitting devices 550D1 and 550F1, a voltage higher than that for the light-emitting device 550D1 was required for the light-emitting device 550F1 although the properties of the electrode 551F1 are improved in Step 10.

<Display Apparatus 700-2>

Like the display apparatus 700-1, the display apparatus 700-2 includes the pixel set 703. Note that the display apparatus 700-2 is different from the display apparatus 700-1 in that the pixel set 703 includes the light-emitting devices 550D2, 550E2, and 550F2 instead of the light-emitting devices 550D1, 550E1, and 550F1. Note that the light-emitting devices 550D2, 550E2, and 550F2 each include a layer containing InZO on a surface of an electrode. Different portions are described in detail here, and the above description is referred to for portions where a structure and a method similar to the above were employed.

«Structure of Light-Emitting Device»

In FIG. 31B and Table 5, the reference numerals "D2", "E2", and "F2" corresponding to the components of the light-emitting devices 550D2, 550E2, and 550F2, respectively, are replaced with "X". Note that in the tables in this example, subscript and superscript characters are written in ordinary size for convenience. For example, a subscript character in an abbreviation and a superscript character in a unit are written in ordinary size in the tables. The corresponding description in the specification gives an accurate reading of such notations in the tables.

TABLE 5

| Components | Reference numerals | Materials | Composition ratio | Thickness/ nm |
|---|---|---|---|---|
| Layer | CAP | IGZO | | 70 |
| Electrode | 552X | Ag:Mg | 1:0.1 | 15 |
| Layer | 105X | LiF:Yb | 1:1 | 1 |
| Layer | 113X2 | mPPhen2P | | 10 |
| Layer | 113X1 | 2mPCCzPDBq | | 10 |
| Layer | 111X | 8mpTP-4mDBtPBfpm:βNCCP:Ir(5mppy-d3)2(mbfpypy-d3) | 0.6:0.4:0.1 | 42.4 |
| Layer | 112X | PCBBiF | | 98.0 |
| Layer | 104X | PCBBiF:OCHD-003 | 1:0.03 | 11.4 |
| Electrode | 551X | InZO | | 20 |
| Conductive film | TCOX | ITSO | | 30 |
| Reflective film | REFX | APC | | 100 |

«Method for Fabricating Display Apparatus 700-2»

The display apparatus 700-2 described in this example was fabricated using a method including the following steps.

The fabrication method of the display apparatus 700-2 is different from that of the display apparatus 700-1 in that, in Step 2-1, a conductive film containing ITSO is formed over reflective films REFD2, REFE2, and REFF2 and a conductive film containing InZO is formed over the conductive film containing ITSO. Different portions are described in detail here, and the above description is referred to for portions where a structure and a method similar to the above were employed in the description of the fabrication method of the display apparatus 700-2 by replacing "D1", "E1", and "F1" in the reference numerals with "D2", "E2", and "F2", respectively.

[Step 2-1]

In Step 2-1, a conductive film was formed over the reflective films REFD2, REFE2, and REFF2. Specifically, the conductive film was formed by a sputtering method using ITSO and InZO as targets. The conductive film includes a 30-nm-thick film containing ITSO and a 20-nm-thick film containing InZO.

[Step 2-2]

In Step 2-2, a conductive film TCOD2 and an electrode 551D2, a conductive film TCOE2 and an electrode 551E2, and a conductive film TCOF2 and an electrode 551F2 were formed by a photolithography method. After that, heating was performed at 200° C. in a nitrogen atmosphere for 60 minutes.

<Operation Characteristics of Display Apparatus 700-2>

The display apparatus 700-2 includes the light-emitting devices 550D2, the light-emitting devices 550E2, and the light-emitting devices 550F2 that are arranged to have a resolution of 500 ppi.

«Operation Characteristics of Light-Emitting Device 550D2»

When supplied with electric power, the light-emitting device 550D2 emitted light. Operation characteristics of the light-emitting device 550D2 were measured at room temperature (see FIG. 38). Note that the area of the light-emitting device 550D2 occupies 23.58% of the area of a measurement region. The measured value was corrected with use of the area ratio.

Table 6 shows main initial characteristics of the fabricated light-emitting device emitting light while being supplied with a current flowing at a current density of approximately 10.0 mA/cm$^2$. Table 6 also shows the characteristics of the other light-emitting devices each having a structure described later.

TABLE 6

| | Voltage (V) | Current density (mA/cm2) |
|---|---|---|
| Light-emitting device 550D2 | 3.88 | 10.0 |
| Light-emitting device 550E2 | 4.11 | 10.0 |
| Light-emitting device 550F2 | 4.17 | 10.0 |

The light-emitting device 550D2 was found to exhibit favorable characteristics. The driving voltage of the light-emitting device 550D2 is lower than that of the light-emitting device 550D1.

«Operation Characteristics of Light-Emitting Device 550E2»

When supplied with electric power, the light-emitting device 550E2 emitted light. Operation characteristics of the light-emitting device 550E2 were measured at room temperature (see FIG. 38). Note that the area of the light-emitting device 550E2 occupies 9.76% of the area of a measurement region. The measured value was corrected with use of the area ratio.

Table 6 shows the main initial characteristics of the fabricated light-emitting device emitting light while being supplied with a current flowing at a current density of approximately 10.0 mA/cm$^2$.

The light-emitting device 550E2 was found to exhibit favorable characteristics. In order to flow the same amount of current through the light-emitting devices 550D2 and 550E2, a voltage higher than that for the light-emitting device 550D2 was required for the light-emitting device 550E2 although the properties of the electrode 551E2 are improved in Step 6.

«Operation Characteristics of Light-Emitting Device 550F2»

When supplied with electric power, the light-emitting device 550F2 emitted light. Operation characteristics of the light-emitting device 550F2 were measured at room temperature (see FIG. 38). Note that the area of the light-emitting device 550F2 occupies 9.76% of the area of a measurement region. The measured value was corrected with use of the area ratio.

Table 6 shows the main initial characteristics of the fabricated light-emitting device emitting light while being supplied with a current flowing at a current density of approximately 10.0 mA/cm$^2$.

The light-emitting device 550F2 was found to exhibit favorable characteristics. In order to flow the same amount of current through the light-emitting devices 550D2 and 550F2, a voltage higher than that for the light-emitting device 550D2 was required for the light-emitting device 550F2 although the properties of the electrode 551F2 are improved in Step 10.

Example 3

In this example, a method of treatment on a conductive film that can be used for a display apparatus of one embodiment of the present invention is described with reference to FIG. 39A to 39D.

Figure 39A:
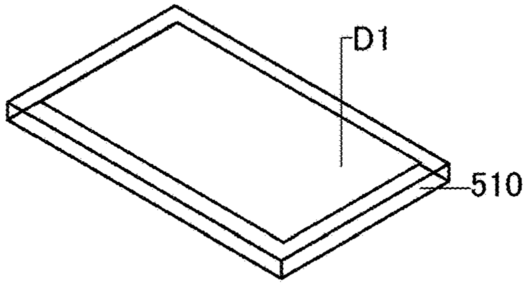
FIGS. 39A to 39D illustrate a structure of a light-emitting device that can be used for a display apparatus of an example.
Figure 39B:
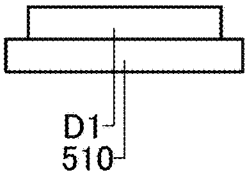
Figure 39C:
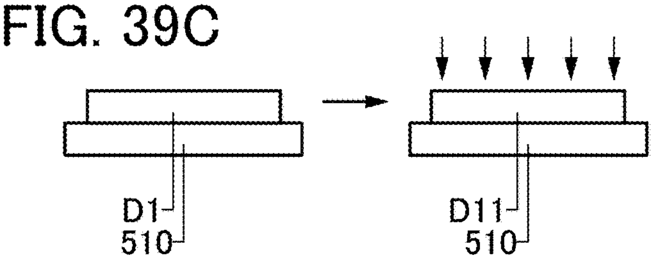
Figure 39D:
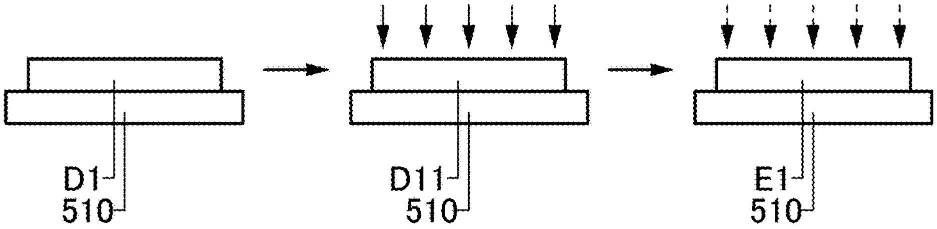

FIG. 39A is a perspective view illustrating a structure of a workpiece, and FIG. 39B to 39D are cross-sectional views illustrating a method of treatment on a conductive film.

<Conductive Film D1>

A conductive film D1 described in this example can be used for the display apparatus of one embodiment of the present invention. Specifically, the conductive film D1 can be used for the electrode 551X of the light-emitting device 550X.

«Formation Method of Conductive Film D1»

The conductive film D1 was formed by a method including the following step (see FIGS. 39A and 39B).

[Step 1]

In Step 1, a conductive film was formed over the substrate 510. Specifically, the conductive film was formed over a quartz substrate by a sputtering method using indium oxide-tin oxide containing silicon or silicon oxide (abbreviation: ITSO) as a target. After that, heating was performed in a nitrogen atmosphere at 200° C. for 60 minutes. The conductive film contains ITSO and has a thickness of 10 nm.

«Characteristics of Conductive Film D1»

The sheet resistance of the conductive film D1 was measured. Table 7 shows the sheet resistance of the conductive film. Table 7 also shows the sheet resistances of other conductive films each having a structure described later.

TABLE 7

| | Sheet resistance (Ω/□) | Carrier concentration ($/cm^{-3}$) |
|---|---|---|
| Conductive film D1 | $2.4 \times 10^3$ | $1.6 \times 10^{20}$ |
| Conductive film D11 | $4.2 \times 10^5$ | $6.1 \times 10^{18}$ |
| Conductive film E1 | $2.9 \times 10^3$ | $1.8 \times 10^{20}$ |
| Conductive film D2 | $7.6 \times 10^2$ | $2.8 \times 10^{20}$ |
| Conductive film D21 | $1.5 \times 10^4$ | $3.2 \times 10^{19}$ |
| Conductive film E2 | $9.5 \times 10^2$ | $3.1 \times 10^{20}$ |

The conductive film D1 had suitable sheet resistance. Meanwhile, a conductive film D11 described later had a higher sheet resistance than the conductive film D1. The conductivity of ITSO is derived from levels formed by a tin atom or levels formed by an oxygen vacancy. In Step 2 of a method for forming the conductive film D11, oxygen vacancies may be filled with oxygen. A conductive film E1 described later had a lower sheet resistance than the conductive film D11. In Step 3 using a gas containing $CF_4$ of a method for forming the conductive film E1, carbon contained in generated plasma might reduce ITSO and might form a level contributing to the conductivity in the conductive film E1 again.

<Conductive Film D11>

The conductive film D11 can be used for the display apparatus of one embodiment of the present invention. Specifically, the conductive film D11 can be used for the electrode 551X of the light-emitting device 550X.

«Formation Method of Conductive Film D11»

The conductive film D11 described in this example was formed by a method including the following step (see FIGS. 39A and 39C). The formation method of the conductive film D11 is different from that of the conductive film D1 in including Step 2 subsequent to Step 1. Different portions are described in detail here, and the above description is referred to for portions where a method similar to the above was employed.

[Step 2]

In Step 2, in an apparatus in which the pressure was reduced to 2.0 Pa, $O_2$ plasma treatment was performed with an energy of 1000 W for 60 seconds while oxygen was supplied at a flow rate of 167 sccm. Note that this step corresponds to Step 5 of the manufacturing method of the display apparatus described in Embodiment 1. In this manner, a conductive film is exposed to an etching gas used in a dry etching method. In addition, the properties of the conductive film D11 are made different from those of the conductive film D1.

«Characteristics of Conductive Film D11»

The sheet resistance of the conductive film D11 was measured. Table 7 shows the sheet resistance of the conductive film.

<Conductive Film E1>

The conductive film E1 can be used for the display apparatus of one embodiment of the present invention. Specifically, the conductive film E1 can be used for the electrode 551X of the light-emitting device 550X.

«Formation Method of Conductive Film E1»

The conductive film E1 described in this example was formed by a method including the following steps (see FIGS. 39A and 39D). The formation method of the conductive film E1 is different from that of the conductive film D1 in including Step 2 and Step 3, which are subsequent to Step 1. Different portions are described in detail here, and the above description is referred to for portions where a method similar to the above was employed.

[Step 2]

In Step 2, in an apparatus in which the pressure was reduced to 2.0 Pa, $O_2$ plasma treatment was performed with an energy of 1000 W for 60 seconds while oxygen was supplied at a flow rate of 167 sccm. Note that this step corresponds to Step 5 of the manufacturing method of the display apparatus described in Embodiment 1. In this manner, a conductive film is exposed to an etching gas used in a dry etching method. In addition, the properties of the conductive film E1 are made different from those of the conductive film D1.

[Step 3]

In Step 3, plasma treatment was performed in an apparatus in which the pressure was reduced to 2.0 Pa with an energy of 1000 W for 15 seconds while $CF_4$ at a flow rate of 100 sccm, oxygen at a flow rate of 67 sccm, and helium (He) at a flow rate of 333 sccm were supplied. Accordingly, the properties of the conductive film E1 are made different from those of the conductive film D11.

«Characteristics of Conductive Film E1»

The sheet resistance of the conductive film E1 was measured. Table 7 shows the sheet resistance of the conductive film.

<Conductive Film D2>

A conductive film D2 (not illustrated) described in this example can be used for the display apparatus of one embodiment of the present invention. Specifically, the conductive film D2 can be used for the electrode 551X of the light-emitting device 550X.

«Formation Method of Conductive Film D2»

The conductive film D2 was formed by a method including the following step. The formation method of the conductive film D2 is different from that of the conductive film D1 in that the conductive film D2 was formed by a sputtering method using not ITSO but InZO as a target in Step 1. Different portions are described in detail here, and the above description is referred to for portions where a method similar to the above was employed.

[Step 1]

In Step 1, a conductive film was formed over a quartz substrate. Specifically, the conductive film was formed by a sputtering method using InZO as a target. After that, heating was performed in a nitrogen atmosphere at 200° C. for 60 minutes. The conductive film contains InZO and has a thickness of 10 nm.

«Characteristics of Conductive Film D2»

The sheet resistance of the conductive film D2 was measured. Table 7 shows the sheet resistance of the conductive film.

The conductive film D2 had suitable sheet resistance. Meanwhile, a conductive film D21 described later had a higher sheet resistance than the conductive film D2. The conductivity of InZO is derived from a level formed by an oxygen vacancy. In Step 2 of a method for forming the conductive film D21, oxygen vacancies may be filled with oxygen. A conductive film E2 described later had a lower sheet resistance than the conductive film D21. In Step 3 using a gas containing $CF_4$ of a method for forming the conductive film E2, carbon contained in generated plasma might reduce InZO and might form a level contributing to the conductivity in the conductive film E2 again.

The conductive film D2 had a lower sheet resistance and a higher carrier concentration than the conductive film D1. Note that as described in Example 2, the light-emitting device containing InZO in the electrode 551X had a lower driving voltage than the light-emitting device containing ITSO in the electrode 551X. The conductive film D2 facilitates hole transfer from the electrode 551X to the layer 104X compared to the conductive film D1.

<Conductive film D21>

The conductive film D21 (not illustrated) can be used for the display apparatus of one embodiment of the present invention. Specifically, the conductive film D21 can be used for the electrode 551X of the light-emitting device 550X.

«Formation Method of Conductive Film D21»

The conductive film D21 described in this example was formed by a method including the following step. The formation method of the conductive film D21 is different from that of the conductive film D2 in including Step 2 subsequent to Step 1. Different portions are described in detail here, and the above description is referred to for portions where a method similar to the above was employed.

[Step 2]

In Step 2, in an apparatus in which the pressure was reduced to 2.0 Pa, $O_2$ plasma treatment was performed with an energy of 1000 W for 60 seconds while oxygen was supplied at a flow rate of 167 sccm. Note that this step corresponds to Step 5 of the manufacturing method of the display apparatus described in Embodiment 1. In this manner, a conductive film is exposed to an etching gas used in a dry etching method. In addition, the properties of the conductive film D21 are made different from those of the conductive film D2.

«Characteristics of Conductive Film D21»

The sheet resistance of the conductive film D21 was measured. Table 7 shows the sheet resistance of the conductive film.

<Conductive Film E2>

The conductive film E2 can be used for the display apparatus of one embodiment of the present invention. Specifically, the conductive film E2 can be used for the electrode 551X of the light-emitting device 550X.

«Formation Method of Conductive Film E2»

The conductive film E2 described in this example was formed by a method including the following steps. The formation method of the conductive film E2 is different from that of the conductive film D2 in including Step 2 and Step 3, which are subsequent to Step 1. Different portions are described in detail here, and the above description is referred to for portions where a method similar to the above was employed.

[Step 2]

In Step 2, in an apparatus in which the pressure was reduced to 2.0 Pa, $O_2$ plasma treatment was performed with an energy of 1000 W for 60 seconds while oxygen was supplied at a flow rate of 167 sccm. Note that this step corresponds to Step 5 of the manufacturing method of the display apparatus described in Embodiment 1. In this manner, a conductive film is exposed to an etching gas used in a dry etching method. In addition, the properties of the conductive film E2 are made different from those of the conductive film D2.

[Step 3]

In Step 3, plasma treatment was performed in an apparatus in which the pressure was reduced to 2.0 Pa with an energy of 1000 W for 15 seconds while $CF_4$ at a flow rate of 100 sccm, oxygen at a flow rate of 67 sccm, and helium (He) at a flow rate of 333 sccm were supplied. Accordingly, the properties of the conductive film E2 are made different from those of the conductive film D21.

«Characteristics of Conductive Film E2»

The sheet resistance of the conductive film E2 was measured. Table 7 shows the sheet resistance of the conductive film.

Example 4

In this example, a display apparatus of 700-3 of one embodiment of the present invention is described with reference to FIGS. 40A to 40C, FIGS. 41A to 41C, FIG. 42, FIG. 43, FIG. 44, FIG. 45, FIG. 46, FIG. 47, FIG. 48, FIG. 49, FIG. 50, FIG. 51, FIG. 52, FIG. 53, FIG. 54, FIG. 55, FIG. 56, FIG. 57, FIG. 58, FIG. 59, FIG. 60, FIG. 61, FIG. 62, FIG. 63, FIG. 64, FIG. 65, FIG. 66, FIG. 67, FIG. 68, and FIG. 69.

Figure 40A:
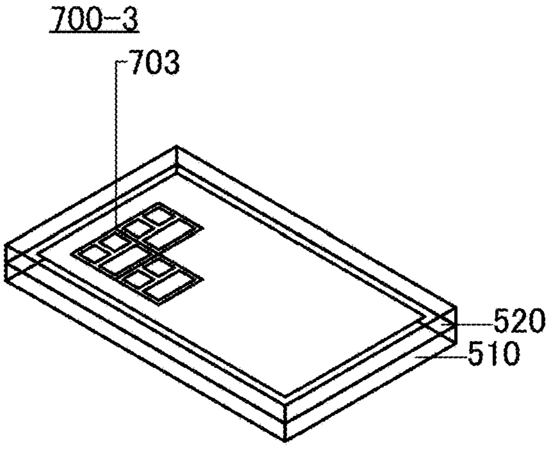
FIGS. 40A to 40C illustrate a structure of a display apparatus of an example.
Figure 40B:
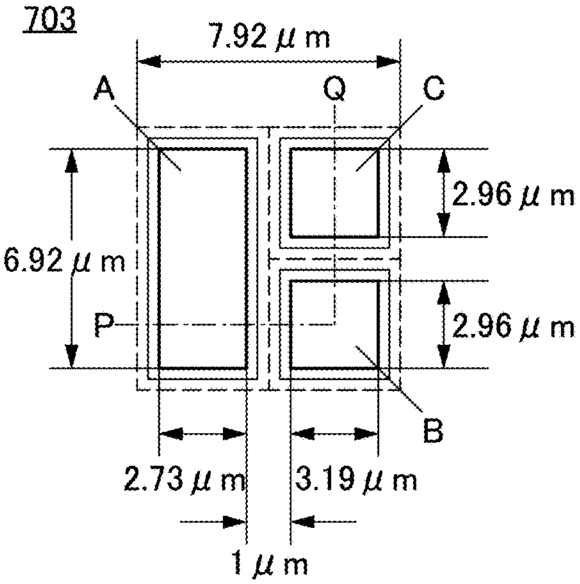
Figure 40C:
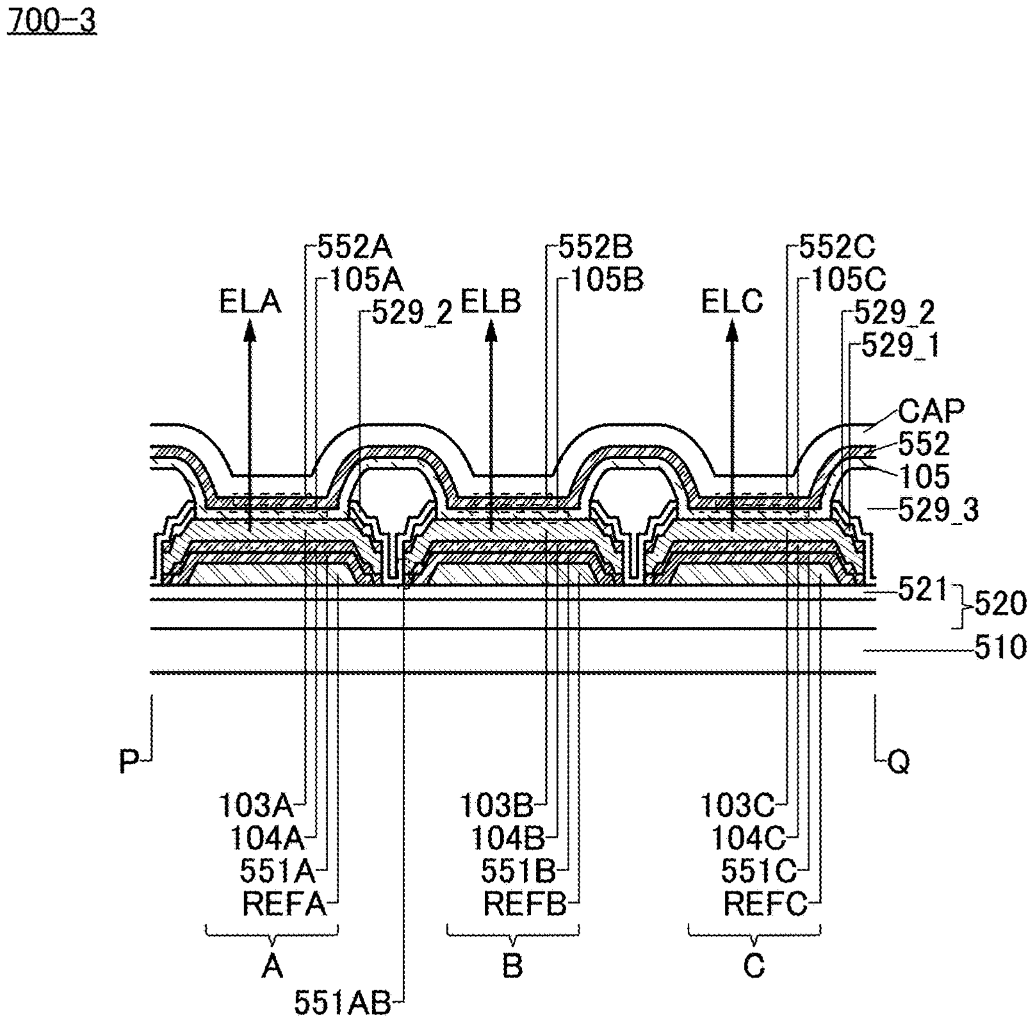

FIG. 40A is a perspective view illustrating a structure of the display apparatus 700-3. FIG. 40B is a front view illustrating part of the structure of the display apparatus 700-3 in FIG. 40A, and FIG. 40C is a cross-sectional view illustrating the structure of the display apparatus 700-3 taken along a cutting line P-Q in FIG. 40A.

Figure 41A:
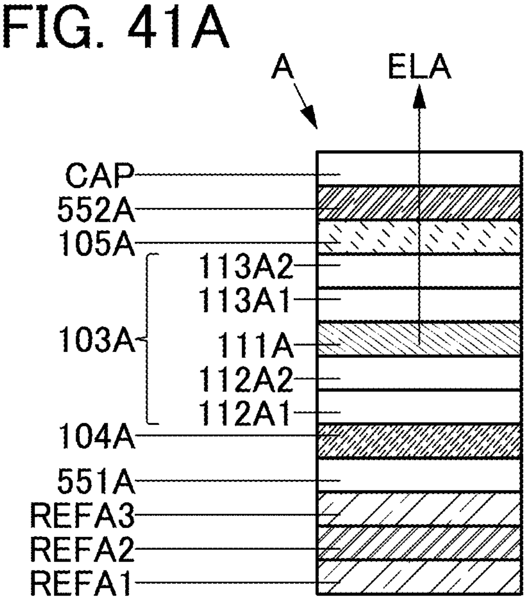
FIGS. 41A to 41C illustrate structures of light-emitting devices that can be used for a display apparatus of an example.
Figure 41B:
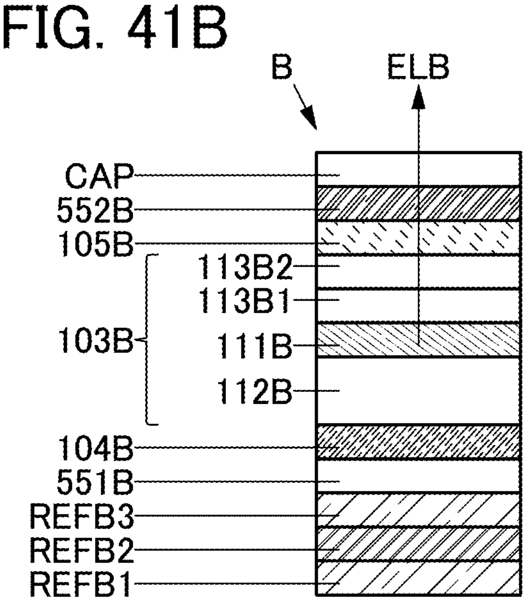
Figure 41C:
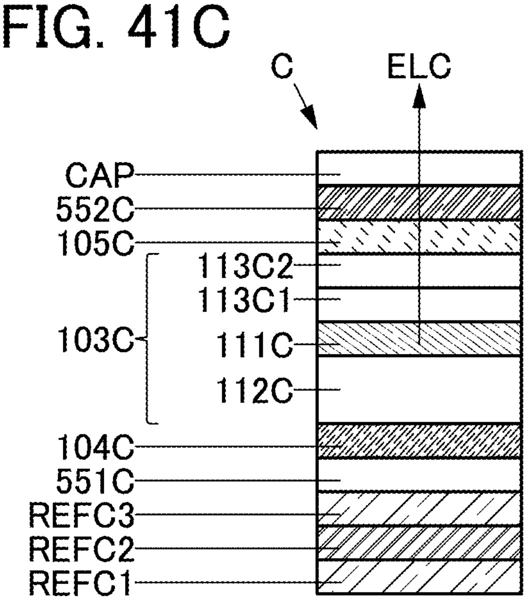

FIG. 41A is a cross-sectional view illustrating a structure of a light-emitting device A. FIG. 41B is a cross-sectional view illustrating a structure of a light-emitting device B. FIG. 41C is a cross-sectional view illustrating a structure of a light-emitting device C.

Figure 42:
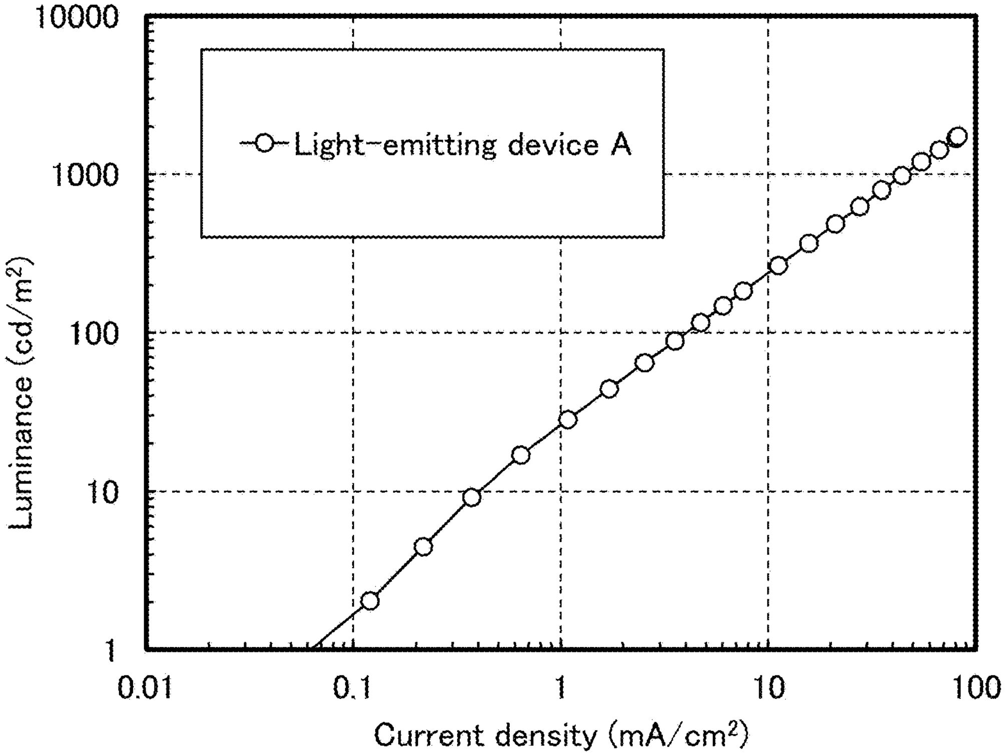
FIG. 42 shows current density-luminance characteristics of a light-emitting device of an example.

FIG. 42 shows current density-luminance characteristics of the light-emitting device A.

Figure 43:
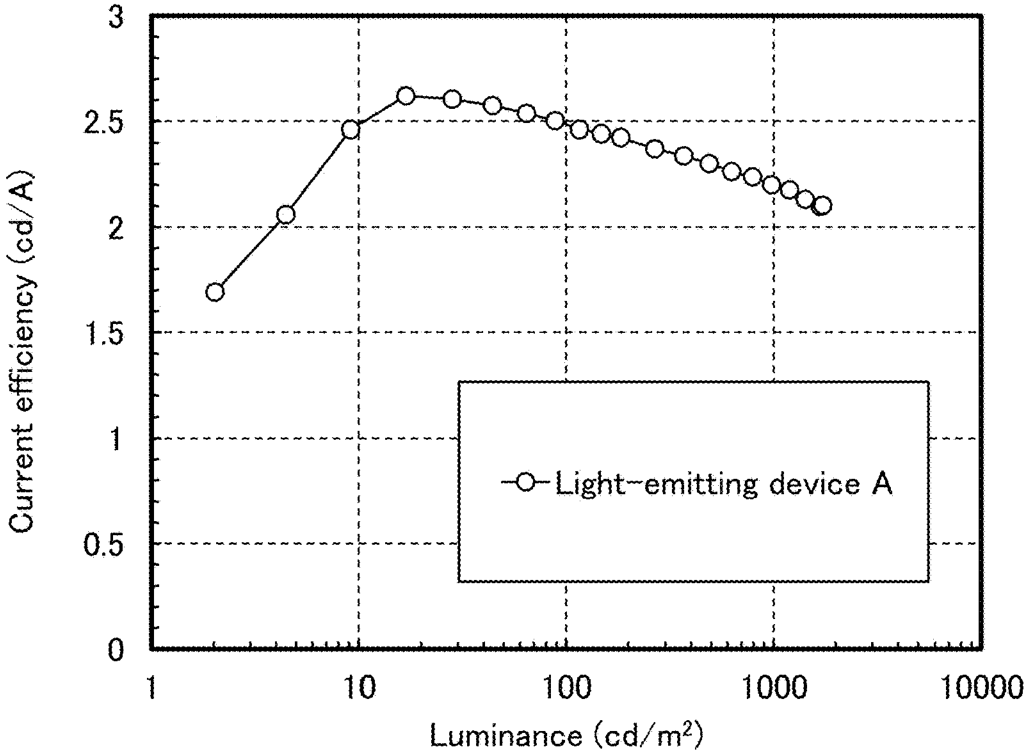
FIG. 43 shows luminance-current efficiency characteristics of a light-emitting device of an example.

FIG. 43 shows luminance-current efficiency characteristics of the light-emitting device A.

Figure 44:
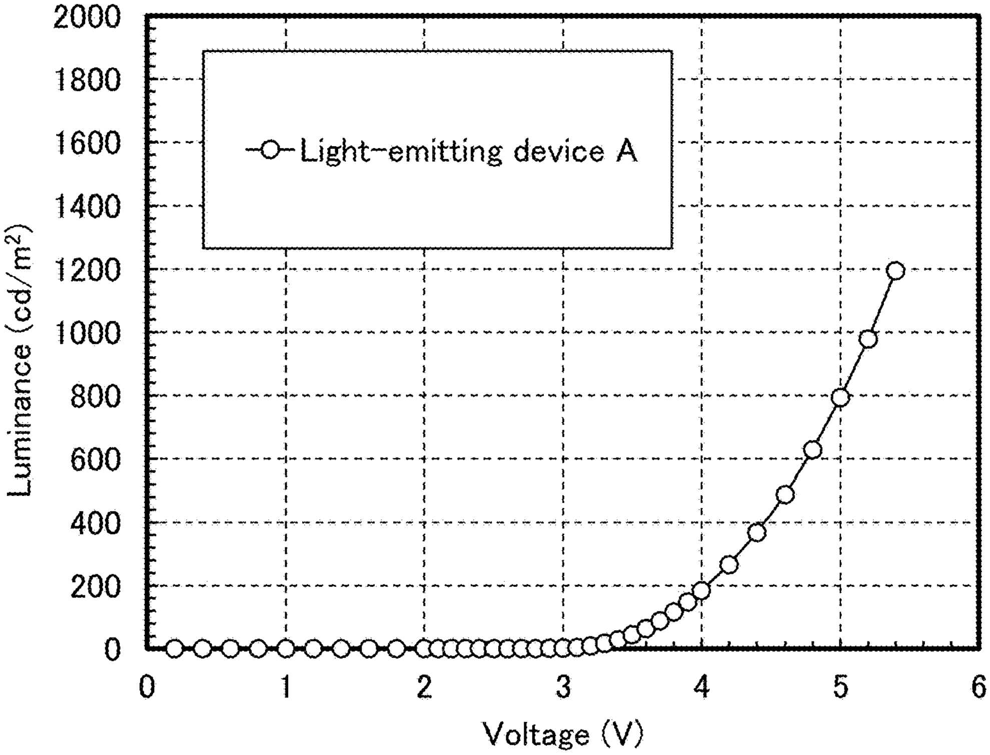
FIG. 44 shows voltage-luminance characteristics of a light-emitting device of an example.

FIG. 44 shows voltage-luminance characteristics of the light-emitting device A.

Figure 45:
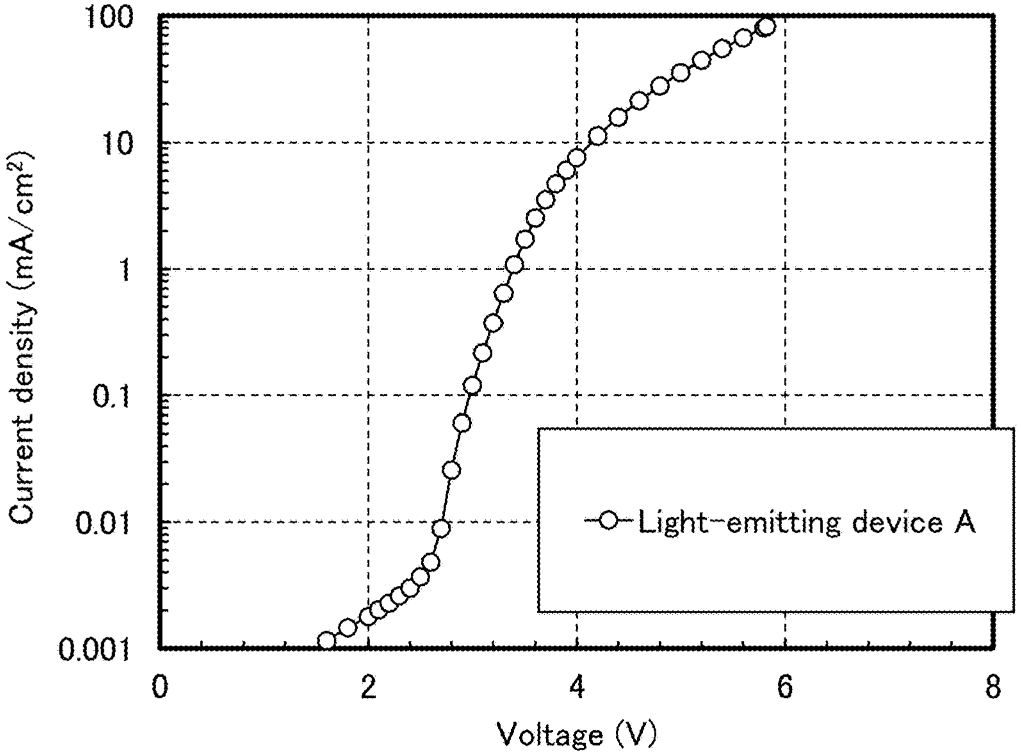
FIG. 45 shows voltage-current density characteristics of a light-emitting device of an example.

FIG. 45 shows voltage-current density characteristics of the light-emitting device A.

Figure 46:
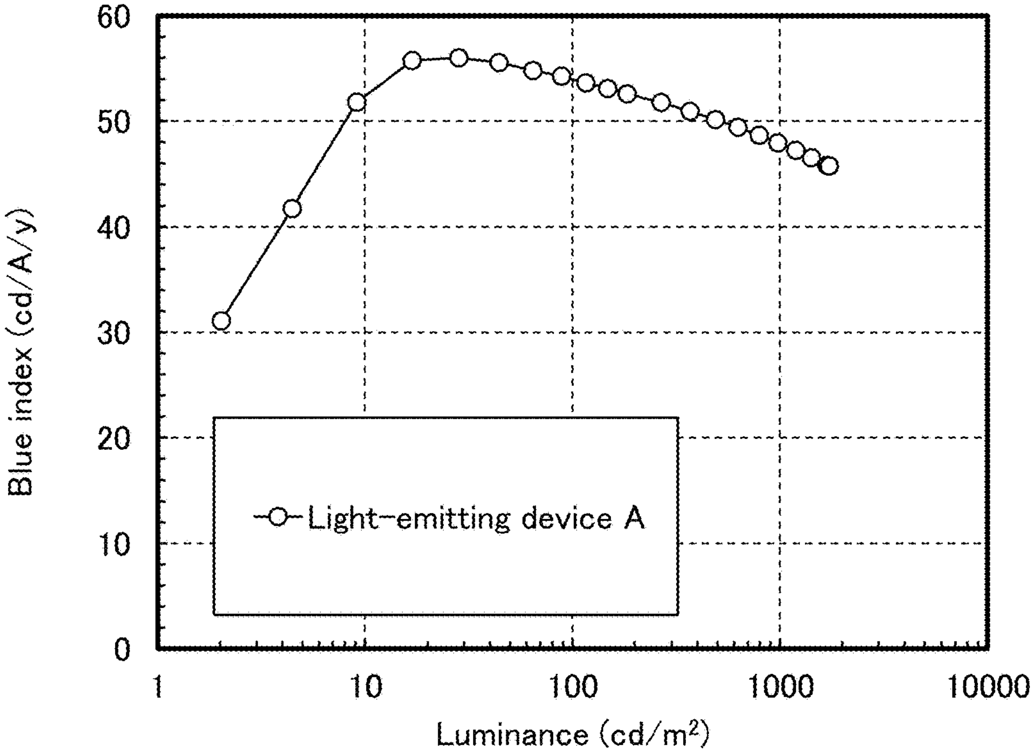
FIG. 46 shows luminance-blue index characteristics of a light-emitting device of an example.

FIG. 46 shows luminance-blue index characteristics of the light-emitting device A.

Note that the blue index (BI) is one of the indicators of characteristics of a blue light-emitting device, and is a value obtained by dividing current efficiency (cd/A) by chromaticity y. In general, blue light with high color purity is useful in expressing a wide color gamut. In addition, blue light with higher color purity tends to have lower chromaticity y. Thus, a value obtained by dividing current efficiency (cd/A) by chromaticity y is the indicator of usefulness of a blue light-emitting device. In other words, a blue light-emitting device with a large BI is suitable for providing a highly efficient display apparatus capable of displaying an image with a wide color gamut.

Figure 47:
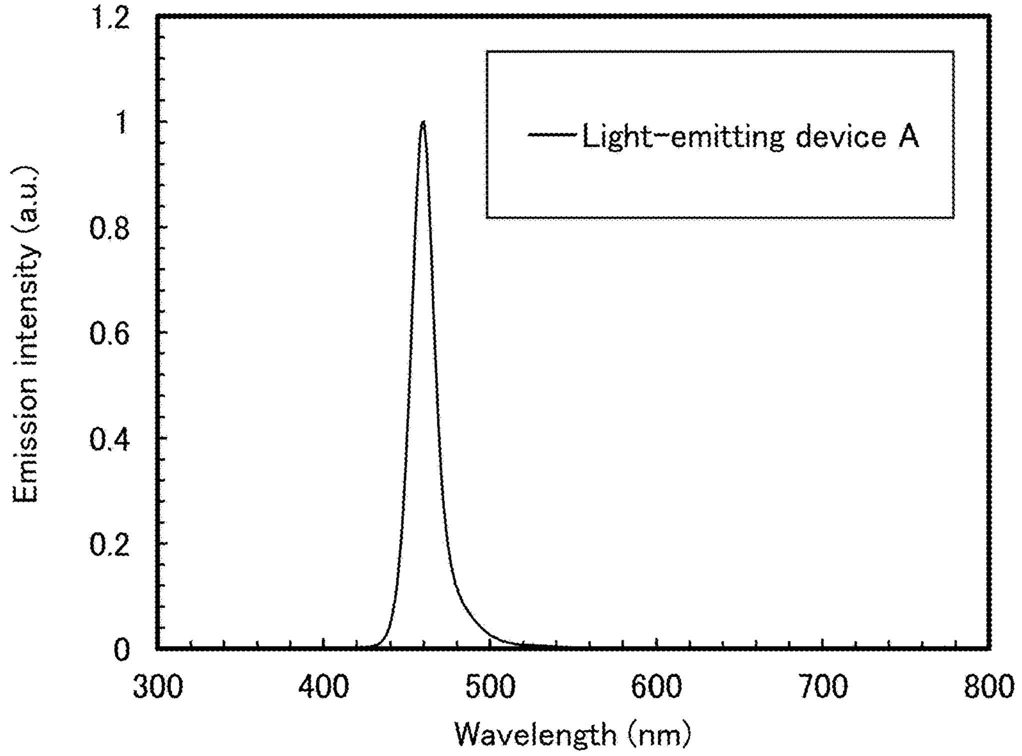
FIG. 47 shows an emission spectrum of a light-emitting device of an example.

FIG. 47 shows an emission spectrum of the light-emitting device A emitting light at a luminance of 1000 cd/$m^2$.

Figure 48:
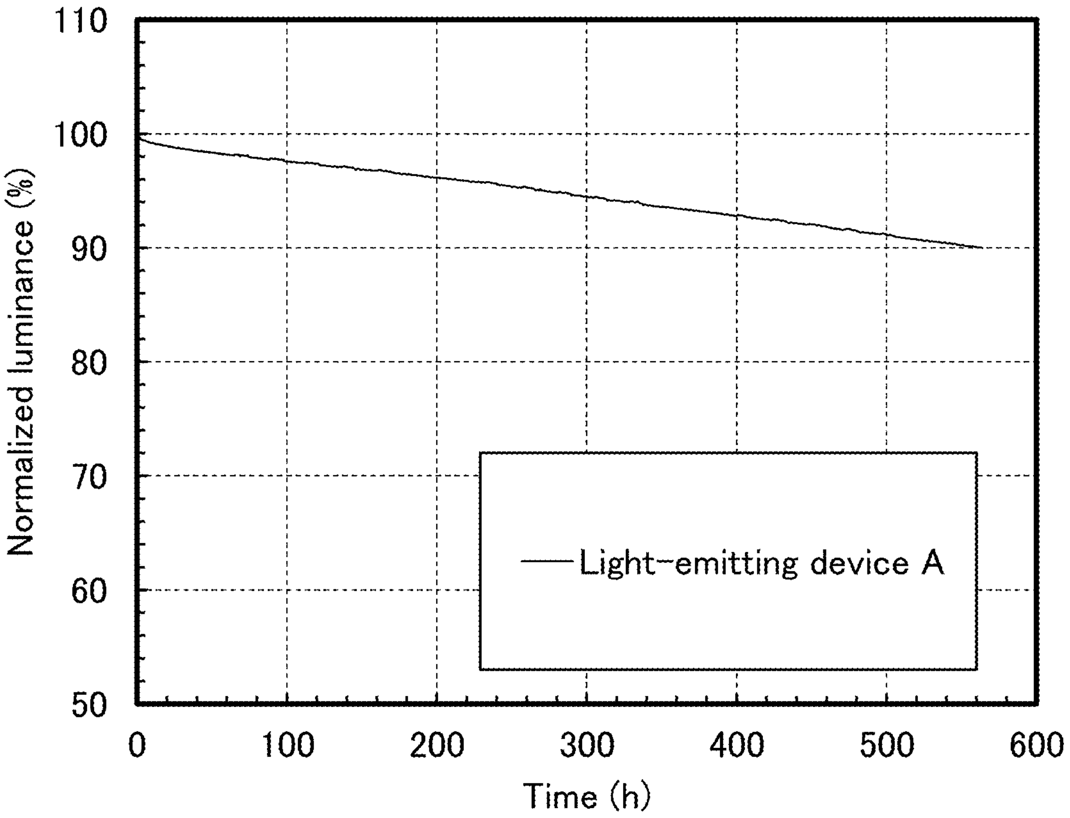
FIG. 48 shows a change in normalized luminance over time of a light-emitting device of an example.

FIG. 48 shows a change in normalized luminance over time of the light-emitting device A emitting light at a constant current density of 50 mA/$cm^2$.

Figure 49:
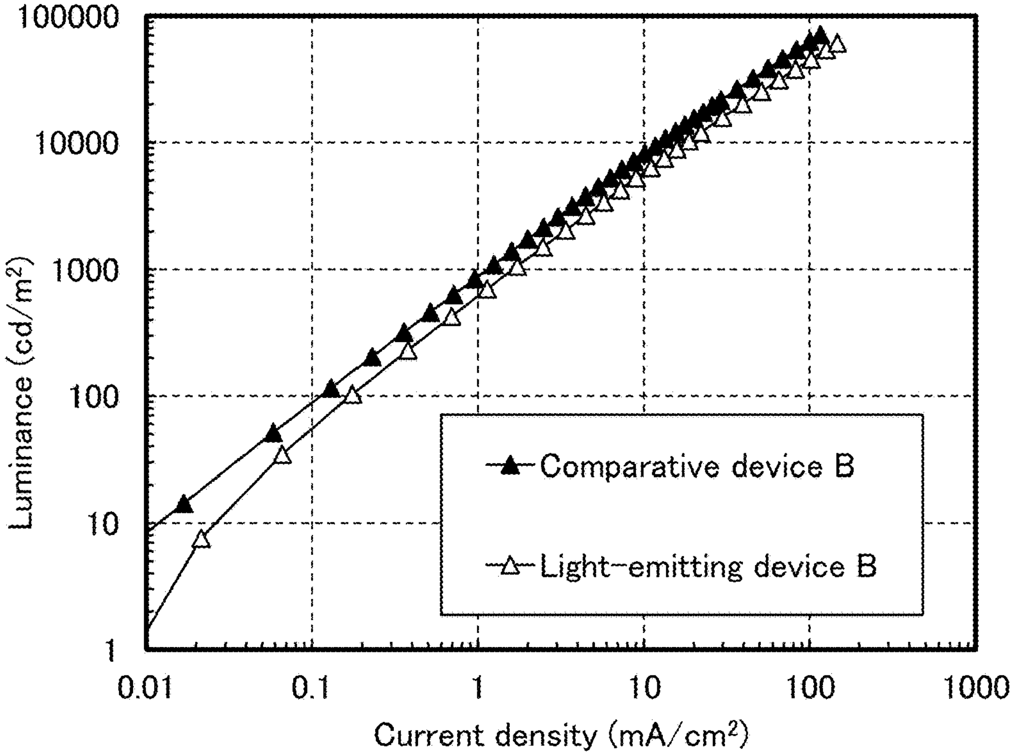
FIG. 49 shows current density-luminance characteristics of light-emitting devices of an example.

FIG. 49 shows current density-luminance characteristics of the light-emitting device B and a comparative device B.

Figure 50:
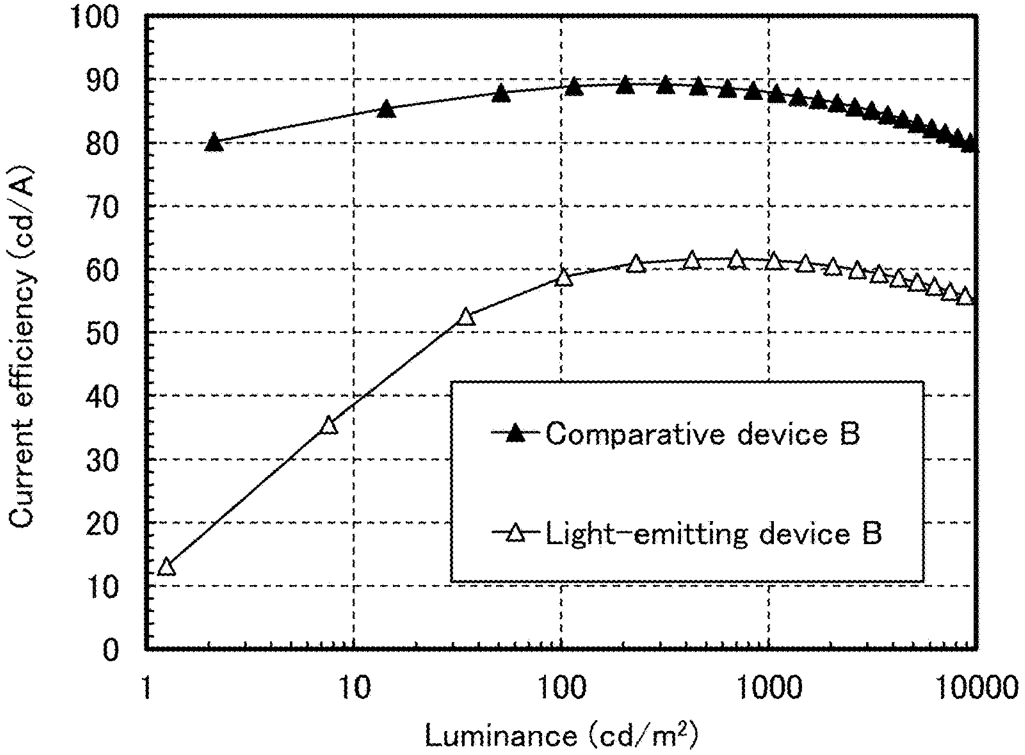
FIG. 50 shows luminance-current efficiency characteristics of light-emitting devices of an example.

FIG. 50 shows luminance-current efficiency characteristics of the light-emitting device B and the comparative device B.

Figure 51:
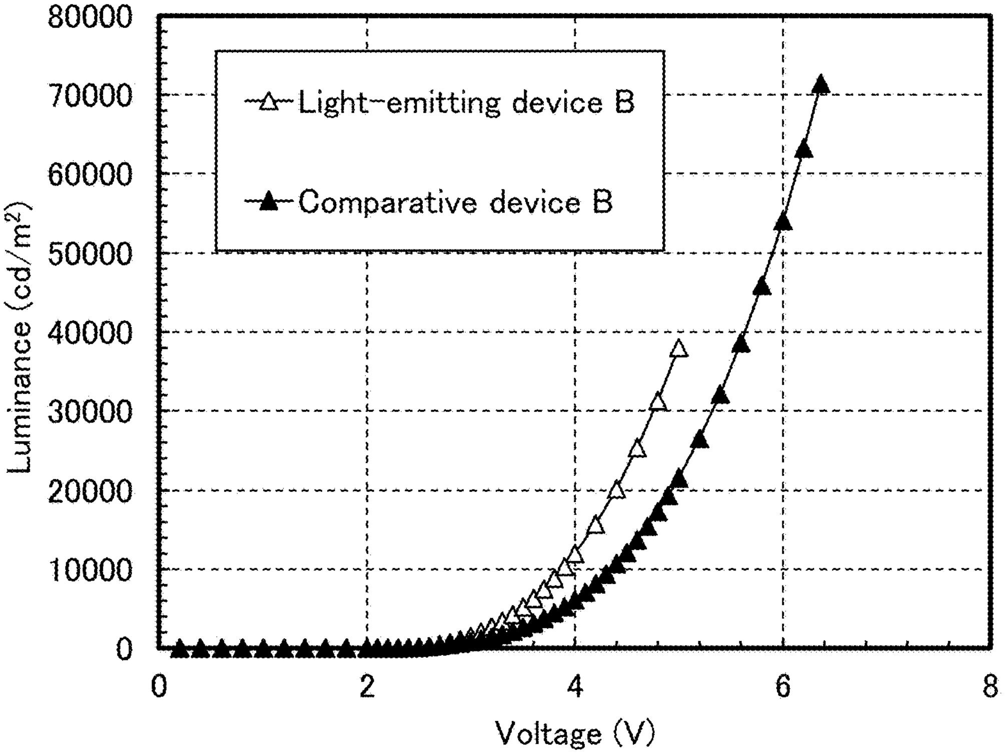
FIG. 51 shows voltage-luminance characteristics of light-emitting devices of an example.

FIG. 51 shows voltage-luminance characteristics of the light-emitting device B and the comparative device B.

Figure 52:
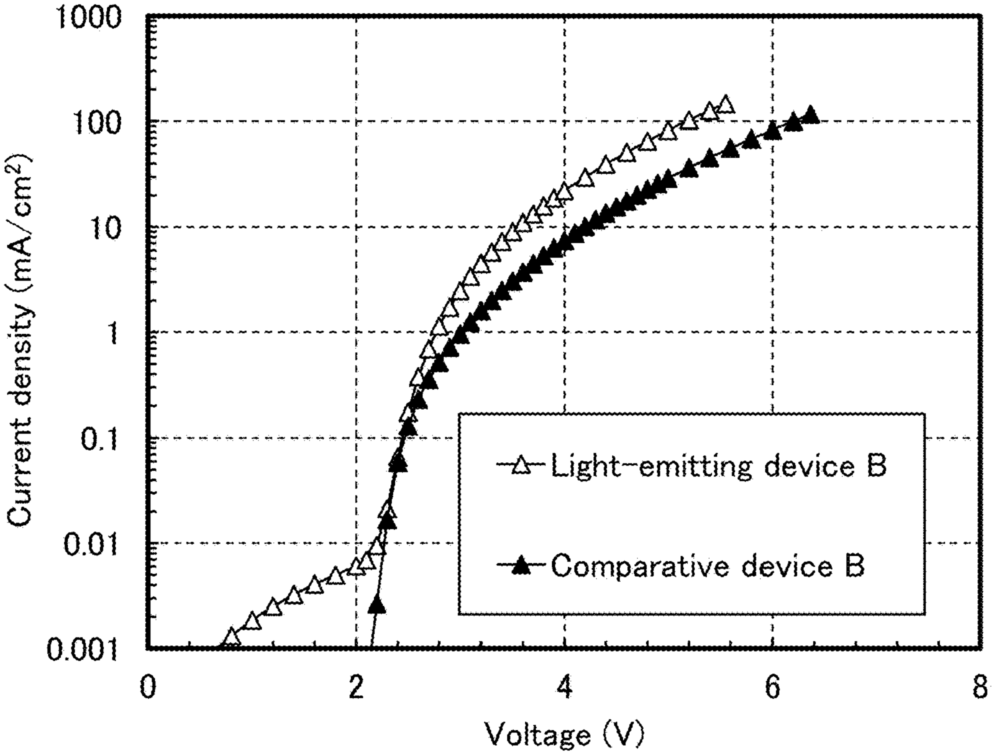
FIG. 52 shows voltage-current density characteristics of light-emitting devices of an example.

FIG. 52 shows voltage-current density characteristics of the light-emitting device B and the comparative device B.

Figure 53:
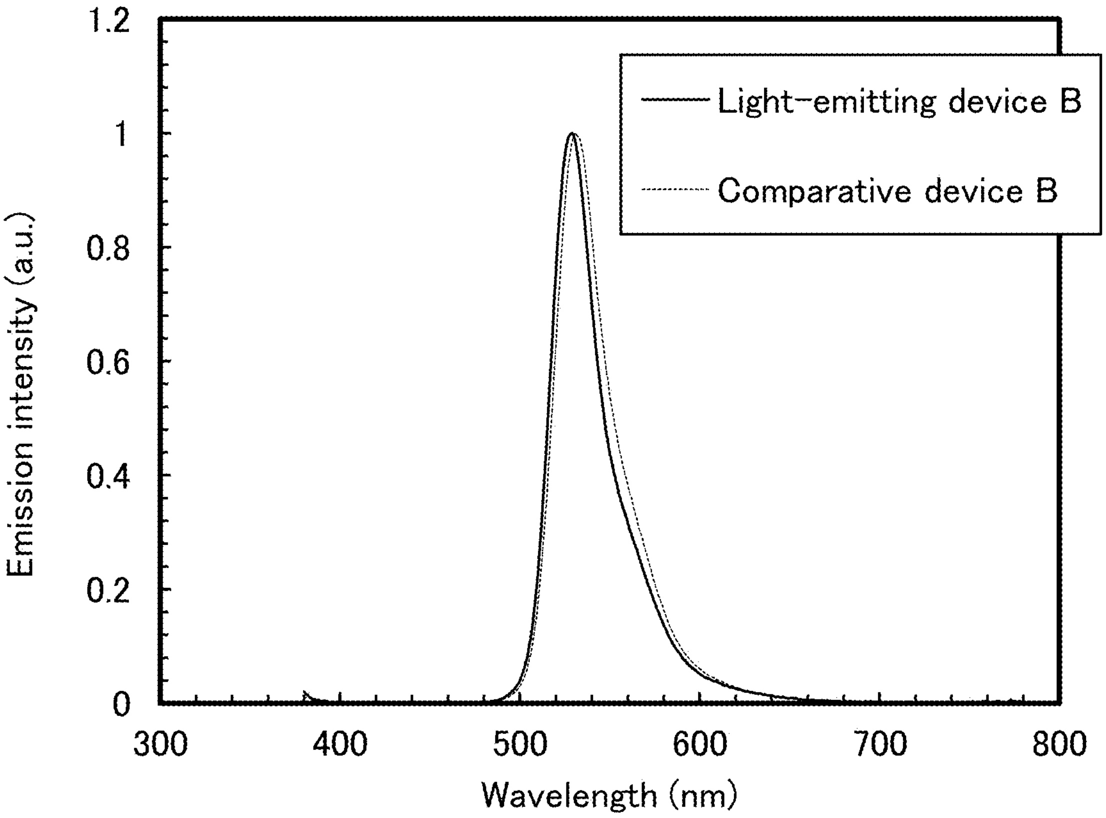
FIG. 53 shows emission spectra of light-emitting devices of an example.

FIG. 53 shows emission spectra of the light-emitting device B and the comparative device B each emitting light at a luminance of 1000 cd/$m^2$.

Figure 54:
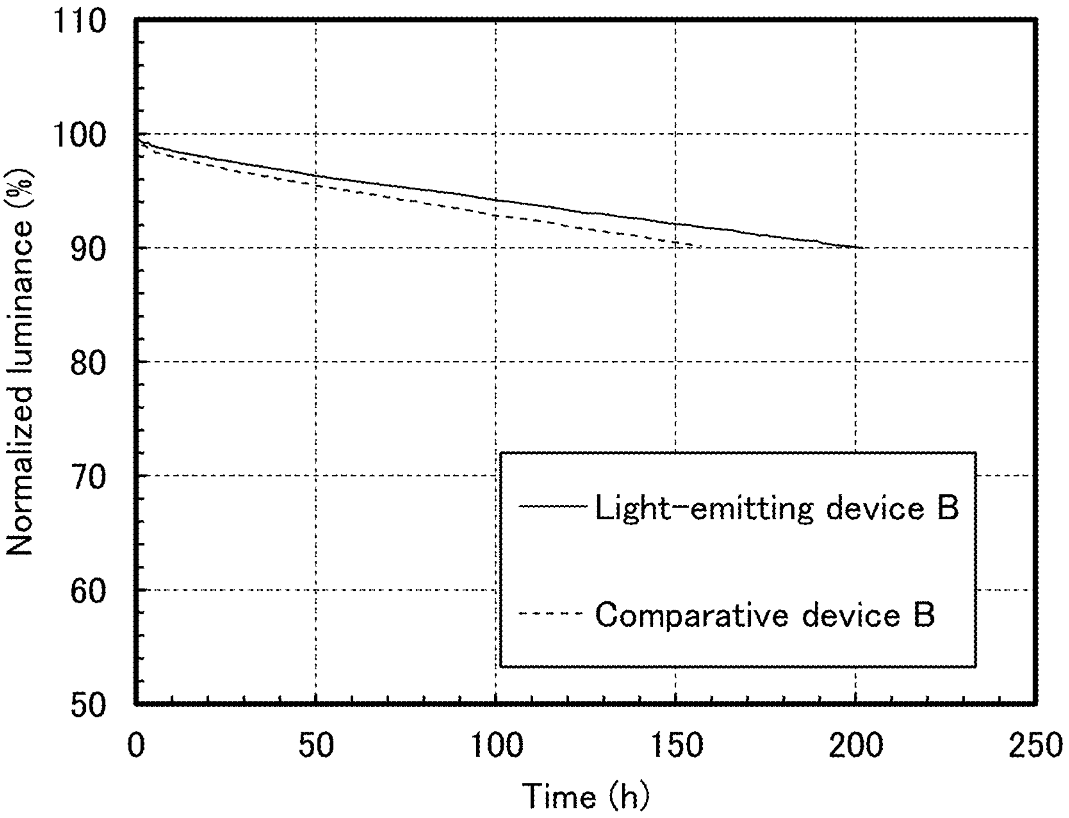
FIG. 54 shows changes in normalized luminance over time of light-emitting devices of an example.

FIG. 54 shows a change in normalized luminance over time of the light-emitting device B and the comparative device B each emitting light at a constant current density of 50 mA/$cm^2$.

Figure 55:
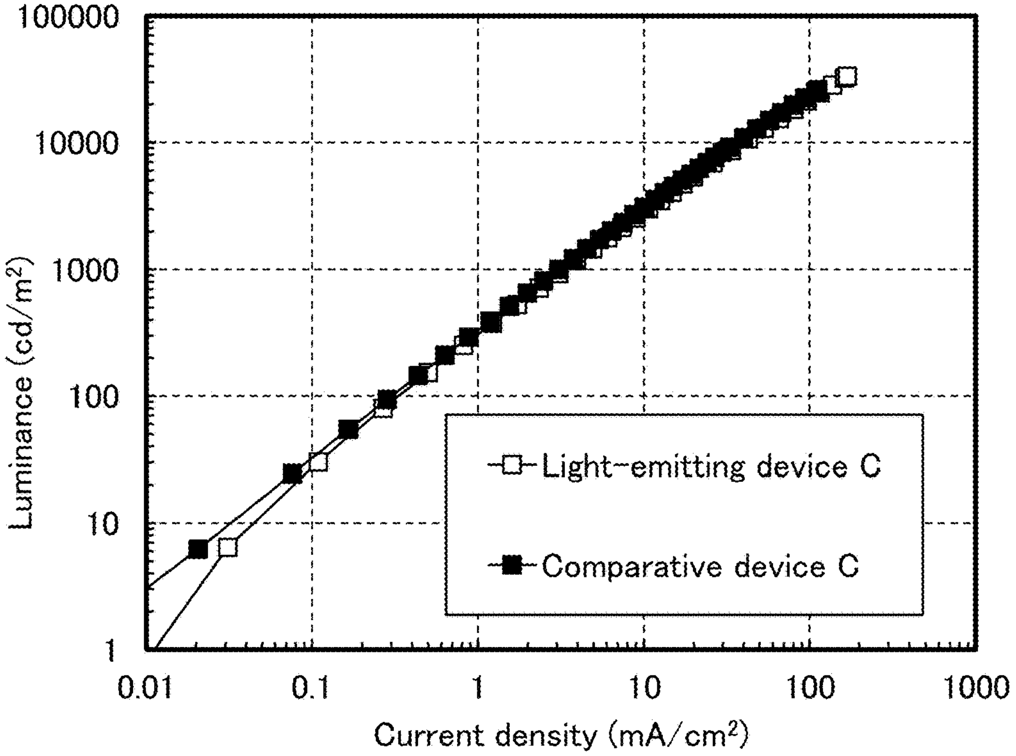
FIG. 55 shows current density-luminance characteristics of light-emitting devices of an example.

FIG. 55 shows current density-luminance characteristics of the light-emitting device C and a comparative device C.

Figure 56:
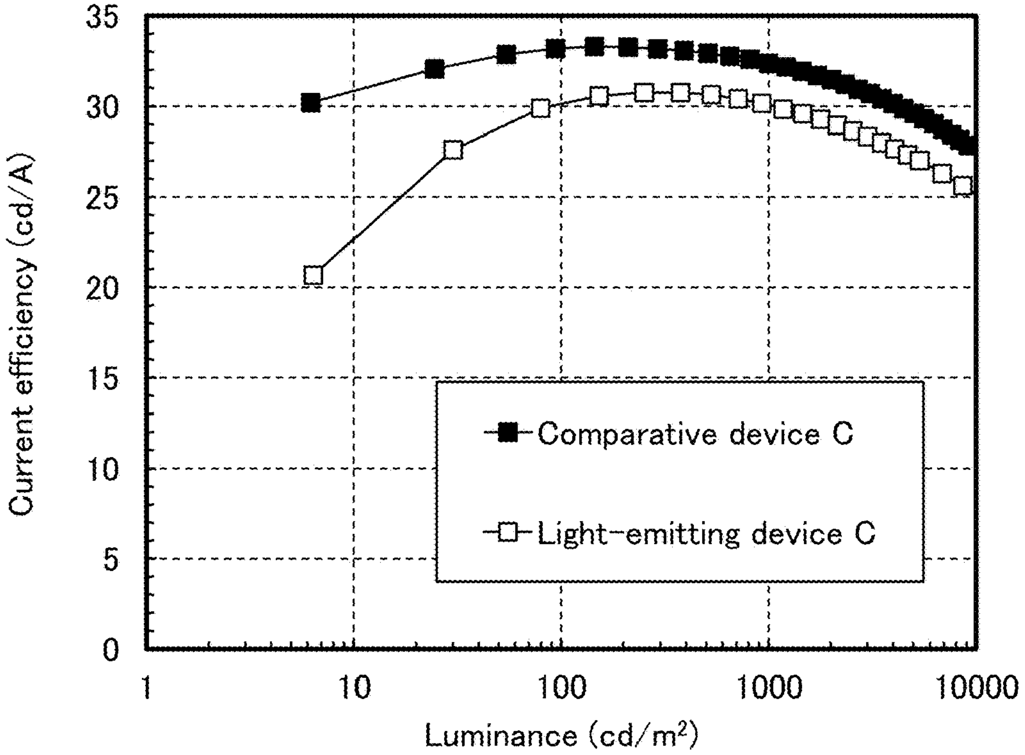
FIG. 56 shows luminance-current efficiency characteristics of light-emitting devices of an example.

FIG. 56 shows luminance-current efficiency characteristics of the light-emitting device C and the comparative device C.

Figure 57:
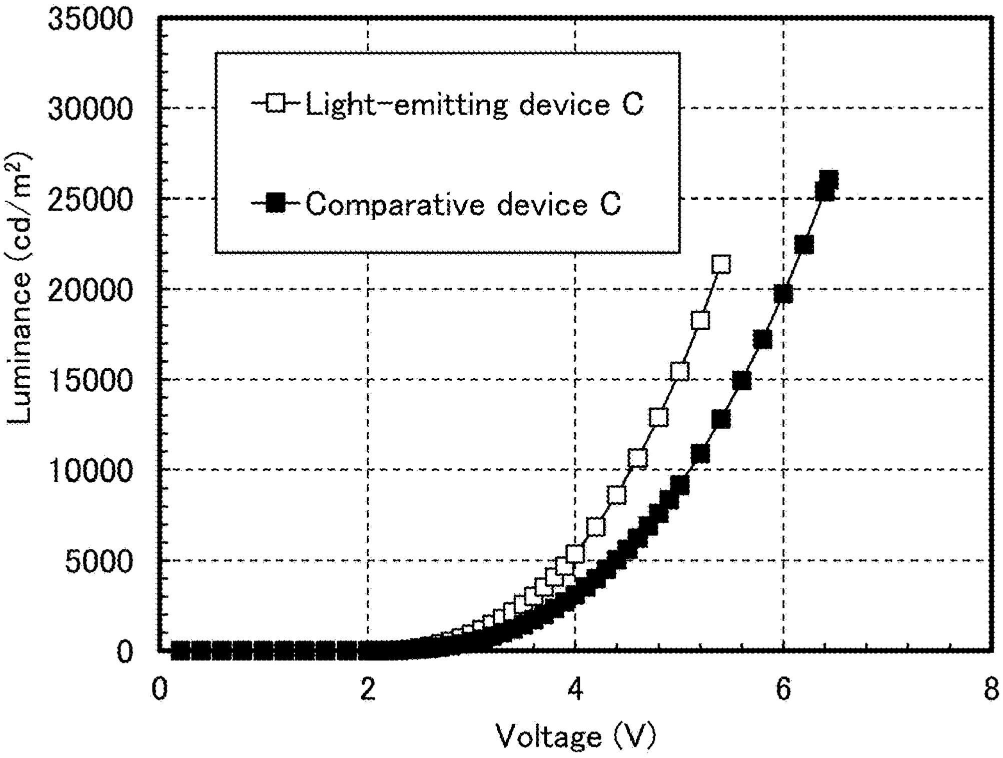
FIG. 57 shows voltage-luminance characteristics of light-emitting devices of an example.

FIG. 57 shows voltage-luminance characteristics of the light-emitting device C and the comparative device C.

Figure 58:
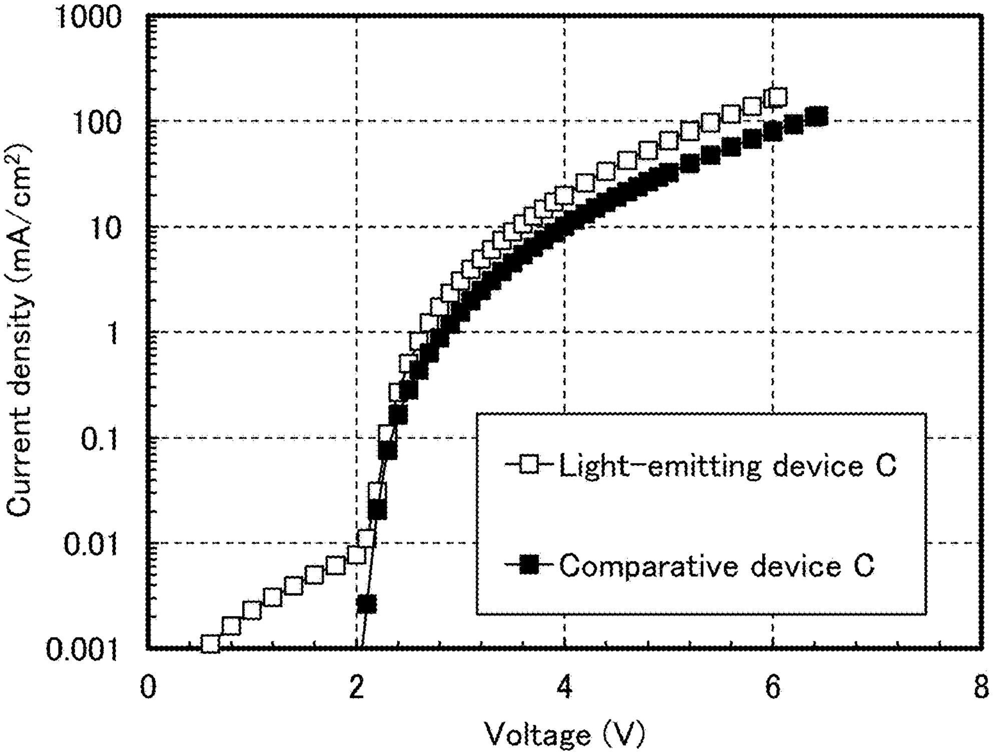
FIG. 58 shows voltage-current density characteristics of light-emitting devices of an example.

FIG. 58 shows voltage-current density characteristics of the light-emitting device C and the comparative device C.

Figure 59:
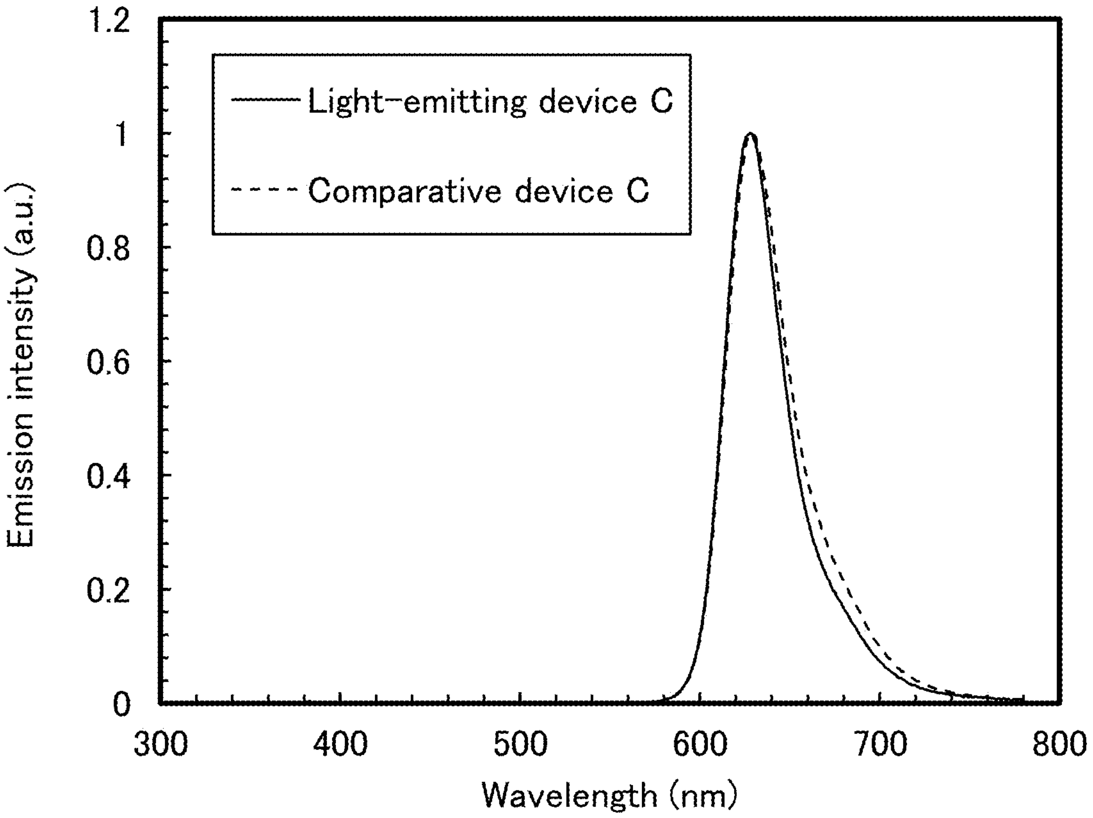
FIG. 59 shows emission spectra of light-emitting devices of an example.

FIG. 59 shows emission spectra of the light-emitting device C and the comparative device C each emitting light at a luminance of 1000 cd/$m^2$.

Figure 60:
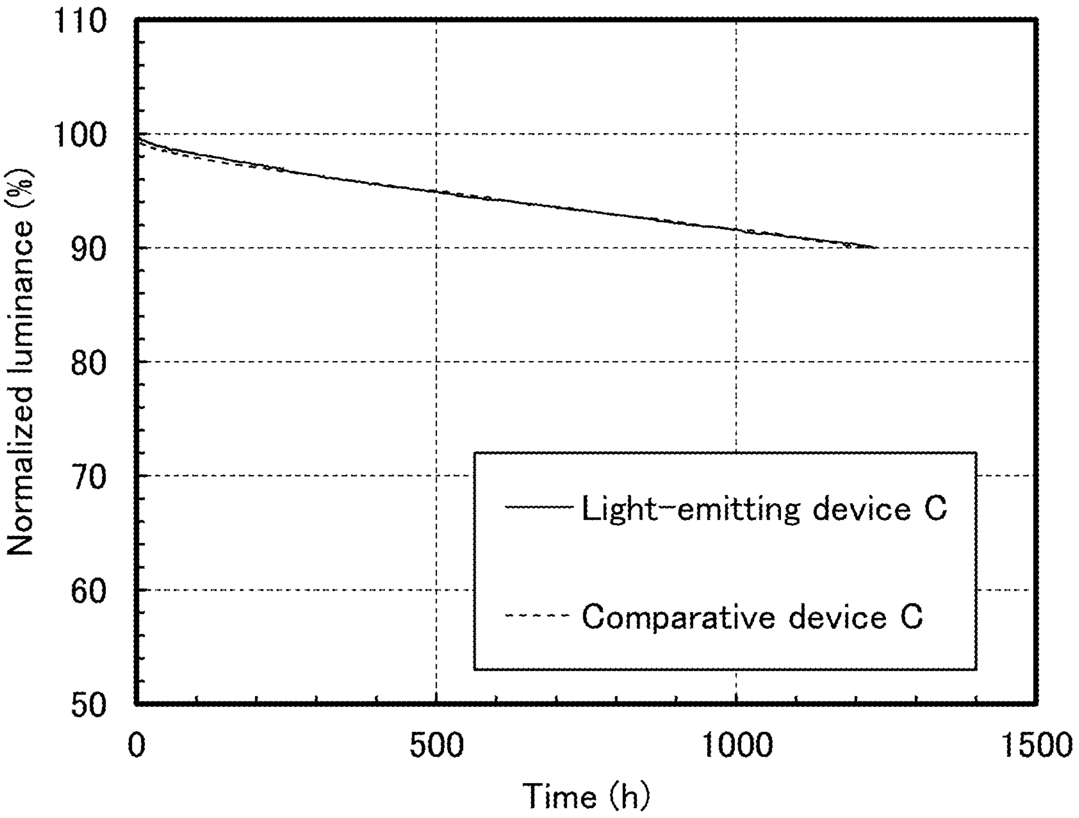
FIG. 60 shows changes in normalized luminance over time of light-emitting devices of an example.

FIG. 60 shows a change in normalized luminance over time of the light-emitting device C and the comparative device C each emitting light at a constant current density of 50 mA/$cm^2$.

Figure 61:
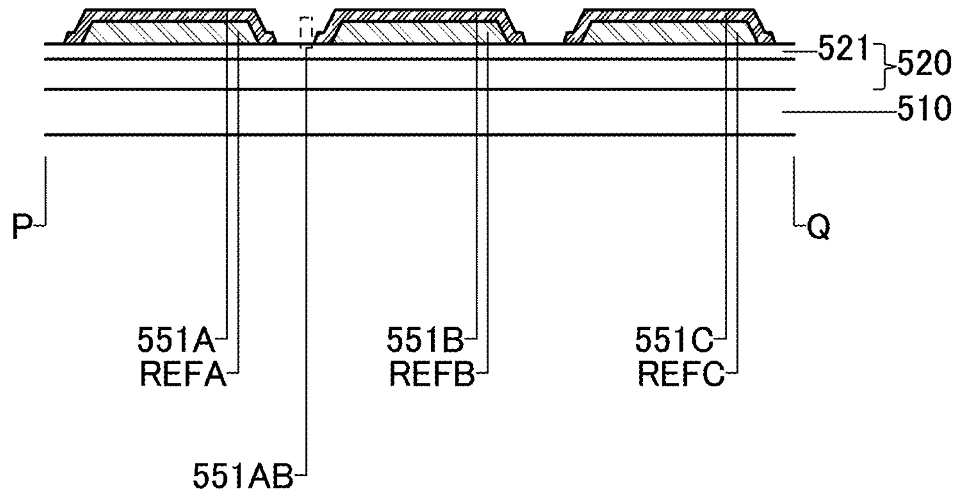
FIG. 61 illustrates a method for fabricating a display apparatus of an example.

FIG. 61 illustrates a fabrication method of the display apparatus 700-3.

Figure 62:
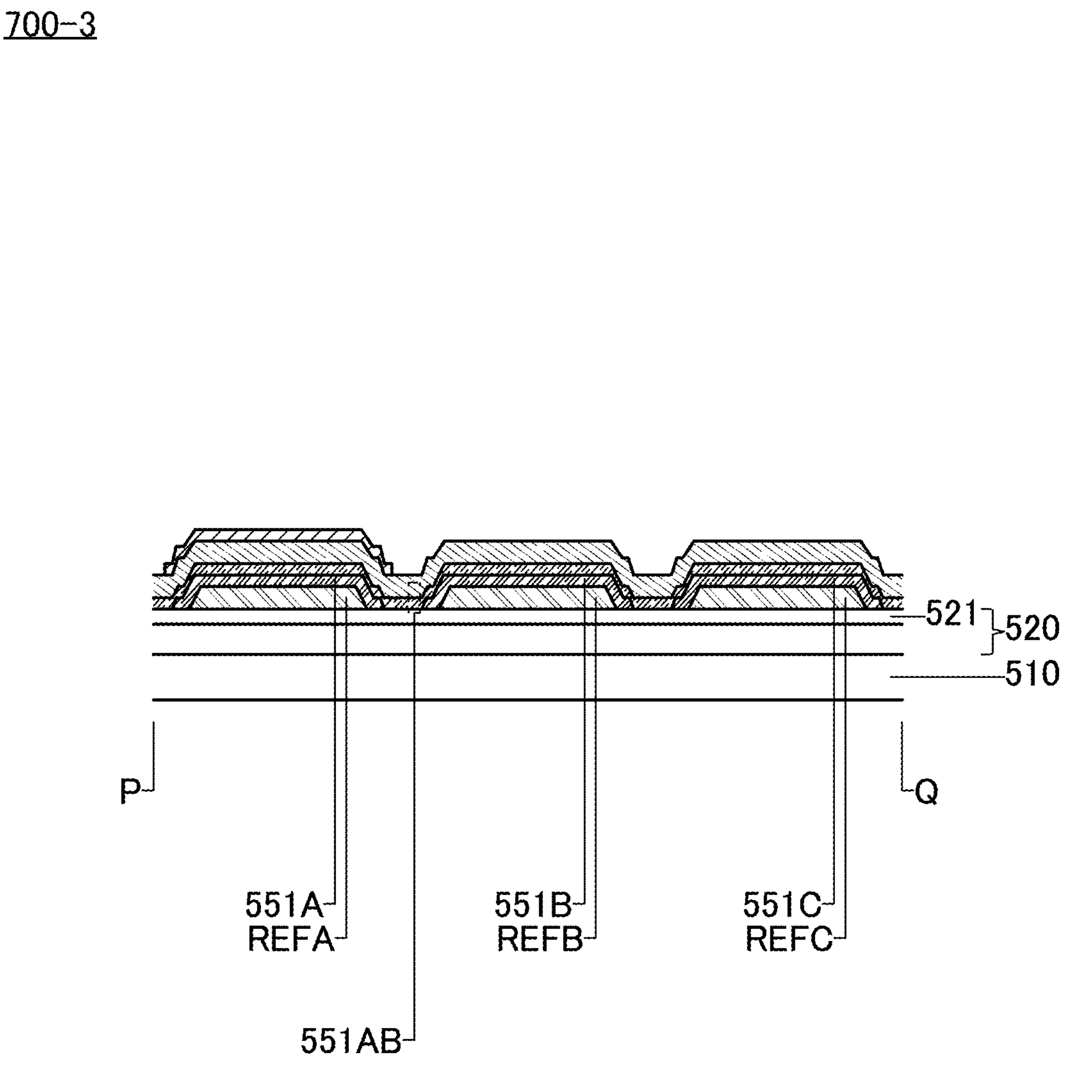
FIG. 62 illustrates a method for fabricating a display apparatus of an example.

FIG. 62 illustrates the fabrication method of the display apparatus 700-3.

Figure 63:
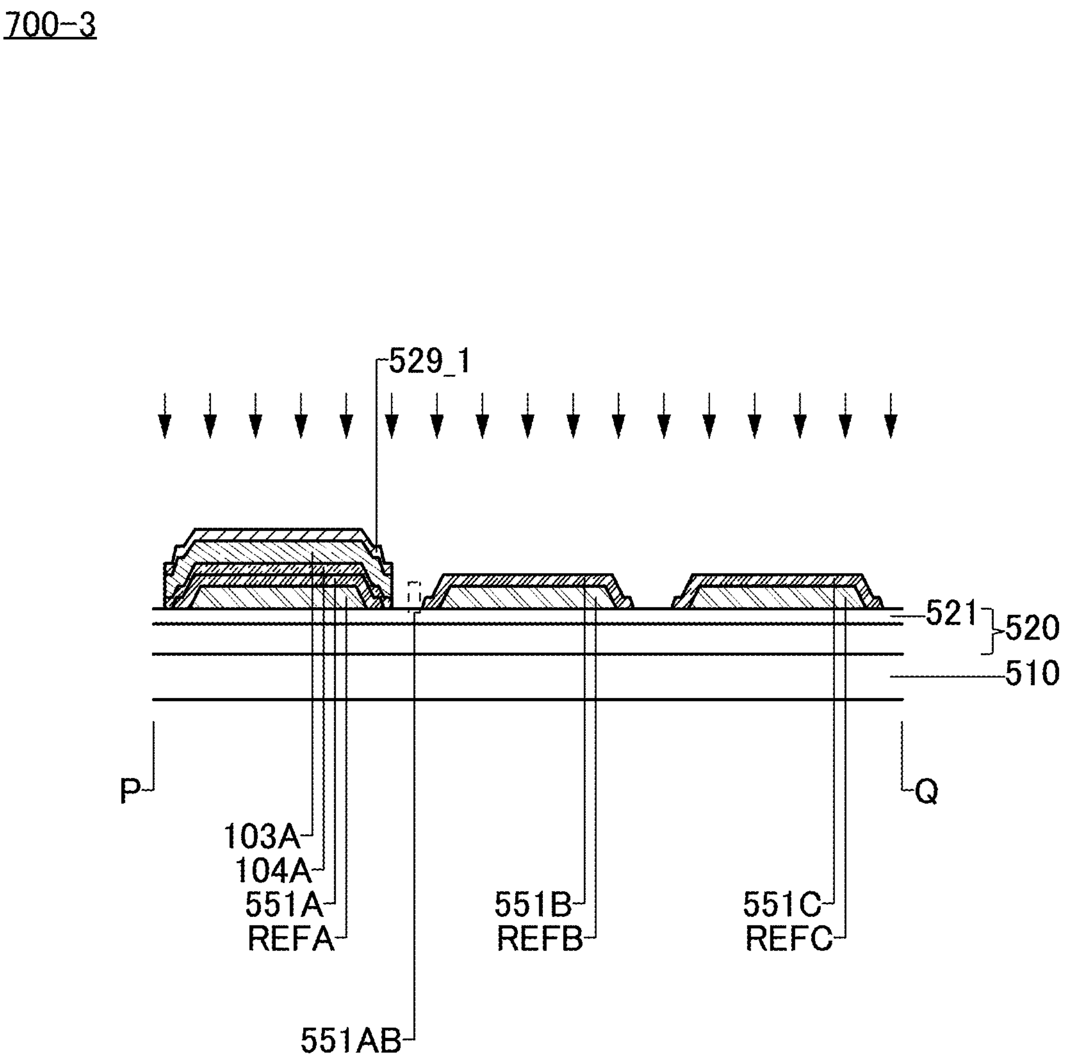
FIG. 63 illustrates a method for fabricating a display apparatus of an example.

FIG. 63 illustrates the fabrication method of the display apparatus 700-3.

Figure 64:
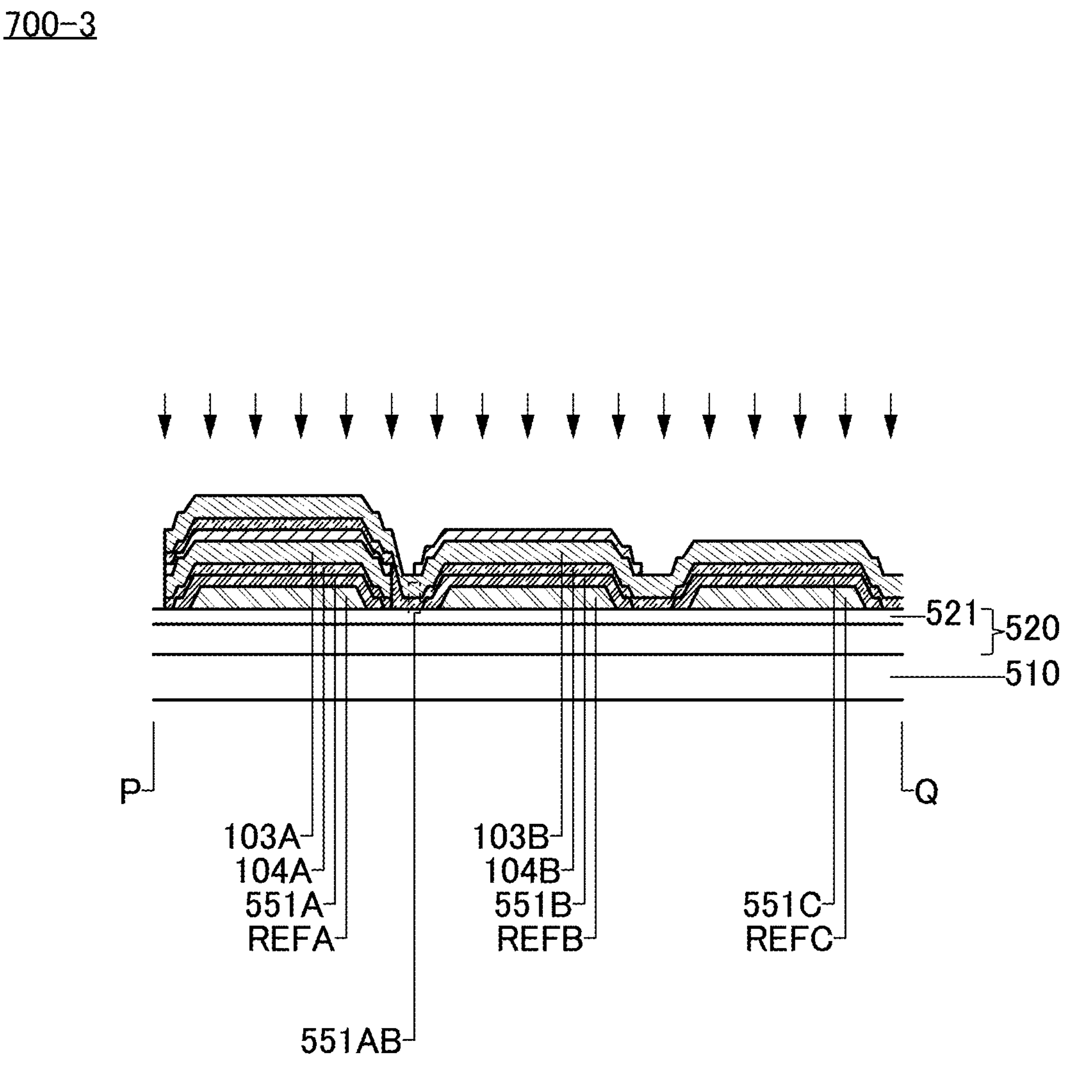
FIG. 64 illustrates a method for fabricating a display apparatus of an example.

FIG. 64 illustrates the fabrication method of the display apparatus 700-3.

Figure 65:
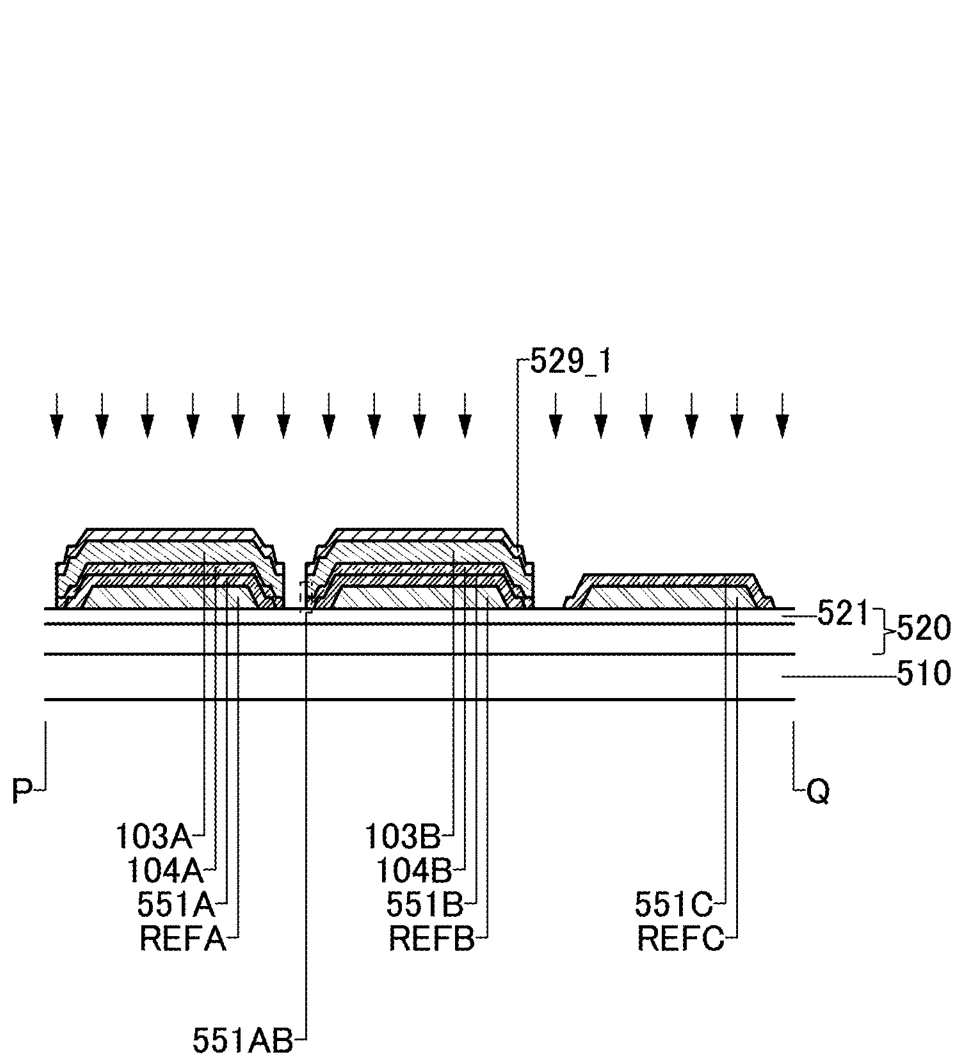
FIG. 65 illustrates a method for fabricating a display apparatus of an example.

FIG. 65 illustrates the fabrication method of the display apparatus 700-3.

Figure 66:
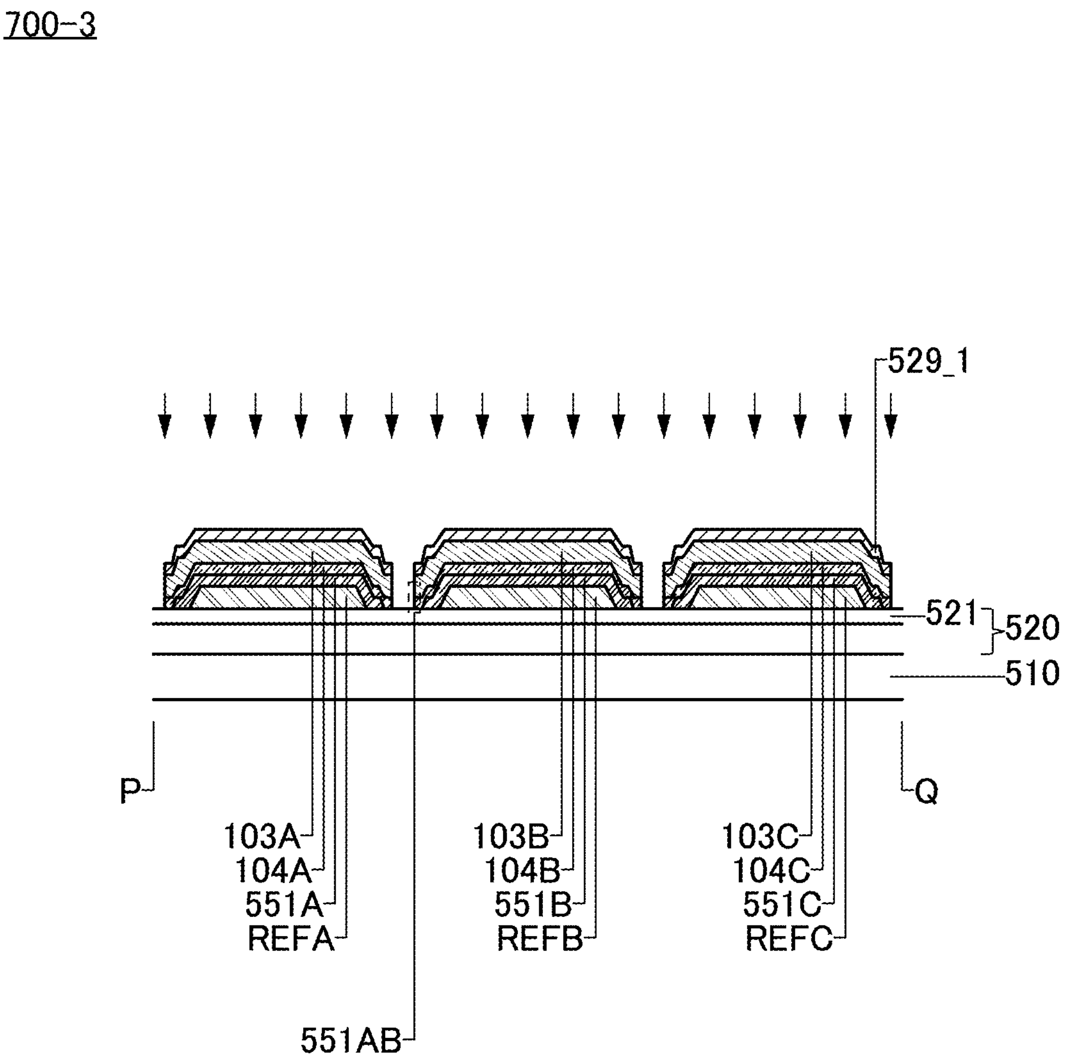
FIG. 66 illustrates a method for fabricating a display apparatus of an example.

FIG. 66 illustrates the fabrication method of the display apparatus 700-3.

Figure 67:
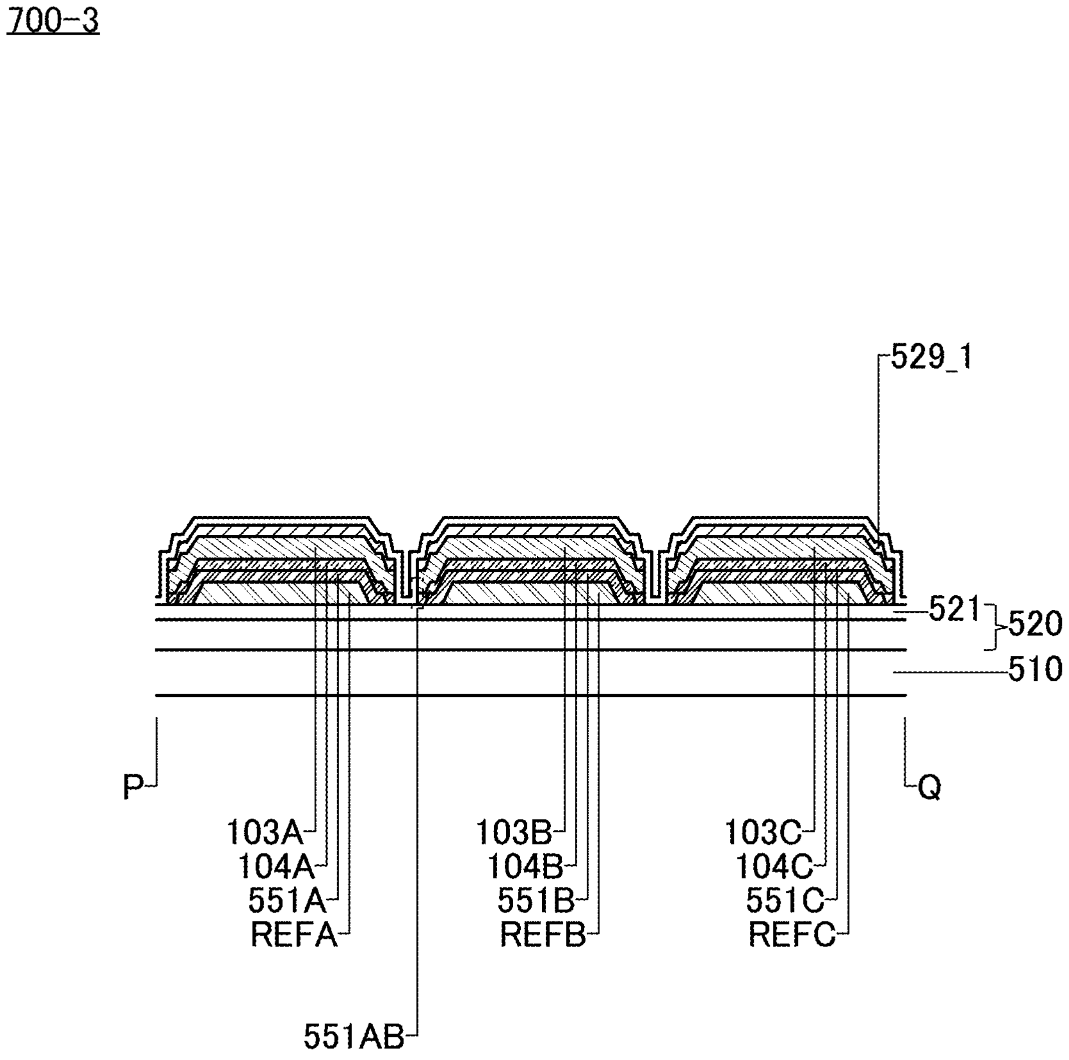
FIG. 67 illustrates a method for fabricating a display apparatus of an example.

FIG. 67 illustrates the fabrication method of the display apparatus 700-3.

Figure 68:
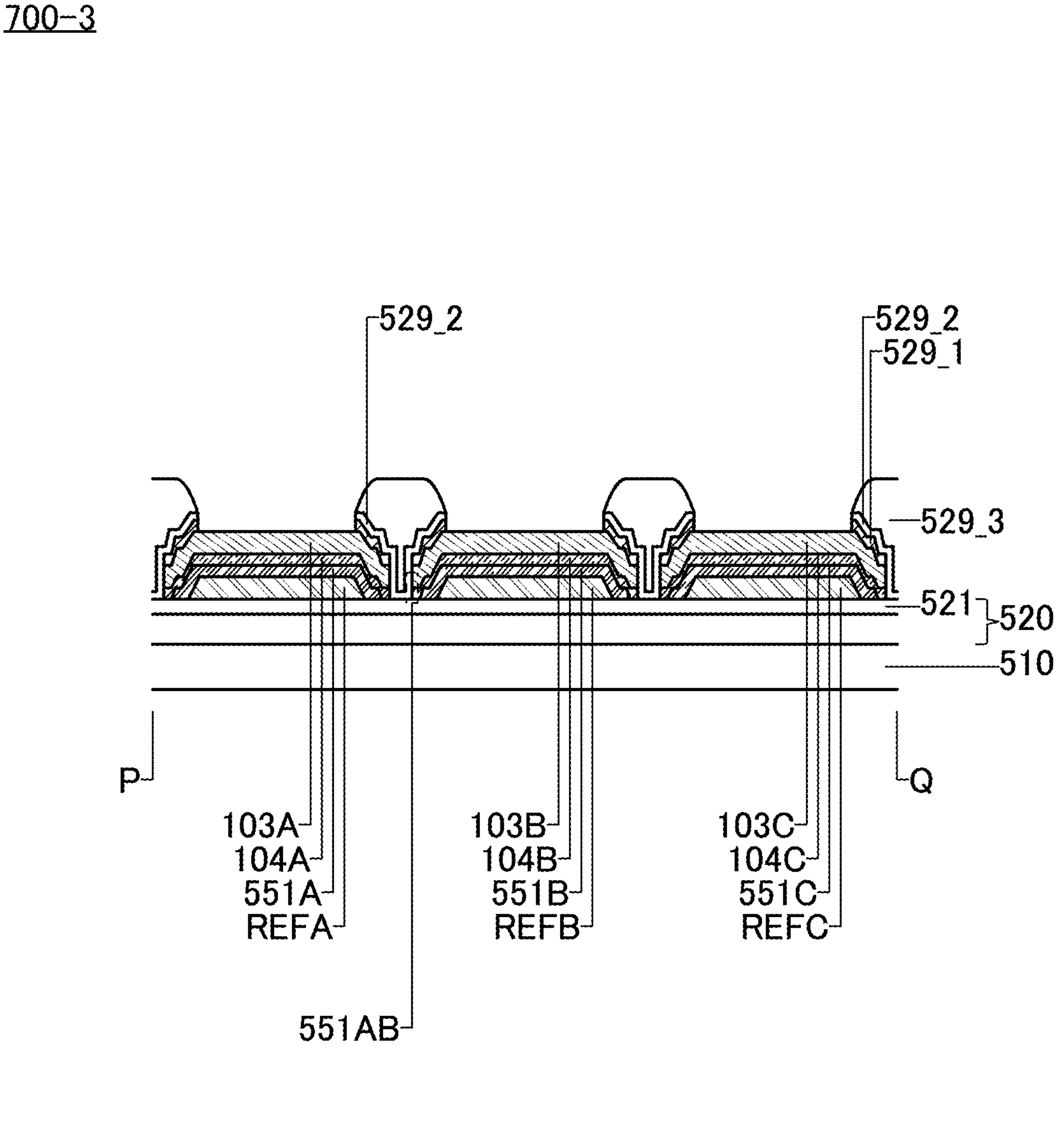
FIG. 68 illustrates a method for fabricating a display apparatus of an example.

FIG. 68 illustrates the fabrication method of the display apparatus 700-3.

Figure 69:
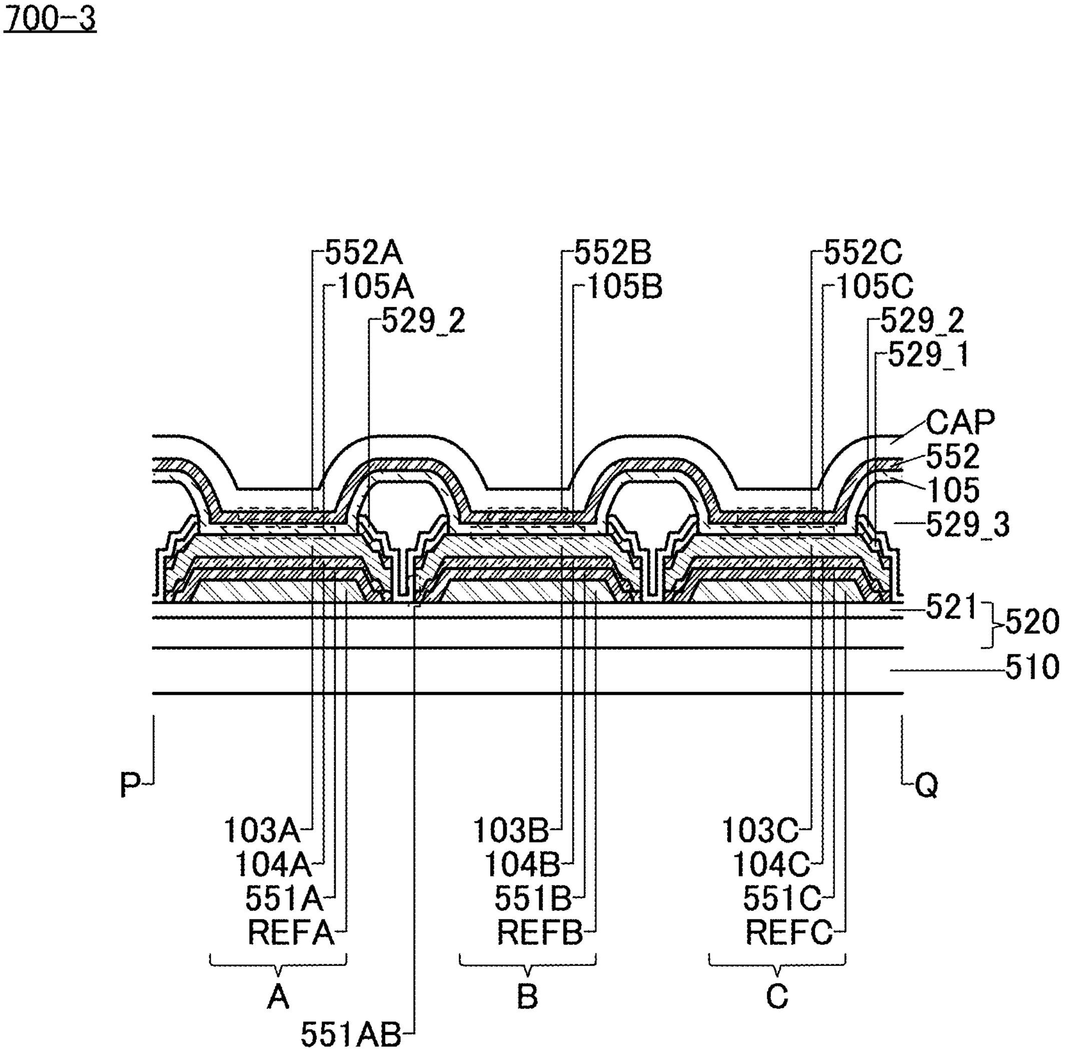
FIG. 69 illustrates a method for fabricating a display apparatus of an example.

FIG. 69 illustrates the fabrication method of the display apparatus 700-3.

<Display Apparatus 700-3>

The fabricated display apparatus 700-3 described in this example includes the substrate 510, the functional layer 520, and the pixel set 703 (see FIG. 40A). Note that the display apparatus 700-3 includes a plurality of pixel sets 703 arranged longitudinally and horizontally at a 7.92 μm pitch to have a resolution of 3207 ppi.

The pixel set 703 includes the light-emitting devices A, B, and C (see FIGS. 40B and 40C).

The functional layer 520 is positioned between the substrate 510 and the light-emitting device A. The functional layer 520 includes the insulating film 521, and the light-emitting devices A, B, and C are formed over the insulating film 521.

The display apparatus 700 includes the conductive film 552, the layer 105, the insulating film 529_3, and the films 529_1 and 529_2.

The conductive film 552 overlaps with the insulating film 521 and includes the electrode 552A, the electrode 552B, and an electrode 552C. The layer 105 is positioned between the conductive film 552 and the insulating film 521 and includes the layer 105A, the layer 105B, and a layer 105C.

The insulating film 529_3 is positioned between the conductive film 552 and the insulating film 521. The gap 551AB is positioned between the electrode 551B and the electrode 551A and the insulating film 529_3 overlaps with the gap 551AB. The insulating film 529_3 has a plurality of openings; one opening overlaps with the electrode 551A, another opening overlaps with the electrode 551B, and another opening overlaps with an electrode 551C.

The film 5292 is positioned between the insulating film 529_3 and the insulating film 521. The film 529_2 includes regions in contact with the layer 104A, the layer 104B, and a layer 104C. The film 529_2 includes regions in contact with the unit 103A, the unit 103B, and a unit 103C.

The film 5292 has openings; one opening overlaps with the electrode 551A, another opening overlaps with the electrode 551B, and another opening overlaps with the electrode 551C. The film 529_2 overlaps with the gap 551AB.

The film 529_1 is positioned between the film 529_2 and the insulating film 521.

«Structure of Light-Emitting Device A»

The light-emitting device A includes a reflective film REFA, the electrode 551A, the electrode 552A, the unit 103A, the layer 104A, the layer 105A, and the layer CAP (see FIG. 40C). The light-emitting device A has a rectangular shape with a size of 6.92 m×2.73 μm (see FIG. 40B).

The reflective film REFA includes a layer REFA1, a layer REFA2, and a layer REFA3 (see FIG. 41A). The unit 103A includes the layer 112A, a layer 113A1, a layer 113A2, and the layer 111A.

Table 8 shows the specific structure of the fabricated light-emitting device A described in this example. Structural formulae of materials used in the light-emitting devices described in this example are shown below. Note that in the tables in this example, subscript and superscript characters are written in ordinary size for convenience. For example, a subscript character in an abbreviation and a superscript character in a unit are written in ordinary size in the tables. The corresponding description in the specification gives an accurate reading of such notations in the tables.

TABLE 8

| Components | Reference numerals | Materials | Composition ratio | Thickness/nm |
|---|---|---|---|---|
| Layer | CAP | ITO | | 70 |
| Electrode | 552A | Ag:Mg | 1:0.1 | 25 |
| Layer | 105A | LiF:Yb | 1:0.5 | 1.5 |
| Layer | 113A2 | mPPhen2P | | 15 |
| Layer | 113A1 | 2mPCCzPDBq | | 20 |
| Layer | 111A | αN-βNPAnth: 3,10PCA2Nbf(IV)-02 | 1: 0.015 | 25 |
| Layer | 112A2 | DBfBB1TP | | 10 |
| Layer | 112A1 | PCBBiF | | 96 |
| Layer | 104A | PCBBiF:OCHD-003 | 1:0.03 | 10 |
| Electrode | 551A | ITSO | | 10 |
| Reflective film | REFA3 | Ti | | 6 |
| Reflective film | REFA2 | Al | | 70 |
| Reflective film | REFA1 | Ti | | 50 |

[Chemical Formulae 4]

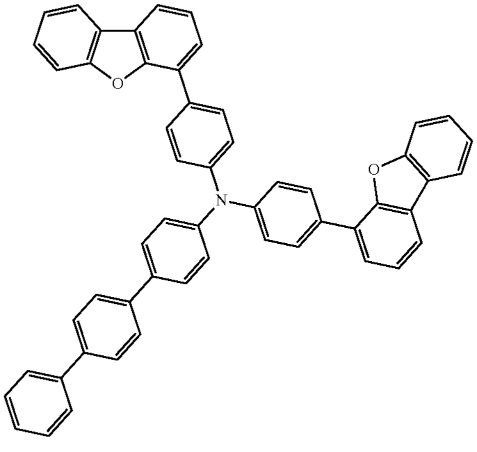

DBfBB1TP

TABLE 8-continued

| Components | Reference numerals | Materials | Composition ratio | Thickness/nm |
|---|---|---|---|---|

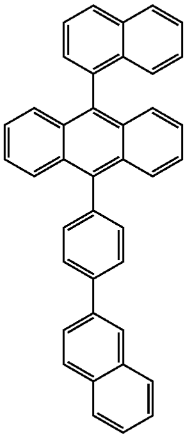

αN-βNPAnth

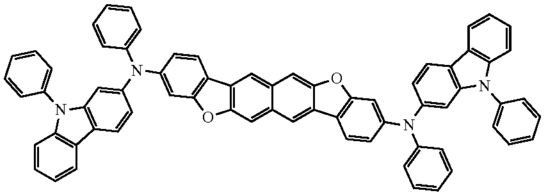

3,10PCA2Nbf(IV)-02

In this example, the light-emitting devices were fabricated using titanium (Ti), aluminum (Al), indium oxide-tin oxide containing silicon or silicon oxide (abbreviation: ITSO), N-(biphenyl-4-yl)-N-[4-(9-phenyl-9H-carbazol-3-yl)phenyl]-9,9-dimethyl-9H-fluoren-2-amine (abbreviation: PCBBiF), an electron-accepting material (OCHD-003), N,N-bis[4-(dibenzofuran-4-yl)phenyl]-4-amino-p-terphenyl (abbreviation: DBfBB1TP), 9-(1-naphthyl)-10-[4-(2-naphthyl)phenyl]anthracene (abbreviation: αN-βNPAnth), N,N'-diphenyl-N,N'-bis(9-phenyl-9H-carbazol-2-yl)naphtho[2,3-b;6,7-b']bisbenzofuran-3,10-diamine (abbreviation: 3,10PCA2Nbf(IV)-02), 2-{3-[3-(N-phenyl-9H-carbazol-3-yl)-9H-carbazol-9-yl]phenyl}dibenzo[f,h]quinoxaline (abbreviation: 2mPCCzPDBq), 2,2'-(1,3-phenylene)bis(9-phenyl-1,10-phenanthroline) (abbreviation: mPPhen2P), lithium fluoride (LiF), ytterbium (Yb), silver (Ag), magnesium (Mg), and indium oxide-tin oxide (abbreviation: ITO).

«Operation Characteristics of Light-Emitting Device A»

When supplied with electric power, the light-emitting device A emitted the light ELA (see FIG. 40C). Operation characteristics of the light-emitting device A were measured at room temperature (see FIG. 42 to FIG. 48). Note that luminance, CIE chromaticity, and emission spectra were measured with a spectroradiometer (SR-UL1R manufactured by TOPCON TECHNOHOUSE CORPORATION).

Table 9 shows main initial characteristics of the fabricated light-emitting device emitting light at a luminance of approximately 1000 $cd/m^2$. Table 9 also shows the characteristics of other light-emitting devices each having a structure described later.

Table 10 shows a time LT90 taken for the luminance to drop to 90% of its initial value at a constant current density of 50 $mA/cm^2$, which was obtained under the condition where the light-emitting devices each emitted light. Table 10 also shows the characteristics of other light-emitting devices each having a structure described later.

TABLE 9

| | Voltage (V) | Current (mA) | Current density (mA/cm2) | Chromaticity x | Chromaticity y | Current efficiency (cd/A) |
|---|---|---|---|---|---|---|
| Light-emitting device A | 5.6 | 0.41 | 10.1 | 0.14 | 0.05 | 2.1 |
| Light-emitting device B | 4.0 | 0.07 | 1.9 | 0.26 | 0.70 | 54.3 |
| Light-emitting device C | 4.8 | 0.16 | 3.9 | 0.69 | 0.31 | 24.2 |
| Comparative device B | 3.1 | 0.01 | 1.2 | 0.28 | 0.69 | 87.7 |
| Comparative device C | 3.3 | 0.02 | 3.1 | 0.69 | 0.31 | 32.4 |

TABLE 10

| | LT90 (hr) |
|---|---|
| Light-emitting device A | 560 |
| Light-emitting device B | 200 |
| Light-emitting device C | 1200 |
| Comparative device B | 160 |
| Comparative device C | 1200 |

The light-emitting device A was found to exhibit favorable characteristics. For example, the light-emitting device A was able to be driven at a low voltage. Moreover, blue display with high color purity was able to be performed.

«Structure of Light-Emitting Device B»

The light-emitting device B includes a reflective film REFB, the electrode 551B, the electrode 552B, the unit 103B, the layer 104B, the layer 105B, and the layer CAP (see FIG. 40C). The light-emitting device B has a rectangular shape with a size of 2.96 μm×3.19 μm (see FIG. 40B).

The reflective film REFB includes a layer REFB1, a layer REFB2, and a layer REFB3 (see FIG. 41B). The unit 103B includes the layer 112B, a layer 113B1, a layer 113B2, and the layer 111B.

Table 11 shows the specific structure of the fabricated light-emitting device B described in this example. Structural formulae of materials used in the light-emitting devices described in this example are shown below. Note that in the tables in this example, subscript and superscript characters are written in ordinary size for convenience. For example, a subscript character in an abbreviation and a superscript character in a unit are written in ordinary size in the tables. The corresponding description in the specification gives an accurate reading of such notations in the tables.

TABLE 11

| Components | Reference numerals | Materials | Composition ratio | Thickness/nm |
|---|---|---|---|---|
| Layer | CAP | ITO | | 70 |
| Electrode | 552B | Ag:Mg | 1:0.1 | 25 |
| Layer | 105B | LiF:Yb | 1:0.5 | 1.5 |
| Layer | 113B2 | mPPhen2P | | 15 |
| Layer | 113B1 | 2mPCCzPDBq | | 10 |
| Layer | 111B | 8mpTP-4mDBtPBfpm:βNCCP:Ir(5mppy-d3)2(mbfpypy-d3) | 0.6:0.4:0.1 | 40 |
| Layer | 112B | PCBBiF | | 10 |
| Layer | 104B | PCBBiF:OCHD-003 | 1:0.3 | 10 |
| Electrode | 551B | ITSO | | 10 |
| Reflective film | REFB3 | Ti | | 6 |
| Reflective film | REFB2 | Al | | 70 |
| Reflective film | REFB1 | Ti | | 50 |

«Operation Characteristics of Light-Emitting Device B»

When supplied with electric power, the light-emitting device B emitted the light ELB (see FIG. 40C). Operation characteristics of the light-emitting device B were measured at room temperature (see FIG. 49 to FIG. 54). Note that luminance, CIE chromaticity, and emission spectra were measured with a spectroradiometer (SR-UL1R manufactured by TOPCON TECHNOHOUSE CORPORATION).

Table 9 shows the main initial characteristics of the fabricated light-emitting device emitting light at a luminance of approximately 1000 cd/$m^2$. Table 10 shows the time LT90 taken for the luminance to drop to 90% of its initial value at a constant current density of 50 mA/$cm^2$, which was obtained under the condition where the light-emitting devices each emitted light.

The light-emitting device B was found to exhibit favorable characteristics. For example, the light-emitting device B was able to be driven at a low voltage. Moreover, green display with high color purity was able to be performed.

«Structure of Light-Emitting Device C»

The light-emitting device C includes a reflective film REFC, the electrode 551C, the electrode 552C, the unit 103C, the layer 104C, the layer 105C, and the layer CAP (see FIG. 40C). The light-emitting device C has a rectangular shape with a size of 2.96 μm×3.19 μm (see FIG. 40B).

The reflective film REFC includes a layer REFC1, a layer REFC2, and a layer REFC3 (see FIG. 41C). The unit 103C includes a layer 112C, a layer 113C1, a layer 113C2, and a layer 111C.

Table 12 shows the specific structure of the fabricated light-emitting device C described in this example. Structural formulae of materials used in the light-emitting devices described in this example are shown below. Note that in the tables in this example, subscript and superscript characters are written in ordinary size for convenience. For example, a subscript character in an abbreviation and a superscript character in a unit are written in ordinary size in the tables. The corresponding description in the specification gives an accurate reading of such notations in the tables.

TABLE 12

| Components | Reference numerals | Materials | Composition ratio | Thickness/ nm |
|---|---|---|---|---|
| Layer | CAP | ITO | | 70 |
| Electrode | 552C | Ag:Mg | 1:0.1 | 25 |
| Layer | 105C | LiF:Yb | 1:0.5 | 1.5 |
| Layer | 113C2 | mPPhen2P | | 20 |
| Layer | 113C1 | 2mPCCzPDBq | | 20 |
| Layer | 111C | 11mDBtBPPnfpr: PCBBiF: OCPG-006 | 0.7: 0.3:0.05 | 40 |
| Layer | 112C | PCBBiF | | 25 |
| Layer | 104C | PCBBiF:OCHD-003 | 1:0.3 | 10 |
| Electrode | 551C | ITSO | | 10 |
| Reflective film | REFC3 | Ti | | 6 |
| Reflective film | REFC2 | Al | | 70 |
| Reflective film | REFC1 | Ti | | 50 |

[Chemical Formula 5]

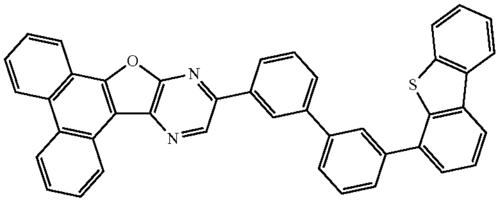

11mDBtBPPnfpr

In this example, the light-emitting device C was fabricated using 11-[(3'-dibenzothiophen-4-yl)biphenyl-3-yl] phenanthro[9',10':4,5]furo[2,3-b]pyrazine (abbreviation: 11mDBtBPPnfpr) and a phosphorescent dopant (OCPG-006).

«Operation Characteristics of Light-Emitting Device C»

When supplied with electric power, the light-emitting device C emitted the light ELC (see FIG. 40C). Operation characteristics of the light-emitting device C were measured at room temperature (see FIG. 55 to FIG. 60). Note that luminance, CIE chromaticity, and emission spectra were measured with a spectroradiometer (SR-UL1R manufactured by TOPCON TECHNOHOUSE CORPORATION).

Table 9 shows the main initial characteristics of the fabricated light-emitting device emitting light at a luminance of approximately 1000 cd/m$^2$. Table 10 shows the time LT90 taken for the luminance to drop to 90% of its initial value at a constant current density of 50 mA/cm$^2$, which was obtained under the condition where the light-emitting devices each emitted light.

The light-emitting device C was found to exhibit favorable characteristics. For example, the light-emitting device C was able to be driven at a low voltage. Moreover, red display with high color purity was able to be performed.

<Comparative Apparatus 700-REF>

A fabricated comparative apparatus 700-REF described in this example is different from the display apparatus 700-3 in including the comparative devices B and C instead of the light-emitting devices B and C. Different portions are described in detail here, and the above description is referred to for portions where a method similar to the above was employed.

«Structure of Comparative Device B»

The comparative device B is different from the light-emitting device B in the structure of the layer 104B. Specifically, the comparative device B is different from the light-emitting device B in containing PCBBiF and OCHD-003 at not 1:0.3 but 1:0.03 in a weight ratio.

«Structure of Comparative Device C»

The comparative device C is different from the light-emitting device C in the structure of the layer 104C. Specifically, the comparative device C is different from the light-emitting device C in containing PCBBiF and OCHD-003 at not 1:0.3 but 1:0.03 in a weight ratio.

<Method for Fabricating Display Apparatus 700-3>

The display apparatus 700-3 described in this example was fabricated by a method including the following steps.

In Step 1 and Step 2, the reflective films REFA, REFB, and REFC and the electrodes 551A, 551B, and 551C are formed (see FIG. 61).

In Step 3 to Step 8, a film to be the layer 104A later and a film to be the unit 103A later are stacked (see FIG. 62). Step 3 to Step 8 include a step common to the fabrication methods of the light-emitting devices A, B, and C.

In Step 9-1 to Step 9-4, the stacked-layer film is microfabricated by a photolithography method into a predetermined shape to form the film 529_1 (see FIG. 63). Step 9-1 to Step 9-4 include a step common to the fabrication methods of the light-emitting devices A, B, and C.

In Step 10-1 to Step 10-3, the film 529_2 and the insulating film 529_3 are formed (see FIG. 68).

In Step 11 to Step 13, the layer 105, the conductive film 552, and the layer CAP are formed over the units 103A, 103B, and 103C (see FIG. 69).

«Method for Fabricating Light-Emitting Device A»

The light-emitting device A described in this example was fabricated using a method including the following steps.

[Step 1]

In Step 1, the reflective films REFA, REFB, and REFC were formed over the insulating film 521 (see FIG. 61). Specifically, a 50-nm-thick film containing Ti, a 70-nm-thick film containing Al, and a 6-nm-thick film containing Ti were stacked by a sputtering method, and the stacked-layer film was processed into a predetermined shape by a photolithography method.

[Step 2]

In Step 2, the electrodes 551A, 551B, and 551C were formed over the reflective films REFA, REFB, and REFC, respectively. Specifically, a conductive film was formed by a sputtering method using ITSO as a target and then processed into a predetermined shape by a photolithography method. The electrode 551B is adjacent to the electrode 551A and the gap 551AB is positioned between the electrode 551B and the electrode 551A. The electrodes 551A, 551B, and 551C each contain ITSO and have a thickness of 10 nm.

Then, a workpiece provided with a plurality of electrodes was washed with water and then transferred into a vacuum evaporation apparatus in which the pressure was reduced to approximately $10^{-4}$ Pa, and vacuum baking was performed at 170° C. for 60 minutes in a heating chamber of the vacuum evaporation apparatus. Then, the workpiece was cooled down for approximately 30 minutes.

[Step 3]

In Step 3, a film to be the layer 104A later was formed over the electrode 551A. Specifically, materials of the layer 104A were co-deposited by a resistance-heating method. The layer 104A contains PCBBiF and OCHD-003 at 1:0.03 in a weight ratio and has a thickness of 10 nm.

[Step 4]

In Step 4 to Step 7, a stacked-layer film to be the unit 103A later was formed. First, in Step 4, a film to be a layer 112A1 later was formed over the film to be the layer 104A later. Specifically, a material of the layer 112A1 was deposited by a resistance-heating method. The layer 112A1 contains PCBBiF and has a thickness of 96 nm.

[Step 5]

In Step 5, a film to be a layer 112A2 later was formed over the film to be the layer 112A1 later. Specifically, a material of the layer 112A2 was deposited by a resistance-heating method. The layer 112A2 contains DBfBB1TP and has a thickness of 10 nm.

[Step 6]

In Step 6, a film to be the layer 111A later was formed over the film to be the layer 112A2 later. Specifically, materials of the layer 111A were co-deposited by a resistance-heating method. The layer 111A contains αN-βNPAnth and 3,10PCA2Nbf(IV)-02 at 1:0.015 in a weight ratio and has a thickness of 25 nm.

[Step 7]

In Step 7, a film to be the layer 113A1 later was formed over the film to be the layer 111A later. Specifically, a material of the layer 113A1 was deposited by a resistance-heating method. The layer 113A1 contains 2mPCCzPDBq and has a thickness of 20 nm.

[Step 8]

In Step 8, a film to be the layer 113A2 later was formed over the film to be the layer 113A1 later. Specifically, a material of the layer 113A2 was deposited by a resistance-heating method. The layer 113A2 contains mPPhen2P and has a thickness of 15 nm.

[Step 9-1]

In Step 9-1, a film to be the film 529_1 later was formed over the film to be the layer 113A2 later. The film to be the film 529_1 later includes a 30-nm-thick film containing aluminum oxide and a 50-nm-thick film containing tungsten. Specifically, the workpiece provided with components up to the film to be the layer 113A2 later was taken out from a vacuum evaporation apparatus and then transferred into an ALD deposition apparatus, and the film containing aluminum oxide was formed by an ALD method. Next, the workpiece was taken out from the ALD deposition apparatus and then transferred into a sputtering apparatus, and the film containing tungsten was formed by a sputtering method.

[Step 9-2]

In Step 9-2, the film to be the film 529_1 later was processed into a predetermined shape. Specifically, the workpiece was taken out from the sputtering apparatus, the resist RES was formed over the film to be the film 529_1 later, and an unnecessary portion of the film containing tungsten was etched by an etching method using the resist RES so that a portion overlapping with the electrode 551A was left.

After the resist RES was removed, an unnecessary portion of the film containing aluminum oxide was etched by an etching method using the film containing tungsten so that a portion overlapping with the electrode 551A was left (see FIG. 62).

[Step 9-3]

In Step 9-3, the unit 103A and the layer 104A were formed (see FIG. 63). Specifically, unnecessary portions were etched so that portions overlapping with the electrode 551A were left. Note that the film to be the film 529_1 later functions as a hard mask. An oxygen-containing gas was used as an etching gas.

After Step 9-1 to Step 9-3, the electrode 551A, the layer 113A2, and the components therebetween in the light-emitting device A are formed on the workpiece and the film to be the film 529_1 later is formed over the layer 113A2. Alternatively, a plurality of predetermined electrodes can be exposed, for example. Note that the workpiece provided with the electrode 551A, the layer 113A2, and the components therebetween in the light-emitting device A can be referred to as work in process.

In the case where fabrication of the light-emitting device A is continued using the work in process provided with the electrode 551A, the layer 113A2, and the components therebetween, the process proceeds to Step 9-4 after Step 9-3.

In the case where the electrode 551B was exposed on the work in process, the light-emitting device B was fabricated over the electrode 551B. Similarly, in the case where the electrode 551C was exposed on the work in process, the light-emitting device C was fabricated over the electrode 551C. In that case, after Step 9-3, the workpiece was transferred into a vacuum evaporation apparatus in which the pressure was reduced to approximately $10^{-4}$ Pa, the process proceeded to Step 3, and then the light-emitting device B or the light-emitting device C was fabricated.

[Step 9-4]

In Step 9-4, the film 529_1 was formed. Specifically, the film containing tungsten was removed from the film to be the film 529_1 later so that the film containing aluminum oxide was left, whereby the film 529_1 was formed.

[Step 10-1]

In Step 10-1, an insulating film to be the film 529_2 later was formed (see FIG. 67). Specifically, the insulating film to be the film 529_2 later was formed by an ALD method to cover a top surface of the film 529_1, side surfaces of the unit 103A, and side surfaces of the layer 104A. Note that the film 529_2 contains aluminum oxide and has a thickness of 10 nm.

[Step 10-2]

In Step 10-2, the insulating film 529_3 was formed into a predetermined shape. Specifically, a portion between the electrode 551A and the electrode 551B was left and portions overlapping with the electrode 551A and the electrode 551B were removed with use of a photosensitive resin. Furthermore, a portion overlapping with the electrode 551C was removed.

[Step 10-3]

In Step 10-3, the film 529_1 and the film 529_2 were formed into predetermined shapes (see FIG. 68). Specifically, openings were formed in the film 529_1 and the film to be the film 529_2 later using the insulating film 529_3 as a resist.

A wet etching method can be employed, for example. Specifically, an aqueous solution containing hydrofluoric acid (HF) or an aqueous solution containing tetramethyl ammonium hydroxide (abbreviation: TMAH) can be used as an etchant. Accordingly, the units 103A, 103B, and 103C are exposed in the openings. In other words, the layers 113A2, 113B2, and 113C2 are exposed.

Then, the workpiece was transferred into a vacuum evaporation apparatus in which the pressure was reduced to approximately $10^{-4}$ Pa, and vacuum baking was performed at 70° C. for 90 minutes in a heating chamber of the vacuum evaporation apparatus.

[Step 11]

In Step 11, the layer 105 was formed over the layer 113A2. Specifically, materials of the layer 105 were co-deposited by a resistance-heating method. Note that the layer 105 includes the layers 105A, 105B, and 105C. The layer 105 contains LiF and Yb at 1:0.5 in a volume ratio and has a thickness of 1.5 nm.

[Step 12]

In Step 12, the conductive film 552 was formed over the layer 105. Specifically, materials of the conductive film 552 were co-deposited by a resistance-heating method. The conductive film 552 includes the electrodes 552A, 552B, and 552C. The conductive film 552 contains Ag and Mg at 1:0.1 in a weight ratio and has a thickness of 25 nm.

[Step 13]

In Step 13, the layer CAP was formed over the electrode 552A. Specifically, the layer CAP was formed by a sputtering method using ITO as a target. The layer CAP contains ITO and has a thickness of 70 nm.

«Method for Fabricating Light-Emitting Device B»

The light-emitting device B of the display apparatus described in this example was fabricated using a method including the following steps.

The fabrication method of the light-emitting device B is different from that of the light-emitting device A in that, in Step 3, the work in process of the light-emitting device A is used as a workpiece and the weight ratio of PCBBiF to OCHD-003 in the film containing PCBBiF and OCHD-003 is different from that in the fabrication method of the light-emitting device A.

Specifically, the workpiece is provided with the electrodes 551A and 551B, and the layer 104A, the unit 103A, and the film to be the film 529_1 later are formed over the electrode 551A. The fabrication method of the light-emitting device B is different from that of the light-emitting device A in that the weight ratio of PCBBiF to OCHD-003 in the film containing PCBBiF and OCHD-003 was 1:0.3 in Step 3; the thickness of the film containing PCBBiF was 10 nm in Step 4; Step 5 was omitted; the material and the thickness of the film in Step 6 were different from those in the fabrication method of the light-emitting device A; and the thickness of the film containing 2mPCCzPDBq was 10 nm in Step 7. Different portions are described in detail here, and the description of the fabrication method of the light-emitting device A is referred to for portions where a method similar to the above was employed in the description of the fabrication method of the light-emitting device B by replacing "A" in the reference numerals with "B".

[Step 3]

In Step 3, a film to be the layer 104B later was formed over the electrode 551B. Specifically, materials of the layer 104B were co-deposited by a resistance-heating method. The layer 104B contains PCBBiF and OCHD-003 at 1:0.3 in a weight ratio and has a thickness of 10 nm.

[Step 4]

In Step 4 to Step 7, a stacked-layer film to be the unit 103B later was formed. First, in Step 4, a film to be the layer 112B later was formed over the film to be the layer 104B later. Specifically, a material of the layer 112B was deposited by a resistance-heating method. The layer 112B contains PCBBiF and has a thickness of 10 nm.

[Step 6]

In Step 6, a film to be the layer 111B later was formed over the film to be the layer 112B later. Specifically, materials of the layer 111B were co-deposited by a resistance-heating method. The layer 111B contains 8mpTP-4mDBtPBfpm, βNCCP, and Ir(5mppy-$d_3$)$_2$(mbfpypy-$d_3$) at 0.6:0.4:0.1 in a weight ratio and has a thickness of 40 nm.

[Step 9-1]

In Step 9-1, a film to be the film 529_1 later was formed over the film to be the layer 113B2 later. The film to be the film 529_1 later includes a 30-nm-thick film containing aluminum oxide and a 50-nm-thick film containing tungsten. Specifically, the workpiece provided with components up to the film to be the layer 113B2 later was taken out from a vacuum evaporation apparatus and then transferred into an ALD deposition apparatus, and the film containing aluminum oxide was formed by an ALD method. Next, the workpiece was taken out from the ALD deposition apparatus and then transferred into a sputtering apparatus, and the film containing tungsten was formed by a sputtering method.

[Step 9-2]

In Step 9-2, the film to be the film 529_1 later was processed into a predetermined shape. Specifically, the workpiece was taken out from the sputtering apparatus, the resist RES was formed over the film to be the film 529_1 later, and an unnecessary portion of the film containing tungsten was etched by an etching method using the resist RES so that a portion overlapping with the electrode 551B was left.

After the resist RES was removed, an unnecessary portion of the film containing aluminum oxide was etched by an etching method using the film containing tungsten so that a portion overlapping with the electrode 551B was left (see FIG. 64).

[Step 9-3]

In Step 9-3, the unit 103B and the layer 104B were formed (see FIG. 65). Specifically, unnecessary portions were etched so that portions overlapping with the electrode 551B were left. Note that the film to be the film 529_1 later functions as a hard mask. An oxygen-containing gas was used as an etching gas.

After Step 9-1 to Step 9-3, the electrode 551B, the layer 113B2, and the components therebetween in the light-emitting device B are formed on the workpiece and the film to be the film 529_1 later is formed over the layer 113B2. Alternatively, a plurality of predetermined electrodes can be exposed, for example. Note that the workpiece provided with the electrode 551B, the layer 113B2, and the components therebetween in the light-emitting device B can be referred to as work in process.

In the case where fabrication of the light-emitting device B is continued using the work in process provided with the electrode 551B, the layer 113B2, and the components therebetween, the process proceeds to Step 9-4 after Step 9-3.

In the case where the electrode 551C was exposed on the work in process, the light-emitting device C was fabricated over the electrode 551C. In that case, after Step 9-3, the workpiece was transferred into a vacuum evaporation apparatus in which the pressure was reduced to approximately $10^{-4}$ Pa, the process proceeded to Step 3, and then the light-emitting device C was fabricated.

«Method for Fabricating Light-Emitting Device C»

The light-emitting device C of the display apparatus described in this example was fabricated using a method including the following steps.

The fabrication method of the light-emitting device C is different from that of the light-emitting device A in that, in Step 3, the work in process of the light-emitting device A and the light-emitting device B is used as a workpiece and the weight ratio of PCBBiF to OCHD-003 in the film containing PCBBiF and OCHD-003 is different from that in the fabrication method of the light-emitting device A.

Specifically, the workpiece is provided with the electrodes 551A, 551B, and 551C; the layer 104A, the unit 103A, and the film to be the film 529_1 later are formed over the electrode 551A; and the layer 104B, the unit 103B, and the film to be the film 529_1 later are formed over the electrode 551B. The fabrication method of the light-emitting device C is different from that of the light-emitting device A in that the weight ratio of PCBBiF to OCHD-003 in the film containing PCBBiF and OCHD-003 was 1:0.3 in Step 3; the thickness of the film containing PCBBiF was 25 nm in Step 4; Step 5 was omitted; the material and the thickness of the film in Step 6 were different from those in the fabrication method of the light-emitting device A; and the thickness of the film containing mPPhen2P was 20 nm in Step 8. Different portions are described in detail here, and the description of the fabrication method of the light-emitting device A is referred to for portions where a method similar to the above was employed in the description of the fabrication method of the light-emitting device C by replacing "A" in the reference numerals with "C".

[Step 3]

In Step 3, a film to be the layer 104C later was formed over the electrode 551C. Specifically, materials of the layer 104C were co-deposited by a resistance-heating method. The layer 104C contains PCBBiF and OCHD-003 at 1:0.3 in a weight ratio and has a thickness of 10 nm.

[Step 4]

In Step 4 to Step 7, a stacked-layer film to be the unit 103C later was formed. First, in Step 4, a film to be the layer 112C later was formed over the film to be the layer 104C later. Specifically, a material of the layer 112C was deposited by a resistance-heating method. The layer 112C contains PCBBiF and has a thickness of 25 nm.

[Step 6]

In Step 6, a film to be the layer 111C later was formed over the film to be the layer 112C later. Specifically, materials of the layer 111C were co-deposited by a resistance-heating method. The layer 111C contains 11mDBtBPPnfpr, PCBBiF, and OCPG-006 at 0.7:0.3:0.05 in a weight ratio and has a thickness of 40 nm.

[Step 7]

In Step 7, a film to be the layer 113C2 later was formed over the film to be the layer 113C1 later. Specifically, a material of the layer 113C2 was deposited by a resistance-heating method. The layer 113C2 contains mPPhen2P and has a thickness of 20 nm.

[Step 9-1]

In Step 9-1, a film to be the film 529_1 later was formed over the film to be the layer 113C2 later. The film to be the film 529_1 later includes a 30-nm-thick film containing aluminum oxide and a 50-nm-thick film containing tungsten. Specifically, the workpiece provided with components up to the film to be the layer 113C2 later was taken out from a vacuum evaporation apparatus and then transferred into an ALD deposition apparatus, and the film containing aluminum oxide was formed by an ALD method. Next, the workpiece was taken out from the ALD deposition apparatus and then transferred into a sputtering apparatus, and the film containing tungsten was formed by a sputtering method.

[Step 9-2]

In Step 9-2, the film to be the film 529_1 later was processed into a predetermined shape. Specifically, the workpiece was taken out from the sputtering apparatus, the resist RES was formed over the film to be the film 529_1 later, and an unnecessary portion of the film containing tungsten was etched by an etching method using the resist RES so that a portion overlapping with the electrode 551C was left.

After the resist RES was removed, an unnecessary portion of the film containing aluminum oxide was etched by an etching method using the film containing tungsten so that a portion overlapping with the electrode 551C was left.

[Step 9-3]

In Step 9-3, the unit 103C and the layer 104C were formed (see FIG. 66). Specifically, unnecessary portions were etched so that portions overlapping with the electrode 551C were left. Note that the film to be the film 529_1 later functions as a hard mask. An oxygen-containing gas was used as an etching gas.

After Step 9-1 to Step 9-3, the electrode 551C, the layer 113C2, and the components therebetween in the light-emitting device C are formed on the workpiece and the film to be the film 529_1 later is formed over the layer 113C2. Note that the workpiece provided with the electrode 551C, the layer 113C2, and the components therebetween in the light-emitting device C can be referred to as work in process.

In the case where fabrication of the light-emitting device C is continued using the work in process provided with the electrode 551C, the layer 113C2, and the components therebetween, the process proceeds to Step 9-4 after Step 9-3.

<Method for Fabricating Comparative Apparatus 700-REF>

The fabrication method of the comparative apparatus 700-REF described in this example is different from that of the display apparatus 700-3 in that the weight ratio of PCBBiF to OCHD-003 in the film containing PCBBiF and OCHD-003 was 1:0.03 in Step 3 of each of the fabrication process of the comparative device B and the fabrication process of the comparative device C. Here, the above description is referred to for portions where a method similar to the above was employed.

Reference Example

In this reference example, fabricated reference devices are described with reference to FIG. 70, FIG. 71, FIG. 72, FIG. 73, FIG. 74, FIG. 75, FIG. 76, FIG. 77, and FIG. 78.

Figure 70:
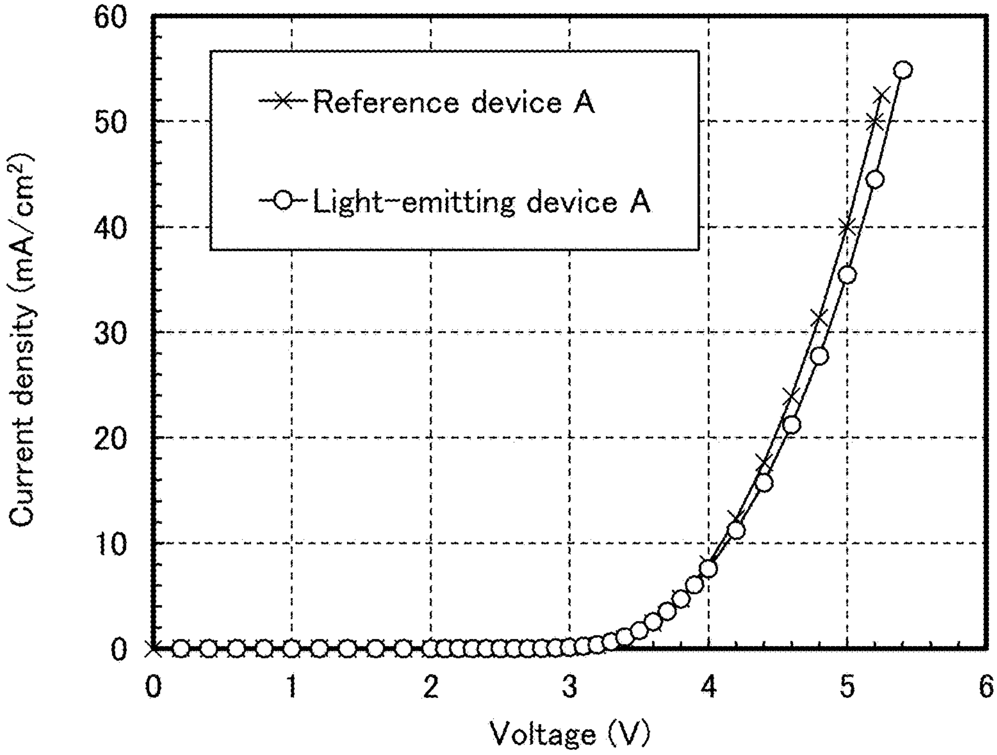
FIG. 70 shows voltage-current density characteristics of light-emitting devices of an example.

FIG. 70 shows voltage-current density characteristics of a reference device A and the light-emitting device A.

Figure 71:
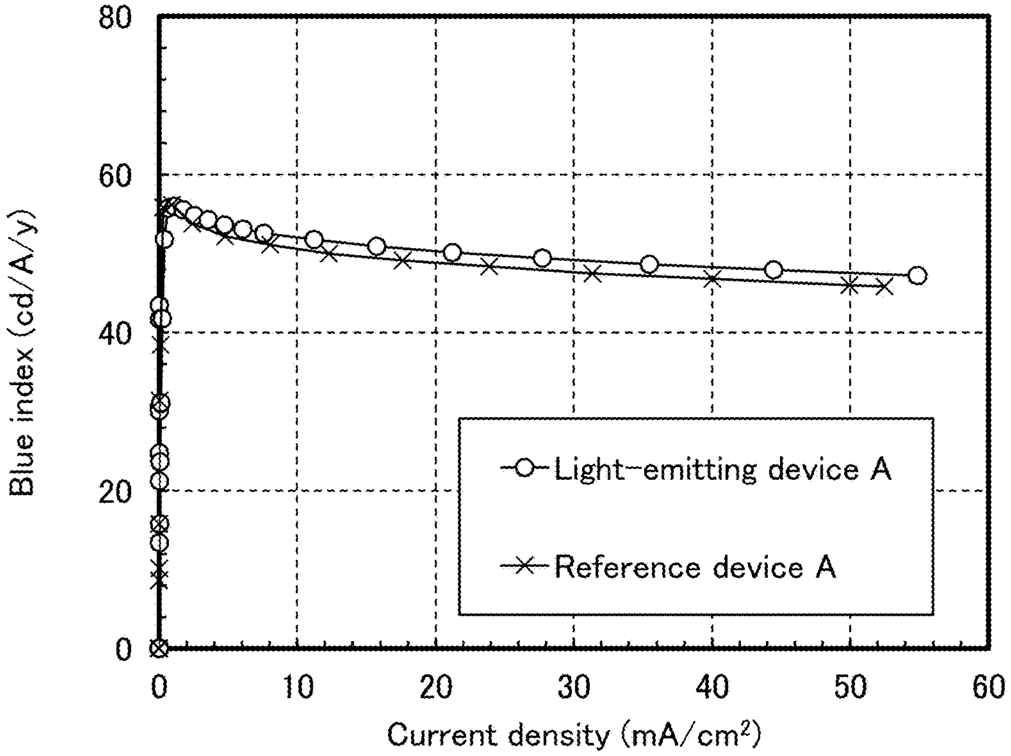
FIG. 71 shows current density-blue index characteristics of light-emitting devices of an example.

FIG. 71 shows current density-blue index characteristics of the reference device A and the light-emitting device A.

Figure 72:
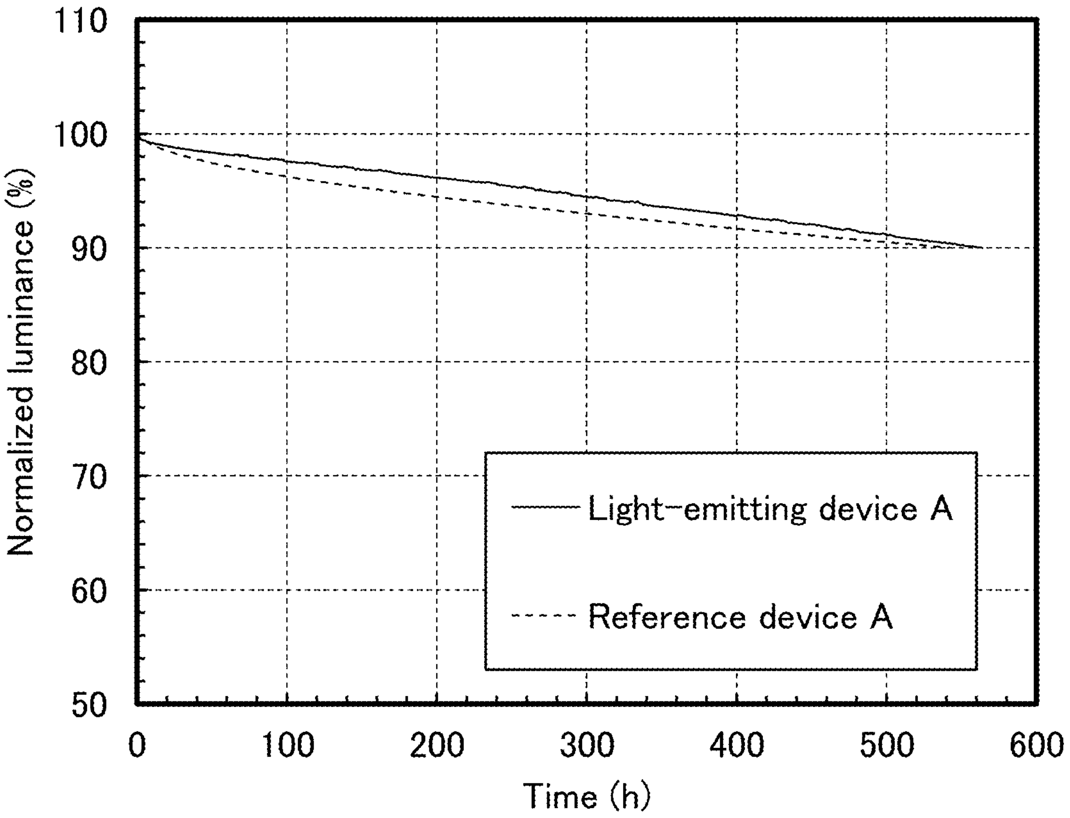
FIG. 72 shows changes in normalized luminance over time of light-emitting devices of an example.

FIG. 72 shows a change in normalized luminance over time of the reference device A and the light-emitting device A each emitting light at a constant current density of 50 $mA/cm^2$.

Figure 73:
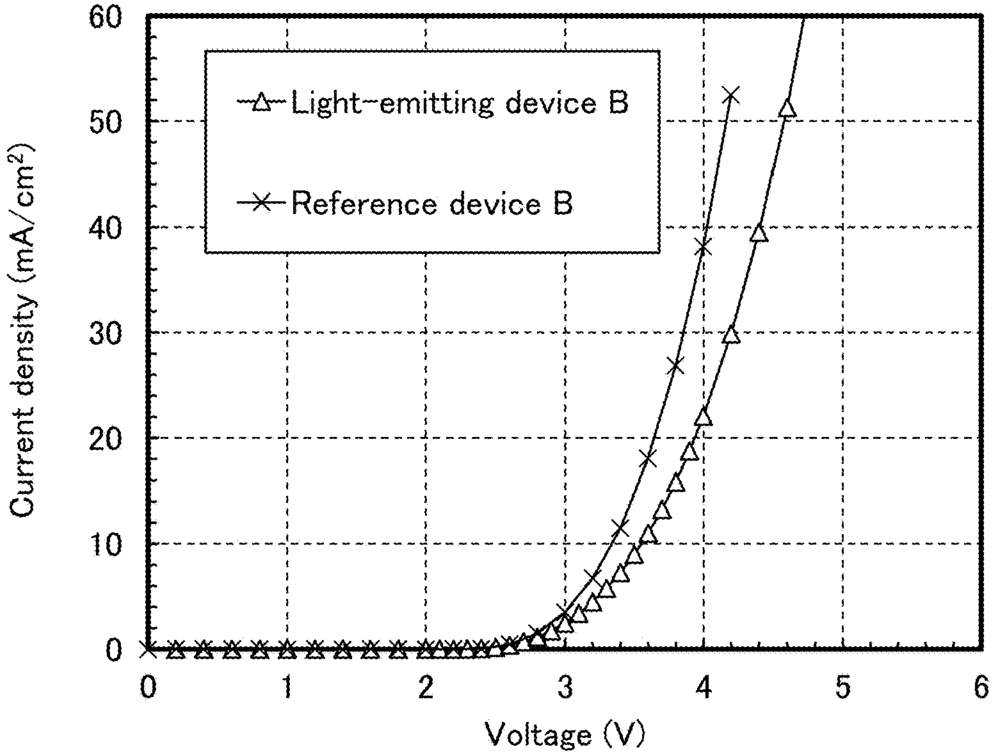
FIG. 73 shows voltage-current density characteristics of light-emitting devices of an example.

FIG. 73 shows voltage-current density characteristics of a reference device B and the light-emitting device B.

Figure 74:
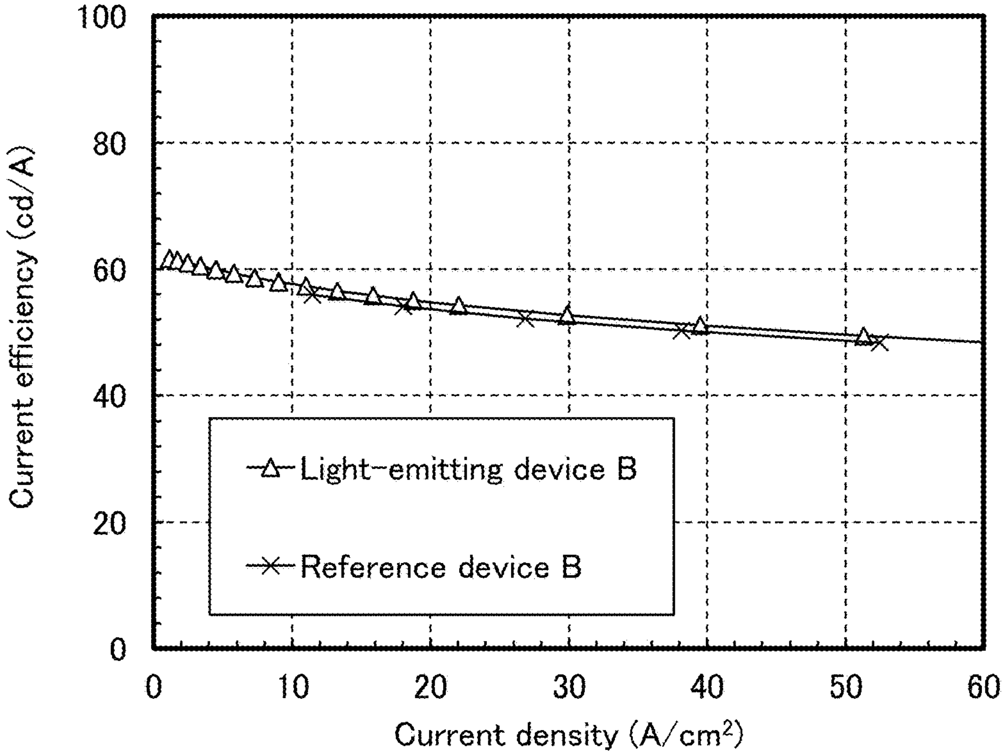
FIG. 74 shows current density-current efficiency characteristics of light-emitting devices of an example.

FIG. 74 shows current density-current efficiency characteristics of the reference device B and the light-emitting device B.

Figure 75:
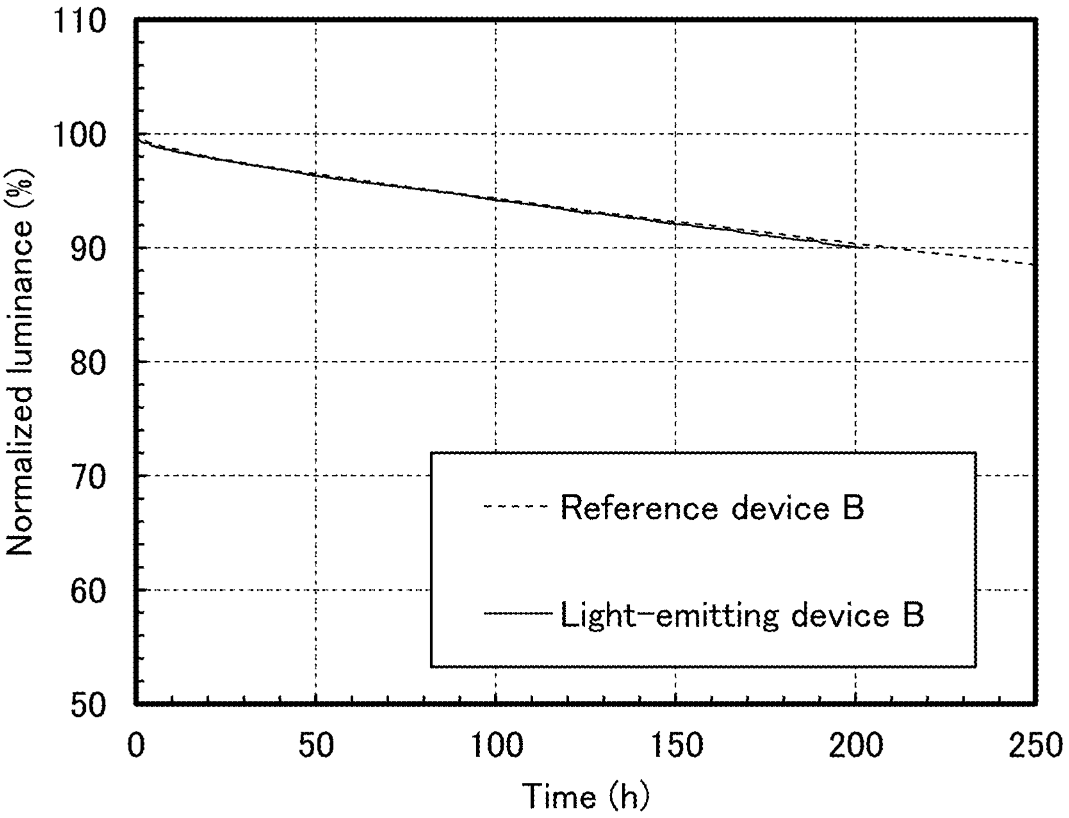
FIG. 75 shows changes in normalized luminance over time of light-emitting devices of an example.

FIG. 75 shows a change in normalized luminance over time of the reference device B and the light-emitting device B each emitting light at a constant current density of 50 $mA/cm^2$.

Figure 76:
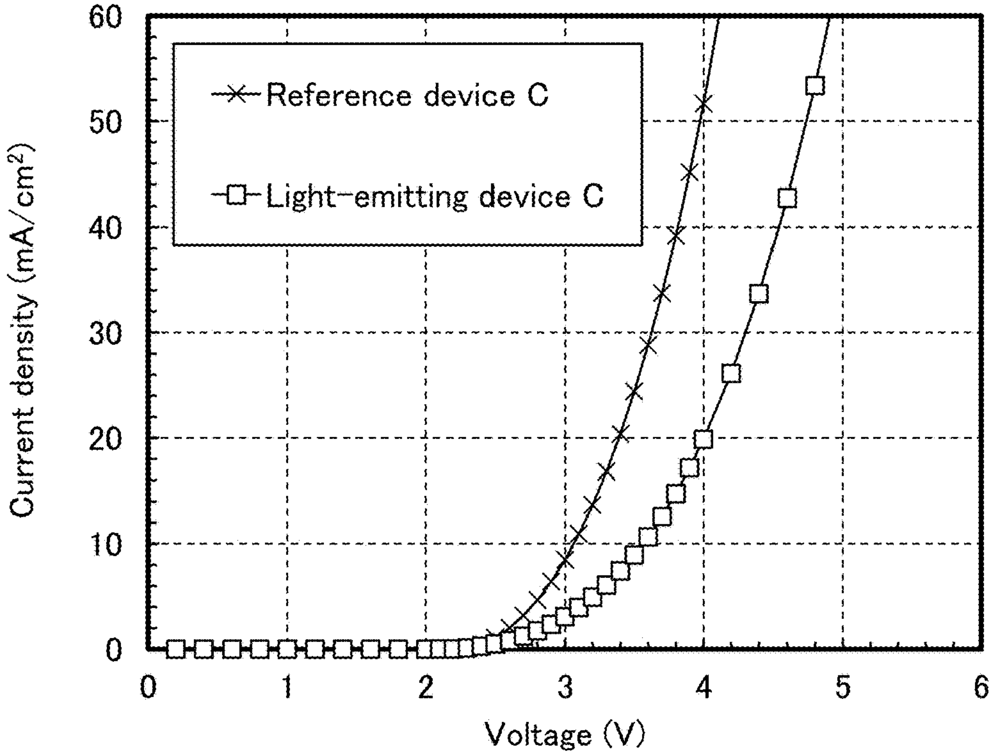
FIG. 76 shows voltage-current density characteristics of light-emitting devices of an example.

FIG. 76 shows voltage-current density characteristics of a reference device C and the light-emitting device C.

Figure 77:
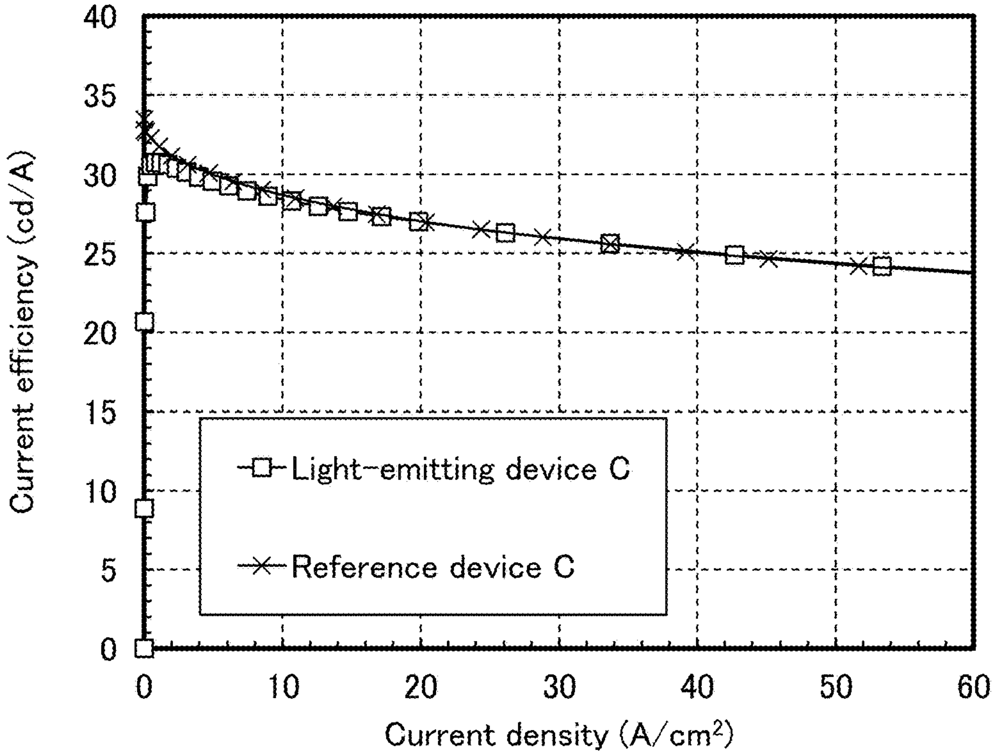
FIG. 77 shows current density-current efficiency characteristics of light-emitting devices of an example.

FIG. 77 shows current density-current efficiency characteristics of the reference device C and the light-emitting device C.

Figure 78:
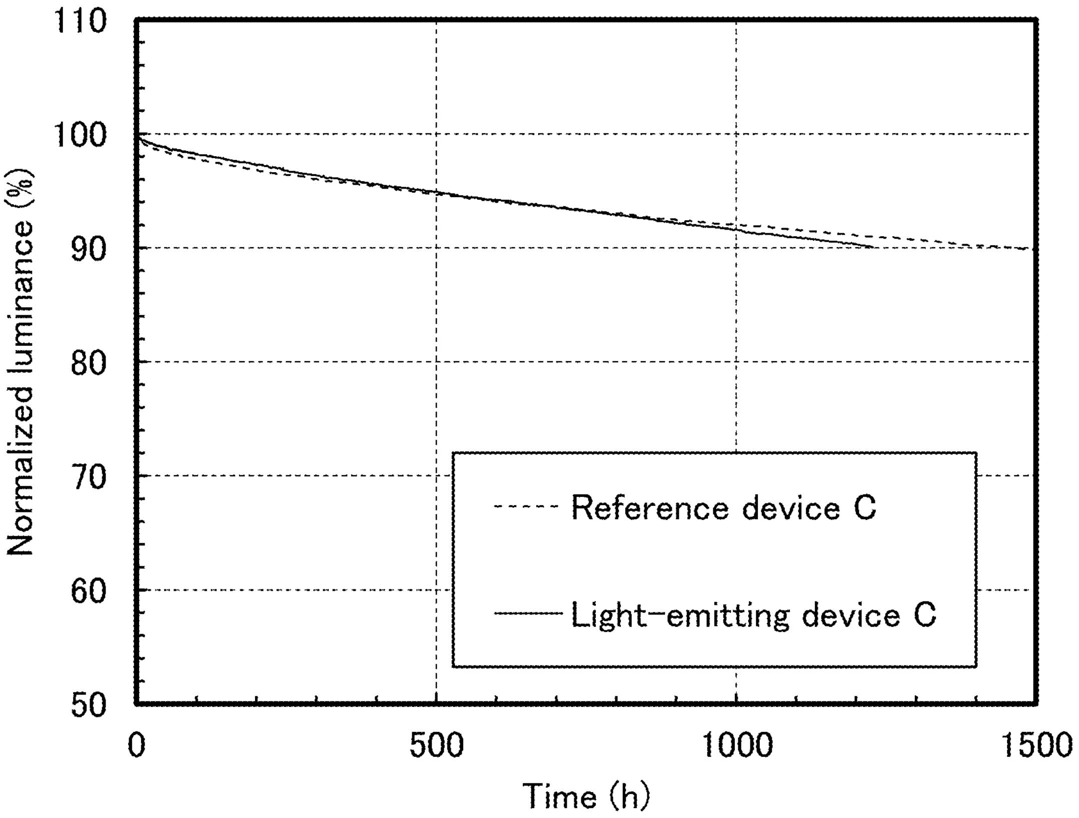
FIG. 78 shows changes in normalized luminance over time of light-emitting devices of an example.

FIG. 78 shows a change in normalized luminance over time of the reference device C and the light-emitting device C each emitting light at a constant current density of 50 mA/$cm^2$.

<Reference Device A>

The reference device A described in this example is different from the light-emitting device A in that the electrode 551A has an area of 4 $mm^2$ (2 mm×2 mm) and the layer 104A and the unit 103A are each continuously provided without a gap between the reference device A and another reference device adjacent to the reference device A.

The fabrication method of the reference device A is different from that of the light-emitting device A in that the process proceeds to Step 11 after Step 8 of the fabrication method of the light-emitting device A. In other words, the reference device A was treated in an apparatus in which the pressure was reduced continuously through the fabrication process.

«Operation Characteristics of Reference Device A»

When supplied with electric power, the reference device A emitted light. Operation characteristics of the reference device A were measured at room temperature (see FIG. 70 to FIG. 72). Note that luminance, CIE chromaticity, and emission spectra were measured with a spectroradiometer (SR-UL1R manufactured by TOPCON TECHNOHOUSE CORPORATION).

Table 13 shows main initial characteristics of the fabricated reference device A emitting light at a luminance of approximately 1000 cd/$m^2$. Table 13 also shows the characteristics of other reference devices.

Table 14 shows a time LT90 taken for the luminance to drop to 90% of its initial value at a constant current density of 50 mA/$cm^2$, which was obtained under the condition where the reference device A emitted light. Table 14 also shows the characteristics of the other reference devices.

TABLE 13

| | Voltage (V) | Current (mA) | Current density (mA/cm2) | Chromaticity x | Chromaticity y | Current efficiency (cd/A) |
|---|---|---|---|---|---|---|
| Light-emitting device A | 5.6 | 0.41 | 10.1 | 0.14 | 0.05 | 2.1 |
| Light-emitting device B | 4.0 | 0.07 | 1.9 | 0.26 | 0.70 | 54.3 |
| Light-emitting device C | 4.8 | 0.16 | 3.9 | 0.69 | 0.31 | 24.2 |
| Reference device A | 5.2 | 2.00 | 49.9 | 0.14 | 0.04 | 1.7 |
| Reference device B | 2.8 | 0.06 | 1.5 | 0.25 | 0.70 | 61.7 |
| Reference device C | 2.6 | 0.08 | 2.0 | 0.69 | 0.31 | 34.1 |

TABLE 14

| | LT90 (hr) |
|---|---|
| Light-emitting device A | 560 |
| Light-emitting device B | 200 |
| Light-emitting device C | 1200 |
| Reference device A | 540 |
| Reference device B | 209 |
| Reference device C | 1460 |

The light-emitting device A was found to exhibit favorable characteristics compared to the reference device A.

<Reference Device B>

The reference device B described in this example is different from the light-emitting device B in that the electrode 551B has an area of 4 $mm^2$ (2 mm×2 mm), the layer 104B contains PCBBiF and OCHD-003 at 1:0.03 in a weight ratio, and the layer 104B and the unit 103B are each continuously provided without a gap between the reference device B and another reference device adjacent to the reference device B.

The fabrication method of the reference device B is different from that of the light-emitting device B in that PCBBiF and OCHD-003 were co-deposited at 1:0.03 in a weight ratio in Step 3 of the fabrication method of the light-emitting device B and the process proceeds to Step 11 after Step 8 of the fabrication method of the light-emitting device B. In other words, the reference device B was treated in an apparatus in which the pressure was reduced continuously through the fabrication process.

«Operation Characteristics of Reference Device B»

When supplied with electric power, the reference device B emitted light. Operation characteristics of the reference device B were measured at room temperature (see FIG. 73 to FIG. 75).

Table 13 shows the main initial characteristics of the fabricated reference device B emitting light at a luminance of approximately 1000 cd/$m^2$. Table 14 shows the time LT90 taken for the luminance to drop to 90% of its initial value at a constant current density of 50 mA/$cm^2$, which was obtained under the condition where the reference device B emitted light.

The light-emitting device B was found to exhibit favorable characteristics compared to the reference device B.

<Reference Device C>

The reference device C described in this example is different from the light-emitting device C in that the electrode 551C has an area of 4 $mm^2$ (2 mm×2 mm), the layer 104C contains PCBBiF and OCHD-003 at 1:0.03 in a weight ratio, and the layer 104C and the unit 103C are each continuously provided without a gap between the reference device C and another reference device adjacent to the reference device C.

The fabrication method of the reference device C is different from that of the light-emitting device C in that PCBBiF and OCHD-003 were co-deposited at 1:0.03 in a weight ratio in Step 3 of the fabrication method of the light-emitting device C and the process proceeds to Step 11 after Step 8 of the fabrication method of the light-emitting device C. In other words, the reference device C was treated in an apparatus in which the pressure was reduced continuously through the fabrication process.

«Operation Characteristics of Reference Device C»

When supplied with electric power, the reference device C emitted light. Operation characteristics of the reference device C were measured at room temperature (see FIG. 76 to FIG. 78).

Table 13 shows the main initial characteristics of the fabricated reference device C emitting light at a luminance of approximately 1000 cd/$m^2$. Table 14 shows the time LT90 taken for the luminance to drop to 90% of its initial value at a constant current density of 50 $mA/cm^2$, which was obtained under the condition where the reference device C emitted light.

The light-emitting device C was found to exhibit favorable characteristics compared to the reference device C.

Example 5

This example will provide a supplementary explanation of the characteristics of the fabricated display apparatus 700-3 of one embodiment of the present invention with use of Table 15.

A white color (D65, 5000 $cd/m^2$) was displayed using the fabricated display apparatus. At this time, the current efficiency of the display apparatus was 23.3 cd/A.

In Table 15, the current efficiencies and chromaticities of light-emitting devices of red, green, and blue pixels are shown in R, G, and B columns, respectively. The fabricated display apparatus covered 98% of DCI-P3 (standard for digital cinemas).

TABLE 15

| | R | G | B |
|---|---|---|---|
| Current efficiency (cd/A) | 29.5 | 70.9 | 2.7 |
| Chromaticity x | 0.691 | 0.279 | 0.14 |
| Chromaticity y | 0.308 | 0.689 | 0.048 |

Reference Example 2

In this reference example, fabricated reference devices are described with reference to FIG. 79 and FIG. 80.

Figure 79:
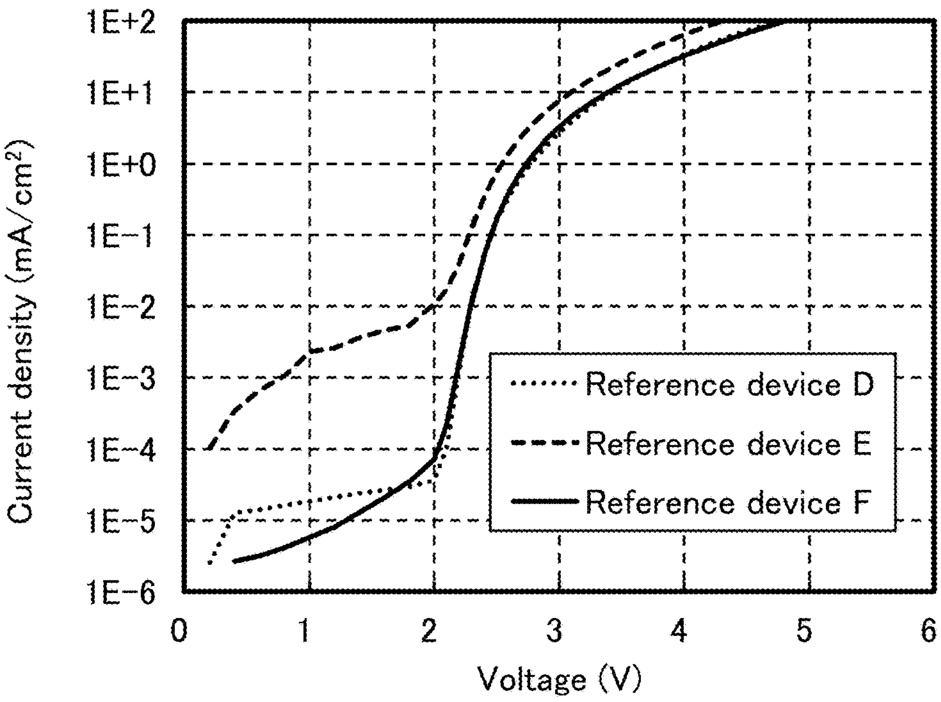
FIG. 79 shows voltage-current density characteristics of reference devices of an example.

FIG. 79 shows voltage-current density characteristics of a reference device D to a reference device F.

Figure 80:
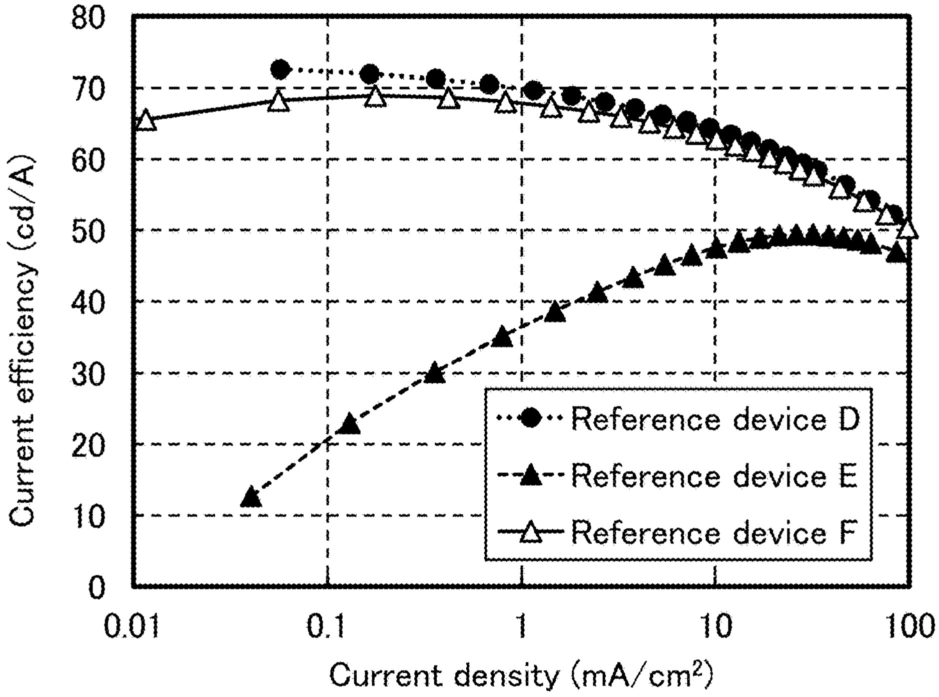
FIG. 80 shows current density-current efficiency characteristics of reference devices of an example.

FIG. 80 shows current density-current efficiency characteristics of the reference device D to the reference device F.

<Reference Device D>

«Structure of Reference Device D»

The reference device D includes the reflective film REFB, the electrode 551*n*, the electrode 552B, the unit 103B, the layer 104B, the layer 105B, and the layer CAP (see FIG. 40C). The reference device D has a square shape with a size of 2 mm×2 mm.

The reflective film REFB includes the layer REFB1, the layer REFB2, and the layer REFB3 (see FIG. 41B). The unit 103B includes the layer 112B, the layer 113B1, the layer 113B2, and the layer 111B.

Table 16 shows the specific structure of the fabricated reference device D described in this example. Note that in the table in this example, subscript and superscript characters are written in ordinary size for convenience. For example, a subscript character in an abbreviation and a superscript character in a unit are written in ordinary size in the table. The corresponding description in the specification gives an accurate reading of such notations in the table.

TABLE 16

| Components | Reference numerals | Materials | Composition ratio | Thickness/ nm |
|---|---|---|---|---|
| Layer | CAP | ITO | | 70 |
| Electrode | 552B | Ag:Mg | 1:0.1 | 25 |
| Layer | 105B | LiF:Yb | 1:0.5 | 1.5 |
| Layer | 113B2 | mPPhen2P | | 15 |
| Layer | 113B1 | 2mPCCzPDBq | | 10 |
| Layer | 111B | 8mpTP-4mDBtPBfpm:βNCCP:Ir(5mppy-d3)2(mbfpypy-d3) | 0.6:0.4:0.1 | 40 |
| Layer | 112B | PCBBiF | | 10 |
| Layer | 104B | PCBBiF:OCHD-003 | 1:0.3 | 10 |
| Electrode | 551B | ITSO | | 10 |
| Reflective film | REFB3 | Ti | | 6 |
| Reflective film | REFB2 | Al | | 70 |
| Reflective film | REFB1 | Ti | | 50 |

«Method for Fabricating Reference Device D»

The reference device D described in this example was fabricated using a method including the following steps.

[Step 1]

In Step 1, the reflective film REFB was formed over the insulating film 521. Specifically, a 50-nm-thick film containing Ti, a 70-nm-thick film containing Al, and a 6-nm-thick film containing Ti were stacked by a sputtering method, and the stacked-layer film was processed into a predetermined shape by a photolithography method.

[Step 2]

In Step 2, the electrode 551B was formed over the reflective film REFB. Specifically, a conductive film was formed by a sputtering method using ITSO as a target and then processed into a predetermined shape by a photolithography method. The electrode 551B contains ITSO and has a thickness of 10 nm.

Then, a workpiece provided with the electrode was washed with water and then transferred into a vacuum evaporation apparatus in which the pressure was reduced to approximately $10^{-4}$ Pa, and vacuum baking was performed at 170° C. for 60 minutes in a heating chamber of the vacuum evaporation apparatus. Then, the workpiece was cooled down for approximately 30 minutes.

[Step 3]

In Step 3, a film to be the layer 104B later was formed over the electrode 551B. Specifically, materials of the layer 104B were co-deposited by a resistance-heating method. The layer 104B contains PCBBiF and OCHD-003 at 1:0.3 in a weight ratio and has a thickness of 10 nm.

[Step 4]

In Step 4 to Step 7, a stacked-layer film to be the unit 103B later was formed. First, in Step 4, a film to be a layer 112B later was formed over the film to be the layer 104B later. Specifically, a material of the layer 112B was deposited by a resistance-heating method. The layer 112B contains PCBBiF and has a thickness of 10 nm.

[Step 6]

In Step 6, a film to be the layer 111B later was formed over the film to be the layer 112B later. Specifically, materials of the layer 111B were co-deposited by a resistance-heating method. The layer 111B contains 8mpTP-4mDBtPBfpm, βNCCP, and Ir(5mppy-$d_3$)$_2$(mbfpypy-$d_3$) at 0.6:0.4:0.1 in a weight ratio and has a thickness of 40 nm.

[Step 11]

In Step 11, the layer 105B was formed over the layer 113B2. Specifically, materials of the layer 105B were co-deposited by a resistance-heating method. The layer 105B contains LiF and Yb at 1:0.5 in a volume ratio and has a thickness of 1.5 nm.

[Step 12]

In Step 12, the conductive film 552 was formed over the layer 105B. Specifically, materials of the conductive film 552 were co-deposited by a resistance-heating method. The conductive film 552 includes the electrode 552B. The conductive film 552 contains Ag and Mg at 1:0.1 in a weight ratio and has a thickness of 25 nm.

[Step 13]

In Step 13, the layer CAP was formed over the electrode 552B. Specifically, the layer CAP was formed by a sputtering method using ITO as a target. The layer CAP contains ITO and has a thickness of 70 nm.

«Operation Characteristics of Reference Device D»

When supplied with electric power, the reference device D emitted light. Operation characteristics of the reference device D were measured at room temperature (see FIG. 79 and FIG. 80).

<Reference Device E>

«Structure of Reference Device E»

The reference device E described in this reference example is different from the reference device D in that 63001 (251×251) electrodes 551B are arranged in a matrix in a 2-mm square area on the assumption of stripe arrangement. Thus, the detailed structure of the reference device E is similar to that of the reference device D shown in Table 16. The area where the electrode 551B is exposed in an opening (i.e., the light-emitting area) is roughly 3.24 μm×2.95 μm. This shape and arrangement correspond to a pixel density of 3207 ppi and an aperture ratio of 15.1%. That is, in the reference device E, 63001 (251×251) light-emitting devices having the same structure are formed in a 2-mm square area. Note that in the reference device E, the layer 104B is continuously provided without a gap between one light-emitting device and another light-emitting device adjacent to the one light-emitting device. Similarly, the unit 103B is continuously provided without a gap between one light-emitting device and another light-emitting device adjacent to the one light-emitting device.

«Method for Fabricating Reference Device E»

The fabrication method of the reference device E is different from that of the reference device D in Step 2; specifically, the formed conductive film was separated into 63001 (251×251) electrodes 551B, an inorganic insulating film was formed over the electrodes 551B and then processed by a photolithography method, and a plurality of openings were formed so as to overlap with the separate electrodes 551B. Thus, the detailed structure of the reference device E is similar to that of the reference device D shown in Table 16.

«Operation Characteristics of Reference Device E»

When supplied with electric power, the reference device E emitted light. Operation characteristics of the reference device E were measured at room temperature (see FIG. 79 and FIG. 80).

«Structure of Reference Device F»

The reference device F is different from the reference device D in that 63001 (251×251) electrodes 551B are arranged in a matrix in a 2-mm square area on the assumption of stripe arrangement. This shape and arrangement correspond to a pixel density of 3207 ppi and an aperture ratio of 16.1%. That is, in the reference device F, 63001 (251×251) light-emitting devices having the same structure are formed in a 2-mm square area. Note that in the reference device F, the layer 104B is provided individually for the light-emitting devices adjacent to each other, and a gap is provided between the adjacent layers 104B. Similarly, the unit 103B is provided individually for the light-emitting devices adjacent to each other, and a gap is provided between the adjacent units 103B.

«Method for Fabricating Reference Device F»

The fabrication method of the reference device F is different from that of the reference device D in Step 2; specifically, the formed conductive film was separated into 63001 (251×251) electrodes 551B, an inorganic insulating film was formed over the electrodes 551B and then processed by a photolithography method, and a plurality of openings were formed so as to overlap with the separate electrodes 551B. In addition, another difference is that the fabrication method of the reference device F includes Step 7 to Step 10 between Step 6 and Step 11 so that the layer 104B and the unit 103B were processed into island shapes corresponding to the separate electrodes 551B. Step 7 to Step 10 are shown below.

[Step 7]

In Step 7, a film to be the layer 113B1 later was formed over the film to be the layer 111B later. Specifically, a material of the layer 113B1 was deposited by a resistance-heating method. The layer 113B1 contains 2mPCCzPDBq and has a thickness of 10 nm.

[Step 8]

In Step 8, a film to be the layer 113B2 later was formed over the film to be the layer 113B1 later. Specifically, a material of the layer 113B2 was deposited by a resistance-heating method. The layer 113B2 contains mPPhen2P and has a thickness of 15 nm.

[Step 9-1]

In Step 9-1, a film to be the film 529_1 later was formed over the film to be the layer 113B2 later. The film to be the film 529_1 later includes a 30-nm-thick film containing aluminum oxide and a 50-nm-thick film containing tungsten. Specifically, a workpiece provided with components up to the film to be the layer 113B2 later was taken out from a vacuum evaporation apparatus and then transferred into an ALD deposition apparatus, and the film containing aluminum oxide was formed by an ALD method. Next, the workpiece was taken out from the ALD deposition apparatus and then transferred into a sputtering apparatus, and the film containing tungsten was formed by a sputtering method.

[Step 9-2]

In Step 9-2, the film to be the film 529_1 later was processed into a predetermined shape. Specifically, the workpiece was taken out from the sputtering apparatus, the resist RES was formed over the film to be the film 529_1 later, and an unnecessary portion of the film containing tungsten was etched by an etching method using the resist RES so that a portion overlapping with the electrode 551B was left.

After the resist RES was removed, an unnecessary portion of the film containing aluminum oxide was etched by an etching method using the film containing tungsten so that portions overlapping with the separate electrodes 551B were left.

[Step 9-3]

In Step 9-3, the unit 103B and the layer 104B were formed. Specifically, unnecessary portions were etched so that island-shaped portions overlapping with the separate electrodes 551B were left. Note that the film to be the film 529_1 later functions as a hard mask. An oxygen-containing gas was used as an etching gas. By this processing, the unit 103B and the layer 104B are independently formed for each of the separate electrodes 551B. That is, the layer 104B and the unit 103B of a light-emitting device (light-emitting device F1) including one of the separate electrodes 551B are separated from those of another light-emitting device, which is adjacent to the light-emitting device F1, and a gap is provided between the adjacent layers 104B and the adjacent units 103B.

After Step 9-1 to Step 9-3, the electrode 551B, the layer 113B2, and the components therebetween in the light-emitting device are formed on the workpiece and the film to be the film 529_1 later is formed over the layer 113B2.

[Step 9-4]

In Step 9-4, the film 529_1 was formed. Specifically, the film containing tungsten was removed from the film to be the film 529_1 later so that the film containing aluminum oxide was left, whereby the film 529_1 was formed.

[Step 10-1]

In Step 10-1, an insulating film to be the film 529_2 later was formed. Specifically, the insulating film to be the film 529_2 later was formed by an ALD method to cover the top surface of the film 529_1, side surfaces of the unit 103B, and side surfaces of the layer 104B. Note that the film 529_2 contains aluminum oxide and has a thickness of 10 nm.

[Step 10-2]

In Step 10-2, the insulating film 529_3 was formed into a predetermined shape. Specifically, a portion between the separate electrodes 551B was left and portions overlapping with the separate electrodes 551B were removed with use of a photosensitive resin.

[Step 10-3]

In Step 10-3, the film 529_1 and the film 529_2 were formed into predetermined shapes. Specifically, openings were formed in the film 529_1 and the film to be the film 529_2 later using the insulating film 529_3 as a resist.

A wet etching method can be employed, for example. Specifically, an aqueous solution containing hydrofluoric acid (HF) or an aqueous solution containing tetramethyl ammonium hydroxide (abbreviation: TMAH) can be used as an etchant. Accordingly, the unit 103B is exposed in the opening. In other words, the layer 113B2 is exposed.

Then, the workpiece was transferred into a vacuum evaporation apparatus in which the pressure was reduced to approximately $10^{-4}$ Pa, and vacuum baking was performed at 90° C. for 90 minutes in a heating chamber of the vacuum evaporation apparatus.

«Operation Characteristics of Reference Device F»

When supplied with electric power, the reference device F emitted light. Operation characteristics of the reference device F were measured at room temperature (see FIG. 79 and FIG. 80).

As shown in FIG. 79, the reference devices D and F exhibited similar favorable characteristics but the reference device E, in which leakage current was generated, exhibited low current efficiency. This is because the reference device E includes the light-emitting devices arranged to have a high resolution of 3207 ppi and thus leakage current is generated through a hole-injection layer or the like having low resistance and unexpected light emission occurs in a region other than a light-emitting region, such as a region between adjacent light-emitting devices.

Meanwhile, the reference device F, although including the light-emitting devices arranged to have a high resolution of 3207 ppi as in the reference device E, exhibited favorable characteristics similar to those of the reference device D. This is because generation of leakage current is inhibited by the structure in which each of the layer 104B and the unit 103B is provided individually for the light-emitting devices adjacent to each other, and a gap is provided between the adjacent layers 104B and the adjacent units 103B.

This application is based on Japanese Patent Application Serial No. 2022-139638 filed with Japan Patent Office on Sep. 2, 2022, Japanese Patent Application Serial No. 2022-169723 filed with Japan Patent Office on Oct. 24, 2022, Japanese Patent Application Serial No. 2023-060387 filed with Japan Patent Office on Apr. 3, 2023, Japanese Patent Application Serial No. 2023-077626 filed with Japan Patent Office on May 10, 2023, and Japanese Patent Application Serial No. 2023-117083 filed with Japan Patent Office on Jul. 18, 2023, the entire contents of which are hereby incorporated by reference.

What is claimed is:

1. A display apparatus comprising:

a first light-emitting device, the first light-emitting device comprising:
- a first electrode;
- a first layer;
- a first unit; and
- a second electrode; and a second light-emitting device, the second light-emitting device comprising:
- a third electrode;
- a second layer;
- a second unit; and
- a fourth electrode, wherein the first unit is between the first electrode and the second electrode, wherein the first unit comprises a first light-emitting material, wherein the first layer is between the first unit and the first electrode, wherein the first layer is in contact with the first electrode, wherein the first layer uses a material having a first spin density observed with an electron spin resonance (ESR) spectrometer when the material is in a film state, wherein the third electrode is adjacent to the first electrode, wherein a first gap is between the third electrode and the first electrode, wherein the second unit is between the third electrode and the fourth electrode, wherein the second unit comprises a second light-emitting material, wherein the second layer is between the second unit and the third electrode, wherein the second layer is in contact with the third electrode, wherein the second layer uses a material having a second spin density observed with an electron spin resonance (ESR) spectrometer when the material is in a film state, and wherein the second spin density is higher than the first spin density.

2. A display module comprising:

the display apparatus according to claim 1; and at least one of a connector and an integrated circuit.

3. An electronic device comprising:

the display apparatus according to claim 1; and at least one of a battery, a camera, a speaker, and a microphone.

4. A display apparatus comprising:

a first light-emitting device, the first light-emitting device comprising:

a first electrode;

a first layer;

a first unit; and a second electrode; and a second light-emitting device, the second light-emitting device comprising:

a third electrode;

a second layer;

a second unit; and a fourth electrode, wherein the first unit is between the first electrode and the second electrode, wherein the first unit comprises a first light-emitting material, wherein the first layer is between the first unit and the first electrode, wherein the first layer is in contact with the first electrode, wherein the first layer comprises an electron-accepting material at a first weight percentage, wherein the third electrode is adjacent to the first electrode, wherein a first gap is between the third electrode and the first electrode, wherein the second unit is between the third electrode and the fourth electrode, wherein the second unit comprises a second light-emitting material, wherein the second layer is between the second unit and the third electrode, wherein the second layer is in contact with the third electrode, wherein the second layer comprises an electron-accepting material at a second weight percentage, and wherein the second weight percentage is higher than the first weight percentage.

5. The display apparatus according to claim 4, wherein a second gap is between the second layer and the first layer, and wherein the second gap overlaps with the first gap.

6. The display apparatus according to claim 5, further comprising:

a first insulating film;

a conductive film; and a second insulating film, wherein the first insulating film overlaps with the conductive film, wherein the first electrode and the third electrode are between the first insulating film and the conductive film, wherein the conductive film comprises the second electrode and the fourth electrode, wherein the second insulating film is between the conductive film and the first insulating film, wherein the second insulating film overlaps with the first gap, wherein the second insulating film fills the second gap, wherein the second insulating film comprises a first opening and a second opening, wherein the first opening overlaps with the first electrode, and wherein the second opening overlaps with the third electrode.

7. The display apparatus according to claim 5, wherein an emission spectrum of the first light-emitting material has a maximum peak in a range greater than or equal to 380 nm and less than or equal to 480 nm, and wherein an emission spectrum of the second light-emitting material has a maximum peak in a range greater than or equal to 500 nm and less than or equal to 550 nm.

8. The display apparatus according to claim 7, wherein the first light-emitting material is a fluorescent substance, and wherein the second light-emitting material is a phosphorescent substance.

9. A display module comprising:

the display apparatus according to claim 4; and at least one of a connector and an integrated circuit.

10. An electronic device comprising:

the display apparatus according to claim 4; and at least one of a battery, a camera, a speaker, and a microphone.

* * * * *